United States Patent
Utsumi et al.

(10) Patent No.: US 8,987,386 B2
(45) Date of Patent: Mar. 24, 2015

(54) METHOD OF PRODUCING POLYMERIC COMPOUND, RESIST COMPOSITION, AND METHOD OF FORMING RESIST PATTERN

(75) Inventors: Yoshiyuki Utsumi, Kawasaki (JP); Takahiro Dazai, Kawasaki (JP); Masatoshi Arai, Kawasaki (JP); Takaaki Kaiho, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 106 days.

(21) Appl. No.: 13/491,860

(22) Filed: Jun. 8, 2012

(65) Prior Publication Data

US 2012/0328993 A1 Dec. 27, 2012

(30) Foreign Application Priority Data

Jun. 10, 2011 (JP) .................................. 2011-130706

(51) Int. Cl.
| | | |
|---|---|---|
| C08F 228/02 | (2006.01) | |
| C08F 228/06 | (2006.01) | |
| C08F 8/34 | (2006.01) | |
| C08F 20/36 | (2006.01) | |
| C08F 20/38 | (2006.01) | |
| C08F 220/18 | (2006.01) | |
| C08F 220/28 | (2006.01) | |
| C08F 220/34 | (2006.01) | |
| C08F 220/38 | (2006.01) | |
| C08F 8/00 | (2006.01) | |
| G03F 7/20 | (2006.01) | |
| G03F 7/004 | (2006.01) | |
| G03F 7/11 | (2006.01) | |
| G03F 7/038 | (2006.01) | |
| G03F 7/039 | (2006.01) | |

(52) U.S. Cl.
CPC ................. *C08F 8/34* (2013.01); *C08F 228/02* (2013.01); *C08F 228/06* (2013.01); *G03F 7/20* (2013.01); *C08F 220/18* (2013.01); *C08F 220/28* (2013.01); *G03F 7/0045* (2013.01); *G03F 7/0046* (2013.01); *G03F 7/0397* (2013.01); *G03F 7/11* (2013.01); *G03F 7/2041* (2013.01); *Y10S 522/904* (2013.01)
USPC ..................... 525/326.4; 525/350; 430/270.1; 430/325; 430/326; 522/904

(58) Field of Classification Search
None
See application file for complete search history.

(56) References Cited

U.S. PATENT DOCUMENTS

| 5,945,517 A | 8/1999 | Nitta et al. |
| 6,153,733 A | 11/2000 | Yukawa et al. |
| 7,074,543 B2 | 7/2006 | Iwai et al. |
| 7,482,108 B2 | 1/2009 | Matsumaru et al. |
| 7,723,011 B2 * | 5/2010 | Wariishi ..................... 430/270.1 |
| 2004/0062939 A1 | 4/2004 | Shimada et al. |
| 2007/0148582 A1 * | 6/2007 | Hayashi et al. ............ 430/270.1 |
| 2008/0241754 A1 * | 10/2008 | Hayashi et al. ............ 430/287.1 |
| 2009/0317743 A1 | 12/2009 | Shiono et al. |
| 2010/0075256 A1 | 3/2010 | Joo et al. |
| 2010/0304302 A1 | 12/2010 | Masunaga et al. |
| 2011/0177453 A1 | 7/2011 | Masubuchi et al. |
| 2012/0065291 A1 | 3/2012 | Matsumura et al. |

FOREIGN PATENT DOCUMENTS

| JP | A-09-208554 | 8/1997 |
| JP | A-10-221852 | 8/1998 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2003-241385 | 8/2003 |
| JP | A-2004-099797 | 4/2004 |
| JP | A-2006-045311 | 2/2006 |
| JP | A-2009-025707 | 2/2009 |
| JP | A-2010-002870 | 1/2010 |
| JP | A-2010-077377 | 4/2010 |
| JP | A-2010-095643 | 4/2010 |
| JP | A-2011-008233 | 1/2011 |
| WO | WO 2004/074242 A2 | 9/2004 |
| WO | WO 2010/119910 A1 | 10/2010 |
| WO | WO-2011/093520 A1 * | 8/2011 |

OTHER PUBLICATIONS

Allen et al, Investigation of Polymer-bound PAGs: Synthesis, Characterization and Initial Structure/Property Relationships of Anion-Bound Reists, Jouranl of Photopolymer Science and Technology, vol. 22, No. 1 (2009) pp. 25-29.*
Office Action in Japanese Patent Application No. 2011-130706, mailed Oct. 21, 2014.

* cited by examiner

*Primary Examiner* — Cynthia Hamilton
(74) *Attorney, Agent, or Firm* — Knobbe Martens Olson & Bear LLP

(57) ABSTRACT

A method of producing a polymeric compound containing a structural unit that decomposes upon exposure to generate an acid, the method including: synthesizing a precursor polymer by polymerizing a water-soluble monomer having an anionic group, washing the precursor polymer with water, and subsequently subjecting the precursor polymer to a salt exchange with an organic cation. Also, a polymeric compound produced using the method of producing a polymeric compound, and a method of forming a resist pattern using the resist composition.

4 Claims, No Drawings

METHOD OF PRODUCING POLYMERIC COMPOUND, RESIST COMPOSITION, AND METHOD OF FORMING RESIST PATTERN

BACKGROUND OF THE INVENTION

1. Field of the Invention

The present invention relates to a method of producing a polymeric compound that is useful as a base component for a resist composition, and also relates to a resist composition containing the polymeric compound, and a method of forming a resist pattern that uses the resist composition.

Priority is claimed on Japanese Patent Application No. 2011-130706, filed Jun. 10, 2011, the content of which is incorporated herein by reference.

2. Description of Related Art

In lithography techniques, for example, a resist film composed of a resist material is formed on a substrate, and the resist film is subjected to selective exposure, followed by development, thereby forming a resist pattern having a predetermined shape on the resist film. A resist material in which the exposed portions of the resist film become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a shorter wavelength (higher energy) than these excimer lasers, such as extreme ultraviolet radiation (EUV), electron beam (EB), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is conventionally used, which includes an acid generator component that generates acid upon exposure, and a base component that exhibits changed solubility in a developing solution under the action of acid.

A resin (base resin) is generally used as the base component used in a chemically amplified resist composition.

For example, a chemically amplified resist composition for forming a positive-type resist pattern in an alkali developing process that uses an alkali developing solution as the developing solution typically contains an acid generator component and a resin component which exhibits increased solubility in the alkali developing solution under the action of acid. If the resist film formed using this resist composition is selectively exposed during formation of a resist pattern, then within the exposed portions, acid is generated from the acid generator component, and the action of this acid causes an increase in the solubility of the resin component in the alkali developing solution, making the exposed portions soluble in the alkali developing solution. Accordingly, by performing alkali developing, the unexposed portions remain as a pattern, resulting in the formation of a positive-type pattern.

As the resin component, a resin for which the polarity increases under the action of acid is generally used. As the polarity increases, the solubility of the resin in an alkali developing solution increases, whereas the solubility of the resin within organic solvents decreases. Accordingly, if a solvent developing process that uses a developing solution containing an organic solvent (an organic developing solution) is employed instead of an alkali developing process, then within the exposed portions of the resist film, the solubility in the organic developing solution decreases relatively, meaning that during the solvent developing process, the unexposed portions of the resist film are dissolved in the organic developing solution and removed, whereas the exposed portions remain as a pattern, resulting in the formation of a negative-type resist pattern. This type of solvent developing process that results in the formation of a negative-type resist pattern is also referred to as a negative tone development process (for example, see Patent Document 1).

Currently, resins that contain structural units derived from (meth)acrylate esters within the main chain (acrylic resins) are generally used as base resins for chemically amplified resist compositions that use ArF excimer laser lithography or the like, as they exhibit excellent transparency in the vicinity of 193 nm (for example, see Patent Document 2).

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

In order to improve the lithography properties and the like, the base resin includes a plurality of structural units.

For example, in the case of an aforementioned resin component that exhibits increased polarity under the action of acid, typically, a base resin is used that contains a structural unit having an acid-decomposable group that decomposes under the action of the acid generated from the acid generator component, resulting in increased polarity, and also contains a structural unit having a polar group such as a hydroxyl group, and a structural unit having a lactone structure and the like. Structural units having a polar group are particularly widely used, as they enhance the affinity with alkali developing solutions, which contributes to an improvement in the resolution.

In recent years, chemically amplified resist compositions have been proposed that include a resin component which has an acid-generating group that generates acid upon exposure and an acid-decomposable group that exhibits increased polarity under the action of acid within the structure (for example, see Patent Documents 3 to 5).

These types of resin components combine the function of an acid generator and the function of a base component, and enable a chemically amplified resist composition to be prepared using only a single component. In other words, when this type of resin component is subjected to exposure, acid is generated from the acid-generating group within the structure, and the action of that acid causes decomposition of the acid-decomposable group, thereby forming a polar group such as a carboxyl group that causes an increase in the polarity. As a result, when a resin film (resist film) formed using such a resin component is subjected to selective exposure, the polarity of the exposed portions increases, and by performing developing using an alkali developing solution, the exposed portions can be dissolved and removed, thus forming a positive-type resist pattern.

DOCUMENTS OF RELATED ART

Patent Documents

[Patent Document 1]
Japanese Unexamined Patent Application, First Publication No. 2009-25707
[Patent Document 2]
Japanese Unexamined Patent Application, First Publication No. 2003-241385
[Patent Document 3]
Japanese Unexamined Patent Application, First Publication No. Hei 10-221852
[Patent Document 4]
Japanese Unexamined Patent Application, First Publication No. 2006-045311
[Patent Document 5]
Japanese Unexamined Patent Application, First Publication No. 2010-095643

SUMMARY OF THE INVENTION

It is considered that resin components such as those disclosed in Patent Documents 3 to 5, which include both an acid-generating group and an acid-decomposable group, provide improved resolution compared with those cases where the acid generator and the base component are added separately. It is thought that the reason for this improvement in the resolution is that because the resin component that functions as the base component includes an acid-generating group, these acid-generating groups can be more easily distributed uniformly throughout the resist film, meaning the acid generated from the acid-generating groups upon exposure can diffuse more uniformly through the resist film. This type of resin component is generally produced by a conventional radical polymerization method or the like, using the monomers that give rise to the repeating units that constitute the resin.

However, these types of resin components suffer from poor removal efficiency of the unreacted monomers during production of the resin component, and the removal efficiency of monomers containing an acid-generating group that generates acid upon exposure is particularly poor.

Due to the effects of these unreacted monomers, a problem arises in that when a resist pattern is formed using a resist composition containing this type of resin component, it is often difficult to achieve the desired lithography properties.

The present invention has been developed in light of the above circumstances, and has an object of providing a method of producing a polymeric compound that is useful as the base component of a resist composition having excellent lithography properties, as well as providing a resist composition containing the polymeric compound, and a method of forming a resist pattern that uses the resist composition.

In order to achieve the object described above, the present invention employs the aspects described below.

In other words, a first aspect of the present invention is a method of producing a polymeric compound containing a structural unit that decomposes upon exposure to generate an acid, the method including: synthesizing a precursor polymer by polymerizing a water-soluble monomer having an anionic group, washing the precursor polymer with water, and subsequently subjecting the precursor polymer to a salt exchange with an organic cation.

A second aspect of the present invention is a resist composition which contains a polymeric compound produced using the method of producing a polymeric compound according to the first aspect.

A third aspect of the present invention is a method of forming a resist pattern, the method including: forming a resist film using the resist composition according to the second aspect, conducting exposure of the resist film, and developing the resist film to form a resist pattern.

In the present description and the claims, the term "exposure" is used as a general concept that includes irradiation with any form of radiation.

A "structural unit" describes a monomer unit that contributes to the formation of a polymeric compound (a resin, polymer or copolymer).

The term "aliphatic" is a relative concept used in relation to the term "aromatic", and defines a group or compound or the like that has no aromaticity.

The term "alkyl group" includes linear, branched and cyclic monovalent saturated hydrocarbon groups, unless specified otherwise. This definition also applies for the alkyl group within an alkoxy group.

The term "alkylene group" includes linear, branched and cyclic divalent saturated hydrocarbon groups, unless specified otherwise.

A "halogenated alkyl group" is a group in which part or all of the hydrogen atoms of an alkyl group have each been substituted with a halogen atom, and a "halogenated alkylene group" is a group in which part or all of the hydrogen atoms of an alkylene group have each been substituted with a halogen atom, wherein examples of the halogen atom include a fluorine atom, chlorine atom, bromine atom and iodine atom.

A "fluorinated alkyl group" is a group in which part or all of the hydrogen atoms of an alkyl group have each been substituted with a fluorine atom, and a "fluorinated alkylene group" is a group in which part or all of the hydrogen atoms of an alkylene group have each been substituted with a fluorine atom.

The present invention is able to provide a method of producing a polymeric compound that is useful as the base component of a resist composition having excellent lithography properties, a resist composition that contains the polymeric compound, and a method of forming a resist pattern that uses the resist composition.

EMBODIMENTS OF THE INVENTION

Method of Producing Polymeric Compound

A method of producing a polymeric compound according to the present invention includes: synthesizing a precursor polymer by polymerizing a water-soluble monomer having an anionic group, washing the precursor polymer with water, and subsequently subjecting the precursor polymer to a salt exchange with an organic cation to produce a polymeric compound.

The polymeric compound produced using this production method generates acid upon exposure. Specifically, at least a portion of the structural units that constitute the polymeric compound, and are derived from the aforementioned water-soluble monomer in which the cation moiety has undergone salt exchange with the organic cation, decompose upon exposure to generate an acid.

A "structural unit derived from the water-soluble monomer" describes a structural unit that is formed by cleavage of the ethylenic double bond of the water-soluble monomer.

The polymeric compound produced using the production method according to the present invention is ideal as a base resin of the base component for a resist composition.

The method of producing the polymeric compound according to the present invention is described in more detail below, with the description split into three parts, namely the step (i) of synthesizing a precursor polymer by polymerizing a water-soluble monomer having an anionic group, the step (ii) of washing the precursor polymer with water, and the step (iii) of subjecting the precursor polymer to a salt exchange with an organic cation.

<Step (i)>

Step (i) in the present invention refers to the step of synthesizing a precursor polymer by polymerizing a water-soluble monomer having an anionic group.

In one embodiment of the step (i), a precursor polymer is produced by dissolving a water-soluble monomer having an anionic group in a polymerization solvent, together with one or more other monomers that give rise to each of the structural units that are to be introduced into the polymeric compound according to need, subsequently adding a radical polymerization initiator to the solution, and then performing a polymerization (such as a conventional radical polymerization).

During the above polymerization, a chain transfer agent such as $HS-CH_2-CH_2-CH_2-C(CF_3)_2-OH$ may also be used to introduce a $-C(CF_3)_2-OH$ group at the terminals of the polymeric compound. This type of copolymer having an introduced hydroxyalkyl group in which part of the hydrogen atoms of the alkyl group have been substituted with fluorine atoms is effective in reducing developing defects and line edge roughness (LER: unevenness in the side walls of a line pattern).

The water-soluble monomer having an anionic group is described below.

The monomers that give rise to each of the other structural units may be any compounds that are capable of copolymerization with the water-soluble monomer having an anionic group, and examples include compounds that yield the structural units (A) and (a1) to (a4) described below. As these monomers that give rise to each of the other structural units, commercially available monomers may be used, or the monomers may be synthesized using conventional methods.

Examples of the polymerization initiator include azobisisobutyronitrile (AIBN) and dimethyl azobisisobutyrate.

The polymerization solvent may be any solvent that is capable of dissolving the water-soluble monomer having an anionic group and the monomers that give rise to each of the other structural units, and specific examples include ethyl lactate, γ-butyrolactone, methyl ethyl ketone, propylene glycol monomethyl ether acetate, tetrahydrofuran, and mixed solvents thereof.

The amounts used of the water-soluble monomer having an anionic group, and the monomers that give rise to each of the other structural units may be selected as appropriate, with due consideration of the desired copolymer composition ratio (the proportion of each structural unit within the polymeric compound).

The reaction temperature is preferably within a range from 50 to 100° C., and more preferably from 65 to 85° C.

The reaction time differs depending on the reactivity of the monomers and the reaction temperature and the like, but typically, is preferably within a range from 60 to 480 minutes, and more preferably from 240 to 420 minutes.

Following polymerization of the water-soluble monomer, the polymerization reaction solution is dripped, for example, into a large volume of water or an organic solvent (such as isopropanol, heptane or methanol) to precipitate the polymer, and the precursor polymer is then collected by filtration or the like.

(Water-Soluble Monomer Having an Anionic Group)

The water-soluble monomer having an anionic group becomes a repeating unit that constitutes the precursor polymer as a result of the polymerization performed in the step (i), and the cation moiety of that repeating unit is capable of salt exchange with an organic cation in the step (iii) described below.

Here, the term "water-soluble monomer" describes a monomer which, when 1 g of the monomer is added to, and dissolved in, 100 g of water at 25° C., yields a solution that is transparent with no cloudiness.

The anionic group in the water-soluble monomer having an anionic group is preferably at least one group selected from the group consisting of sulfonate anions, carboxylate anions, sulfanilamide anions, bis(alkylsulfonyl)imide anions, and tris(alkylsulfonyl)methide anions.

Specific examples of the anionic group include groups represented by general formulas (a5-an1), (a5-an2), (a5-an3) and (a5-an4) shown below.

[Chemical Formula 1]

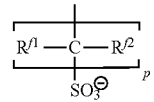
(a5-an1)

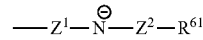
(a5-an2)

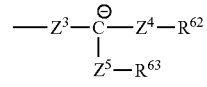
(a5-an3)

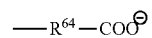
(a5-an4)

In the above formulas, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, p represents an integer of 1 to 8, each of $Z^1$ and $Z^2$ independently represents $-C(=O)-$ or $-SO_2-$, $R^{61}$ represents a hydrocarbon group which may have a fluorine atom, each of $Z^3$, $Z^4$ and $Z^5$ independently represents $-C(=O)-$ or $-SO_2-$, each of $R^{62}$ and $R^{63}$ independently represents a hydrocarbon group which may have a fluorine atom, and $R^{64}$ represents a hydrocarbon group which may have a fluorine atom.

In the formula (a5-an1), each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group.

The alkyl group for $R^{f1}$ and $R^{f2}$ is preferably an alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The fluorinated alkyl group for $R^{f1}$ and $R^{f2}$ is preferably a group in which part or all of the hydrogen atoms within an aforementioned alkyl group for $R^{f1}$ and $R^{f2}$ have each been substituted with a fluorine atom.

Each of $R^{f1}$ and $R^{f2}$ is preferably a fluorine atom or a fluorinated alkyl group.

In the formula (a5-an1), p represents an integer of 1 to 8, and is preferably an integer of 1 to 4, and more preferably 1 or 2.

In the formula (a5-an2), each of $Z^1$ and $Z^2$ independently represents —C(=O)— or —SO$_2$—, and it is preferable that at least one of $Z^1$ and $Z^2$ represents —SO$_2$—, and more preferable that both of $Z^1$ and $Z^2$ represent —SO$_2$—.

$R^{61}$ represents a hydrocarbon group which may have a fluorine atom. Examples of the hydrocarbon group for $R^{61}$ include alkyl groups, monovalent alicyclic hydrocarbon groups, aryl groups and aralkyl groups.

The alkyl group for $R^{61}$ preferably contains 1 to 8 carbon atoms, more preferably 1 to 6 carbon atoms, and still more preferably 1 to 4 carbon atoms, and may be either a linear group or a branched group. Specific examples of preferred alkyl groups include a methyl group, ethyl group, propyl group, butyl group, hexyl group and octyl group.

The monovalent alicyclic hydrocarbon group for $R^{61}$ preferably contains 3 to 20 carbon atoms and more preferably 3 to 12 carbon atoms, and may be either a polycyclic group or a monocyclic group. The monocyclic alicyclic hydrocarbon group is preferably a group in which one or more hydrogen atoms have been removed from a monocycloalkane. The monocycloalkane preferably contains 3 to 6 carbon atoms, and specific examples include cyclobutane, cyclopentane and cyclohexane. The polycyclic alicyclic hydrocarbon group is preferably a group in which one or more hydrogen atoms have been removed from a polycycloalkane, wherein the polycycloalkane preferably contains 7 to 12 carbon atoms, and specific examples include adamantane, norbornane, isobornane, tricyclodecane and tetracyclododecane.

The aryl group for $R^{61}$ preferably contains 6 to 18 carbon atoms and more preferably 6 to 10 carbon atoms, and a phenyl group is particularly desirable.

The aralkyl group for $R^{61}$ is preferably a group in which an alkylene group of 1 to 8 carbon atoms is bonded to an aforementioned "aryl group for $R^{61}$". An aralkyl group in which an alkylene group of 1 to 6 carbon atoms is bonded to an aforementioned "aryl group for $R^{61}$" is more preferred, and an aralkyl group in which an alkylene group of 1 to 4 carbon atoms is bonded to an aforementioned "aryl group for $R^{61}$" is particularly desirable.

In the hydrocarbon group for $R^{61}$, it is preferable that part or all of the hydrogen atoms within the hydrocarbon group are each substituted with a fluorine atom, and hydrocarbon groups in which 30 to 100% of the hydrocarbon group hydrogen atoms are substituted with fluorine atoms are more preferred. Among such groups, perfluoroalkyl groups in which all of the hydrogen atoms within an aforementioned alkyl group have been substituted with fluorine atoms are particularly desirable.

In the formula (a5-an3), each of $Z^3$, $Z^4$ and $Z^5$ independently represents —C(=O)— or —SO$_2$—, and it is preferable that at least one of $Z^3$, $Z^4$ and $Z^5$ represents —SO$_2$—, and more preferable that all of $Z^3$, $Z^4$ and $Z^5$ represent —SO$_2$—.

Each of $R^{62}$ and $R^{63}$ independently represents a hydrocarbon group which may have a fluorine atom, and examples include the same groups as those described above for the hydrocarbon group which may have a fluorine atom for $R^{61}$.

In the formula (a5-an4), $R^{64}$ represents a hydrocarbon group which may have a fluorine atom. Examples of the hydrocarbon group for $R^{64}$ include alkylene groups, divalent alicyclic hydrocarbon groups, groups in which one or more hydrogen atoms have been removed from an aryl group, and groups in which one or more hydrogen atoms have been removed from an aralkyl group.

Specific examples of the hydrocarbon group for $R^{64}$ include groups in which one or more hydrogen atoms have been removed from the hydrocarbon group described above for $R^{61}$ (such as an alkyl group, monovalent alicyclic hydrocarbon group, aryl group or aralkyl group).

In the hydrocarbon group for $R^{64}$, it is preferable that part or all of the hydrogen atoms within the hydrocarbon group are each substituted with a fluorine atom, and groups in which 30 to 100% of the hydrocarbon group hydrogen atoms are substituted with fluorine atoms are more preferred.

Among the various possibilities described above, from the viewpoint of obtaining superior lithography properties when the polymeric compound is used as the base resin for a resist composition, the anionic group in the water-soluble monomer having an anionic group is preferably at least one group selected from the group consisting of groups represented by the above general formulas (a5-an1) and (a5-an2), and is most preferably a group represented by the general formula (a5-an1).

Examples of the water-soluble monomer having an anionic group include monomers in which the anionic group described above is bonded to a polymerizable group via a linking group (-A$^0$-; for example, the linking groups -A$^1$-, -A$^2$- and -A$^3$- in general formulas (a5-1) to (a5-4) shown below, this definition also applies below), and monomers in which the anionic group is bonded directly to a polymerizable group with no linking group (-A$^0$-).

Examples of the polymerizable group include a vinyl group, allyl group, acryloyl group, methacryloyl group, fluorovinyl group, difluorovinyl group, trifluorovinyl group, difluorotrifluoromethylvinyl group, trifluoroallyl group, perfluoroallyl group, trifluoromethylacryloyl group, nonylfluorobutylacryloyl group, vinyl ether group, fluorine-containing vinyl ether group, allyl ether group, fluorine-containing allyl ether group, styryl group, fluorine-containing styryl group, norbornyl group, fluorine-containing norbornyl group, and silyl group.

There are no particular limitations on the linking group (-A$^0$-), but preferred examples include divalent hydrocarbon groups which may have a substituent, and divalent linking groups containing a hetero atom.

The expression that the hydrocarbon group "may have a substituent" means that part or all of the hydrogen atoms in the hydrocarbon group may each be substituted with a substituent (an atom other than a hydrogen atom or a group).

The hydrocarbon group for A$^0$ may be an aliphatic hydrocarbon group or an aromatic hydrocarbon group.

An "aliphatic hydrocarbon group" refers to a hydrocarbon group that has no aromaticity.

The aliphatic hydrocarbon group for the divalent hydrocarbon group for A$^0$ may be either saturated or unsaturated, but in most cases, is preferably saturated.

More specific examples of the aliphatic hydrocarbon group include linear or branched aliphatic hydrocarbon groups and aliphatic hydrocarbon groups that include a ring within the structure.

The linear or branched aliphatic hydrocarbon group preferably contains 1 to 10 carbon atoms, and more preferably 1 to 6 carbon atoms, still more preferably 1 to 4 carbon atoms, and most preferably 1 to 3 carbon atoms.

As the linear aliphatic hydrocarbon group, a linear alkylene group is preferable, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and an oxygen atom (═O).

Examples of the aliphatic hydrocarbon group that includes a ring within the structure include alicyclic hydrocarbon groups (groups in which two hydrogen atoms have been removed from an aliphatic hydrocarbon ring), groups in which an alicyclic hydrocarbon group is bonded to the terminal of a linear or branched aliphatic hydrocarbon group, and groups in which an alicyclic hydrocarbon group is interposed within the chain of a linear or branched aliphatic hydrocarbon group. Examples of the linear or branched aliphatic hydrocarbon group include the same groups as those described above.

The alicyclic hydrocarbon group preferably contains 3 to 20 carbon atoms, and more preferably 3 to 12 carbon atoms.

Examples of the alicyclic hydrocarbon group include groups (divalent groups) in which an additional one hydrogen atom has been removed from the monovalent alicyclic hydrocarbon group described above for $R^{61}$.

The alicyclic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

The aromatic hydrocarbon group is a hydrocarbon group that includes an aromatic ring.

The aromatic hydrocarbon group for the divalent hydrocarbon group for $A^0$ preferably contains 5 to 30 carbon atoms, more preferably 6 to 20 carbon atoms, still more preferably 6 to 15 carbon atoms, and most preferably 6 to 10 carbon atoms. This number of carbon atoms excludes carbon atoms within substituents.

Specific examples of the aromatic ring within the aromatic hydrocarbon group include aromatic hydrocarbon rings such as benzene, biphenyl, fluorene, naphthalene, anthracene and phenanthrene, and aromatic heterocyclic rings in which part of the carbon atoms that constitute one of the above aromatic hydrocarbon rings have been substituted with a hetero atom. Examples of the hetero atom in the aromatic heterocyclic rings include an oxygen atom, a sulfur atom and a nitrogen atom.

Specific examples of the aromatic hydrocarbon group include groups in which two hydrogen atoms have been removed from an aforementioned aromatic hydrocarbon ring (namely, arylene groups), and groups in which one hydrogen atom from a group having one hydrogen atom removed from an aforementioned aromatic hydrocarbon ring (namely, an aryl group) is substituted with an alkylene group (for example, groups in which one hydrogen atom is removed from the aryl group of an arylalkyl group such as a benzyl group, phenethyl group, 1-naphthylmethyl group, 2-naphthylmethyl group, 1-naphthylethyl group or 2-naphthylethyl group). The alkylene group (the alkyl chain within the arylalkyl group) preferably contains 1 to 4 carbon atoms, more preferably 1 or 2 carbon atoms, and most preferably 1 carbon atom.

The aromatic hydrocarbon group may or may not have a substituent. For example, a hydrogen atom bonded to the aromatic hydrocarbon ring of an aforementioned aromatic hydrocarbon group may be substituted with a substituent. Examples of the substituent include an alkyl group, alkoxy group, halogen atom, halogenated alkyl group, hydroxyl group and oxygen atom (═O).

The alkyl group for the substituent is preferably an alkyl group of 1 to 5 carbon atoms, and is most preferably a methyl group, ethyl group, propyl group, n-butyl group or tert-butyl group.

The alkoxy group for the substituent is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom for the substituent on the aromatic hydrocarbon group include a fluorine atom, chlorine atom, bromine atom and iodine atom, and a fluorine atom is preferred.

Examples of the halogenated alkyl group for the substituent include groups in which part or all of the hydrogen atoms of an aforementioned alkyl group have each been substituted with an aforementioned halogen atom.

Examples of the hetero atom in the "divalent linking group containing a hetero atom" for $A^0$ include atoms other than a carbon atom or hydrogen atom, and specific examples include an oxygen atom, nitrogen atom, sulfur atom and halogen atom.

Specific examples of the divalent linking group containing a hetero atom include —O—, —C(═O)—O—, —C(═O)—, —O—C(═O)—O—, —C(═O)—NH—, —NH— (wherein H may be substituted with a substituent such as an alkyl group or acyl group), —S—, —S(═O)$_2$—, —S(═O)$_2$—O—, —NH—C(═O)—, ═N— and groups represented by general formulas —Y$^{21}$—O—Y$^{22}$—, —Y$^{21}$—C(═O)—O—, —Y$^{21}$—O—C(═O)—, —[Y$^{21}$—C(═O)—O]$_{m'}$—Y$^{22}$—, —O—C(═O)—Y$^{22}$—, —Y$^{21}$—O—Y$^{22}$—O—C(═O)—, —Y$^{21}$—O—S(═O)$_2$—, —Y$^{21}$—S—Y$^{22}$—O—S(═O)$_2$—, —Y$^{21}$—O—C(═O)—Y$^{22}$—O—S(═O)$_2$—, —Y$^{21}$—O—Y$^{22}$—O—C(═O)—Y$^{23}$—, —Y$^{21}$—O—S(═O)$_2$—Y$^{22}$—, —Y$^{21}$—S—Y$^{22}$—O—S(═O)$_2$—Y$^{23}$—, and —Y$^{21}$—O—C(═O)—Y$^{22}$—O—S(═O)$_2$—Y$^{23}$— [wherein each of Y$^{21}$, Y$^{22}$ and Y$^{23}$ independently represents a divalent hydrocarbon group which may have a substituent, O represents an oxygen atom, C represents a carbon atom, S represents a sulfur atom, and m' represents an integer of 0 to 3].

When $A^0$ represents —NH—, the H may be substituted with a substituent such as an alkyl group or an aryl group (aromatic group).

Each of Y$^{21}$, Y$^{22}$ and Y$^{23}$ independently represents a divalent hydrocarbon group which may have a substituent. Examples of this divalent hydrocarbon group include the same groups as those described above for the "divalent hydrocarbon group which may have a substituent" for $A^0$.

Y$^{21}$ is preferably an aliphatic hydrocarbon group or aromatic hydrocarbon group which may have a substituent, more preferably a linear or cyclic alkylene group, still more preferably a linear alkylene group of 1 to 5 carbon atoms, and most preferably a methylene group or an ethylene group.

$Y^{22}$ is preferably an aliphatic hydrocarbon group or aromatic hydrocarbon group which may have a substituent, and is more preferably a methylene group, ethylene group, alkylmethylene group, (poly)cycloalkylene group, phenylene group or naphthylene group. The alkyl group within the alkylmethylene group is preferably a linear alkyl group of 1 to 5 carbon atoms, more preferably a linear alkyl group of 1 to 3 carbon atoms, and most preferably a methyl group.

$Y^{23}$ is preferably a linear or branched aliphatic hydrocarbon group which may have a substituent, and is more preferably a linear or branched alkylene group which may have a substituent.

In the group represented by the formula $—[Y^{21}—C(=O)—O]_{m'}—Y^{22}—$, m' represents an integer of 0 to 3, and is preferably an integer of 0 to 2, more preferably 0 or 1, and most preferably 1. In other words, the group represented by the formula $—[Y^{21}—C(=O)—O]_{m'}—Y^{22}—$ is most preferably a group represented by a formula $—Y^{21}—C(=O)—O—Y^{22}—$. Among such groups, groups represented by a formula $—(CH_2)_{a'}—C(=O)—O—(CH_2)_{b'}—$ are particularly preferred. In this formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

The divalent linking group containing a hetero atom is preferably a linear group containing an oxygen atom as the hetero atom, such as a group containing an ether linkage or an ester linkage, and a group represented by one of the above formulas $—Y^{21}—C(=O)—O—$, $—Y^{21}—O—C(=O)—$, $—Y^{21}—O—Y^{22}—$, $—[Y^{21}—C(=O)—O]_{m'}—Y^{22}—$ or $—Y^{21}—O—C(=O)—Y^{22}—$ is particularly desirable.

Among the above possibilities, the divalent linking group for $A^0$ is preferably a linear or branched alkylene group, a divalent alicyclic hydrocarbon group, or a divalent linking group containing a hetero atom. Of these groups, a linear or branched alkylene group or a divalent linking group containing a hetero atom is particularly preferred.

The cation moiety of the water-soluble monomer having an anionic group may be any cation capable of undergoing salt exchange with an organic cation, and examples include an ammonium ion, $H^+$, metal cation, phosphonium ion, and other inorganic cations.

Examples of the ammonium ion include an ammonium ion ($NH_4^+$), a quaternary ammonium ion, and primary to tertiary ammonium ions.

Examples of the quaternary ammonium ion include cations represented by a general formula (a5-ca1) shown below.

[Chemical Formula 2]

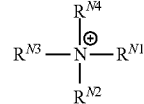

(a5-ca1)

In the above formula, each of $R^{N1}$ to $R^{N4}$ independently represents an alkyl group of 1 to 20 carbon atoms or an aryl group, which may be substituted with an aryl group, carboxyl group, hydroxyl group, alkoxy group of 1 to 5 carbon atoms, or alkylcarbonyloxy group of 1 to 5 carbon atoms.

The alkyl group of 1 to 20 carbon atoms for $R^{N1}$ to $R^{N4}$ in the formula (a5-ca1) may be a chain-like group or a cyclic group, but is preferably a linear alkyl group.

Examples of the aryl group for $R^{N1}$ to $R^{N4}$ include the same aryl groups as those described above for $R^{61}$, and a phenyl group is preferred.

When the alkyl group or aryl group for $R^{N1}$ to $R^{N4}$ has an aryl group as a substituent, examples of the aryl group substituent include the same aryl groups as those described above for $R^{61}$, and a phenyl group is preferred.

When the alkyl group or aryl group for $R^{N1}$ to $R^{N4}$ has an alkoxy group of 1 to 5 carbon atoms as a substituent, examples of the alkoxy group include the same alkoxy groups as those described above as the substituent for $A^0$.

When the alkyl group or aryl group for $R^{N1}$ to $R^{N4}$ has an alkylcarbonyloxy group of 1 to 5 carbon atoms as a substituent, examples of the alkylcarbonyloxy group include a methylcarbonyloxy group, ethylcarbonyloxy group and butylcarbonyloxy group.

Further, the quaternary ammonium ion may be a cation that contains two or more (and preferably two) nitrogen atoms ($N^+$).

Specific examples of the quaternary ammonium ion include a tetramethylammonium ion, tetraethylammonium ion ($Et_4N^+$), trimethylethylammonium ion ($Me_3EtN^+$), tetra-n-propylammonium ion (n-$Pr_4N^+$), tetra-i-propylammonium ion (i-$Pr_4N^+$), tetra-n-butylammonium ion (n-$Bu_4N^+$), and quaternary ammonium ions represented by the chemical formulas shown below.

[Chemical Formula 3]

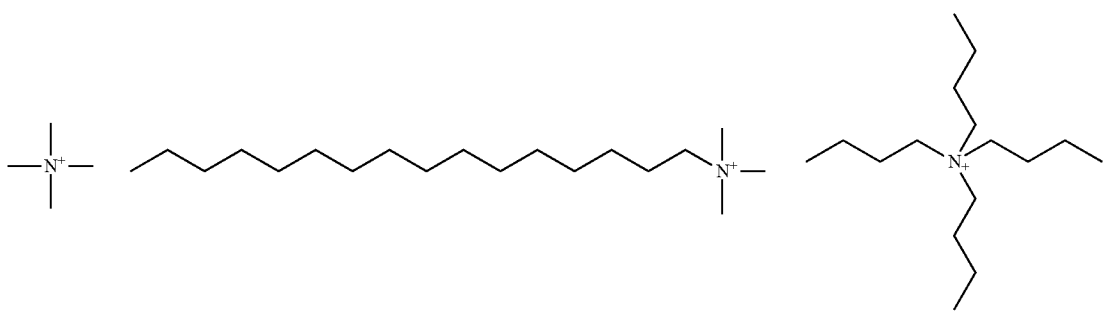

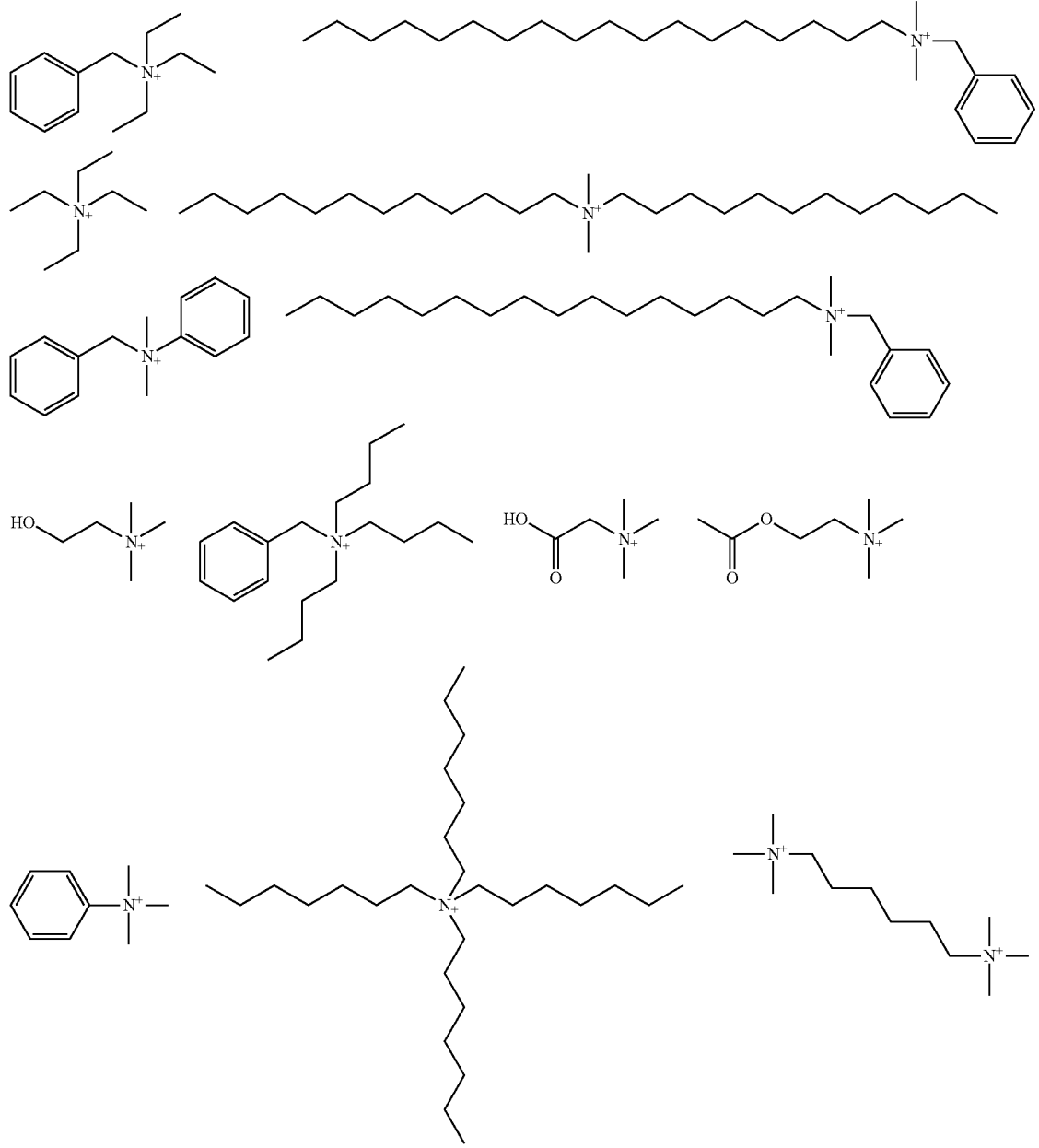

Specific examples of the primary to tertiary ammonium ions include a methylammonium ion, dimethylammonium ion, trimethylammonium ion, ethylammonium ion, diethylammonium ion, triethylammonium ion, n-propylammonium ion, di-n-propylammonium ion, tri-n-propylammonium ion, i-propylammonium ion, di-i-propylammonium ion, tri-i-propylammonium ion, n-butylammonium ion, di-n-butylammonium ion, tri-n-butylammonium ion, sec-butylammonium ion, di-sec-butylammonium ion, tri-sec-butylammonium ion, tert-butylammonium ion, di-tert-butylammonium ion, tri-tert-butylammonium ion, diisopropylethylammonium ion, phenylammonium ion, diphenylammonium ion, and triphenylammonium ion ($Ph_3NH^+$).

Further examples of ammonium ions include ions represented by the chemical formulas shown below.

[Chemical Formula 4]

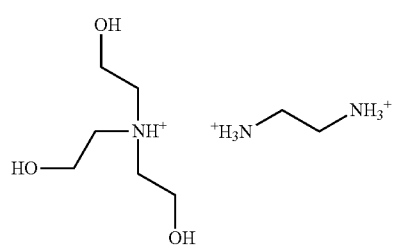

-continued

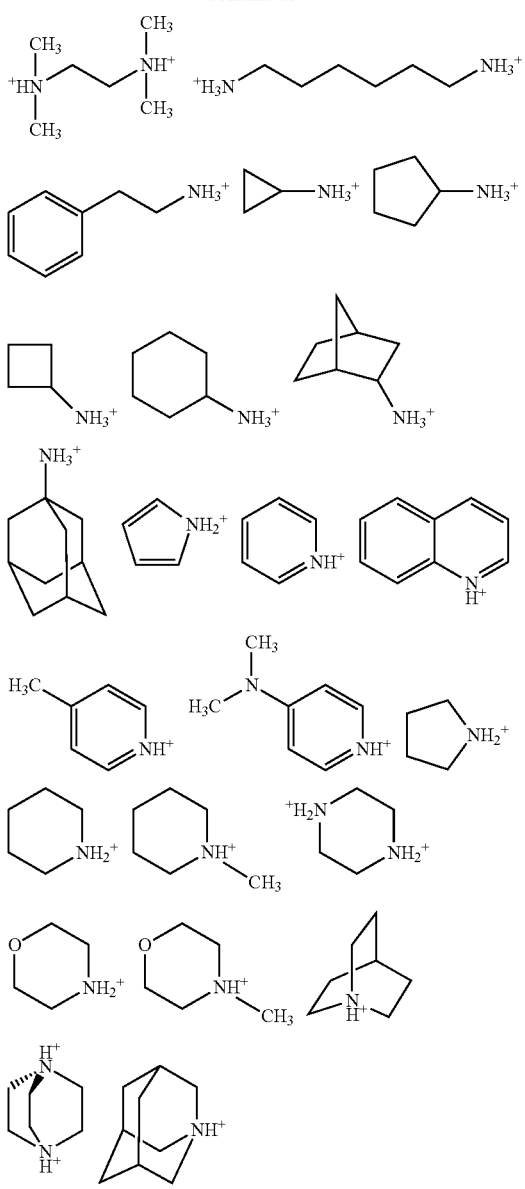

Examples of the metal cation include alkali metal ions such as a sodium ion, potassium ion and lithium ion, alkaline earth metal ions such as a magnesium ion and calcium ion, as well as an iron ion and aluminum ion.

Among the above possibilities, the cation moiety is preferably an ion of high polarity. Among such ions, in terms of enhancing the water solubility of the monomer and improving the removal efficiency of the unreacted monomer, an ammonium ion is preferable, a tertiary ammonium ion or quaternary ammonium ion is more preferable, and a quaternary ammonium ion is still more preferable. Among quaternary ammonium ions, a quaternary ammonium ion represented by the above formula (a5-ca1) is preferable, and a tetramethylammonium ion is particularly desirable.

Preferred examples of the water-soluble monomer having an anionic group include at least one monomer selected from the group consisting of compounds represented by general formulas (a5-1), (a5-2), (a5-3) and (a5-4) shown below.

[Chemical Formula 5]

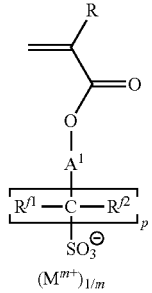
(a5-1)

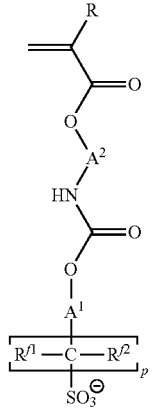
(a5-2)

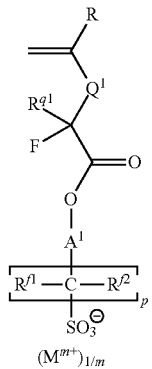
(a5-3)

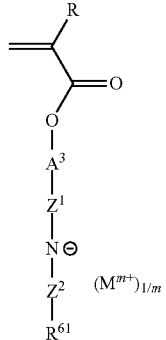
(a5-4)

In the above formulas, each R independently represents a hydrogen atom, an alkyl group of 1 to 5 carbon atoms or a halogenated alkyl group of 1 to 5 carbon atoms, each $A^1$ independently represents a single bond or a divalent linking group, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, each p independently represents an integer of 1 to 8, each $M^{m+}$ independently represents a counter cation, and each m independently represents an integer of 1 to 3. In the formula (a5-2), $A^2$ represents a divalent linking group. In the formula (a5-3), $Q^1$ represents a group containing —O—, —CH$_2$—O— or —C(=O)—O—, and $R^{q1}$ represents a fluorine atom or a fluorinated alkyl group. In the formula (a5-4), $A^3$ represents a divalent linking group, each of $Z^1$ and $Z^2$ independently represents —C(=O)— or —SO$_2$—, and $R^{61}$ represents a hydrocarbon group which may have a fluorine atom.

[Compounds represented by General Formula (a5-1)]

In the formula (a5-1), R represents a hydrogen atom, an alkyl group of 1 to 5 carbon atoms or a halogenated alkyl group of 1 to 5 carbon atoms.

The alkyl group of 1 to 5 carbon atoms for R is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Specific examples of the halogenated alkyl group of 1 to 5 carbon atoms for R include groups in which part or all of the hydrogen atoms of an aforementioned "alkyl group of 1 to 5 carbon atoms for R" have each been substituted with a halogen atom. Examples of the halogen atom include a fluorine atom, chlorine atom, bromine atom and iodine atom, and a fluorine atom is particularly desirable.

Among these, R is preferably a hydrogen atom, an alkyl group of 1 to 5 carbon atoms, or a fluorinated alkyl group of 1 to 5 carbon atoms, and from the viewpoint of industrial availability, is most preferably a hydrogen atom or a methyl group.

In the formula (a5-1), $A^1$ represents a single bond or a divalent linking group. Examples of the divalent linking group for $A^1$ include the same groups as those described above for the linking group (-$A^0$-). Of these groups, $A^1$ is preferably a linear or branched alkylene group, a divalent alicyclic hydrocarbon group, an arylene group, or a divalent linking group containing a hetero atom.

A linear or branched alkylene group, a combination of a linear or branched alkylene group and a divalent linking group containing a hetero atom, a combination of a divalent alicyclic hydrocarbon group and a divalent linking group containing a hetero atom, or a combination of an arylene group and a divalent linking group containing a hetero atom is more preferred.

A linear or branched alkylene group, a combination of a linear or branched alkylene group and an ester linkage [—C(=O)—O—], or a combination of a divalent alicyclic hydrocarbon group and an ester linkage [—C(=O)—O—] is particularly desirable.

A linear or branched alkylene group is the most preferred.

In the formula (a5-1), $R^{f2}$ and p are the same as defined above for $R^{f1}$, $R^{f2}$ and p in the formula (a5-an1).

In the formula (a5-1), $M^{m+}$ represents a counter cation, wherein m represents an integer of 1 to 3. The counter cation for $M^{m+}$ may be any cation capable of undergoing salt exchange with an organic cation, and examples include the aforementioned ammonium ions, H$^+$, metal cations, phosphonium ion, and other inorganic cations.

Specific examples of preferred compounds represented by the formula (a5-1) are shown below. In each of the following formulas, $R^\alpha$ represents a hydrogen atom, a methyl group or a trifluoromethyl group, and $R^{N1}$ to $R^{N4}$ are the same as defined above for $R^{N1}$ to $R^{N4}$ in the formula (a5-ca1).

[Chemical Formula 6]

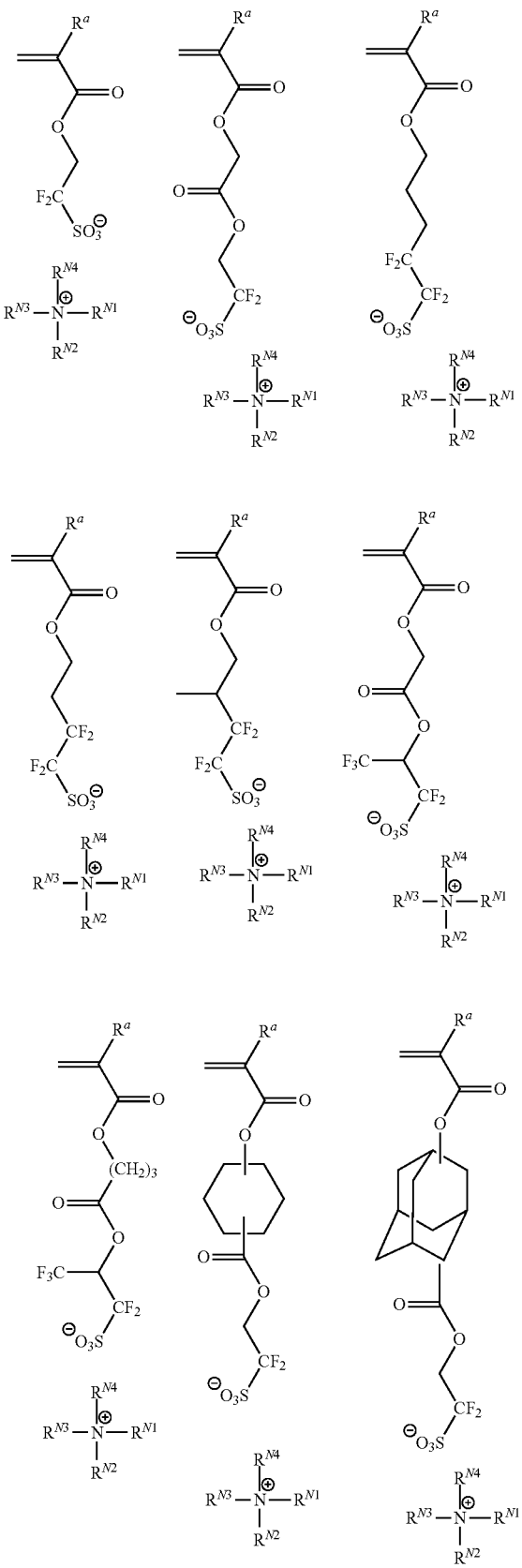

-continued

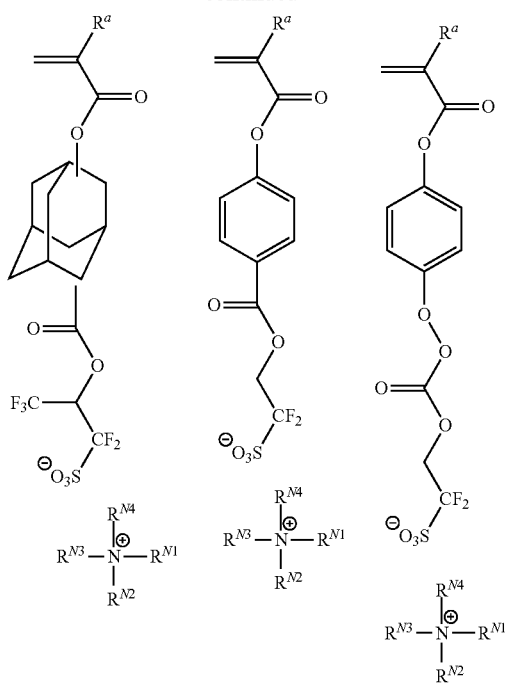

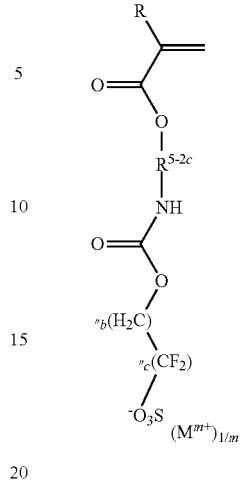

[Compounds represented by General Formula (a5-2)]

In the formula (a5-2), R, $A^1$, $R^{f1}$, $R^{f2}$, p, $M^{m+}$ and m are the same as defined above for R, $A^1$, $R^{f1}$, $R^{f2}$, p, $M^{m+}$ and m in the formula (a5-1).

In the formula (a5-2), $A^2$ represents a divalent linking group, and examples include the same divalent linking groups as those described above for $A^0$. Among these, a linear or branched alkylene group, a divalent alicyclic hydrocarbon group, or a divalent aromatic hydrocarbon group is particularly desirable.

Of the various compounds represented by the general formula (a5-2), compounds represented by general formulas (a5-2-1) and (a5-2-2) shown below are preferred.

[Chemical Formula 7]

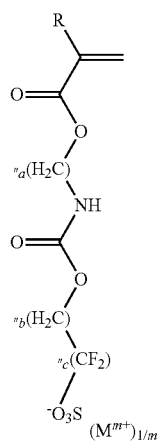

(a5-2-1)

(a5-2-2)

In the above formulas, R represents a hydrogen atom, an alkyl group of 1 to 5 carbon atoms or a halogenated alkyl group of 1 to 5 carbon atoms, a" represents an integer of 1 to 6, b" represents an integer of 1 to 4, c" represents an integer of 1 to 4, $R^{5-2c}$ represents a cyclic hydrocarbon group, $M^{m+}$ represents a counter cation, and m represents an integer of 1 to 3.

In the formulas (a5-2-1) and (a5-2-2), R, $M^{m+}$ and m are each the same as defined above. b" is preferably 1 or 2. c" is preferably 1 or 2.

In the formula (a5-2-1), a" is preferably 1 or 2.

In the formula (a5-2-2), examples of the cyclic hydrocarbon group for $R^{5-2c}$ include the same groups as those described above for the divalent cyclic hydrocarbon group (aliphatic hydrocarbon group or aromatic hydrocarbon group) for $A^0$.

Specific examples of preferred compounds represented by the formula (a5-2) are shown below. In each of the following formulas, $R^\alpha$ represents a hydrogen atom, a methyl group or a trifluoromethyl group, and $R^{N1}$ to $R^{N4}$ are the same as defined above for $R^{N1}$ to $R^{N4}$ in the formula (a5-ca1).

[Chemical Formula 8]

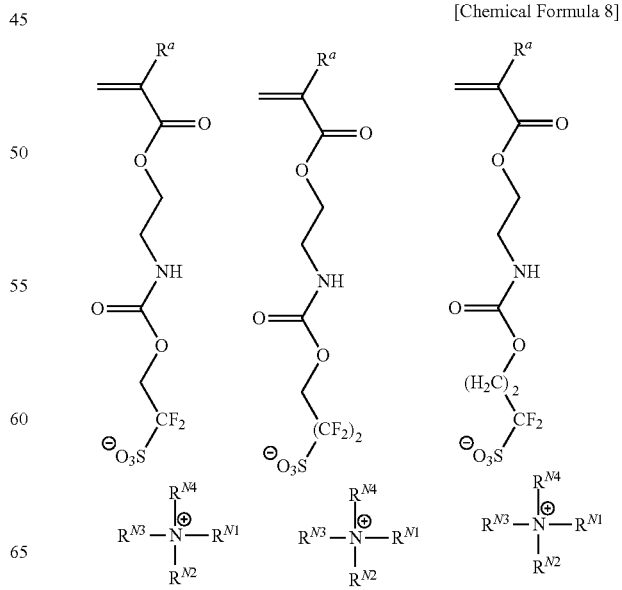

-continued

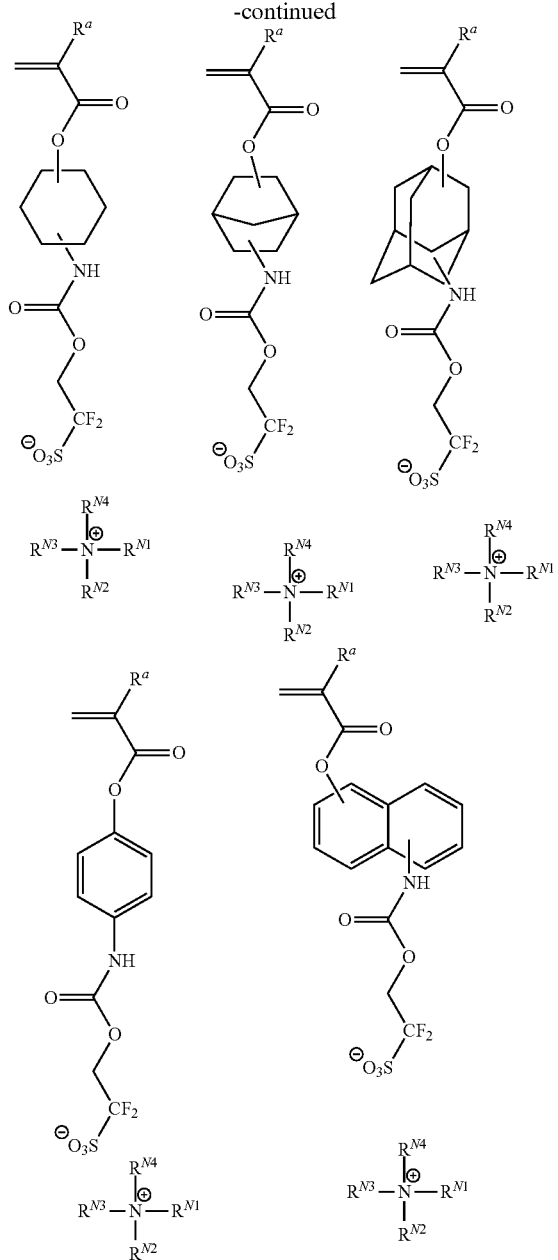

[Compounds represented by General Formula (a5-3)]

In the formula (a5-3), R, $A^1$, $R^{f1}$, $R^{f3}$, $M^{m+}$ and m are the same as defined above for R, $A^1$, $R^{f1}$, $R^{f2}$, p, $M^{m+}$ and m in the formula (a5-1).

When $A^1$ is a divalent linking group, a linear or branched alkylene group is preferable, a linear or branched alkylene group of 1 to 4 carbon atoms is more preferable, and a linear alkylene group is particularly desirable. Specific examples of the linear alkylene group of 1 to 4 carbon atoms include a methylene group [—$CH_2$—], an ethylene group [—$(CH_2)_2$—], a trimethylene group [—$(CH_2)_3$—], and a tetramethylene group [—$(CH_2)_4$—]. Specific examples of the branched alkylene group of 1 to 4 carbon atoms include alkylalkylene groups, including alkylmethylene groups such as —CH($CH_3$)—, —CH($CH_2CH_3$)—, —C($CH_3$)$_2$— and —C($CH_3$)($CH_2CH_3$)—, alkylethylene groups such as —CH($CH_3$)$CH_2$—, —CH($CH_3$)CH($CH_3$)—, —C($CH_3$)$_2CH_2$— and —CH($CH_2CH_3$)$CH_2$—, and alkyltrimethylene groups such as —CH($CH_3$)$CH_2CH_2$— and —$CH_2$CH($CH_3$)$CH_2$—.

$A^1$ is preferably a single bond, a methylene group [—$CH_2$—], or an ethylene group [—$(CH_2)_2$—].

In the formula (a5-3), $Q^1$ represents a group that contains —O—, —$CH_2$—O— or —C(=O)—O—.

Specific examples of $Q^1$ include groups consisting solely of —O—, —$CH_2$—O— or —C(=O)—O—, and groups composed of —O—, —$CH_2$—O— or —C(=O)—O—, and a divalent hydrocarbon group which may have a substituent.

Examples of the divalent hydrocarbon group which may have a substituent include the same groups as the divalent hydrocarbon groups which may have a substituent described above for the linking group (-$A^0$-). Among these, the "divalent hydrocarbon group" within Q' is preferably an aliphatic hydrocarbon group, and more preferably a linear or branched alkylene group.

$Q^1$ is preferably a group composed of —C(=O)—O— and a divalent hydrocarbon group which may have a substituent, more preferably a group composed of —C(=O)—O— and an aliphatic hydrocarbon group, and still more preferably a group composed of —C(=O)—O— and a linear or branched alkylene group.

Specific examples of preferred groups for $Q^1$ include the groups represented by a general formula ($Q^1$-1) shown below.

[Chemical Formula 9]

($Q^1$-1)

In the formula ($Q^1$-1), each of $R^{q2}$ and $R^{q3}$ independently represents a hydrogen atom, an alkyl group or a fluorinated alkyl group, wherein $R^{q2}$ and $R^{q3}$ may be bonded to each other to form a ring.

In the formula ($Q^1$-1), the alkyl group for $R^{q2}$ and $R^{q3}$ may be linear, branched or cyclic, but is preferably a linear or branched group.

In the case of a linear or branched alkyl group, a group of 1 to 5 carbon atoms is preferred, a methyl group or ethyl group is more preferred, and an ethyl group is particularly desirable.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane. Among these, a group in which one or more hydrogen atoms have been removed from adamantane is preferred.

The fluorinated alkyl group for $R^{q2}$ and $R^{q3}$ is a group in which part or all of the hydrogen atoms within an alkyl group have each been substituted with a fluorine atom.

In the fluorinated alkyl group, the alkyl group in a state prior to the fluorine atom substitution may be linear, branched or cyclic, and specific examples include the same groups as those described above for the "alkyl group for $R^{q2}$ and $R^{q3}$".

$R^{q2}$ and $R^{q3}$ may be bonded to each other to form a ring, and examples of the ring composed of $R^{q2}$, $R^{q3}$ and the carbon atom to which $R^{q2}$ and $R^{q3}$ are bonded include rings in which two hydrogen atoms have been removed from one of the monocycloalkanes or polycycloalkanes described above in relation to the cyclic alkyl group. The ring is preferably a 4- to 10-membered ring, and more preferably a 5- to 7-membered ring.

Of the various possibilities described above, each of $R^{q2}$ and $R^{q3}$ is preferably a hydrogen atom or an alkyl group.

In the formula (a5-3), $R^{q1}$ represents a fluorine atom or a fluorinated alkyl group.

In the fluorinated alkyl group for $R^{q1}$, the alkyl group in a state prior to the fluorine atom substitution may be linear, branched or cyclic.

In the case of a linear or branched alkyl group, the alkyl group preferably contains 1 to 5 carbon atoms, more preferably 1 to 3 carbon atoms, and still more preferably 1 or 2 carbon atoms.

In the case of a cyclic alkyl group, the cycloalkyl group preferably contains 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane, or a polycycloalkane such as a bicycloalkane, tricycloalkane or tetracycloalkane. Specific examples of such groups include groups in which one or more hydrogen atoms have been removed from either a monocycloalkane such as cyclopentane or cyclohexane, or a polycycloalkane such as adamantane, norbornane, isobornane, tricyclodecane or tetracyclododecane.

In the fluorinated alkyl group, the ratio of the number of fluorine atoms relative to the combined total of all the fluorine atoms and hydrogen atoms within the fluorinated alkyl group (namely, the fluorination ratio (%)) is preferably within a range from 30 to 100%, and more preferably from 50 to 100%. A higher fluorination ratio enhances the hydrophobicity of the resist film.

Among the above possibilities, $R^{q1}$ is most preferably a fluorine atom.

Of the compounds represented by the general formula (a5-3), compounds represented by a general formula (a5-3-1) shown below are preferred.

[Chemical Formula 10]

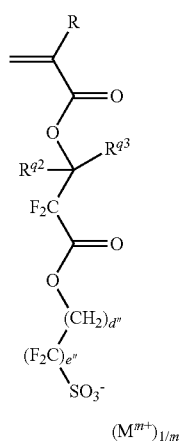

(a5-3-1)

In the above formula, R represents a hydrogen atom, an alkyl group of 1 to 5 carbon atoms or a halogenated alkyl group of 1 to 5 carbon atoms, each of $R^{q2}$ and $R^{q3}$ independently represents a hydrogen atom, an alkyl group or a fluorinated alkyl group, wherein $R^{q2}$ and $R^{q3}$ may be bonded to each other to form a ring, d" represents an integer of 1 to 4, e" represents an integer of 1 to 4, $M^{m+}$ represents a counter cation, and m represents an integer of 1 to 3.

In the formula (a5-3-1), R, $R^{q2}$, $R^{q3}$, $M^{m+}$ and m are each the same as defined above. d" is preferably 1 or 2. e" is preferably 1 or 2.

Specific examples of preferred compounds represented by the formula (a5-3) are shown below. In each of the following formulas, $R^\alpha$ represents a hydrogen atom, a methyl group or a trifluoromethyl group, and $R^{N1}$ to $R^{N4}$ are the same as defined above for $R^{N1}$ to $R^{N4}$ in the formula (a5-ca1).

[Chemical Formula 11]

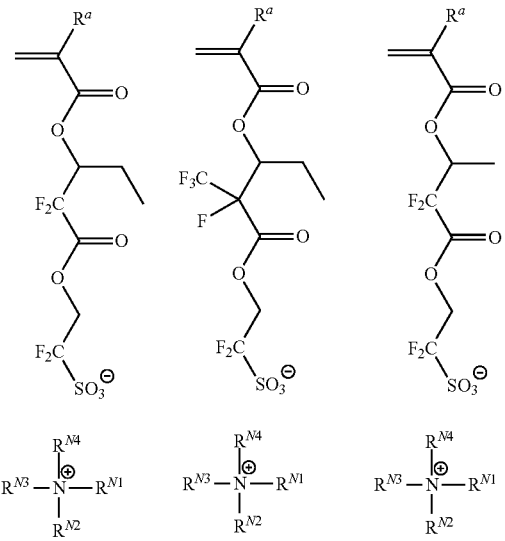

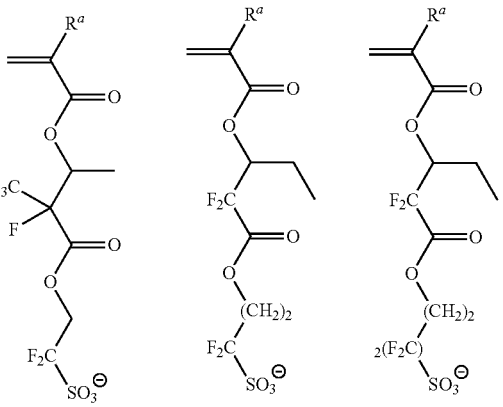

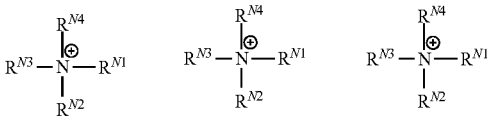

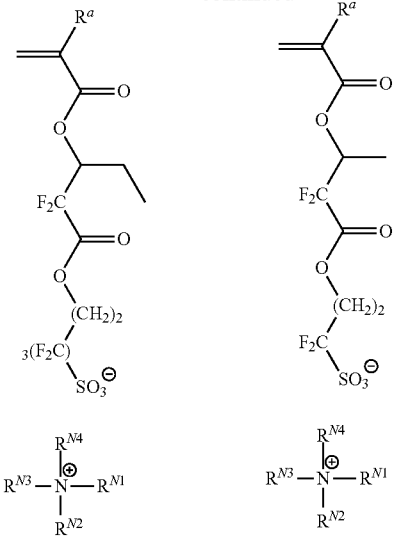

[Compounds represented by General Formula (a5-4)]

In the formula (a5-4), R, $M^{m+}$ and m are the same as defined above for R, $M^{m+}$ and m in the formula (a5-1).

In the formula (a5-4), $Z^1$, $Z^2$ and $R^{61}$ are the same as defined above for $Z^1$, $Z^2$ and $R^{61}$ in the formula (a5-an2).

In the formula (a5-4), $A^3$ represents a divalent linking group, and examples include the same divalent linking groups as those described above for $A^0$. Among these groups, a linear or branched alkylene group, a divalent alicyclic hydrocarbon group, or a divalent linking group containing a hetero atom is preferable, a linear or branched alkylene group or a divalent linking group containing a hetero atom is more preferable, a divalent linking group containing a hetero atom is still more preferable, and a group represented by —$Y^{21}$—O—C(=O)—$Y^{22}$—, —$Y^{21}$—O—$Y^{22}$—O—C(=O)—$Y^{23}$—, $Y^{21}$—O—S(=O)$_2$—$Y^{22}$—, —$Y^{21}$—S—$Y^{22}$—O—S(=O)$_2$—$Y^{23}$—, or —$Y^{21}$—O—C(=O)—$Y^{22}$—O—S(=O)$_2$—$Y^{23}$— (wherein $Y^{21}$ to $Y^{23}$ are the same as defined above) is particularly desirable.

Among the compounds represented by the general formula (a5-4), compounds represented by a general formula (a5-4-1) shown below are preferred.

[Chemical Formula 12]

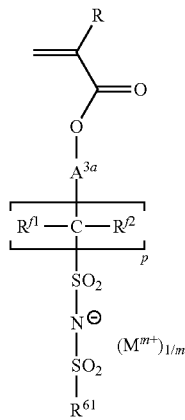

(a5-4-1)

In the above formula, R represents a hydrogen atom, an alkyl group of 1 to 5 carbon atoms or a halogenated alkyl group of 1 to 5 carbon atoms, $A^{3a}$ represents a divalent linking group, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, p represents an integer of 1 to 8, $R^{61}$ represents a hydrocarbon group which may have a fluorine atom, $M^{m+}$ represents a counter cation, and m represents an integer of 1 to 3.

In the formula (a5-4-1), R, $R^{f1}$, $R^{f2}$, p, $R^{61}$, $M^{m+}$ and m are each the same as defined above.

$A^{3a}$ represents a divalent linking group, and examples include the same divalent linking groups as those described above for $A^0$. Among these groups, a divalent linking group containing a hetero atom is preferable, and a group represented by —$Y^{21}$—O—C(=O)—, —$Y^{21}$—O—$Y^{22}$—O—C(=O)—, —$Y^{21}$—O—S(=O)$_2$—, —$Y^{21}$—S—$Y^{22}$—O—S(=O)$_2$—, or —$Y^{21}$—O—C(=O)—$Y^{22}$—O—S(=O)$_2$— (wherein $Y^{21}$ and $Y^{22}$ are the same as defined above) is particularly desirable.

Specific examples of preferred compounds represented by the formula (a5-4) are shown below. In each of the following formulas, $R^\alpha$ represents a hydrogen atom, a methyl group or a trifluoromethyl group, and $R^{N1}$ to $R^{N4}$ are the same as defined above for $R^{N1}$ to $R^{N4}$ in the formula (a5-ca1).

[Chemical Formula 13]

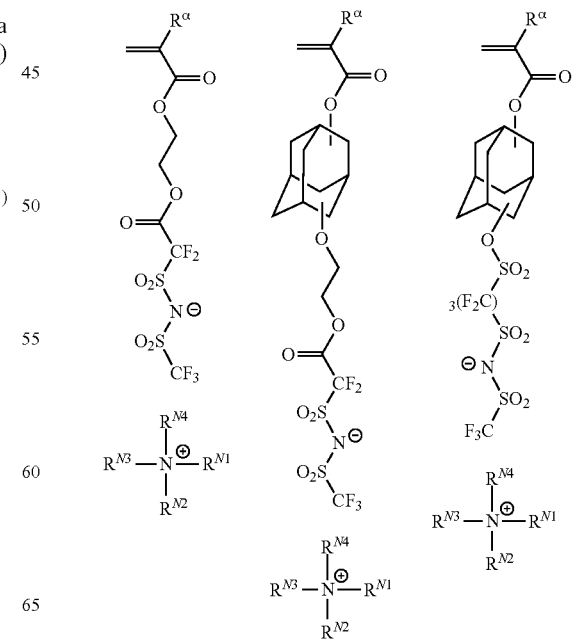

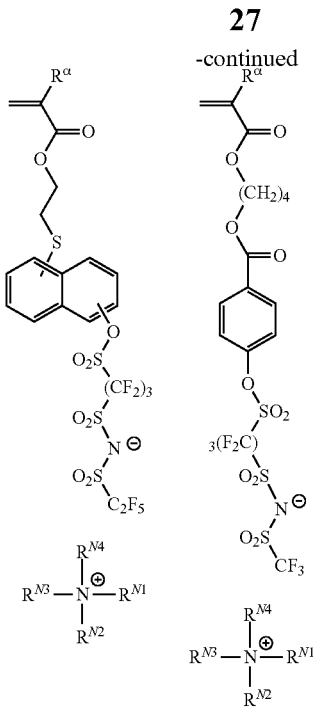
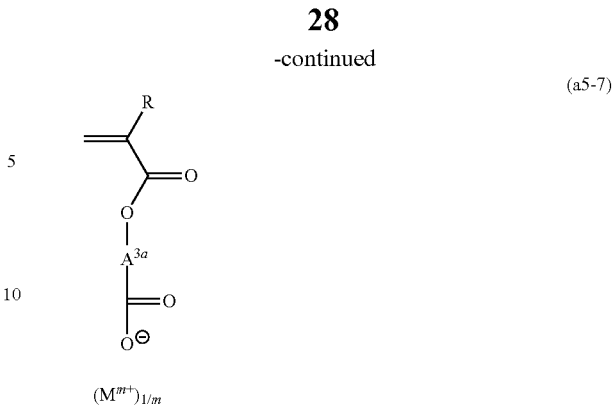

As the water-soluble monomer having an anionic group, a compound other than those represented by the above general formulas (a5-1), (a5-2), (a5-3) and (a5-4) may also be used. For example, compounds represented by one of general formulas (a5-5) to (a5-7) shown below may be used.

[Chemical Formula 14]

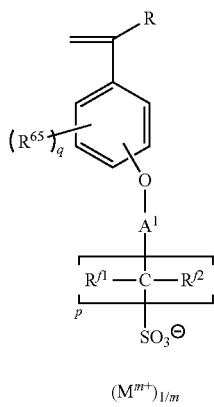

(a5-5)

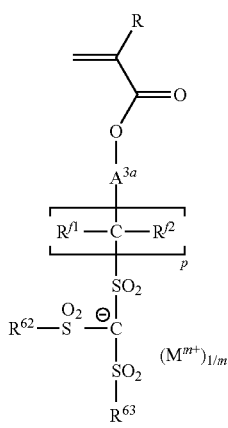

(a5-6)

In the above formulas, R represents a hydrogen atom, an alkyl group of 1 to 5 carbon atoms or a halogenated alkyl group of 1 to 5 carbon atoms, $R^{65}$ represents a hydrogen atom, halogen atom, alkyl group of 1 to 5 carbon atoms, alkoxy group of 1 to 5 carbon atoms or aryl group, q represents an integer of 1 to 4, $A^1$ represents a single bond or a divalent linking group, each $A^{3a}$ independently represents a divalent linking group, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, p represents an integer of 1 to 8, each of $R^{62}$ and $R^{63}$ independently represents a hydrocarbon group which may have a fluorine atom, $M^{m+}$ represents a counter cation, and m represents an integer of 1 to 3.

In the formulas (a5-5) to (a5-7), R, $A^1$, $R^{f1}$, $R^{f2}$, p, $M^{m+}$ and m are the same as defined above for R, $A^1$, $R^{f1}$, $R^{f2}$, p, $M^{m+}$ and m in the formula (a5-1).

In the formulas (a5-6) and (a5-7), $A^{3a}$ is the same as defined above for $A^{3a}$ in the formula (a5-4-1).

In the formula (a5-6), $R^{62}$ and $R^{63}$ are the same as defined above for $R^{62}$ and $R^{63}$ in the formula (a5-an3).

Examples of the halogen atom for $R^{65}$ include a fluorine atom, chlorine atom, bromine atom and iodine atom, and a fluorine atom is preferred.

The alkyl group of 1 to 5 carbon atoms for $R^{65}$ is preferably a methyl group, ethyl group, propyl group, n-butyl group or tert-butyl group.

The alkoxy group of 1 to 5 carbon atoms for $R^{65}$ is preferably a methoxy group, ethoxy group, n-propoxy group, isopropoxy group, n-butoxy group or tert-butoxy group, and is most preferably a methoxy group or an ethoxy group.

Examples of the aryl group for $R^{65}$ include the same aryl groups as those described above for $R^{61}$. $R^{65}$ may also form a divalent arylene group together with the phenylene group in the formula.

When q is an integer of 2 to 4, the plurality of $R^{65}$ groups may be the same or different.

Specific examples of preferred compounds represented by the formulas (a5-5) to (a5-7) are shown below. In each of the following formulas, $R^\alpha$ represents a hydrogen atom, a methyl group or a trifluoromethyl group, and $R^{N1}$ to $R^{N4}$ are the same as defined above for $R^{N1}$ to $R^{N4}$ in the formula (a5-ca1).

[Chemical Formula 15]
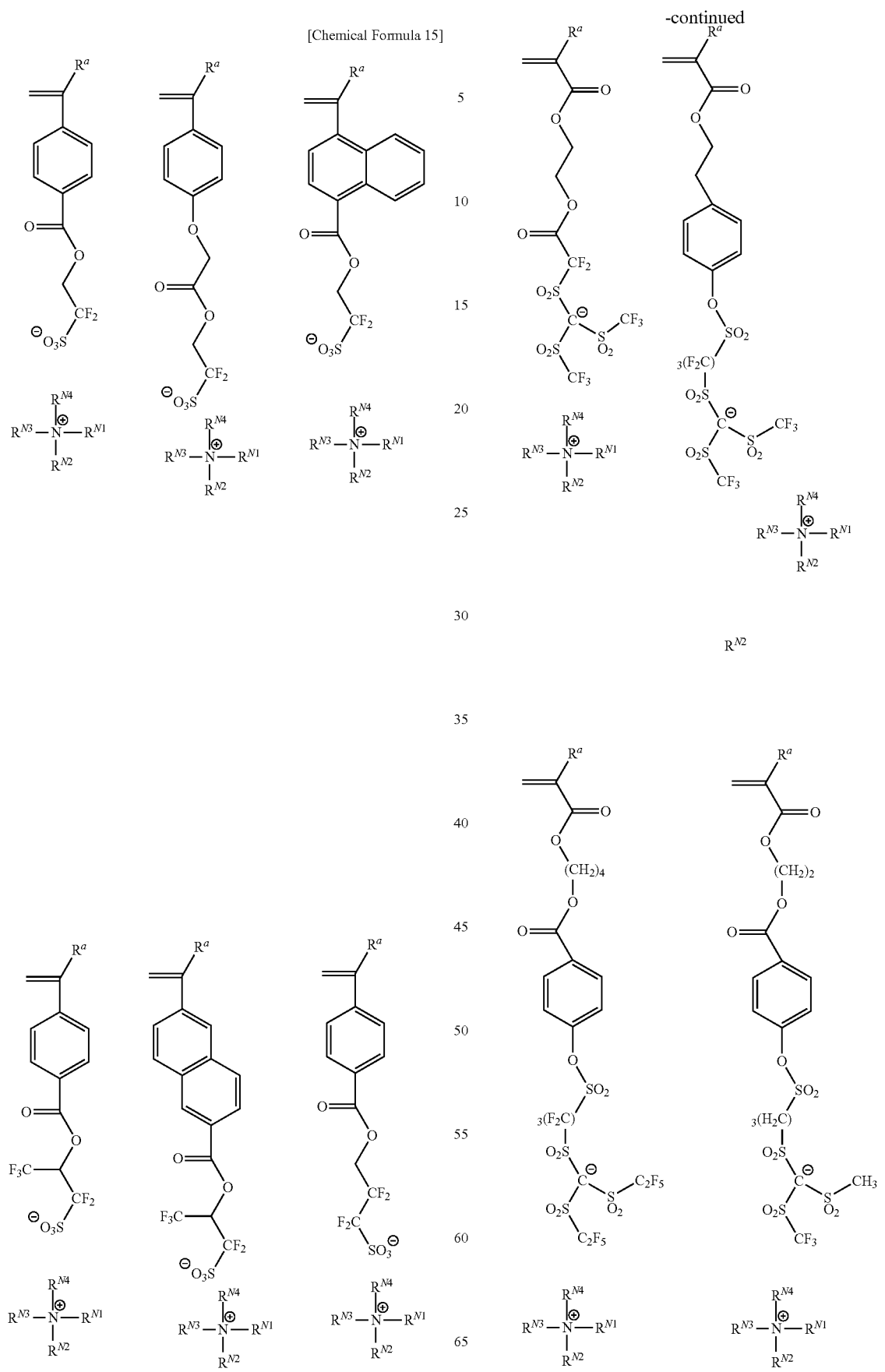

[Chemical Formula 16]

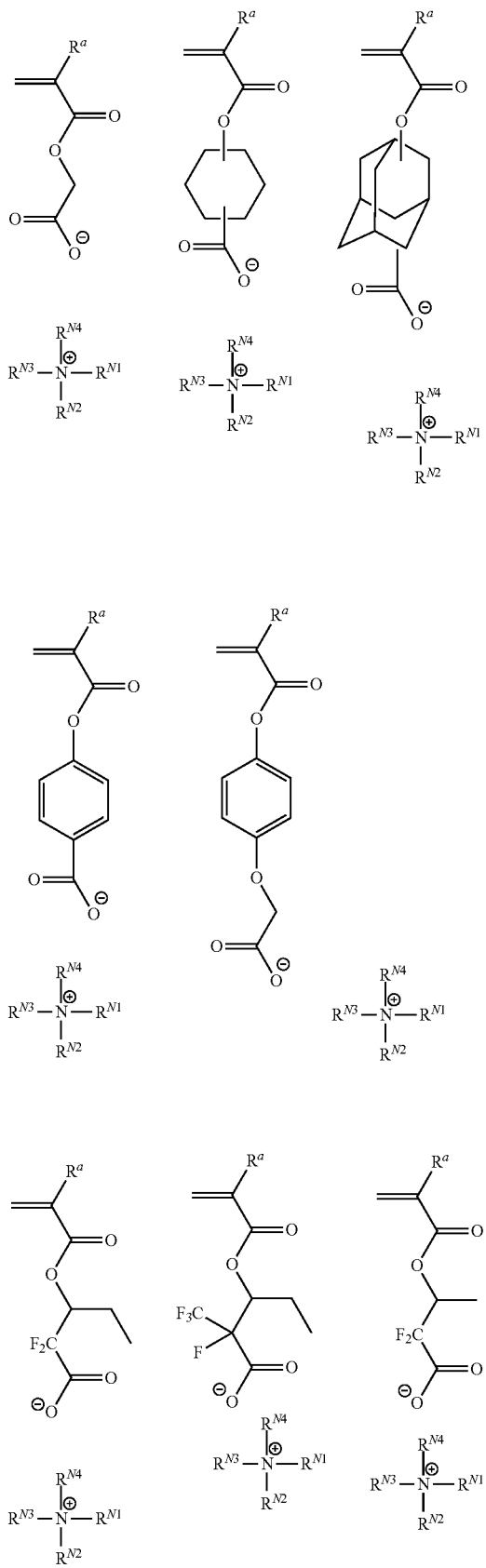

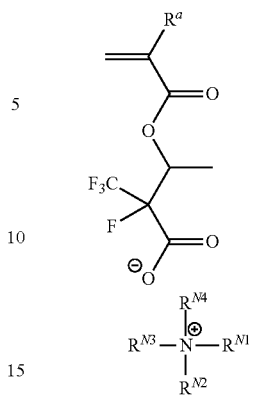

<Step (ii)>
Step (ii) in the present invention refers to the step of washing the precursor polymer obtained in the step (i) with water.

Examples of the method used for washing the precursor polymer with water include methods (a) to (c) described below.

Method (a): a method that employs a liquid-liquid extraction of a solution containing the precursor polymer obtained in the step (i) dissolved in an organic solvent (such as dichloromethane or chloroform), and water.

Method (b): a method in which the precursor polymer obtained in the step (i) is dispersed in water.

Method (c): a method in which a solution containing the precursor polymer obtained in the step (i) dissolved in an organic solvent is added dropwise to water.

Among the methods (a) to (c) described above, the method (a) is preferred in terms of achieving a high removal efficiency of the unreacted monomer from the polymerization reaction of the step (i).

<Step (iii)>
Step (iii) in the present invention refers to the step of subjecting the precursor polymer that has undergone washing with water in the step (ii) to a salt exchange with an organic cation.

This salt exchange can be performed by dissolving the precursor polymer and a compound having an organic cation (a salt exchange compound) in a solvent such as water, dichloromethane, acetonitrile, methanol, chloroform or methylene chloride, and then stirring the solution.

The reaction temperature is preferably within a range from approximately 20 to 40° C., and more preferably from approximately 23 to 30° C. The reaction time varies depending on the reactivity between the precursor polymer and the salt exchange compound, and the reaction temperature and the like, but is typically not less than 10 minutes and not more than 24 hours, and is more preferably within a range from 0.5 to 6 hours.

The amount used of the salt exchange compound in the salt exchange reaction is typically within a range from approximately 1 to 3 mols per 1 mol of the precursor polymer.

The salt exchange compound is preferably a compound in which the cation moiety is an organic cation and the anion moiety is a non-nucleophilic ion.

Examples of the non-nucleophilic ion include halide ions such as a bromide ion and chloride ion, ions that can become acids of lower acidity than the precursor polymer, and $BF_4^-$, $AsF_6^-$, $SbF_6^-$, $PF_6^-$ and $ClO_4^-$. Specific examples of the ions that can become acids of lower acidity than the precursor polymer include sulfonate ions such as a p-toluenesulfonate ion, methanesulfonate ion and benzenesulfonate ion.

There are no particular limitations on the organic cation of the cation moiety in the salt exchange compound, and of the various possibilities, organic cations that are known as the cation moieties for onium salt acid generators added to conventional resist compositions are particularly favorable.

Of such organic cations, a sulfonium ion or iodonium ion is preferred, and a sulfonium ion is particularly desirable.

Among such organic cations, organic cations represented by general formulas (g-c1) and (g-c2) shown below are preferred.

[Chemical Formula 17]

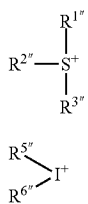

(g-c1)

(g-c2)

In the formula (g-c1), each of $R^{1\prime\prime}$ to $R^{3\prime\prime}$ independently represents an aryl group, alkyl group or alkenyl group which may have a substituent, wherein two of $R^{1\prime\prime}$ to $R^{3\prime\prime}$ may be bonded to each other to form a ring together with the sulfur atom in the formula. In the formula (g-c2), each of $R^{5\prime\prime}$ and $R^{6\prime\prime}$ independently represents an aryl group, alkyl group or alkenyl group which may have a substituent.

In the formula (g-c1), each of $R^{1\prime\prime}$ to $R^{3\prime\prime}$ independently represents an aryl group, alkyl group or alkenyl group which may have a substituent. Two of $R^{1\prime\prime}$ to $R^{3\prime\prime}$ may be bonded to each other to form a ring together with the sulfur atom in the formula.

Furthermore, from the viewpoints of improving the lithography properties and improving the resist pattern shape when the polymeric compound is added to a resist composition, it is preferable that at least one of $R^{1\prime\prime}$ to $R^{3\prime\prime}$ represents an aryl group, more preferable that at least two of $R^{1\prime\prime}$ to $R^{3\prime\prime}$ are aryl groups, and most preferable that all of $R^{1\prime\prime}$ to $R^{3\prime\prime}$ are aryl groups.

Examples of the aryl group for $R^{1\prime\prime}$ to $R^{3\prime\prime}$ include unsubstituted aryl groups of 6 to 20 carbon atoms, and substituted aryl groups in which part or all of the hydrogen atoms of an aforementioned unsubstituted aryl group have been substituted with an alkyl group, alkoxy group, halogen atom, hydroxyl group, oxo group (=O), aryl group, alkoxyalkyloxy group, alkoxycarbonylalkyloxy group, —C(=O)—O—$R^{6\prime}$, —O—C(=O)—$R^{7\prime}$ or —O—$R^{8\prime}$. Each of $R^{6\prime}$, $R^{7\prime}$ and $R^{8\prime}$ represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The unsubstituted aryl group for $R^{1\prime\prime}$ to $R^{3\prime\prime}$ is preferably an aryl group of 6 to 10 carbon atoms because such groups enable lower cost synthesis. Specific examples include a phenyl group and a naphthyl group.

The alkyl group as the substituent for the substituted aryl group for $R^{1\prime\prime}$ to $R^{3\prime\prime}$ is preferably an alkyl group having 1 to 5 carbon atoms, and most preferably a methyl group, ethyl group, propyl group, n-butyl group or tert-butyl group.

The alkoxy group as the substituent for the substituted aryl group is preferably an alkoxy group having 1 to 5 carbon atoms, and most preferably a methoxy group, ethoxy group, n-propoxy group, iso-propoxy group, n-butoxy group or tert-butoxy group.

The halogen atom as the substituent for the substituted aryl group is preferably a fluorine atom.

Examples of the aryl group as the substituent for the substituted aryl group include the same aryl groups as those described above for $R^{1\prime\prime}$ to $R^{3\prime\prime}$, and of these, aryl groups of 6 to 20 carbon atoms are preferred, aryl groups of 6 to 10 carbon atoms are more preferred, and a phenyl group or a naphthyl group is particularly desirable.

Examples of the alkoxyalkyloxy group as the substituent for the substituted aryl group include groups represented by a general formula shown below.

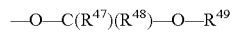

In this formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms and may be either linear or branched, but is preferably an ethyl group or a methyl group, and most preferably a methyl group.

It is preferable that at least one of $R^{47}$ and $R^{48}$ is a hydrogen atom. It is particularly desirable that either one of $R^{47}$ and $R^{48}$ is a hydrogen atom and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and examples include a methyl group, ethyl group, propyl group, n-butyl group and tert-butyl group.

The cyclic alkyl group for $R^{49}$ preferably has 4 to 15 carbon atoms, more preferably 4 to 12 carbon atoms, and most preferably 5 to 10 carbon atoms. Specific examples include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

Examples of the alkoxycarbonylalkyloxy group as the substituent for the substituted aryl group include groups represented by a general formula shown below.

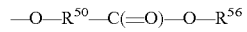

In this formula, $R^{50}$ represents a linear or branched alkylene group, and $R^{56}$ represents a tertiary alkyl group.

The linear or branched alkylene group for $R^{50}$ preferably has 1 to 5 carbon atoms, and examples include a methylene group, ethylene group, trimethylene group, tetramethylene group and 1,1-dimethylethylene group.

Examples of the tertiary alkyl group for $R^{56}$ include a 2-methyl-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and tert-hexyl group.

Moreover, groups in which $R^{56}$ in the above general formula —O—$R^{50}$—C(=O)—O—$R^{56}$ has been substituted with $R^{56\prime}$ may also be used. $R^{56\prime}$ represents a hydrogen atom, an alkyl group, a fluorinated alkyl group, or an aliphatic cyclic group which may contain a hetero atom.

Examples of the alkyl group for $R^{56\prime}$ include the same groups as those described above for the alkyl group for $R^{49}$.

Examples of the fluorinated alkyl group for $R^{56\prime}$ include groups in which part or all of the hydrogen atoms within an aforementioned alkyl group for $R^{49}$ have each been substituted with a fluorine atom.

Examples of the aliphatic cyclic group which may contain a hetero atom for $R^{56\prime}$ include aliphatic cyclic groups that do not contain a hetero atom, aliphatic cyclic groups containing a hetero atom within the ring structure, and groups in which one or more hydrogen atoms within an aliphatic cyclic group have been substituted with a hetero atom.

For $R^{56\prime}$, examples of the aliphatic cyclic groups that do not contain a hetero atom include groups in which one or more hydrogen atoms have been removed from a monocycloalkane or a polycycloalkane such as a bicycloalkane, tricycloalkane or tetracycloalkane. Examples of the monocycloalkane include cyclopentane and cyclohexane. Examples of the polycycloalkane include adamantane, norbornane, isobornane, tricyclodecane and tetracyclododecane. Among these, groups in which one or more hydrogen atoms have been removed from adamantane are preferable.

For $R^{56\prime}$, specific examples of the aliphatic cyclic groups containing a hetero atom within the ring structure include groups represented by formulas (L1) to (L6) and (S1) to (S4), which are described below within the description relating to a component (B).

For $R^{56\prime}$, specific examples of the groups in which one or more hydrogen atoms within the aliphatic cyclic group have been substituted with a hetero atom include groups in which two hydrogen atoms within an aliphatic cyclic group have been substituted with an oxygen atom (=O).

Each of $R^{6\prime}$, $R^{7\prime}$ and $R^{8\prime}$ in the formulas —C—(=O)—O—$R^{6\prime}$, —O—C(=O)—$R^{7\prime}$ and —O—$R^{8\prime}$ represents a linear or branched saturated hydrocarbon group of 1 to 25 carbon atoms, a cyclic saturated hydrocarbon group of 3 to 20 carbon atoms, or a linear or branched aliphatic unsaturated hydrocarbon group of 2 to 5 carbon atoms.

The linear or branched saturated hydrocarbon group contains 1 to 25 carbon atoms, preferably 1 to 15 carbon atoms, and more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group, 4-methylpentyl group, tert-butyl group, tert-pentyl group and tert-hexyl group.

The linear or branched saturated hydrocarbon group may have a substituent. Examples of the substituent include an alkoxy group, halogen atom, halogenated alkyl group, hydroxyl group, oxygen atom (=O), cyano group and carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned linear or branched saturated hydrocarbon group have each been substituted with an aforementioned halogen atom.

The cyclic saturated hydrocarbon group of 3 to 20 carbon atoms for $R^{6\prime}$, $R^{7\prime}$ and $R^{8\prime}$ may be either a polycyclic group or a monocyclic group. Examples include groups in which one hydrogen atom has been removed from a monocycloalkane, and groups in which one hydrogen atom has been removed from a polycycloalkane such as a bicycloalkane, tricycloalkane or tetracycloalkane. More specific examples include groups in which one hydrogen atom has been removed from a monocycloalkane such as cyclopentane, cyclohexane, cycloheptane or cyclooctane, and groups in which one hydrogen atom has been removed from a polycycloalkane such as adamantane, norbornane, isobornane, tricyclodecane or tetracyclododecane.

Further, examples of the cyclic saturated hydrocarbon group of 3 to 20 carbon atoms include the same cyclic saturated hydrocarbon groups as those described above for the aforementioned tertiary alkyl groups of $R^{56}$.

The cyclic saturated hydrocarbon group may have a substituent. For example, part of the carbon atoms that constitute a ring within the cyclic saturated hydrocarbon group may be substituted with a hetero atom, or a hydrogen atom bonded to a ring within the cyclic saturated hydrocarbon may be substituted with a substituent.

Examples of the former case include groups in which one or more hydrogen atoms have been removed from a heterocycloalkane in which part of the carbon atoms that constitute the ring(s) of an aforementioned monocycloalkane or a polycycloalkane have been substituted with a hetero atom such as an oxygen atom, sulfur atom or nitrogen atom. Further, the ring structure may include an ester linkage (—C(=O)—O—). Specific examples include lactone-containing monocyclic groups such as groups in which one hydrogen atom has been removed from γ-butyrolactone, and lactone-containing polycyclic groups in which one hydrogen atom has been removed from a lactone ring-containing bicycloalkane, tricycloalkane or tetracycloalkane.

In the latter case, examples of the substituent include the same substituents as those described above for the aforementioned linear or branched saturated hydrocarbon group, or a lower alkyl group.

Further, $R^{6\prime}$, $R^{7\prime}$ and $R^{8\prime}$ may be a combination of a linear or branched alkyl group and a cyclic alkyl group.

Examples of combinations of a linear or branched alkyl group and a cyclic alkyl group include groups in which a cyclic alkyl group is bonded as a substituent to a linear or branched alkyl group, and groups in which a linear or branched alkyl group is bonded as a substituent to a cyclic alkyl group.

Examples of the linear aliphatic unsaturated hydrocarbon group for $R^{6\prime}$, $R^{7\prime}$ and $R^{8\prime}$ include a vinyl group, propenyl group (allyl group), and butynyl group.

Examples of the branched aliphatic unsaturated hydrocarbon group for $R^{6\prime}$, $R^{7\prime}$ and $R^{8\prime}$ include a 1-methylpropenyl group and 2-methylpropenyl group.

The linear or branched aliphatic unsaturated hydrocarbon group may have a substituent. Examples of the substituent include the same substituents as those described above for the linear or branched saturated hydrocarbon group.

Of the various possibilities described above, each of $R^{6\prime}$, $R^{7\prime}$ and $R^{8\prime}$ is preferably a linear or branched saturated hydrocarbon group of 1 to 15 carbon atoms, or a cyclic saturated hydrocarbon group of 3 to 20 carbon atoms, as such groups yield superior lithography properties and a favorable resist pattern shape.

The aryl group for each of $R^{1\prime\prime\prime}$ to $R^{3\prime\prime\prime}$ is preferably a phenyl group or a naphthyl group.

Examples of the alkyl group for $R^{1\prime\prime\prime}$ to $R^{3\prime\prime\prime}$ include linear, branched or cyclic alkyl groups of 1 to 10 carbon atoms. Among such groups, from the viewpoint of achieving superior resolution, alkyl groups of 1 to 5 carbon atoms are preferred. Specific examples include a methyl group, ethyl group, n-propyl group, isopropyl group, n-butyl group, isobutyl group, n-pentyl group, cyclopentyl group, hexyl group, cyclohexyl group, nonyl group and decyl group. A methyl group is most preferable because it yields excellent resolution and enables synthesis to be conducted at a low cost.

The alkenyl group for $R^{1\prime\prime\prime}$ to $R^{3\prime\prime\prime}$ preferably contains 2 to 10 carbon atoms, more preferably 2 to 5 carbon atoms, and still more preferably 2 to 4 carbon atoms. Specific examples include a vinyl group, propenyl group (allyl group), butynyl group, 1-methylpropenyl group and 2-methylpropenyl group.

In those cases where two of $R^{1\prime\prime\prime}$ to $R^{3\prime\prime\prime}$ are bonded to each other to form a ring together with the sulfur atom in the formula, the ring that is formed is preferably a 3- to 10-membered ring, and more preferably a 5- to 7-membered ring, including the sulfur atom.

In those cases where two of $R^{1\prime\prime\prime}$ to $R^{3\prime\prime\prime}$ are bonded to each other to form a ring together with the sulfur atom in the formula, the remaining group among $R^{1\prime\prime\prime}$ to $R^{3\prime\prime\prime}$ is preferably an aryl group. Examples of this aryl group include the same aryl groups as those described above for $R^{1\prime\prime\prime}$ to $R^{3\prime\prime\prime}$.

Specific examples of the cation moiety represented by the above formula (g-c1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl)tetrahydrothiopyranium, 1-(3,5-dimethyl-4-hydroxyphenyl)tetrahydrothiopyranium and 1-(4-methylphenyl)tetrahydrothiopyranium.

Furthermore, specific examples of preferred cations among those represented by the above formula (g-c1) include the cations shown below.

[Chemical Formula 18]

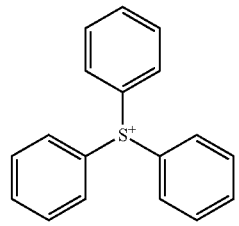

(g-c1-1)

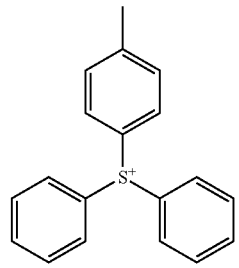

(g-c1-2)

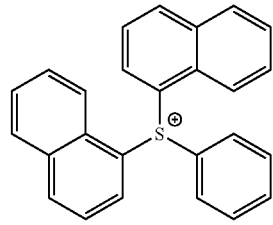

(g-c1-3)

[Chemical Formula 19]

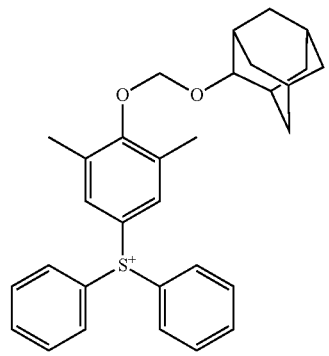

(g-c1-4)

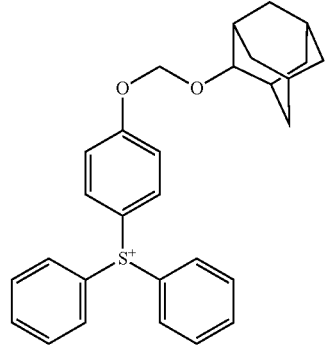

(g-c1-5)

(g-c1-6)
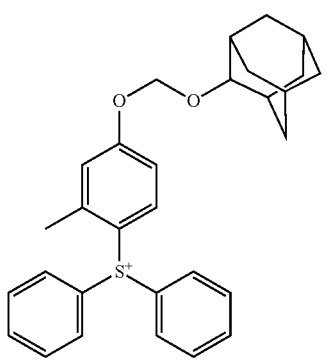
[Chemical Formula 20]
(g-c1-7)
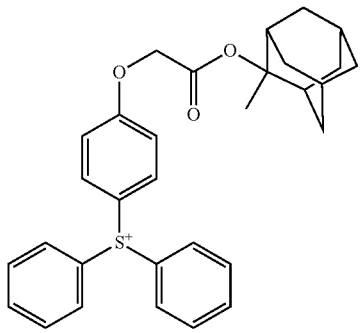
(g-c1-8)
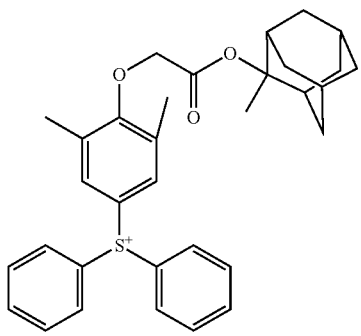
(g-c1-9)
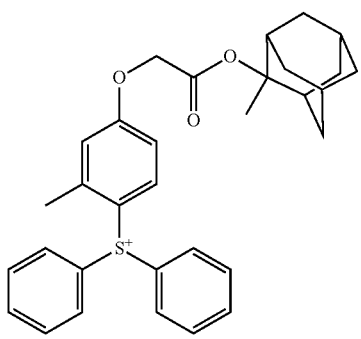
(g-c1-10)
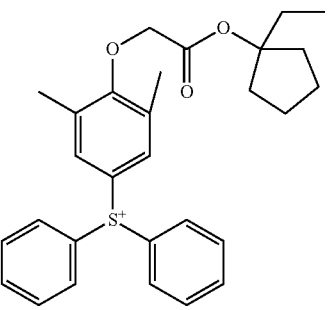
(g-c1-11)
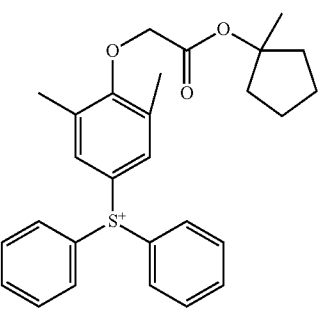
(g-c1-12)
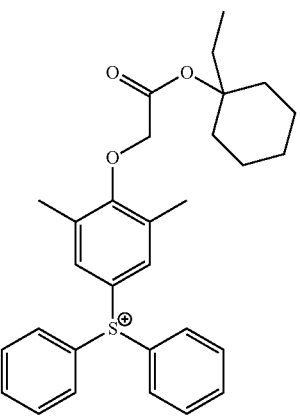
(g-c1-13)
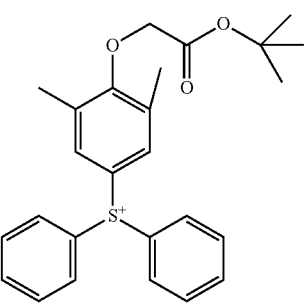

[Chemical Formula 21]
(g-c1-14)
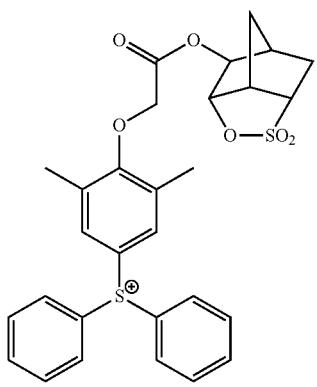
(g-c1-15)
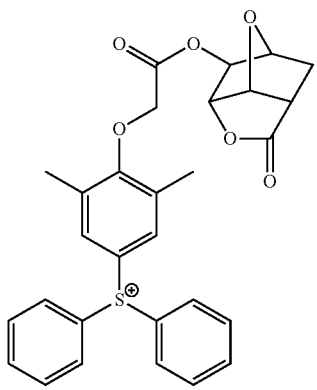
(g-c1-16)
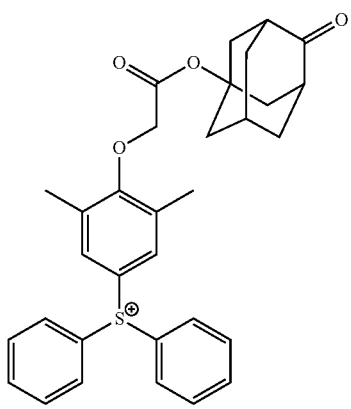
(g-c1-17)
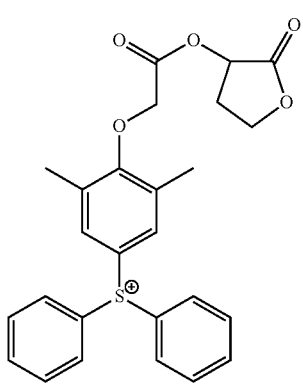
(g-c1-18)
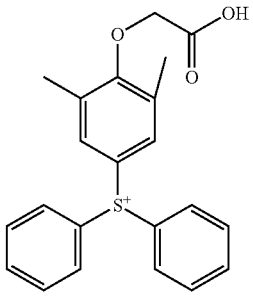
(g-c1-19)
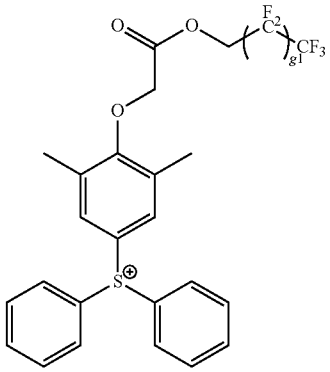
In the above formulas, g1 represents a number of repeating units, and is typically an integer of 1 to 5.
[Chemical Formula 22]
(g-c1-20)
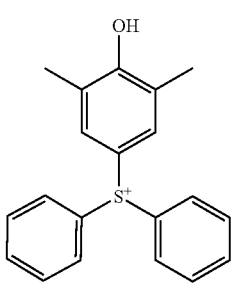
(g-c1-21)
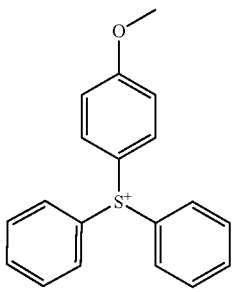

-continued
(g-c1-22)
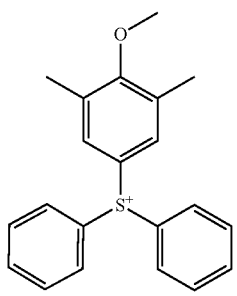
[Chemical Formula 23]
(g-c1-23)
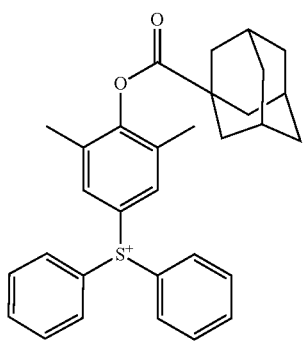
(g-c1-24)
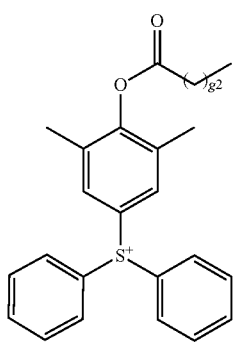
(g-c1-25)
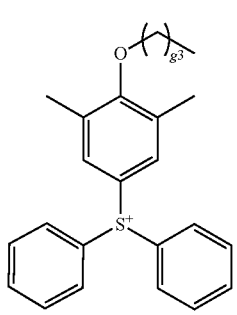
In the above formulas, each of g2 and g3 represents a number of repeating units, wherein g2 represents an integer of 0 to 20, and g3 represents an integer of 0 to 20.
[Chemical Formula 24]
(g-c1-26)
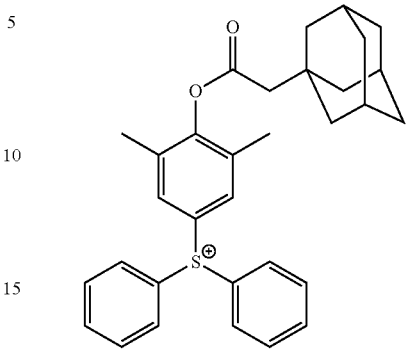
(g-c1-27)
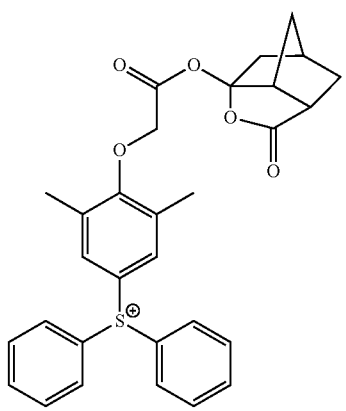
(g-c1-28)
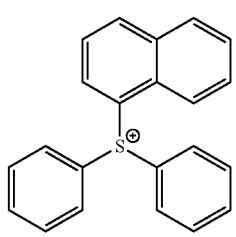
[Chemical Formula 25]
(g-c1-29)
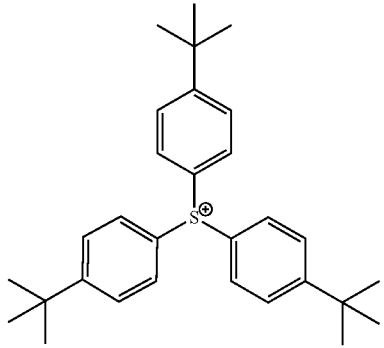

-continued

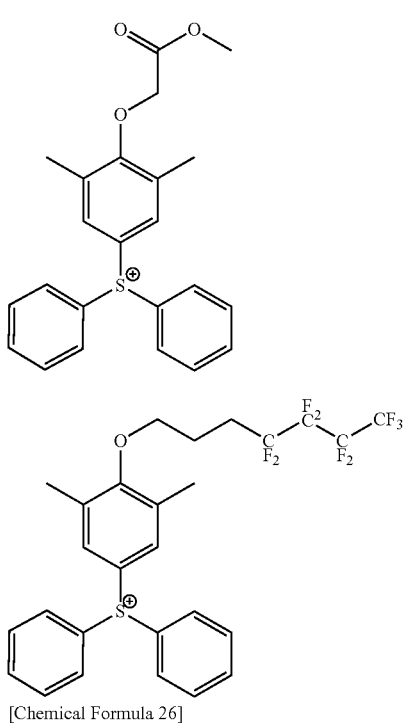

(g-c1-30)

[Chemical Formula 26]

(g-c1-31)

(g-c1-32)

(g-c1-33)

In the above formula (g-c2), each of $R^{5'''}$ and $R^{6'''}$ independently represents an aryl group, alkyl group or alkenyl group which may have a substituent.

It is preferable that at least one of $R^{5'''}$ and $R^{6'''}$ is an aryl group, and more preferable that both of $R^{5'''}$ and $R^{6'''}$ are phenyl groups.

Examples of the aryl group for $R^{5'''}$ and $R^{6'''}$ include the same aryl groups as those described for $R''$ to $R^{3''}$.

Examples of the alkyl group for $R^{5'''}$ and $R^{6'''}$ include the same alkyl groups as those described for $R^{1'''}$ to $R^{3'''}$.

Examples of the alkenyl group for $R^{5'''}$ and $R^{6'''}$ include the same alkenyl groups as those described for $R^{1'''}$ to $R^{3'''}$.

It is most preferable that $R^{5'''}$ and $R^{6'''}$ are both phenyl groups.

Specific examples of the cation moiety represented by the formula (g-c2) include diphenyliodonium and bis(4-tert-butylphenyl)iodonium.

Examples of preferred organic cations include the cations represented by general formulas (g-c3) and (g-c4) shown below.

[Chemical Formula 27]

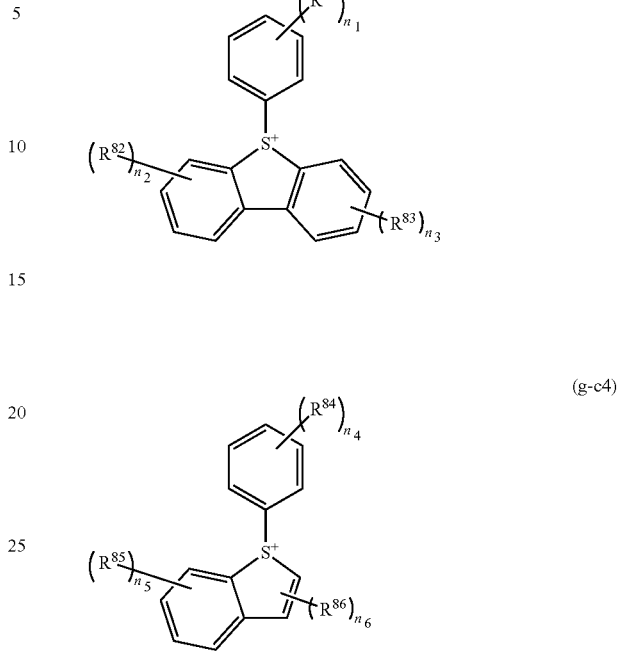

(g-c3)

(g-c4)

In the above formulas, each of $R^{81}$ to $R^{86}$ independently represents an alkyl group, acetyl group, alkoxy group, carboxyl group, hydroxyl group or hydroxyalkyl group, each of $n_1$ to $n_5$ independently represents an integer of 0 to 3, and $n_6$ represents an integer of 0 to 2.

The alkyl group for $R^{81}$ to $R^{86}$ is preferably an alkyl group of 1 to 5 carbon atoms, and among such groups, is more preferably a linear or branched alkyl group, and most preferably a methyl group, ethyl group, propyl group, isopropyl group, n-butyl group or tert-butyl group.

The alkoxy group is preferably an alkoxy group of 1 to 5 carbon atoms, and among such groups, is more preferably a linear or branched alkoxy group, and most preferably a methoxy group or an ethoxy group.

The hydroxyalkyl group is preferably a group in which one or more of the hydrogen atoms within an aforementioned alkyl group have each been substituted with a hydroxyl group, and specific examples include a hydroxymethyl group, hydroxyethyl group and hydroxypropyl group.

When the subscripts $n_1$ to $n_6$ appended to $R^{81}$ to $R^{86}$ represent an integer of 2 or more, the corresponding plurality of $R^{81}$ to $R^{86}$ groups may be the same or different.

$n_1$ is preferably 0 to 2, more preferably 0 or 1, and still more preferably 0.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

Specific examples of preferred cations represented by the above formula (g-c3) or (g-c4) include the cations shown below.

[Chemical Formula 28]

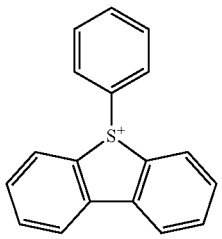 (g-c3-1)

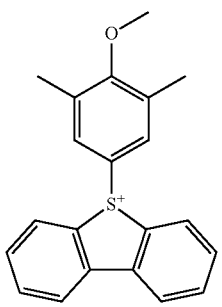 (g-c3-2)

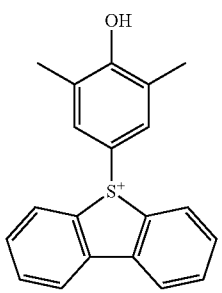 (g-c3-3)

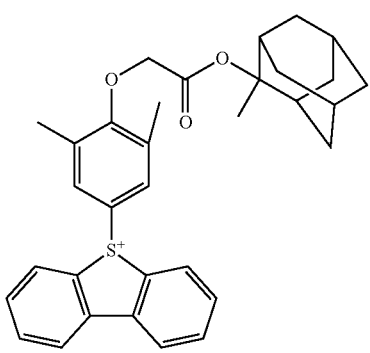 (g-c3-4)

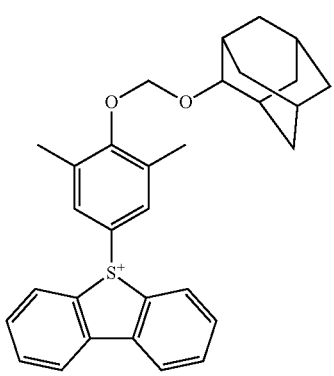 (g-c3-5)

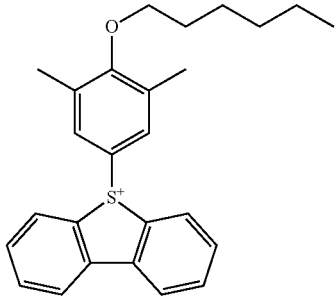 (g-c3-6)

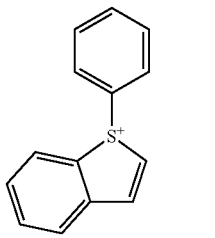 (g-c4-1)

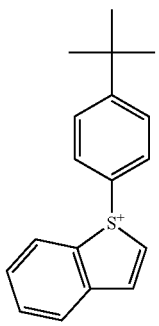 (g-c4-2)

Further examples of preferred organic cations include the cations represented by general formulas (g-c5) and (g-c6) shown below.

[Chemical Formula 29]

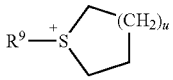 (g-c5)

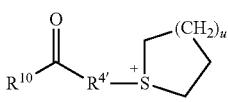 (g-c6)

In the formulas (g-c5) and (g-c6), each of $R^9$ and $R^{10}$ independently represents a phenyl group or naphthyl group which may have a substituent, an alkyl group or alkoxy group of 1 to 5 carbon atoms, or a hydroxyl group. Examples of the substituent include the same substituents as those described above for the substituted aryl groups mentioned within the description relating to the aryl groups of $R^{1'''}$ to $R^{3'''}$ (such as an alkyl group, alkoxy group, alkoxyalkyloxy group, alkoxycarbonylalkyloxy group, halogen atom, hydroxyl group, oxo group (=O), aryl group, —C—(=O)—O—$R^{6'}$, —O—C (=O)—$R^{7'}$ or —O—$R^{8'}$, or group represented by the above general formula —O—$R^{50}$—C(=O)—O—$R^{56}$ in which $R^{56}$ has been substituted with $R^{56'}$).

$R^{4'}$ represents an alkylene group of 1 to 5 carbon atoms.

u represents an integer of 1 to 3, and is most preferably 1 or 2.

Examples of preferred cations represented by the formula (g-c5) or (g-c6) include the cations shown below. In the formula below, $R^C$ represents a substituent mentioned above within the description relating to the substituted aryl groups (namely, an alkyl group, alkoxy group, alkoxyalkyloxy group, alkoxycarbonylalkyloxy group, halogen atom, hydroxyl group, oxo group (=O), aryl group, —C—(=O)—O—$R^{6'}$, —O—C(=O)—$R^{7'}$ or —O—$R^{8'}$).

[Chemical Formula 30]

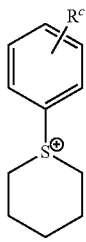

(g-c5-1)

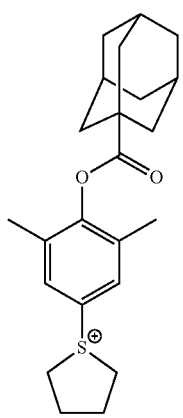

(g-c5-2)

(g-c5-3)

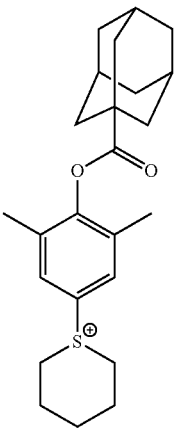

(g-c5-4)

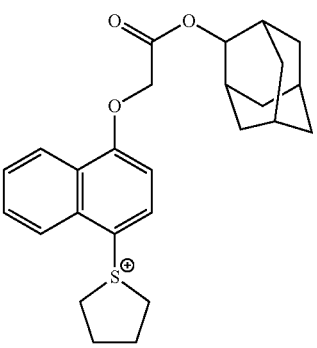

(g-c5-5)

[Chemical Formula 31]

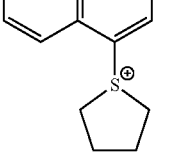

(g-c6-1)

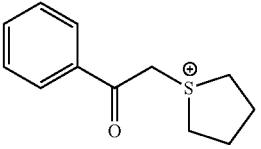

(g-c6-2)

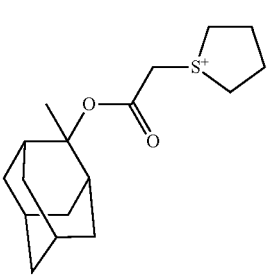

Among the various possibilities described above, the organic cation is most preferably an organic cation represented by the above general formula (g-c1), as such cations yield more favorable lithography properties and facilitate the formation of a more favorable resist pattern shape when the polymeric compound is included in a resist composition.

Following completion of the salt exchange between the precursor polymer and the salt exchange compound, the polymeric compound (final product) within the reaction liquid may be isolated and purified.

The isolation and purification may be performed using conventional methods, and for example, one or more techniques such as concentration, solvent extraction, distillation, crystallization, recrystallization and chromatography may be used.

(Polymeric Compound)

The polymeric compound produced using the method of producing a polymeric compound according to the present invention contains a structural unit that decomposes upon exposure to generate an acid (hereafter this structural unit is also referred to as "structural unit (a5)").

By using this production method, a polymeric compound is produced that contains a minimal amount of the monomer group, which consists of the water-soluble monomer, and the monomer produced as a result of the water-soluble monomer undergoing salt exchange with the aforementioned organic cation.

Specifically, a polymeric compound can easily be produced in which the residual amount of the water-soluble monomer within the polymeric compound obtained following the step (ii) (namely, the polymeric compound prior to salt exchange: the precursor polymer following washing with water), relative to the amount of the polymeric compound prior to salt exchange, is preferably not more than 500 ppm (by mass), more preferably not more than 250 ppm (by mass), and still more preferably less than 100 ppm (by mass). The residual amount of the water-soluble monomer within the polymeric compound obtained following the step (ii) (the polymeric compound prior to salt exchange) is preferably as small as possible.

The residual water-soluble monomer also undergoes salt exchange during the salt exchange treatment performed on the polymeric compound (precursor polymer) during the aforementioned step (iii). As a result, the residual amount of the monomer group, consisting of the water-soluble monomer and the monomer produced as a result of the water-soluble monomer undergoing salt exchange with the aforementioned organic cation, relative to the amount of the polymeric compound following salt exchange is essentially equal to, or less than, the aforementioned residual concentration of the water-soluble monomer within the polymeric compound prior to salt exchange. Accordingly, it can be stated that the residual amount of the aforementioned monomer group, relative to the polymeric compound produced by the production method of the present invention, is preferably not more than 500 ppm (by mass), more preferably not more than 250 ppm (by mass), and still more preferably less than 100 ppm (by mass).

In this manner, the polymeric compound produced by the production method of the present invention, which is obtained by performing a salt exchange of the pre-salt exchange polymeric compound having a minimal residual amount of the water-soluble monomer, contains only a small amount of the monomer group consisting of the water-soluble monomer and the monomer produced as a result of the water-soluble monomer undergoing salt exchange with the aforementioned organic cation. Because the amount of this monomer group is small, when the polymeric compound is used in a resist composition, the lithography properties are more favorable, including superior exposure latitude and reduced roughness, and the resist pattern shape also improves.

In addition to the structural unit (a5), the polymeric compound produced by the production method of the present invention may also contain other structural units. Examples of these other structural units include the structural units (a1)) to (a4) and (a0) described below.

In the method of producing a polymeric compound according to the present invention, because the precursor polymer is prepared using the water-soluble monomer having an anionic group, and the precursor polymer is then washed with water, residual monomers such as unreacted components can be removed easily and with good efficiency. As a result, a resist composition containing the polymeric compound produced using this production method contains minimal residual monomers, meaning diffusion of the acid generated by exposure can be suppressed, which results in superior lithography properties.

In addition, in the method of producing a polymeric compound according to the present invention, because the aforementioned precursor polymer is first prepared, and a salt exchange is then performed with a desired organic cation, there is a very high degree of freedom in terms of the types of organic cations that can be introduced.

<<Resist Composition>>

The resist composition of the present invention contains a polymeric compound produced using the method of producing a polymeric compound according to the present invention described above, namely, a polymeric compound having a structural unit that decomposes upon exposure to generate an acid (the structural unit (a5)).

The resist composition of the present invention preferably includes a base component (A) (hereafter referred to as "component (A)") which exhibits changed solubility in a developing solution under the action of acid. When a resist film is formed using the resist composition, and the resist film is then subjected to selective exposure, within the exposed portions, acid is generated from the structural unit (a5), and the action of that acid causes a change in the solubility of the component (A) in the developing solution, whereas within the unexposed portions, there is no change in the solubility of the component (A) in the developing solution, and therefore a difference in solubility in the developing solution develops between the exposed portions and the unexposed portions. As a result, when the resist film is developed, the exposed portions are dissolved and removed in the case of a positive-type resist composition, forming a positive-type resist pattern, whereas in the case of a negative-type resist composition, the unexposed portions are dissolved and removed to form a negative-type resist pattern.

In the present description, a resist composition in which the exposed portions are dissolved and removed to form a positive-type resist pattern is referred to as a "positive-type resist composition", and a resist composition in which the unexposed portions are dissolved and removed to form a negative-type resist pattern is referred to as a "negative-type resist composition".

The resist composition of the present invention may be either a positive-type resist composition or a negative-type resist composition.

Further, the resist composition of the present invention may be used within either an alkali developing process in which an alkali developing solution is used for the developing treatment during formation of the resist pattern, or a solvent developing process in which a developing solution containing an organic solvent (an organic developing solution) is used for the developing treatment.

<Component (A)>

As the component (A), a single organic compound typically used as a base component for a chemically amplified resist composition may be used alone, or two or more of such organic compounds may be mixed together.

Here, the term "base component" refers to an organic compound capable of forming a film, and is preferably an organic compound having a molecular weight of 500 or more. Ensuring that the organic compound has a molecular weight of 500 or more improves the film-forming ability, and facilitates the formation of nano level resist patterns.

The organic compounds used as the base component can be broadly classified into non-polymers and polymers.

In general, compounds which have a molecular weight of at least 500 but less than 4,000 may be used as non-polymers. Hereafter, a non-polymer having a molecular weight of at least 500 but less than 4,000 is referred to as a "low molecular weight compound".

In terms of the polymers, typically, compounds which have a molecular weight of 1,000 or more may be used. In the present description and claims, the term "resin" is used to describe a polymer having a molecular weight of 1,000 or more.

The "molecular weight" of a polymer refers to the weight-average molecular weight in terms of the polystyrene-equivalent value determined by gel permeation chromatography (GPC).

The component (A) may exhibit either increased solubility in the developing solution under the action of acid or decreased solubility in the developing solution under the action of acid.

In those cases where the resist composition of the present invention is a resist composition which forms a negative-type resist pattern in an alkali developing process (or forms a positive-type resist pattern in a solvent developing process), a base component which is soluble in an alkali developing solution (hereafter referred to as an "alkali-soluble base component") is preferably used as the component (A), and a cross-linking agent component is also added to the composition. A resin (alkali-soluble resin) is typically used as the alkali-soluble base component.

The alkali-soluble base component typically contains alkali-soluble groups such as hydroxyl groups, carboxyl groups and/or amino groups, whereas the cross-linking agent component contains one or more reactive groups such as a methylol group or alkoxymethyl group that are capable of reacting with the alkali-soluble groups under the action of acid. Accordingly, when the resist composition is used to form a resist film, and the resist film is then subjected to selective exposure, acid is generated from the structural unit (a5) in the exposed portions, the action of the generated acid causes cross-linking to occur between the alkali-soluble base component and the cross-linking agent component, causing a reduction in the amount of alkali-soluble groups within the alkali-soluble base component and a corresponding decrease in the polarity and increase in the molecular weight, and as a result, the solubility of the base component in an alkali developing solution decreases (whereas the solubility in an organic developing solution increases). Accordingly, during resist pattern formation, by conducting selective exposure of a resist film obtained by applying the resist composition to a substrate, the exposed portions change to a state that is substantially insoluble in an alkali developing solution (but soluble in an organic developing solution), while the unexposed portions remain soluble in an alkali developing solution (but substantially insoluble in an organic developing solution), meaning developing with an alkali developing solution can be used to form a negative-type resist pattern. Further, if an organic developing solution is used as the developing solution, then a positive-type resist pattern can be formed.

As the cross-linking agent component, an amino-based cross-linking agent such as a glycoluryl having a methylol group or alkoxymethyl group, or a melamine-based cross-linking agent is usually preferable, as it enables the formation of a favorable resist pattern with minimal swelling. The amount added of the cross-linking agent component is preferably within a range from 1 to 50 parts by weight, relative to 100 parts by weight of the alkali-soluble resin.

In those cases where the alkali-soluble base component has self cross-linking properties (for example, cases in which the alkali-soluble base component contains one or more groups that can react with the alkali-soluble groups under the action of acid), addition of the cross-linking agent component may be unnecessary.

In those cases where the resist composition of the present invention is a resist composition which forms a positive-type pattern in an alkali developing process, and forms a negative-type pattern in a solvent developing process, a base component (A0) (hereafter referred to as "component (A0)") which exhibits increased polarity under the action of acid is preferably used as the component (A). The polarity of the base component (A0) changes upon exposure, and therefore by using the base component (A0), excellent developing contrast can be achieved not only in an alkali developing process, but also in a solvent developing process.

In other words, in those cases where an alkali developing process is used, the component (A0) is substantially insoluble in an alkali developing solution prior to exposure, but when acid is generated from the structural unit (a5) upon exposure, the action of the acid causes an increase in the polarity of the component (A0) that increases the solubility in the alkali developing solution. Accordingly, during resist pattern formation, by conducting selective exposure of a resist film formed by applying the resist composition to a substrate, the exposed portions change from being substantially insoluble in the alkali developing solution to being soluble, while the unexposed portions remain substantially insoluble in the alkali developing solution, meaning alkali developing can be used to form a positive-type resist pattern. On the other hand, in those cases where a solvent developing process is used, the component (A0) exhibits good solubility in an organic developing solution prior to exposure, but when acid is generated from the structural unit (a5) upon exposure, the action of the acid causes an increase in the polarity of the component (A0) that reduces the solubility in the organic developing solution. Accordingly, during resist pattern formation, by conducting selective exposure of a resist film formed by applying the resist composition to a substrate, the exposed portions change from being soluble in the organic developing solution to being substantially insoluble, while the unexposed portions remain soluble in the organic developing solution, meaning developing with the organic developing solution can be used to achieve contrast between the exposed portions and the unexposed portions, thereby enabling formation of a negative-type resist pattern.

In the present invention, the component (A) is preferably a base component (A0). In other words, the resist composition of the present invention is preferably a chemically amplified resist composition that functions as a positive-type composition in an alkali developing process, and functions as a negative-type composition in a solvent developing process.

The component (A0) may be a resin component that exhibits increased polarity under the action of acid, a low molecular weight compound component that exhibits increased polarity under the action of acid, or a mixture thereof.

The component (A0) is preferably a resin component that exhibits increased polarity under the action of acid, and preferably includes a polymeric compound (A1) (hereafter referred to as "component (A1)") that generates acid upon exposure, and exhibits increased polarity under the action of acid.

Specifically, the component (A1) is preferably a polymeric compound that contains the structural unit (a5) which decomposes upon exposure to generate an acid, and a structural unit (a1) containing an acid-decomposable group that exhibits increased polarity under the action of acid.

In addition to the structural unit (a5) and the structural unit (a1), the component (A1) preferably also includes at least one structural unit selected from the group consisting of structural units (a0) derived from an acrylate ester in which the hydrogen atom bonded to the carbon atom on the α-position may be substituted with a substituent and containing an —SO$_2$-containing cyclic group, and structural units (a2) containing a lactone-containing cyclic group.

The component (A1) preferably also includes, either in addition to the structural unit (a5) and the structural unit (a1), or in addition to a combination of the structural units (a5) and (a1), and at least one of the structural unit (a0) and the structural unit (a2), a structural unit (a3) derived from an acrylate ester in which the hydrogen atom bonded to the carbon atom on the α-position may be substituted with a substituent and containing a polar group-containing aliphatic hydrocarbon group.

[Structural Unit (a5)]

The structural unit (a5) is a structural unit that decomposes upon exposure to generate an acid, and is a structural unit derived from the aforementioned "water-soluble monomer having an anionic group", in which the cation moiety has been subjected to salt exchange with an aforementioned organic cation.

Among the various units for the structural units (a5), a structural unit derived from at least one compound selected from the group consisting of compounds represented by the above general formulas (a5-1), (a5-2), (a5-3) and (a5-4), in which the cation moiety has been subjected to salt exchange with a sulfonium ion or an iodonium ion is preferred, and a structural unit in which the cation moiety has been subjected to salt exchange with a sulfonium ion is particularly desirable. The sulfonium ion is preferably at least one cation selected from the group consisting of cations represented by the above formulas (gc-1), (gc-3), (gc-4), (gc-5) and (gc-6).

Specific examples of preferred units for the structural unit (a5) are shown below, but the structural unit (a5) is not limited to the units shown below.

In each of the following formulas, $R^\alpha$ represents a hydrogen atom, a methyl group or a trifluoromethyl group.

[Chemical Formula 32]

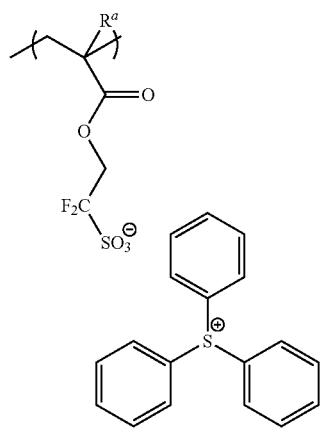

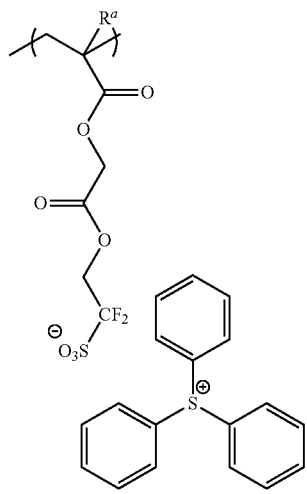

-continued

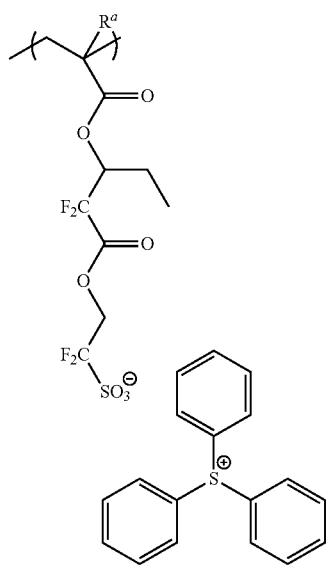

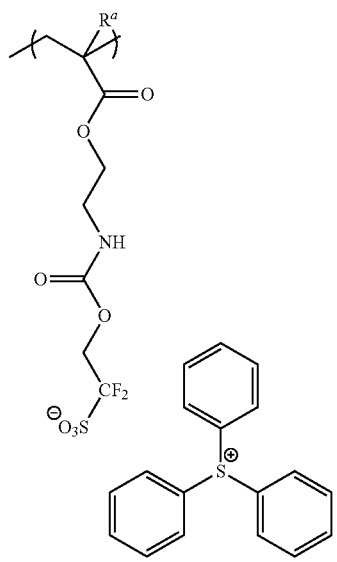

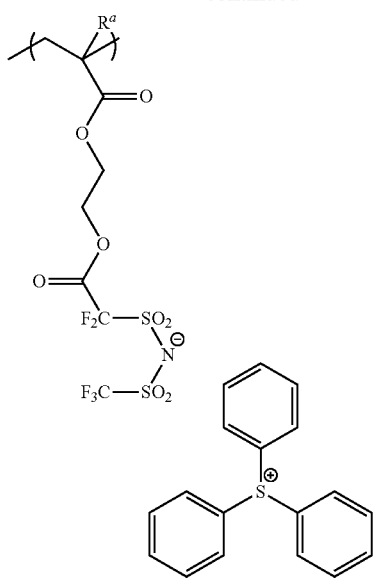
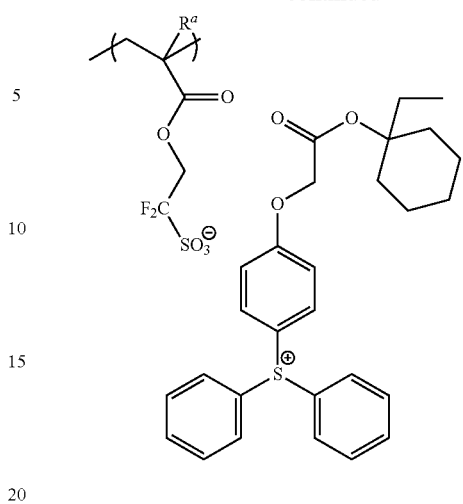
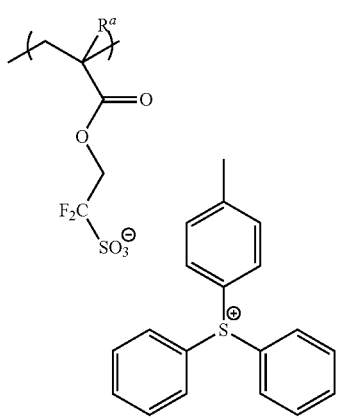
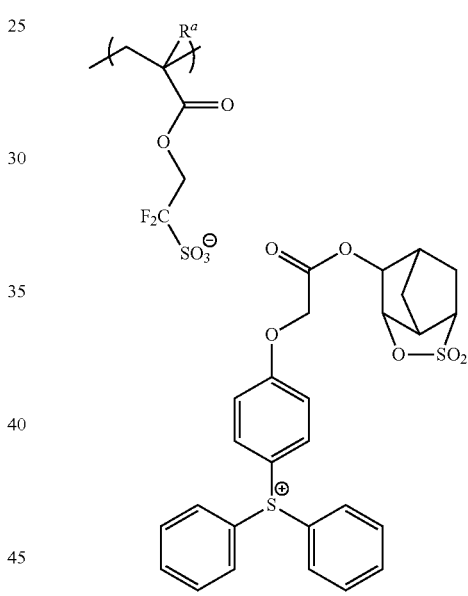
[Chemical Formula 33]
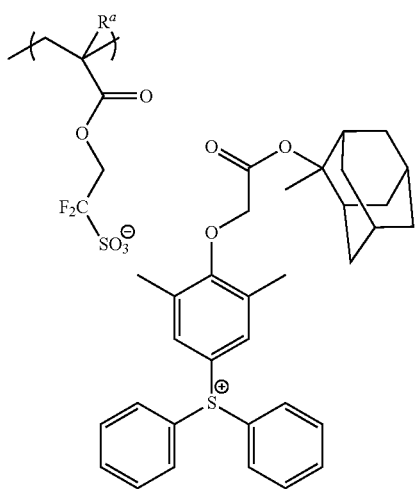
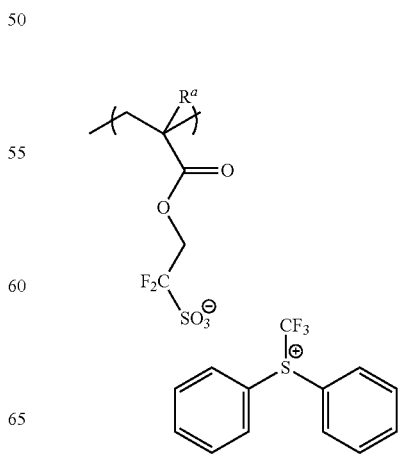

-continued

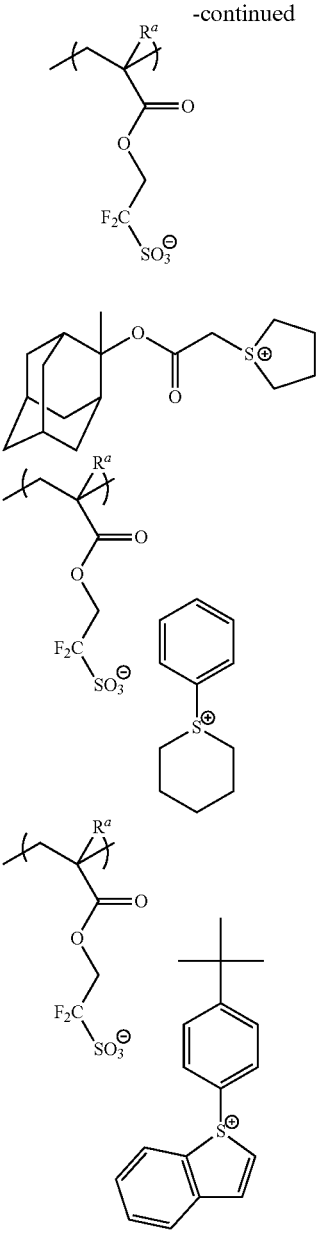

In the component (A1), as the structural unit (a5), one type of structural unit may be used alone, or two or more types may be used in combination.

The amount of the structural unit (a5) within the component (A1), based on the combined total of all the structural units that constitute the component (A1), is preferably within a range from 1 to 40 mol %, more preferably from 1 to 35 mol %, and still more preferably from 3 to 30 mol %. When the amount of the structural unit (a5) is at least as large as the lower limit of the above range, a pattern can be formed easily using a resist composition prepared from the component (A1), and the lithography properties can be improved. On the other hand, when the amount of the structural unit (a5) is not more than the upper limit of the above range, a good balance can be achieved with the other structural units.

[Structural Unit (a1)]

The structural unit (a1) is a structural unit containing an acid-decomposable group that exhibits increased polarity under the action of acid.

The term "acid-decomposable group" describes a group having acid decomposability which, under the action of the acid generated from the component (A1) (the structural unit (a5)) upon exposure, undergoes cleavage of at least some of the bonds within the structure of the acid-decomposable group.

Examples of acid-decomposable groups that exhibit increased polarity under the action of acid include groups which are decomposed by the action of acid to form a polar group.

Examples of the polar group include a carboxyl group, a hydroxyl group, an amino group and a sulfo group (—SO$_3$H). Among these, a polar group containing —OH in the structure thereof (hereafter referred to as an "OH-containing polar group") is preferable, a carboxyl group or a hydroxyl group is more preferable, and a carboxyl group is particularly desirable.

More specific examples of the acid-decomposable group include groups in which an aforementioned polar group is protected with an acid-dissociable group (such as a group in which the hydrogen atom of an OH-containing polar group is protected with an acid-dissociable group).

An "acid-dissociable group" describes a group having acid dissociability which, under the action of the acid generated from the component (A1) (the structural unit (a5)) upon exposure, undergoes cleavage of at least the bond between the acid-dissociable group and the adjacent atom. It is necessary that the acid-dissociable group that constitutes the acid-decomposable group is a group which exhibits a lower polarity than the polar group generated by the dissociation of the acid-dissociable group. Thus, when the acid-dissociable group dissociates under the action of acid, a polar group exhibiting a higher polarity than that of the acid-dissociable group is generated, thereby increasing the polarity. As a result, the polarity of the entire component (A1) is increased. By increasing the polarity, the relative solubility of the component (a1) in the developing solution changes, with the solubility increasing when the developing solution is an alkali developing solution, and the solubility decreasing when the developing solution is a developing solution containing an organic solvent (an organic developing solution).

There are no particular limitations on the acid-dissociable group, and any of the groups that have been proposed as acid-dissociable groups within the base resins of chemically amplified resists can be used. Generally, groups that form either a cyclic or chain-like tertiary alkyl ester with the carboxyl group of the (meth)acrylic acid or the like, and acetal-type acid-dissociable groups such as alkoxyalkyl groups are widely known.

Here, a "tertiary alkyl ester" describes a structure in which an ester is formed by substituting the hydrogen atom of a carboxyl group with a chain-like or cyclic alkyl group, and a tertiary carbon atom within the chain-like or cyclic alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom, thereby forming a carboxyl group.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched, acid-dissociable groups and acid-dissociable groups that contain an aliphatic cyclic group.

Here, the term "aliphatic branched" refers to a branched structure having no aromaticity. The structure of the "aliphatic branched acid-dissociable group" is not limited to groups constituted of only carbon atoms and hydrogen atoms (not limited to hydrocarbon groups), but is preferably a hydrocarbon group. Further, the "hydrocarbon group" may be either saturated or unsaturated, but in most cases, is preferably saturated.

Examples of the aliphatic branched, acid-dissociable group include groups represented by a formula —C($R^{71}$)($R^{72}$)($R^{73}$). In this formula, each of $R^{71}$ to $R^{73}$ independently represents a linear alkyl group of 1 to 5 carbon atoms. The group represented by the formula —C($R^{71}$)($R^{72}$)($R^{73}$) preferably has 4 to 8 carbon atoms, and specific examples include a tert-butyl group, 2-methyl-2-butyl group, 2-methyl-2-pentyl group and 3-methyl-3-pentyl group.

A tert-butyl group is particularly desirable.

The term "aliphatic cyclic group" refers to a monocyclic group or polycyclic group that has no aromaticity.

The "aliphatic cyclic group" within the "acid-dissociable group that contains an aliphatic cyclic group" may or may not have a substituent. Examples of the substituent include an alkyl group of 1 to 5 carbon atoms, an alkoxy group of 1 to 5 carbon atom, a fluorine atom, a fluorinated alkyl group of 1 to 5 carbon atoms, and an oxygen atom (=O).

The basic ring of the "aliphatic cyclic group" excluding substituents is not limited to structures constituted of only carbon and hydrogen (not limited to hydrocarbon groups), but is preferably a hydrocarbon group. Further, the "hydrocarbon group" may be either saturated or unsaturated, but is preferably saturated.

The aliphatic cyclic group may be either monocyclic or polycyclic.

The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Specific examples include the same groups as those described above for the monovalent alicyclic hydrocarbon group for $R^{61}$. Further, part of the carbon atoms that constitute the ring structure of any of these alicyclic hydrocarbon groups may be substituted with an ether group (—O—).

Examples of the acid-dissociable groups that contain an aliphatic cyclic group include the following.

(i) Groups in which a substituent (an atom other than a hydrogen atom or a group) is bonded to a carbon atom within the ring structure of a monovalent aliphatic cyclic group that is bonded to the atom adjacent to the acid-dissociable group (for example, the —O— of —C(=O)—O—), thereby forming a tertiary carbon atom on the ring structure of the monovalent aliphatic cyclic group.

(ii) Groups which have a monovalent aliphatic cyclic group, and a branched alkylene group containing a tertiary carbon atom that is bonded to the monovalent aliphatic cyclic group.

In a group of type (i) described above, examples of the substituent bonded to the carbon atom within the ring structure of the monovalent aliphatic cyclic group that is bonded to the atom adjacent to the acid-dissociable group include alkyl groups. Examples of these alkyl groups include the same groups as those described below for $R^{14}$ in formulas (1-1) to (1-9) shown below.

Specific examples of groups of type (i) include groups represented by general formulas (1-1) to (1-9) shown below.

Specific examples of groups of type (ii) include groups represented by general formulas (2-1) to (2-6) shown below.

[Chemical Formula 34]

(1-1)

(1-2)

(1-3)

(1-4)

(1-5)

(1-6)

(1-7)

(1-8)

(1-9)

In the above formulas, $R^{14}$ represents an alkyl group, and g represents an integer of 0 to 8.

[Chemical Formula 35]

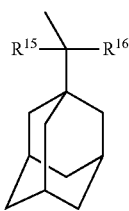 (2-1)

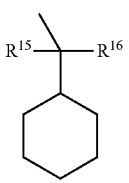 (2-2)

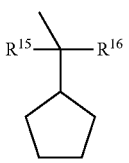 (2-3)

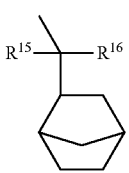 (2-4)

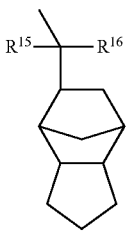 (2-5)

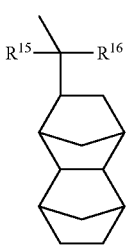 (2-6)

In the above formulas, each of $R^{15}$ and $R^{16}$ independently represents an alkyl group.

In the formulas (I-1) to (I-9), the alkyl group for $R^{14}$ may be linear, branched or cyclic, and a linear or branched alkyl group is preferable.

The linear alkyl group preferably has 1 to 5 carbon atoms, more preferably 1 to 4 carbon atoms, and still more preferably 1 or 2 carbon atoms. Specific examples include a methyl group, ethyl group, n-propyl group, n-butyl group and n-pentyl group. Among these, a methyl group, ethyl group or n-butyl group is preferable, and a methyl group or ethyl group is more preferable.

The branched alkyl group preferably has 3 to 10 carbon atoms, and more preferably 3 to 5 carbon atoms. Specific examples of such branched alkyl groups include an isopropyl group, isobutyl group, tert-butyl group, isopentyl group and neopentyl group, and an isopropyl group is particularly desirable.

g is preferably an integer of 0 to 3, more preferably an integer of 1 to 3, and still more preferably 1 or 2.

In the formulas (2-1) to (2-6), examples of the alkyl group for $R^{15}$ and $R^{16}$ include the same alkyl groups as those described above for $R^{14}$.

In the formulas (I-1) to (I-9) and (2-1) to (2-6), part of the carbon atoms that constitute the ring(s) may be replaced with an ethereal oxygen atom (—O—).

Further, in the formulas (I-1) to (I-9) and (2-1) to (2-6), one or more of the hydrogen atoms bonded to the carbon atoms that constitute the ring(s) may each be substituted with a substituent. Examples of the substituent include an alkyl group of 1 to 5 carbon atoms, a fluorine atom and a fluorinated alkyl group.

An "acetal-type acid-dissociable group" generally substitutes a hydrogen atom at the terminal of an OH-containing polar group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded, thereby forming an OH-containing polar group such as a carboxyl group or hydroxyl group.

Examples of acetal-type acid-dissociable groups include groups represented by a general formula (p1) shown below.

[Chemical Formula 36]

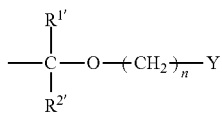 (p1)

In the formula, each of $R^{1\prime}$ and $R^{2\prime}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In the above formula (p1), n is preferably an integer of 0 to 2, more preferably 0 or 1, and most preferably 0.

Examples of the alkyl group for $R^{1\prime}$ and $R^{2\prime}$ include the same alkyl groups as those described above for the substituent which may be bonded to the carbon atom on the α-position within the description relating to the α-substituted acrylate ester described later. Among these, a methyl group or ethyl group is preferable, and a methyl group is the most desirable.

In the present invention, it is preferable that at least one of $R^{1\prime}$ and $R^{2\prime}$ is a hydrogen atom. That is, it is preferable that the acid-dissociable group (p1) is a group represented by a general formula (p1-1) shown below.

[Chemical Formula 37]

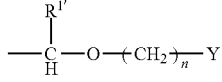 (p1-1)

In the formula, $R^{1\prime}$, n and Y are the same as defined above.

Examples of the alkyl group for Y include the same alkyl groups as those described above for the substituent which may be bonded to the carbon atom on the α-position within the description relating to the α-substituted acrylate ester described later.

As the aliphatic cyclic group for Y, any of the monocyclic or polycyclic aliphatic cyclic groups which have been proposed for conventional ArF resists and the like can be selected and used as appropriate. For example, the same aliphatic cyclic groups as those described above in connection with the "acid-dissociable group that contains an aliphatic cyclic group" can be used.

Further, as the acetal-type acid-dissociable group, groups represented by a general formula (p2) shown below can also be used.

[Chemical Formula 38]

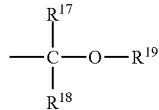

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cyclic alkyl group, the cycloalkyl group preferably has 4 to 15 carbon atoms, more preferably 4 to 12 carbon atoms, and most preferably 5 to 10 carbon atoms. Examples of the cycloalkyl group include the same groups as those described above for the monovalent alicyclic hydrocarbon group for $R^{61}$, including groups in which one or more hydrogen atoms have been removed from a monocycloalkane, or a polycycloalkane such as a bicycloalkane, tricycloalkane or tetracycloalkane, which may or may not be substituted with a fluorine atom or a fluorinated alkyl group. Among these, a group in which one or more hydrogen atoms have been removed from adamantane is preferable.

Further, in the above formula (p2), each of $R^{17}$ and $R^{19}$ may independently represent a linear or branched alkylene group (and preferably an alkylene group of 1 to 5 carbon atoms), wherein $R^{19}$ and $R^{17}$ are bonded to each other.

In such a case, a cyclic group is formed by $R^{17}$, $R^{19}$, the oxygen atom to which $R^{19}$ is bonded, and the carbon atom to which the oxygen atom and $R^{17}$ are bonded. Such a cyclic group is preferably a 4- to 7-membered ring, and more preferably a 4- to 6-membered ring. Specific examples of the cyclic group include a tetrahydropyranyl group and a tetrahydrofuranyl group.

In the resist composition of the present invention, examples of the structural unit (a1) include a structural unit (a11) derived from an acrylate ester in which the hydrogen atom bonded to the carbon atom on the α-position may be substituted with a substituent and containing an acid-decomposable group that exhibits increased polarity under the action of acid, a structural unit (a12) derived from hydroxystyrene or a hydroxystyrene derivative in which at least part of the hydroxyl group hydrogen atoms are protected with a substituent containing an acid-decomposable group, and a structural unit (a13) derived from vinylbenzoic acid or a vinylbenzoic acid derivative in which at least part of the hydrogen atoms in the —C(=O)—OH moiety within the structural unit are protected with a substituent containing an acid-decomposable group.

In the present description and claims, a "structural unit derived from an acrylate ester" refers to a structural unit that is formed by the cleavage of the ethylenic double bond of an acrylate ester.

The term "acrylate ester" describes a compound in which the hydrogen atom at the carboxyl group terminal of acrylic acid ($CH_2$=CH—COOH) has been substituted with an organic group.

In the acrylate ester, the hydrogen atom bonded to the carbon atom on the α-position may be substituted with a substituent. Examples of the substituent that may substitute the hydrogen atom bonded to the carbon atom on the α-position include atoms other than a hydrogen atom and groups, and more specific examples include alkyl groups of 1 to 5 carbon atoms, halogenated alkyl groups of 1 to 5 carbon atoms and hydroxyalkyl groups of 1 to 5 carbon atoms. Unless specified otherwise, "the carbon atom on the α-position of an acrylate ester" refers to the carbon atom having the carbonyl group bonded thereto.

In the following description, an acrylate ester in which the hydrogen atom bonded to the carbon atom on the α-position is substituted with a substituent may also be termed an "α-substituted acrylate ester". Further, the generic term "(α-substituted) acrylate ester" may be used to describe either or both of the acrylate ester and the α-substituted acrylate ester.

In an α-substituted acrylate ester, the alkyl group for the α-position substituent is preferably a linear or branched alkyl group, and specific examples include a methyl group, ethyl group, propyl group, isopropyl group, n-butyl group, isobutyl group, tert-butyl group, pentyl group, isopentyl group and neopentyl group.

Further, specific examples of the halogenated alkyl group for the α-position substituent include groups in which part or all of the hydrogen atoms of an aforementioned "alkyl group for the α-position substituent" have each been substituted with a halogen atom. Examples of the halogen atom include a fluorine atom, chlorine atom, bromine atom or iodine atom, and a fluorine atom is particularly desirable.

Furthermore, specific examples of the hydroxyalkyl group for the α-position substituent include groups in which part or all of the hydrogen atoms of an aforementioned "alkyl group for the α-position substituent" have each been substituted with a hydroxyl group.

A hydrogen atom, an alkyl group of 1 to 5 carbon atoms or a halogenated alkyl group of 1 to 5 carbon atoms is preferably bonded to the α-position of the (α-substituted) acrylate ester, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

A "structural unit derived from hydroxystyrene or a hydroxystyrene derivative" refers to a structural unit that is formed by the cleavage of the ethylenic double bond of hydroxystyrene or a hydroxystyrene derivative.

The expression "hydroxystyrene derivative" is a generic term that includes compounds in which the hydrogen atom on the α-position of hydroxystyrene has been substituted with a substituent such as an alkyl group or a halogenated alkyl group, and derivatives thereof. Unless specified otherwise, "the α-position" ("carbon atom on the α-position") refers to the carbon atom to which the benzene group is bonded.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The expression "vinylbenzoic acid derivative" is a generic term that includes compounds in which the hydrogen atom on the α-position of vinylbenzoic acid has been substituted with a substituent such as an alkyl group or a halogenated alkyl group, and derivatives thereof. Unless specified otherwise, "the α-position" ("carbon atom on the α-position") refers to the carbon atom to which the benzene group is bonded.

The structural units (a11), (a12) and (a13) are described below in further detail.

(Structural Unit (a11))

Specific examples of the structural unit (a11) include structural units represented by a general formula (a11-0-1) shown below, and structural units represented by a general formula (a11-0-2) shown below.

[Chemical Formula 39]

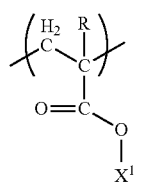
(a11-0-1)

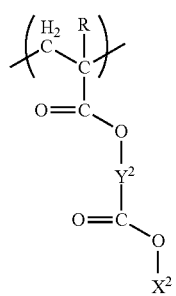
(a11-0-2)

In the above formulas, R represents a hydrogen atom, an alkyl group of 1 to 5 carbon atoms or a halogenated alkyl group of 1 to 5 carbon atoms, $X^1$ represents an acid-dissociable group, $Y^2$ represents a divalent linking group, and $X^2$ represents an acid-dissociable group.

In the general formula (a11-0-1), examples of the alkyl group and the halogenated alkyl group for R include the same alkyl groups and halogenated alkyl groups as those described above for the substituent which may be bonded to the carbon atom on the α-position within the description relating to the α-substituted acrylate ester. R is preferably a hydrogen atom, an alkyl group of 1 to 5 carbon atoms or a fluorinated alkyl group of 1 to 5 carbon atoms, and is most preferably a hydrogen atom or a methyl group.

There are no particular limitations on $X^1$ as long as it is an acid-dissociable group. Examples include the aforementioned tertiary alkyl ester-type acid-dissociable groups and acetal-type acid-dissociable groups, and of these, a tertiary alkyl ester-type acid-dissociable group is preferable.

In the general formula (a11-0-2), R is the same as defined above.

$X^2$ is the same as defined for $X^1$ in the formula (a11-0-1).

Although there are no particular limitations on the divalent linking group for $Y^2$, preferred examples include divalent hydrocarbon groups which may have a substituent, and divalent linking groups containing a hetero atom.

The expression that the hydrocarbon group "may have a substituent" means that part or all of the hydrogen atoms within the hydrocarbon group may each be substituted with a substituent (an atom other than a hydrogen atom, or a group).

The hydrocarbon group may be either an aliphatic hydrocarbon group or an aromatic hydrocarbon group.

An "aliphatic hydrocarbon group" describes a hydrocarbon group that has no aromaticity.

The aliphatic hydrocarbon group for the divalent hydrocarbon group for $Y^2$ may be saturated or unsaturated, but in general, the aliphatic hydrocarbon group is preferably saturated.

Specific examples of the aliphatic hydrocarbon group include linear and branched aliphatic hydrocarbon groups, and aliphatic hydrocarbon groups that include a ring within the structure.

The linear or branched aliphatic hydrocarbon group preferably has 1 to 10 carbon atoms, more preferably 1 to 6 carbon atoms, still more preferably 1 to 4 carbon atoms, and most preferably 1 to 3 carbon atoms.

The linear aliphatic hydrocarbon group is preferably a linear alkylene group, and specific examples include the same groups as those described above for the linear alkylene group for $A^0$.

The branched aliphatic hydrocarbon group is preferably a branched alkylene group, and specific examples include the same groups as those described above for the branched alkylene group for $A^0$.

The linear or branched aliphatic hydrocarbon group may or may not have a substituent. Examples of the substituent include a fluorine atom, a fluorinated alkyl group of 1 to 5 carbon atoms, and an oxygen atom (=O).

Examples of the aliphatic hydrocarbon group that includes a ring within the structure include the same groups as the "aliphatic hydrocarbon group that includes a ring within the structure" described above for $A^0$. Among these groups, groups in which two hydrogen atoms have been removed from cyclopentane, cyclohexane, adamantane or norbornane are preferred.

The aromatic hydrocarbon group is a hydrocarbon group having an aromatic ring.

Examples of the aromatic hydrocarbon group for the divalent hydrocarbon group for $Y^2$ include the same groups as the divalent aromatic hydrocarbon group described above for $A^0$.

The hetero atom in the "divalent linking group containing a hetero atom" for $Y^2$ refers to atoms other than a carbon atom or hydrogen atom, and specific examples include an oxygen atom, nitrogen atom, sulfur atom and halogen atoms.

Examples of the divalent linking group containing a hetero atom include the same groups as the divalent linking groups containing a hetero atom described above for $A^0$, and groups represented by a formula $-(CH_2)_{a'}-C(=O)-O-(CH_2)_{b'}-$ are preferred. In this formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among the above possibilities, the divalent linking group for $Y^2$ is preferably a linear or branched alkylene group, a divalent alicyclic hydrocarbon group, or a divalent linking group containing a hetero atom. Among these groups, a linear or branched alkylene group or a divalent linking group containing a hetero atom is particularly desirable.

Specific examples of the structural unit (a11) include structural units represented by general formulas (a1-1) to (a1-4) shown below.

[Chemical Formula 40]

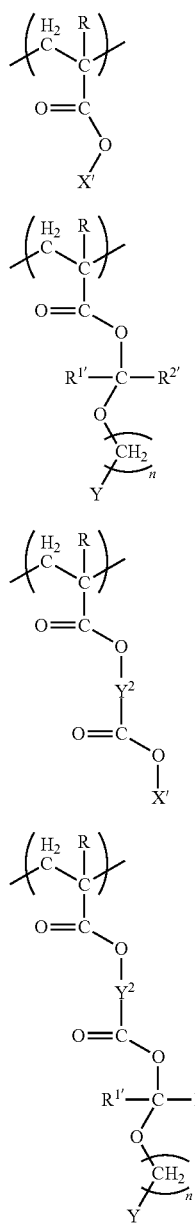

(a1-1)
(a1-2)
(a1-3)
(a1-4)

In the formulas, R, $R^{1'}$, $R^{2'}$, n, Y and $Y^2$ are each the same as defined above, and X' represents a tertiary alkyl ester-type acid-dissociable group.

In the above formulas, examples of X' include the same tertiary alkyl ester-type acid-dissociable groups as those described above.

$R^{1'}$, $R^{2'}$, n and Y are the same as defined above for $R^{1'}$, $R^{2'}$, n and Y respectively in the general formula (p1) described above in connection with the "acetal-type acid-dissociable group".

Examples of $Y^2$ include the same groups as those listed above for $Y^2$ in the general formula (a11-0-2).

Specific examples of the structural units represented by the general formula (a1-1) to (a1-4) are shown below.

In each of the formulas shown below, $R^\alpha$ represents a hydrogen atom, a methyl group or a trifluoromethyl group.

[Chemical Formula 41]

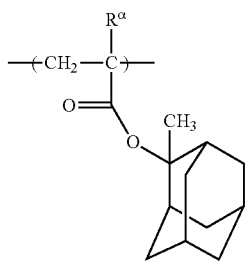

(a1-1-1)

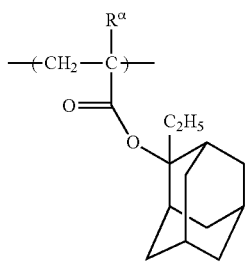

(a1-1-2)

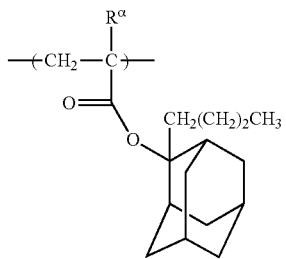

(a1-1-3)

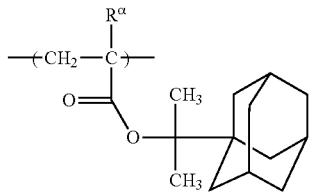

(a1-1-4)

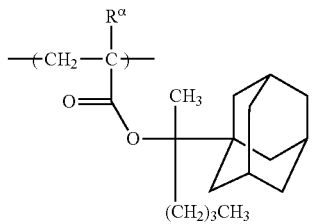

(a1-1-5)

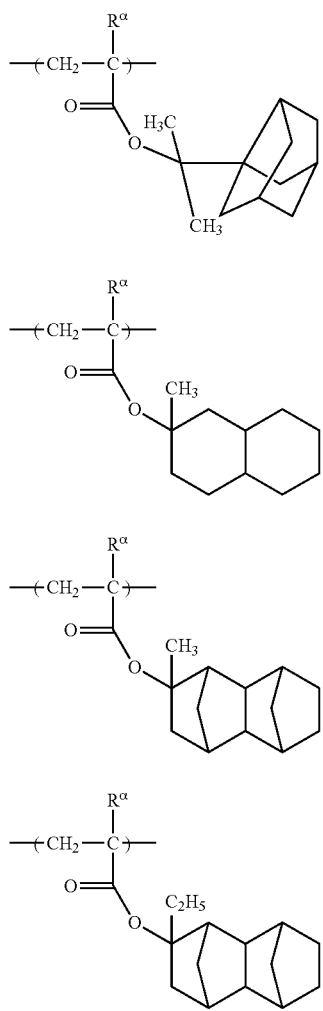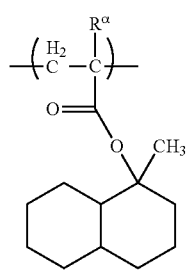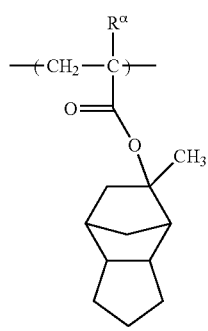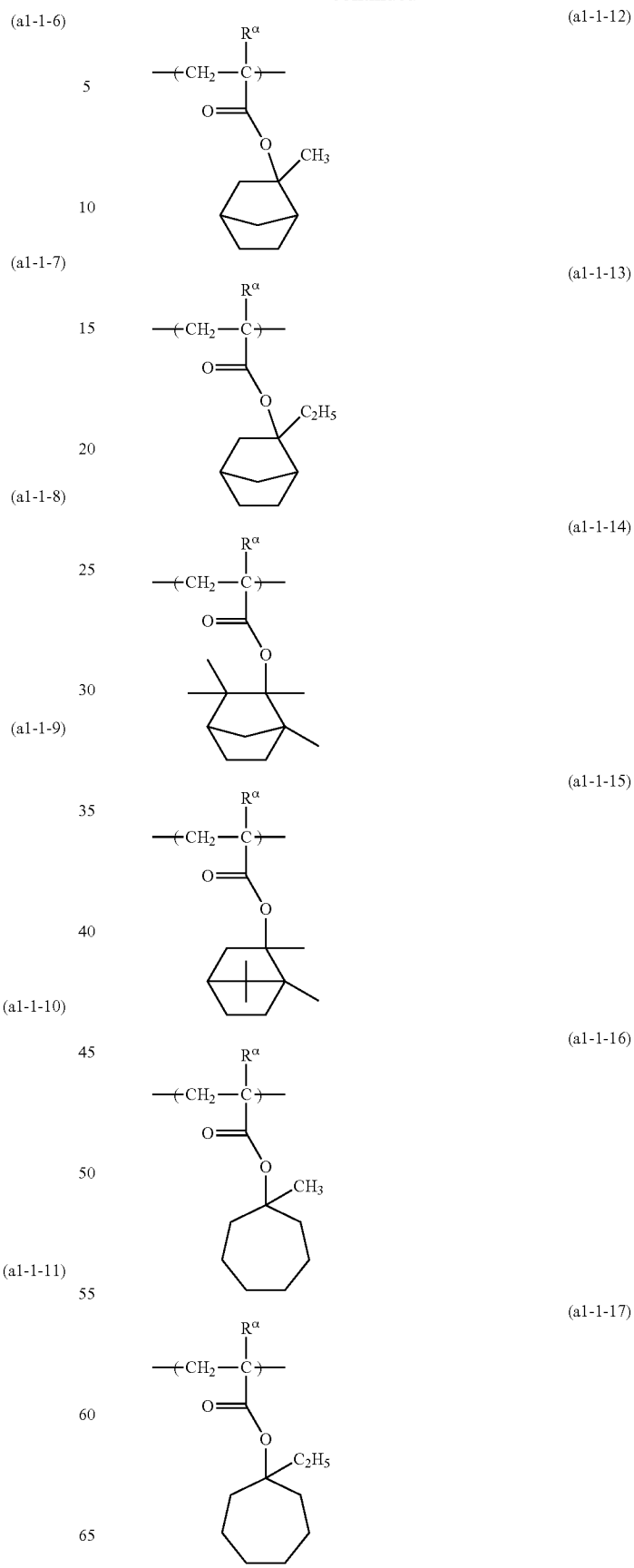

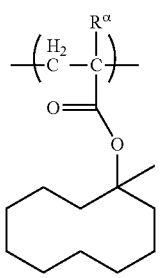 (a1-1-18)
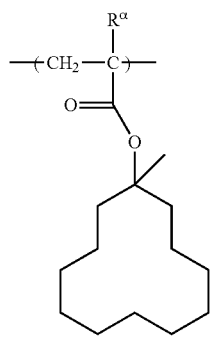 (a1-1-19)
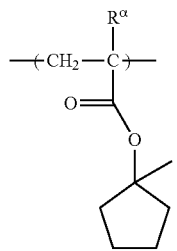 (a1-1-20)
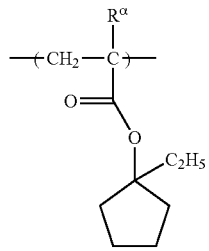 (a1-1-21)
[Chemical Formula 43]
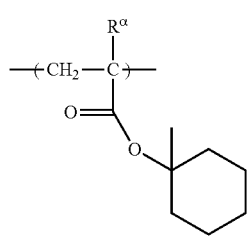 (a1-1-22)
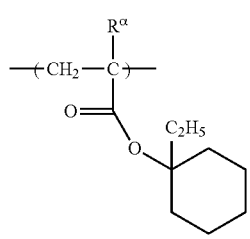 (a1-1-23)
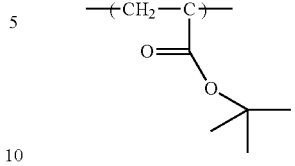 (a1-1-24)
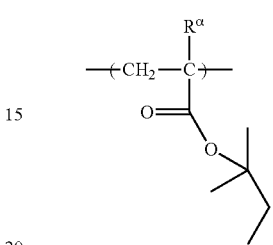 (a1-1-25)
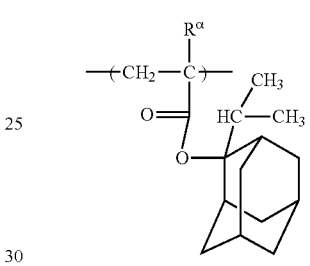 (a1-1-26)
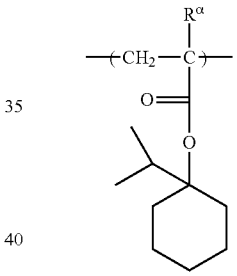 (a1-1-27)
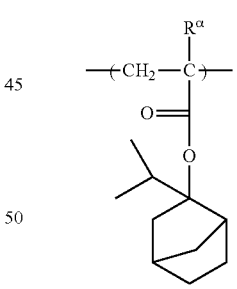 (a1-1-28)
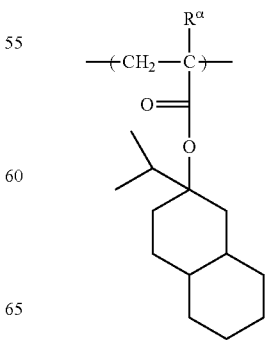 (a1-1-29)

(a1-1-30)
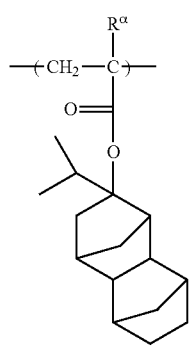
(a1-1-31)
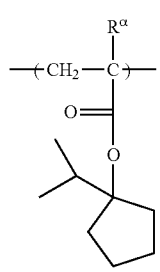
(a1-1-32)
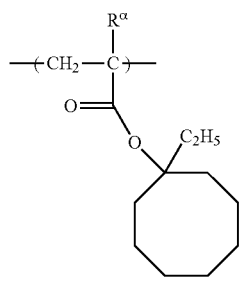
(a1-1-33)
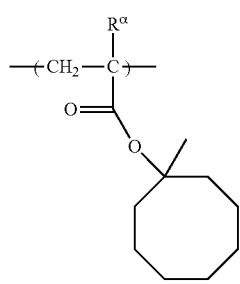
(a1-1-34)
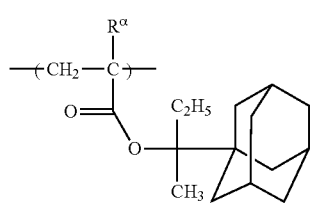
(a1-1-35)
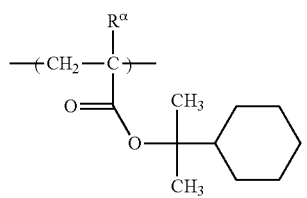
(a1-1-36)
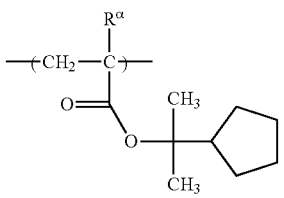
[Chemical Formula 44]
(a1-2-1)
(a1-2-2)
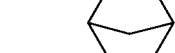
(a1-2-3)
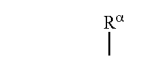

(a1-2-4)
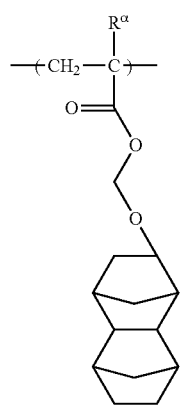
(a1-2-5)
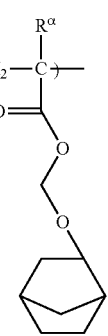
(a1-2-6)
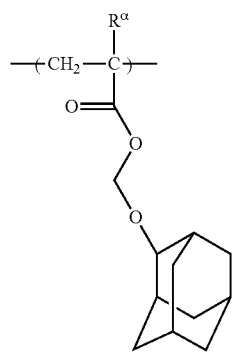
(a1-2-7)
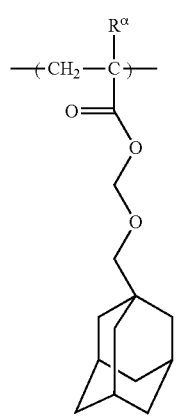
(a1-2-8)
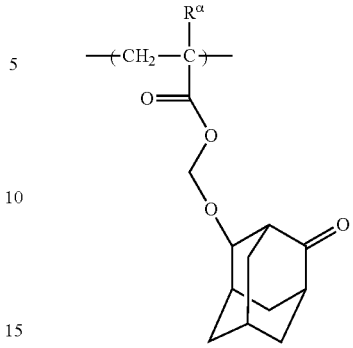
(a1-2-9)
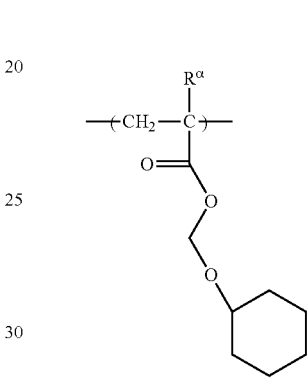
(a1-2-10)
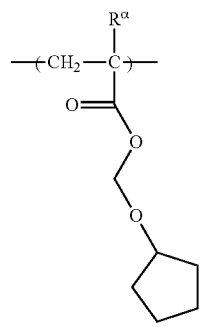
(a1-2-11)
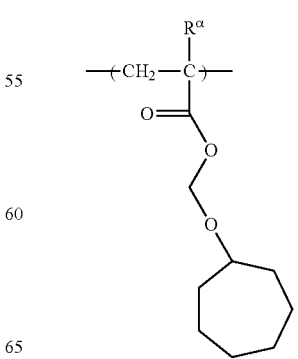

(a1-2-12) 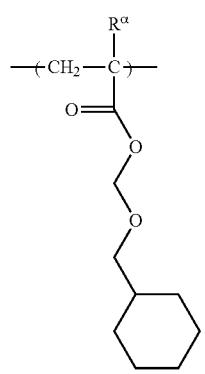
(a1-2-13) 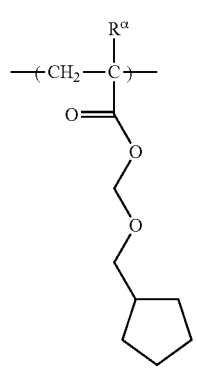
(a1-2-14) 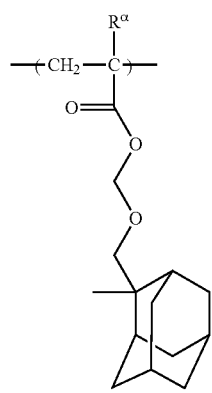
(a1-2-15) 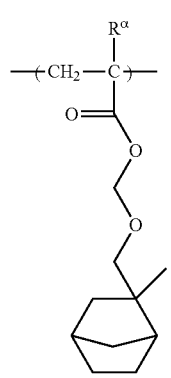
(a1-2-16) 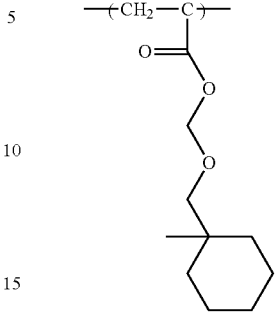
(a1-2-17) 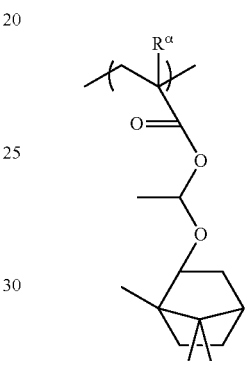
(a1-2-18) 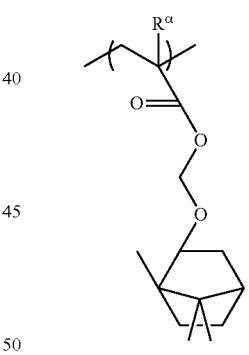
(a1-2-19) 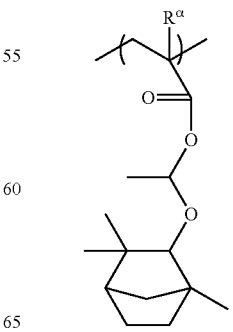

(a1-2-20) 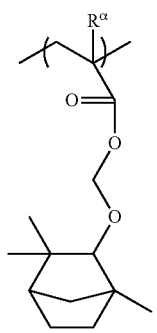
(a1-2-21) 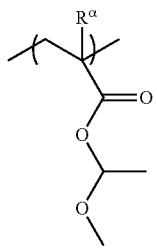
(a1-2-22) 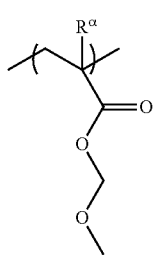
(a1-2-23) 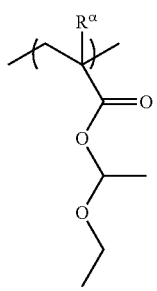
(a1-2-24) 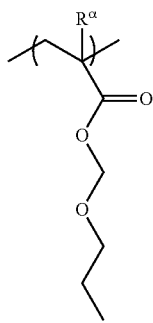
[Chemical Formula 45]
(a1-3-1) 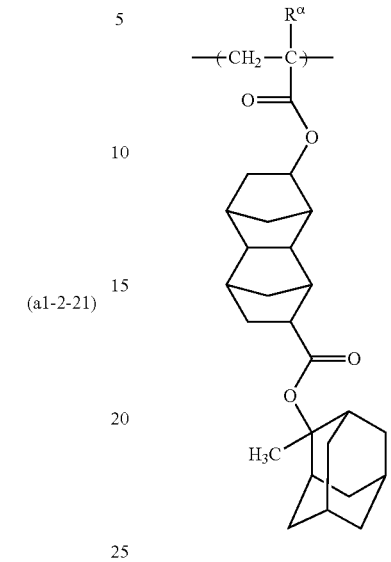
(a1-3-2) 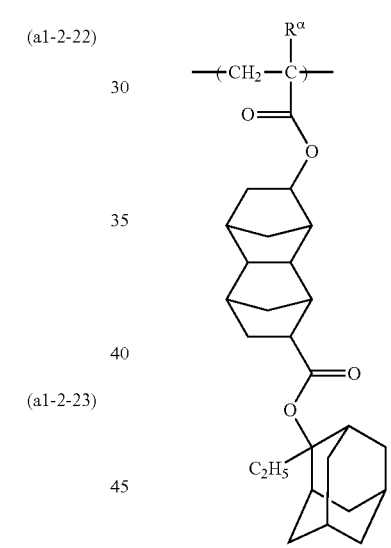
(a1-3-3) 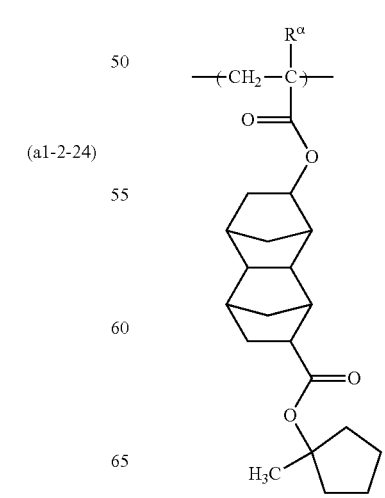

(a1-3-4)
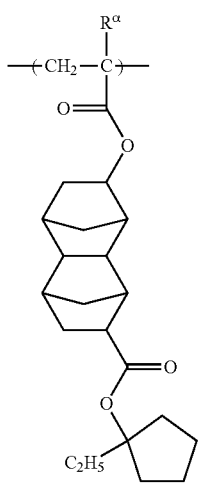
(a1-3-7)
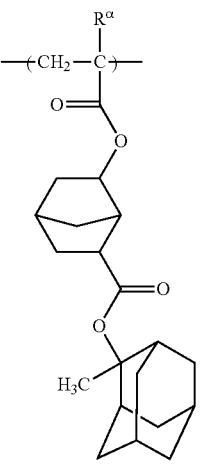
(a1-3-5)
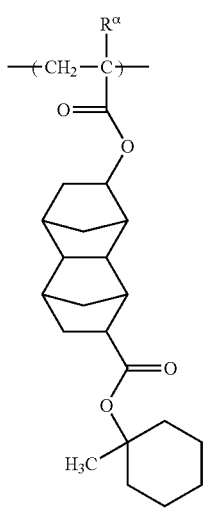
(a1-3-8)
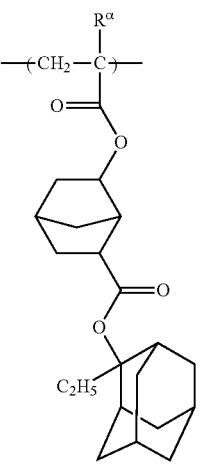
(a1-3-6)
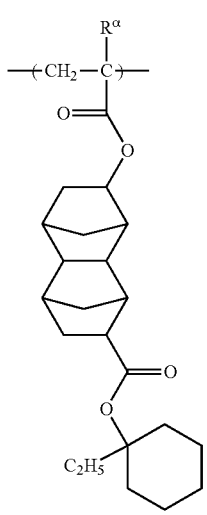
(a1-3-9)
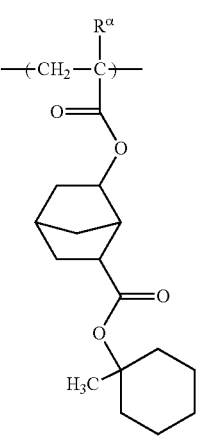

(a1-3-10) 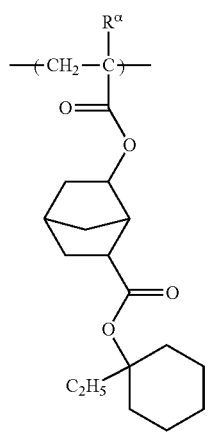
(a1-3-11) 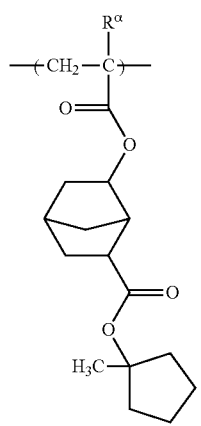
(a1-3-12) 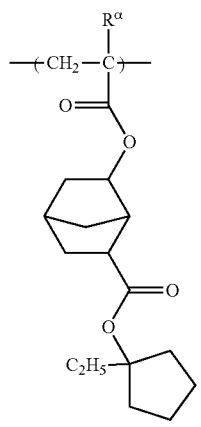
(a1-3-13) 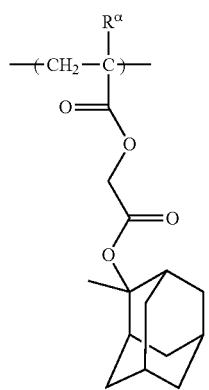
(a1-3-14) 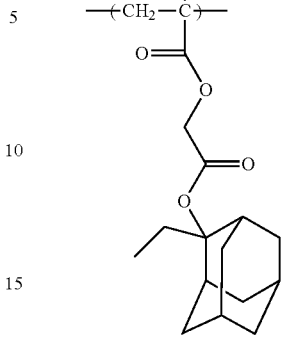
(a1-3-15) 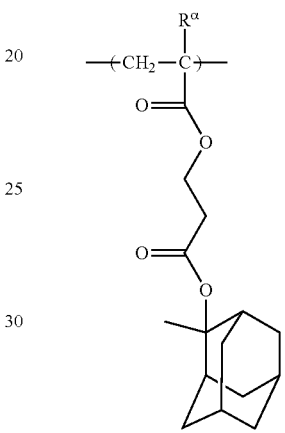
(a1-3-16) 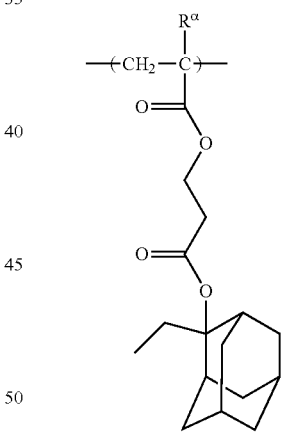
(a1-3-17) 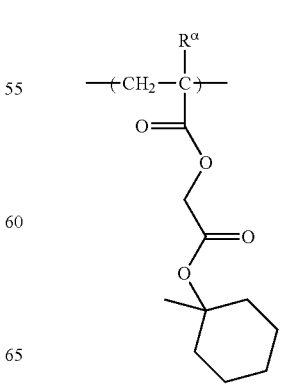

(a1-3-18) 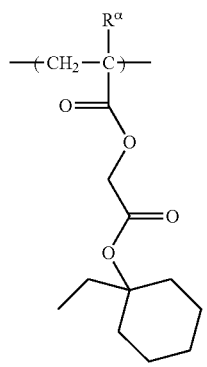
[Chemical Formula 46]
(a1-3-19) 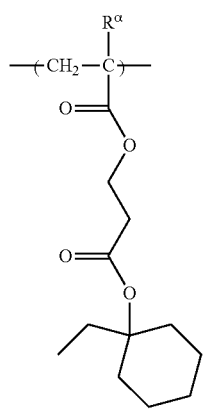
(a1-3-20) 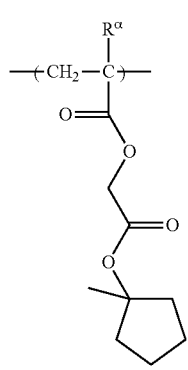
(a1-3-21)
(a1-3-22) 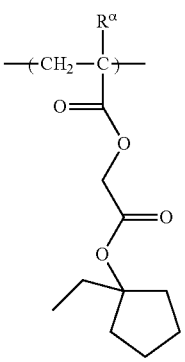
(a1-3-23) 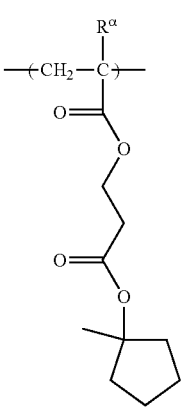
(a1-3-24)

[Chemical Formula 47]
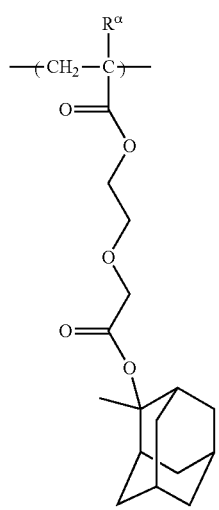 (a1-3-25)
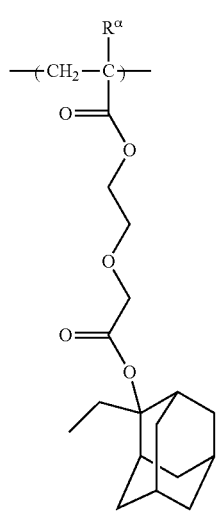 (a1-3-26)
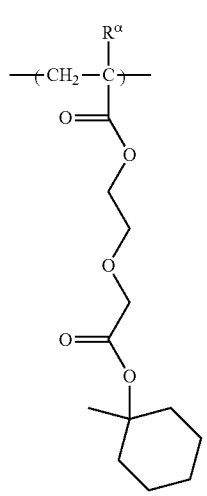 (a1-3-27)
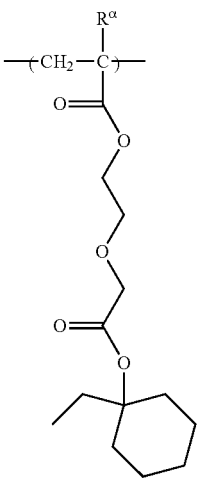 (a1-3-28)
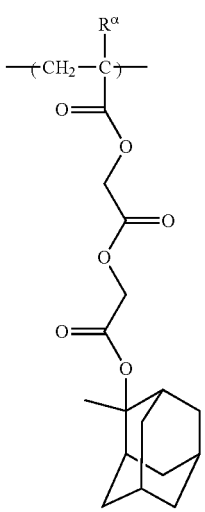 (a1-3-29)
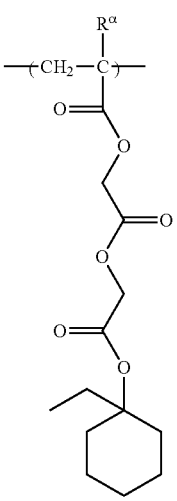 (a1-3-30)

(a1-3-31)
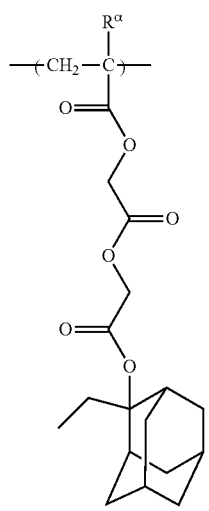
(a1-3-32)
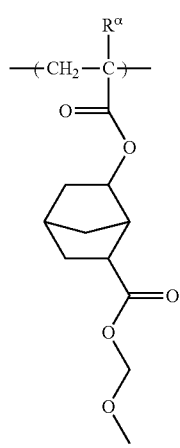
[Chemical Formula 48]
(a1-4-1)
(a1-4-2)
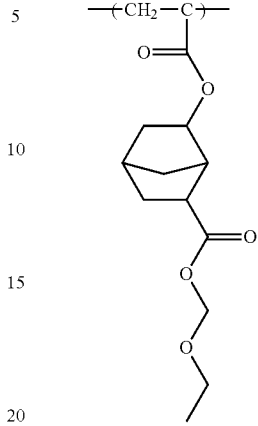
(a1-4-3)
(a1-4-4)
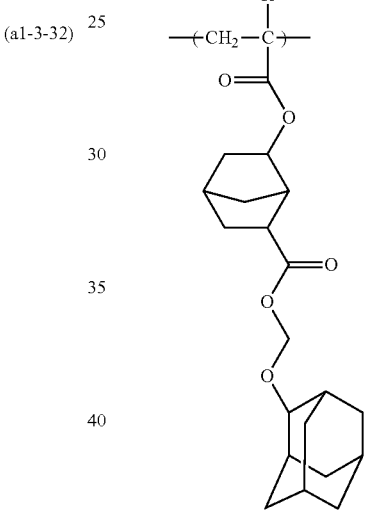
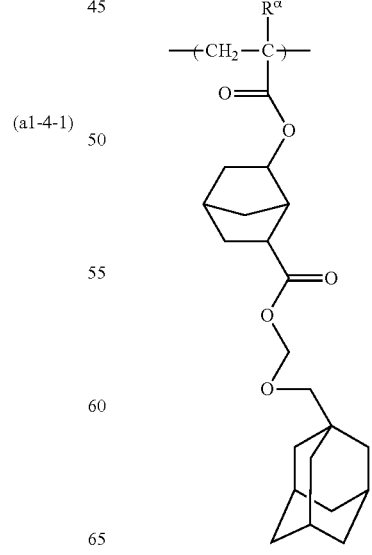

(a1-4-5)
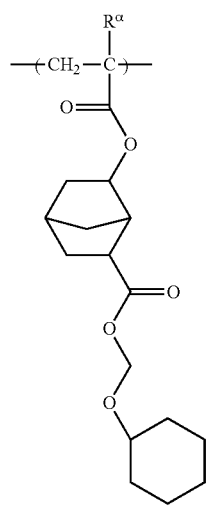
(a1-4-6)
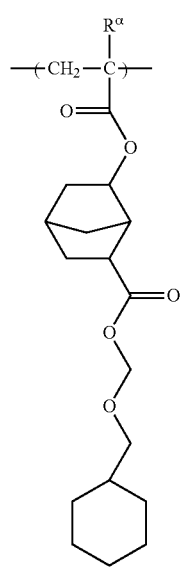
(a1-4-7)
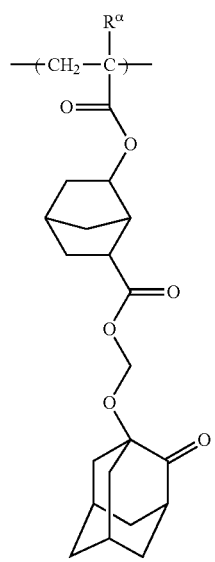
(a1-4-8)
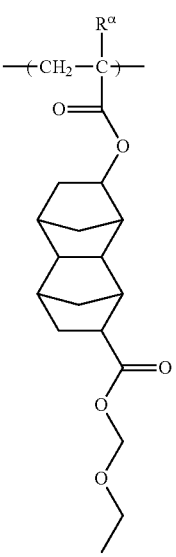
(a1-4-9)
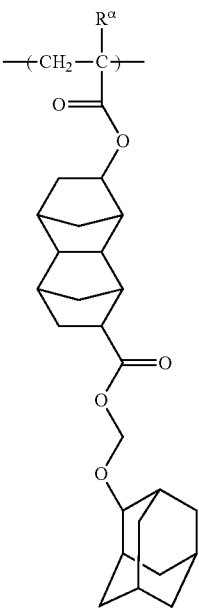

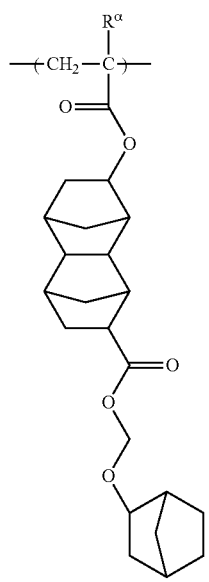 (a1-4-10)
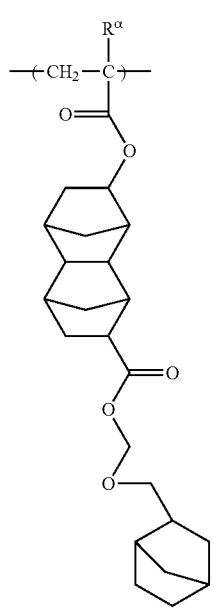 (a1-4-11)
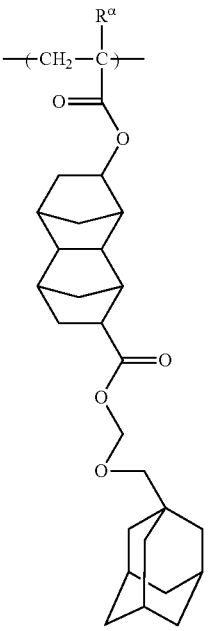 (a1-4-12)
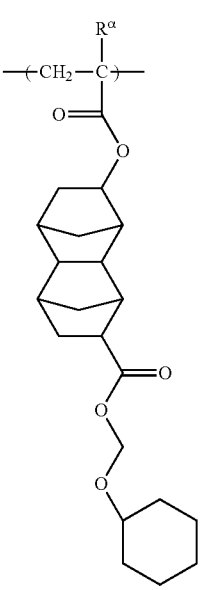 (a1-4-13)

(a1-4-14)

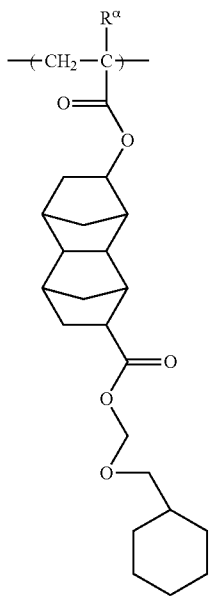

(a1-4-15)

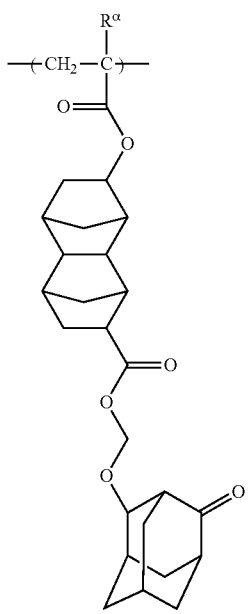

In the present invention, the polymeric compound preferably includes, as the structural unit (a11), at least one structural unit selected from the group consisting of structural units represented by a general formula (a11-0-11) shown below, structural units represented by a general formula (a11-0-12) shown below, structural units represented by a general formula (a11-0-13) shown below, structural units represented by a general formula (a11-0-14) shown below, structural units represented by a general formula (a11-0-15) shown below, and structural units represented by general formula (a11-0-2) shown below.

Among these, at least one structural unit selected from the group consisting of structural units represented by the general formula (a11-0-11), structural units represented by the general formula (a11-0-12), structural units represented by the general formula (a11-0-13), structural units represented by the general formula (a11-0-14), and structural units represented by the general formula (a11-0-15) is particularly desirable.

[Chemical Formula 49]

(a11-0-11)

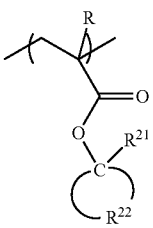

(a11-0-12)

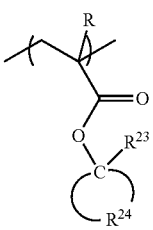

(a11-0-13)

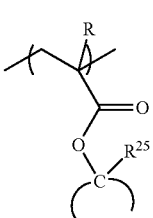

(a11-0-14)

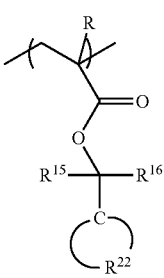

(a11-0-15)

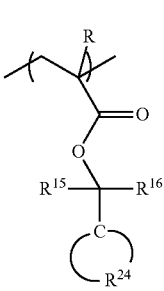

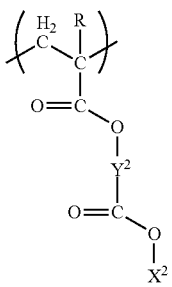

(a11-0-2)

[Chemical Formula 50]

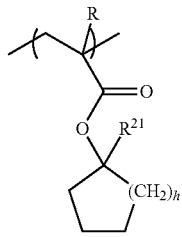

(a11-1-02)

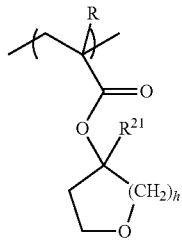

(a11-1-02')

In the above formulas, R represents a hydrogen atom, an alkyl group of 1 to 5 carbon atoms or a halogenated alkyl group of 1 to 5 carbon atoms, $R^{21}$ represents an alkyl group, $R^{22}$ represents a group that forms an aliphatic monocyclic group together with the carbon atom to which $R^{22}$ is bonded, $R^{23}$ represents a branched alkyl group, $R^{24}$ represents a group that forms an aliphatic polycyclic group together with the carbon atom to which $R^{24}$ is bonded, $R^{25}$ represents a linear alkyl group of 1 to 5 carbon atoms, each of $R^{15}$ and $R^{16}$ independently represents an alkyl group, $Y^2$ represents a divalent linking group, and $X^2$ represents an acid-dissociable group.

In each of the above formulas, R, $Y^2$ and $X^2$ are the same as defined above.

In the formula (a11-0-11), examples of the alkyl group for $R^{21}$ include the same alkyl groups as those described above for $R^{14}$ in the formulas (1-1) to (1-9), and a methyl group, ethyl group or isopropyl group is preferred.

In terms of $R^{22}$, examples of the aliphatic monocyclic group that is formed together with the carbon atom to which $R^{22}$ is bonded include the monocyclic groups among the aliphatic cyclic groups described above in connection with the tertiary alkyl ester-type acid-dissociable groups. Specific examples include groups in which one or more hydrogen atoms have been removed from a monocycloalkane. The monocycloalkane is preferably a 3- to 11-membered ring, more preferably a 3- to 8-membered ring, still more preferably a 4- to 6-membered ring, and most preferably a 5- or 6-membered ring.

Part of the carbon atoms that constitute the ring of the monocycloalkane may or may not be substituted with an ether group (—O—).

Further, the monocycloalkane may include an alkyl group of 1 to 5 carbon atoms, a fluorine atom, or a fluorinated alkyl group of 1 to 5 carbon atoms as a substituent.

Examples of the $R^{22}$ group that constitutes the aliphatic monocyclic group include linear alkylene groups which may have an ether group (—O—) interposed between the carbon atoms of the alkylene chain.

Specific examples of the structural unit represented by the formula (a11-0-11) include structural units represented by the above formulas (a1-1-16) to (a1-1-23), (a1-1-27) and (a1-1-31). Among these, structural units represented by a general formula (a11-1-02) shown below, which includes the structural units represented by the above formulas (a1-1-16) and (a1-1-17), the formulas (a1-1-20) to (a1-1-23), and the formulas (a1-1-27), (a1-1-31), (a1-1-32) and (a1-1-33) are preferred. Furthermore, structural units represented by a general formula (a11-1-02) shown below are also preferred.

In each of the formulas below, h represents an integer of 1 to 4, and is preferably 1 or 2.

In the formulas, R and $R^{21}$ are each the same as defined above, and h represents an integer of 1 to 4.

In the formula (a11-0-12), examples of the branched alkyl group for $R^{23}$ include the same branched alkyl groups as those described above for the alkyl group for $R^{14}$ in the formulas (1-1) to (1-9), and an isopropyl group is particularly desirable.

Examples of the aliphatic polycyclic group formed by $R^{24}$ together with the carbon atom to which $R^{24}$ is bonded include the polycyclic groups among the aliphatic cyclic groups described above in connection with the tertiary alkyl ester-type acid-dissociable groups.

Specific examples of the structural unit represented by the general formula (a11-0-12) include the structural units represented by the above formula (a1-1-26) and the formulas (a1-1-28) to (a1-1-30).

The structural unit represented by the formula (a11-0-12) is preferably a structural unit in which the aliphatic polycyclic group formed by $R^{24}$ together with the carbon atom to which $R^{24}$ is bonded is a 2-adamantyl group, and a structural unit represented by the above formula (a1-1-26) is particularly desirable.

In the formula (a11-0-13), R and $R^{24}$ are each the same as defined above.

Examples of the linear alkyl group for $R^{25}$ include the same linear alkyl groups as those described above for the alkyl group for $R^{14}$ in the formulas (1-1) to (1-9), and a methyl group or ethyl group is the most desirable.

Specific examples of the structural unit represented by the formula (a11-0-13) include the structural units represented by the formulas (a1-1-1) to (a1-1-2) and the formulas (a1-1-7) to (a1-1-15), which were mentioned above as specific examples of the general formula (a1-1).

The structural unit represented by the formula (a11-0-13) is preferably a structural unit in which the aliphatic polycyclic group formed by $R^{24}$ together with the carbon atom to which $R^{24}$ is bonded is a 2-adamantyl group, and a structural unit represented by the above formula (a1-1-1) or (a1-1-2) is particularly desirable.

Further, a structural unit in which the aliphatic polycyclic group formed by $R^{24}$ together with the carbon atom to which $R^{24}$ is bonded is a group in which one or more hydrogen atoms have been removed from tetracyclododecane is also preferred, and structural units represented by the above formulas (a1-1-8), (a1-1-9) and (a1-1-30) are also desirable.

In the formula (a11-0-14), R and $R^{22}$ are each the same as defined above. $R^{15}$ and $R^{16}$ are the same as defined above for $R^{15}$ and $R^{16}$ respectively in the above general formulas (2-1) to (2-6).

Specific examples of the structural unit represented by the formula (a11-0-14) include the structural units represented by the formulas (a1-1-35) and (a1-1-36), which were mentioned above as specific examples of the general formula (a1-1).

In the formula (a11-0-15), R and $R^{24}$ are each the same as defined above. $R^{15}$ and $R^{16}$ are the same as defined above for $R^{15}$ and $R^{16}$ respectively in the above general formulas (2-1) to (2-6).

Specific examples of the structural unit represented by the formula (a11-0-15) include the structural units represented by the formulas (a1-1-4) to (a1-1-6) and the formula (a1-1-34), which were mentioned above as specific examples of the general formula (a1-1).

Examples of the structural unit represented by the formula (a11-0-2) include structural units represented by the above formulas (a1-3) and (a1-4), and of these, a structural unit represented by the formula (a1-3) is particularly desirable.

The structural unit represented by the formula (a1'-0-2) is preferably a structural unit in which $Y^2$ in the formula is a group represented by one of the above formulas —$Y^{21}$—O—$Y^{22}$ or —$Y^{21}$—C(=O)—O—$Y^{22}$—.

Preferred examples of such structural units include structural units represented by a general formula (a1-3-01) shown below, structural units represented by a general formula (a1-3-02) shown below, and structural units represented by a general formula (a1-3-03) shown below.

[Chemical Formula 51]

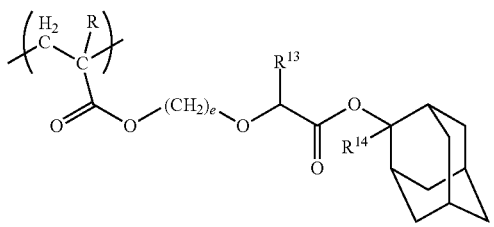

(a1-3-01)

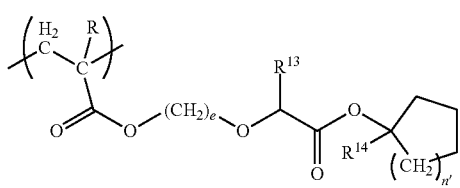

(a1-3-02)

In the formulas, R is the same as defined above, $R^{13}$ represents a hydrogen atom or a methyl group, $R^{14}$ represents an alkyl group, e represents an integer of 1 to 10, and n' represents an integer of 0 to 3.

[Chemical Formula 52]

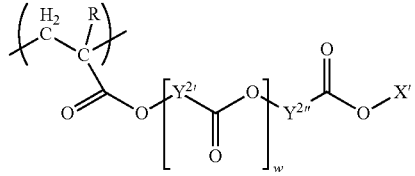

(a1-3-03)

In the formula, R is the same as defined above, each of $Y^{2'}$ and $Y^{2''}$ independently represents a divalent linking group, X' represents an acid-dissociable group, and w represents an integer of 0 to 3.

In the formulas (a1-3-01) and (a1-3-02), $R^{13}$ is preferably a hydrogen atom.

$R^{14}$ is the same as defined above for $R^{14}$ in the formulas (1-1) to (1-9).

e is preferably an integer of 1 to 8, more preferably an integer of 1 to 5, and most preferably 1 or 2.

n' is preferably 1 or 2, and is most preferably 2.

Specific examples of the structural unit represented by the formula (a1-3-01) include the structural units represented by the above formulas (a1-3-25) and (a1-3-26).

Specific examples of the structural unit represented by the formula (a1-3-02) include the structural units represented by the above formulas (a1-3-27) and (a1-3-28).

Examples of the divalent linking groups for $Y^{2'}$ and $Y^{2''}$ in the formula (a1-3-03) include the same groups as those described above for $Y^2$ in the general formula (a1-3).

$Y^{2'}$ is preferably a divalent hydrocarbon group which may have a substituent, is more preferably a linear aliphatic hydrocarbon group, and is still more preferably a linear alkylene group. Among such groups, a linear alkylene group of 1 to 5 carbon atoms is preferable, and a methylene group or ethylene group is the most desirable.

$Y^{2''}$ is preferably a divalent hydrocarbon group which may have a substituent, is more preferably a linear aliphatic hydrocarbon group, and is still more preferably a linear alkylene group. Among such groups, a linear alkylene group of 1 to 5 carbon atoms is preferable, and a methylene group or ethylene group is the most desirable.

Examples of the acid-dissociable group for X' include the same groups as those described above. X' is preferably a tertiary alkyl ester-type acid-dissociable group, and more preferably a group of type (i) described above, in which a substituent is bonded to a carbon atom within the ring structure of a monovalent aliphatic cyclic group that is bonded to the atom adjacent to the acid-dissociable group, thereby forming a tertiary carbon atom on the ring structure of the monovalent aliphatic cyclic group. Among such groups, X' is preferably a group represented by the above general formula (1-1).

w represents an integer of 0 to 3, and is preferably an integer of 0 to 2, more preferably 0 or 1, and most preferably 1.

The structural unit represented by the general formula (a1-3-03) is preferably a structural unit represented by a general formula (a1-3-03-1) or (a1-3-03-2) shown below, and among these, is most preferably a structural unit represented by the formula (a1-3-03-1).

[Chemical Formula 53]

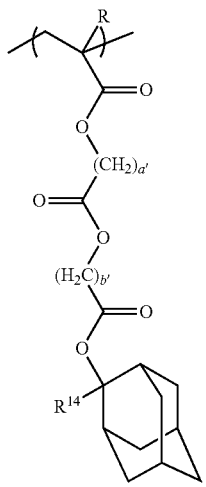
(a1-3-03-1)

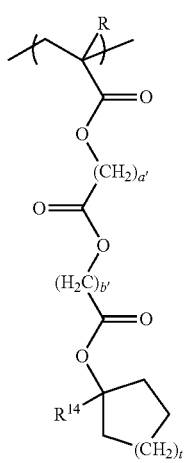
(a1-3-03-2)

In the formulas, R and R$^{14}$ are the same as defined above, a' represents an integer of 1 to 10, b' represents an integer of 1 to 10, and t represents an integer of 0 to 3.

In the formulas (a1-3-03-1) and (a1-3-03-2), a' is the same as defined above, and is preferably an integer of 1 to 8, more preferably an integer of 1 to 5, and most preferably 1 or 2.

b' is the same as defined above, and is preferably an integer of 1 to 8, more preferably an integer of 1 to 5, and most preferably 1 or 2.

t is preferably an integer of 1 to 3, and most preferably 1 or 2.

Specific examples of the structural unit represented by the formula (a1-3-03-1) or (a1-3-03-2) include the structural units represented by the above formulas (a1-3-29) to (a1-3-32).

(Structural Unit (a12), Structural Unit (a13))

In this description, the structural unit (a12) is a structural unit derived from hydroxystyrene or a hydroxystyrene derivative in which at least part of the hydroxyl group hydrogen atoms are protected with a substituent containing an acid-decomposable group.

Further, the structural unit (a13) is a structural unit derived from vinylbenzoic acid or a vinylbenzoic acid derivative in which at least part of the hydrogen atoms in the —C(=O)—OH moiety within the structural unit are protected with a substituent containing an acid-decomposable group.

In the structural unit (a12) and the structural unit (a13), examples of the substituent containing an acid-decomposable group include the tertiary alkyl ester-type acid-dissociable groups and acetal-type acid-dissociable groups described above in relation to the aforementioned structural unit (a11).

Examples of preferred forms of the structural unit (a12) and the structural unit (a13) include structural units represented by general formulas (a12-1) to (a12-4) shown below and general formula (a13-1) shown below respectively.

[Chemical Formula 54]

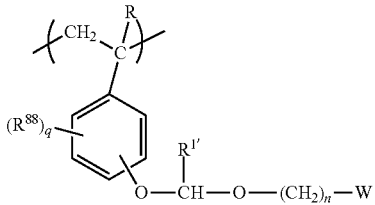
(a12-1)

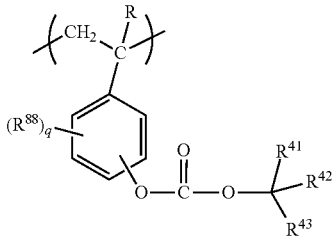
(a12-2)

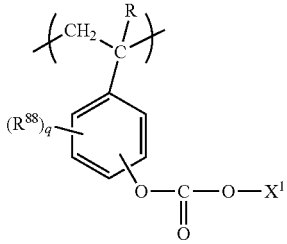
(a12-3)

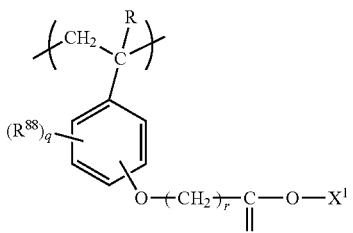
(a12-4)

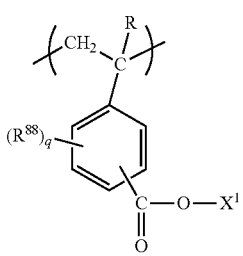
(a13-1)

In the formulas (a12-1) to (a12-4) and the formula (a13-1), R is the same as defined above, R$^{88}$ represents a halogen atom, an alkyl group of 1 to 5 carbon atoms or a halogenated alkyl group of 1 to 5 carbon atoms, q represents an integer of 0 to 4, R$^{1'}$ is the same as defined above, n represents an integer of 0 to 3, W represents an aliphatic cyclic group, an aromatic cyclic hydrocarbon group or an alkyl group of 1 to 5 carbon atoms, r represents an integer of 1 to 3, each of $R^{41}$, $R^{42}$ and $R^{43}$ independently represents a linear or branched alkyl group, and $X^1$ represents an acid-dissociable group.

In the formulas (a12-1) to (a12-4) and the formula (a13-1), the bonding position to the phenyl group of —O—$CHR^{1'}$—O—$(CH_2)_n$—W, —O—C(O)—O—$C(R^{41})(R^{42})(R^{43})$, —OC(O)—O—$X^1$, —O—$(CH_2)_r$—C(O)—O—$X^1$ and —C(O)—O—$X^1$ may be the o-position, the m-position or the p-position, but in terms of achieving superior effects for the present invention, the p-position is preferred.

$R^{88}$ represents a halogen atom, an alkyl group of 1 to 5 carbon atoms or a halogenated alkyl group of 1 to 5 carbon atoms.

Examples of the halogen atom for $R^{88}$ include a fluorine atom, chlorine atom, bromine atom and iodine atom, and a fluorine atom is preferred.

Examples of the alkyl group of 1 to 5 carbon atoms and halogenated alkyl group of 1 to 5 carbon atoms for $R^{88}$ include the same groups as those described above for the alkyl group of 1 to 5 carbon atoms and halogenated alkyl group of 1 to 5 carbon atoms for R.

When q represents 1, the substitution position for $R^{88}$ may be the o-position, the m-position or the p-position.

When q represents 2, any arbitrary combination of substitution positions may be used.

However, $1 \leq p+q \leq 5$.

q represents an integer of 0 to 4, is preferably 0 or 1, and from an industrial perspective, is most preferably 0.

n represents an integer of 0 to 3, preferably an integer of 0 to 2, more preferably 0 or 1, and most preferably 0.

The aliphatic cyclic group for W is a monovalent aliphatic cyclic group. The aliphatic cyclic group may, for example, be selected appropriately from the multitude of aliphatic cyclic groups that have been proposed for use with conventional ArF resists. Specific examples of the aliphatic cyclic group include aliphatic monocyclic groups of 5 to 7 carbon atoms, and aliphatic polycyclic groups of 10 to 16 carbon atoms.

The aliphatic cyclic group may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms and an oxygen atom (=O).

The basic ring structure of the aliphatic cyclic group excluding substituents is not limited to structures constituted of only carbon and hydrogen (not limited to hydrocarbon groups), and for example, the ring structure may include an oxygen atom or the like.

Examples of the aliphatic monocyclic group of 5 to 7 carbon atoms include groups in which one hydrogen atom has been removed from a monocycloalkane, and specific examples include groups in which one hydrogen atom has been removed from cyclopentane or cyclohexane or the like.

Examples of the aliphatic polycyclic group of 10 to 16 carbon atoms include groups in which one hydrogen atom has been removed from a bicycloalkane, tricycloalkane or tetracycloalkane or the like. Specific examples include groups in which one hydrogen atom has been removed from a polycycloalkane such as adamantane, norbornane, isobornane, tricyclodecane or tetracyclododecane. Among these, an adamantyl group, norbornyl group or tetracyclododecyl group is preferably industrially, and an adamantyl group is particularly desirable.

Examples of the aromatic cyclic hydrocarbon group for W include aromatic polycyclic groups of 10 to 16 carbon atoms. Specific examples include groups in which one hydrogen atom has been removed from naphthalene, anthracene, phenanthrene or pyrene or the like. Specific examples include a 1-naphthyl group, 2-naphthyl group, 1-anthryl group, 2-anthryl group, 1-phenanthryl group, 2-phenanthryl group, 3-phenanthryl group or 1-pyrenyl group, and of these, a 2-naphthyl group is preferred industrially.

Examples of the alkyl group of 1 to 5 carbon atoms for W include the same groups as those described above for the alkyl group of 1 to 5 carbon atoms which may be bonded to the α-position of the aforementioned hydroxystyrene, and of these, a methyl group or ethyl group is preferred, and an ethyl group is the most desirable.

Each of $R^{41}$ to $R^{43}$ preferably represents an alkyl group of 1 to 5 carbon atoms, and more preferably an alkyl group of 1 to 3 carbon atoms. Specific examples include the same alkyl group of 1 to 5 carbon atoms described above for R.

The acid-dissociable group for $X^1$ is the same as defined above for the acid-dissociable group for $X^1$ in the formula (a11-0-1).

r is preferably 1 or 2, and most preferably 1.

Among the structural unit (a12) and the structural unit (a13), the structural unit (a12) is preferable, and a structural unit represented by the general formula (a12-1) or the general formula (a12-4) is particularly desirable.

Specific examples of preferred units for the structural unit (a12) are shown below.

[Chemical Formula 55]

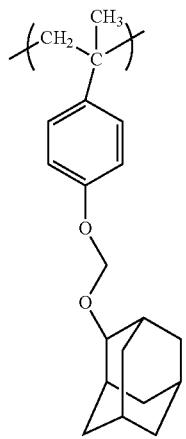

(a12-1-1)

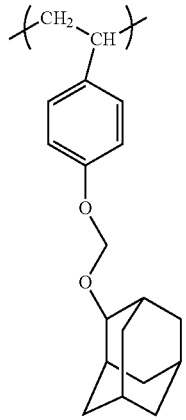

(a12-1-2)

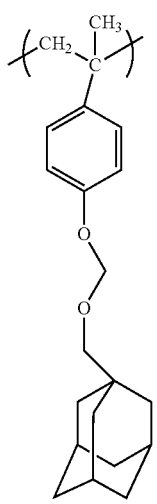 (a12-1-3)
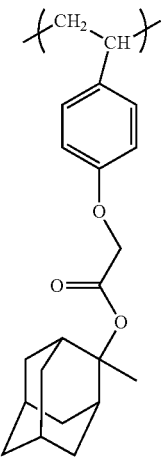 (a12-1-6)
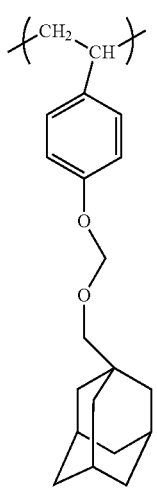 (a12-1-4)
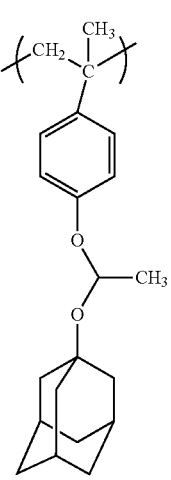 (a12-1-7)
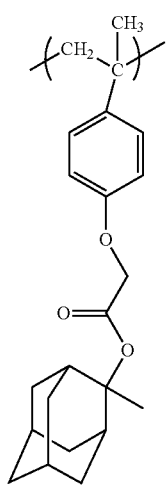 (a12-1-5)
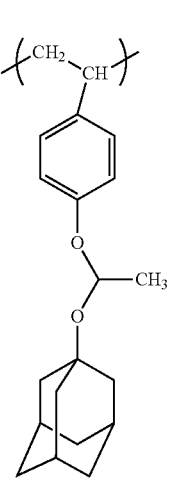 (a12-1-8)

-continued

[Chemical Formula 56]

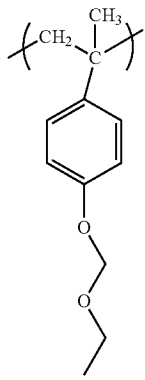

(a12-1-9)

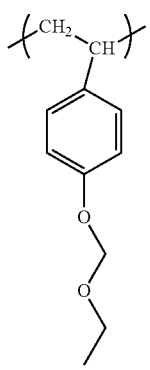

(a12-1-10)

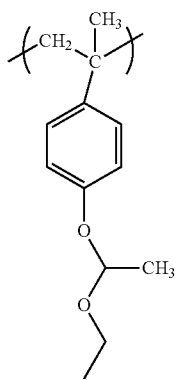

(a12-1-11)

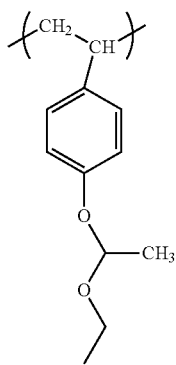

(a12-1-12)

The structural unit (a12) is preferably at least one structural unit selected from among the above chemical formulas (a12-1-1) to (a12-1-12), and is most preferably a structural unit of one of the chemical formulas (a12-1-1), (a12-1-2) and (a12-1-5) to (a12-1-12).

The structural unit (a1) within the component (A1) may be a single type of structural unit, or a combination of two or more types.

Among the above possibilities, the structural unit (a1)) is preferably a structural unit (a11) derived from an acrylate ester in which the hydrogen atom bonded to the carbon atom on the α-position may be substituted with a substituent.

In those cases where the component (A1) contains two or more types of the structural unit (a1), a combination of two or more types of structural units having an aforementioned tertiary alkyl ester-type acid-dissociable group is preferred, and a combination of two or more types of structural units having a group of type (i) described above, in which a substituent (an atom other than a hydrogen atom or a group) is bonded to a carbon atom within the ring structure of a monovalent aliphatic cyclic group that is bonded to the atom adjacent to the acid-dissociable group (for example, the —O— in —C(=O)—O—), thereby forming a tertiary carbon atom on the ring structure of the monovalent aliphatic cyclic group, is particularly desirable.

The amount of the structural unit (a1) within the component (A1), based on the combined total of all the structural units that constitute the component (A1), is preferably within a range from 15 to 70 mol %, more preferably from 15 to 60 mol %, and still more preferably from 20 to 55 mol %.

When the amount of the structural unit (a1) is at least as large as the lower limit of the above range, a pattern can be formed easily using a resist composition prepared from the component (A1), and the lithography properties such as the sensitivity, the resolution and LWR also improve. On the other hand, when the amount of the structural unit (a1) is not more than the upper limit of the above range, a good balance can be more easily achieved with the other structural units.

[Structural Unit (a0)]

The structural unit (a0) is a structural unit derived from an acrylate ester in which the hydrogen atom bonded to the carbon atom on the α-position may be substituted with a substituent and containing an —SO$_2$-containing cyclic group.

By including an —SO$_2$-containing cyclic group, the structural unit (a0) enhances the adhesion between the substrate and a resist film formed using a resist composition containing the component (A1). Further, the structural unit (a0) also contributes to improvements in the lithography properties such as the sensitivity, resolution, exposure latitude (EL margin), line width roughness (LWR), line edge roughness (LER) and mask reproducibility.

In this description, the term "—SO$_2$-containing cyclic group" refers to a cyclic group which includes a ring containing an —SO$_2$— moiety within the ring structure, and specifically refers to a cyclic group in which the sulfur atom (S) of the —SO$_2$— forms a part of the ring structure of the cyclic group.

In the —SO$_2$-containing cyclic group, the ring containing the —SO$_2$— moiety within the ring structure is counted as the first ring, and groups containing only the first ring are referred to as monocyclic groups, whereas groups containing other ring structures are described as polycyclic groups regardless of the structure of the other rings.

The —SO$_2$-containing cyclic group may be either monocyclic or polycyclic.

The —SO$_2$-containing cyclic group is preferably a cyclic group containing an —O—SO$_2$-moiety within the ring structure, namely a cyclic group containing a sultone ring in which the —O—S— within the —O—SO$_2$— forms a part of the ring structure of the cyclic group.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring structure, and does not include carbon atoms contained within substituents.

The —$SO_2$-containing cyclic group may be an —$SO_2$-containing aliphatic cyclic group or an —$SO_2$-containing aromatic cyclic group. An —$SO_2$-containing aliphatic cyclic group is preferred.

Examples of the —$SO_2$-containing aliphatic cyclic group include groups in which at least one hydrogen atom has been removed from an aliphatic hydrocarbon ring in which part of the carbon atoms that constitute the ring structure have been substituted with either —$SO_2$— or —O—$SO_2$—. More specific examples include groups in which at least one hydrogen atom has been removed from an aliphatic hydrocarbon ring in which a —$CH_2$— moiety that constitutes part of the ring structure has been substituted with an —$SO_2$— moiety, and groups in which at least one hydrogen atom has been removed from an aliphatic hydrocarbon ring in which a —$CH_2$—$CH_2$— moiety that constitutes part of the ring structure has been substituted with an —O—$SO_2$— moiety.

The alicyclic hydrocarbon group preferably contains 3 to 20 carbon atoms, and more preferably 3 to 12 carbon atoms.

The alicyclic hydrocarbon group may be either polycyclic or monocyclic. As the monocyclic alicyclic hydrocarbon group, groups in which two hydrogen atoms have been removed from a monocycloalkane of 3 to 6 carbon atoms are preferable, and specific examples of such monocycloalkanes include cyclopentane and cyclohexane. As the polycyclic alicyclic hydrocarbon group, groups in which two hydrogen atoms have been removed from a polycycloalkane of 7 to 12 carbon atoms are preferable, and specific examples of such polycycloalkanes include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (═O), —COOR", —OC(═O)R" (wherein R" represents a hydrogen atom or an alkyl group), hydroxyalkyl group and cyano group.

The alkyl group for the substituent is preferably an alkyl group of 1 to 6 carbon atoms. The alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. The alkoxy group is preferably a linear or branched group. Specific examples include groups in which an oxygen atom (—O—) is bonded to any of the alkyl groups described above as the substituent.

Examples of the halogen atom for the substituent include a fluorine atom, chlorine atom, bromine atom and iodine atom, and a fluorine atom is preferable. Examples of the halogenated alkyl group for the substituent include groups in which part or all of the hydrogen atoms within the aforementioned alkyl groups has been substituted with the aforementioned halogen atoms.

As examples of the halogenated lower alkyl group for the substituent, groups in which part or all of the hydrogen atoms of the aforementioned alkyl groups for the substituent have been substituted with the aforementioned halogen atoms can be given. As the halogenated alkyl group, a fluorinated alkyl group is preferable, and a perfluoroalkyl group is particularly desirable.

In the aforementioned —COOR" group and —OC(═O)R" group, R" preferably represents a hydrogen atom, or a linear, branched or cyclic alkyl group of 1 to 15 carbon atoms.

In those cases where R" represents a linear or branched alkyl group, the alkyl group preferably contains 1 to 10 carbon atoms, and more preferably 1 to 5 carbon atoms, and is most preferably a methyl group or ethyl group.

In those cases where R" is a cyclic alkyl group, the cycloalkyl group preferably contains 3 to 15 carbon atoms, more preferably 4 to 12 carbon atoms, and most preferably 5 to 10 carbon atoms.

The hydroxyalkyl group for the substituent preferably contains 1 to 6 carbon atoms, and specific examples include groups in which at least one hydrogen atom within an aforementioned alkyl group substituent has been substituted with a hydroxyl group.

More specific examples of the —$SO_2$-containing cyclic group include groups represented by general formulas (3-1) to (3-4) shown below.

[Chemical Formula 57]

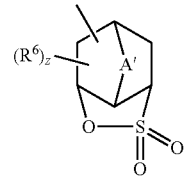

(3-1)

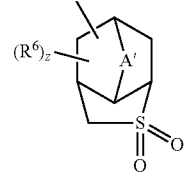

(3-2)

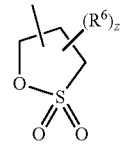

(3-3)

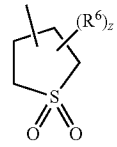

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^6$ represents an alkyl group, alkoxy group, halogenated alkyl group, hydroxyl group, —COOR", —OC(═O)R", hydroxyalkyl group or cyano group, wherein R" represents a hydrogen atom or an alkyl group.

In the above general formulas (3-1) to (3-4), A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms for A', a linear or branched alkylene group is preferable, and specific examples include a methylene group, ethylene group, n-propylene group and isopropylene group.

Examples of the alkylene groups which contain an oxygen atom or a sulfur atom include the aforementioned alkylene groups in which —O— or —S— is either bonded to the terminal of the alkylene group or interposed between carbon atoms of the alkylene group. Specific examples of such alkylene groups include —O—$CH_2$—, —$CH_2$—O—$CH_2$—, —S—$CH_2$— and —$CH_2$—S—$CH_2$—.

A' is preferably an alkylene group of 1 to 5 carbon atoms or —O—, more preferably an alkylene group of 1 to 5 carbon atoms, and most preferably a methylene group.

z represents an integer of 0 to 2, and is most preferably 0.

When z is 2, the plurality of $R^6$ groups may be the same or different.

Examples of the alkyl group, alkoxy group, halogenated alkyl group, —COOR" group, —OC(=O)R" group and hydroxyalkyl group for $R^6$ include the same alkyl groups, alkoxy groups, halogenated alkyl groups, —COOR" groups, —OC(=O)R" groups and hydroxyalkyl groups as those described above for the substituent which the —$SO_2$-containing cyclic group may have.

Specific examples of the cyclic groups represented by the general formulas (3-1) to (3-4) are shown below. In the formulas shown below, "Ac" represents an acetyl group.

[Chemical Formula 58]

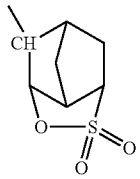
(3-1-1)

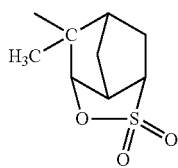
(3-1-2)

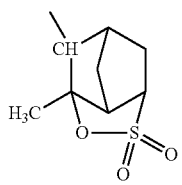
(3-1-3)

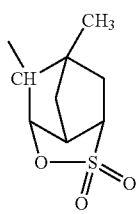
(3-1-4)

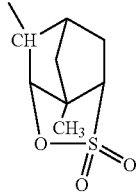
(3-1-5)

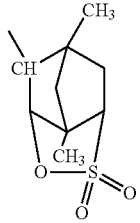
(3-1-6)

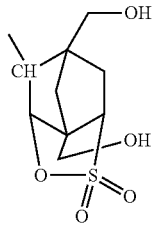
(3-1-7)

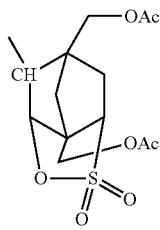
(3-1-8)

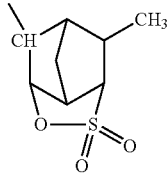
(3-1-9)

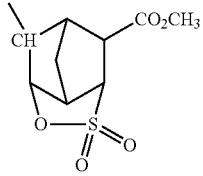
(3-1-10)

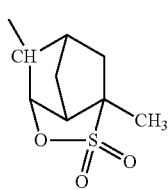
(3-1-11)

(3-1-12)
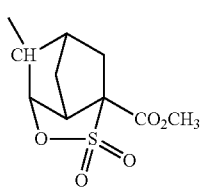
[Chemical Formula 59]
(3-1-13)
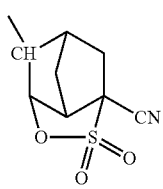
(3-1-14)
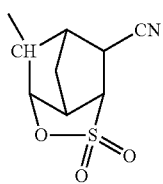
(3-1-15)
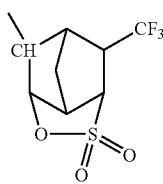
(3-1-16)
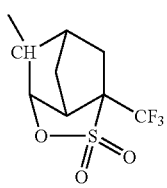
(3-1-17)
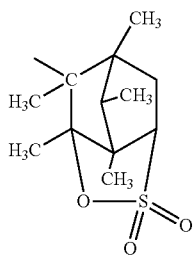
[Chemical Formula 60]
(3-1-18)
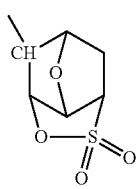
(3-1-19)
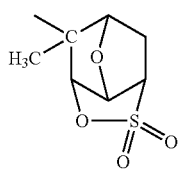
(3-1-20)
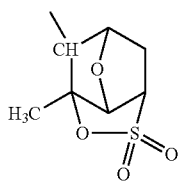
(3-1-21)
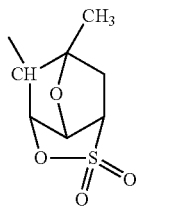
(3-1-22)
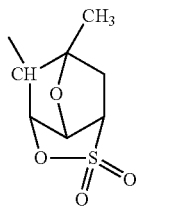
(3-1-23)
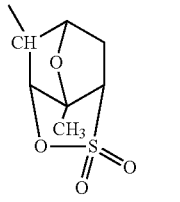
(3-1-24)
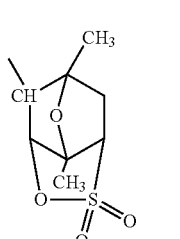
(3-1-25)
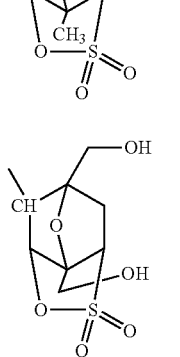
[Chemical Formula 61]
(3-1-26)
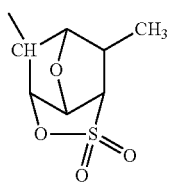

-continued (3-1-27) 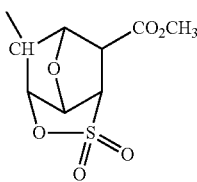

(3-1-28) 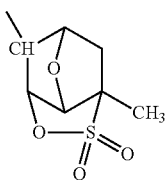

(3-1-29) 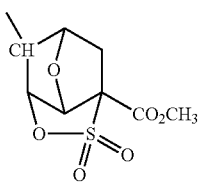

(3-1-30) 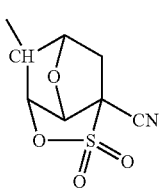

(3-1-31) 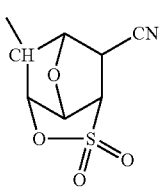

(3-1-32) 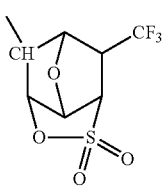

(3-1-33) 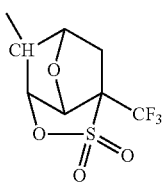

[Chemical Formula 62]

(3-2-1) 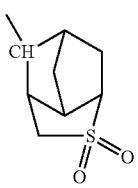

-continued (3-2-2) 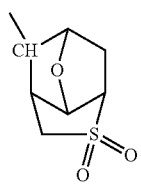

(3-3-1) 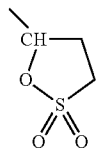

(3-4-1) 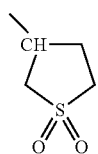

Of the groups shown above, the —$SO_2$-containing cyclic group is preferably a group represented by the general formula (3-1), (3-3) or (3-4), more preferably at least one group selected from the group consisting of groups represented by the above chemical formulas (3-1-1), (3-1-18), (3-3-1) and (3-4-1), and most preferably a group represented by the chemical formula (3-1-1).

More specific examples of the structural unit (a0) include structural units represented by a general formula (a0-0) shown below.

[Chemical Formula 63]

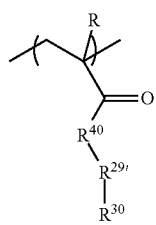

(a0-0)

In the formula, R represents a hydrogen atom, an alkyl group of 1 to 5 carbon atoms or a halogenated alkyl group of 1 to 5 carbon atoms, $R^{40}$ represents —O— or —NH—, $R^{30}$ represents an —$SO_2$-containing cyclic group, and $R^{29'}$ represents a single bond or a divalent linking group.

In the formula (a0-0), R is the same as defined above for R in the general formula (a11-0-1).

In the formula (a0-0), $R^{30}$ is the same as the —$SO_2$-containing cyclic group described above.

$R^{29'}$ may be either a single bond or a divalent linking group. A divalent linking group is preferable in terms of achieving improved lithography properties.

Examples of the divalent linking group for $R^{29'}$ include the same divalent linking groups as those described above for $Y^2$ in the general formula (a11-0-2) within the description relating to the aforementioned structural unit (a1).

The divalent linking group for $R^{29'}$ is preferably an alkylene group, a divalent alicyclic hydrocarbon group, or a divalent linking group containing a hetero atom. Among these, an alkylene group or a divalent linking group containing an ester linkage (—C(=O)—O—) is preferred.

The alkylene group is preferably a linear or branched alkylene group. Specific examples include the same groups as the linear alkylene groups and branched alkylene groups described above as the aliphatic hydrocarbon group for $Y^2$.

As the divalent linking group containing an ester linkage, groups represented by a general formula: —$R^{20}$—C(=O)—O— (wherein $R^{20}$ represents a divalent linking group) are preferred. In other words, the structural unit (a0) is preferably a structural unit represented by a general formula (a0-0-1) shown below.

[Chemical Formula 64]

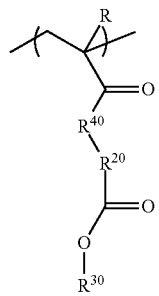

(a0-0-1)

In the formula, R represents a hydrogen atom, an alkyl group of 1 to 5 carbon atoms or a halogenated alkyl group of 1 to 5 carbon atoms, $R^{40}$ represents —O— or —NH—, $R^{20}$ represents a divalent linking group, and $R^{30}$ represents an —$SO_2$-containing cyclic group.

There are no particular limitations on $R^{20}$, and examples include the same groups as the divalent linking groups described above for $R^{29'}$ in the aforementioned general formula (a0-0).

As the divalent linking group for $R^{20}$, a linear or branched alkylene group, a divalent alicyclic hydrocarbon group, or a divalent linking group containing a hetero atom is preferred.

Examples of the linear or branched alkylene group, divalent alicyclic hydrocarbon group, and divalent linking group containing a hetero atom include the same linear or branched alkylene groups, divalent alicyclic hydrocarbon groups, and divalent linking groups containing a hetero atom as those described above as preferred groups for $R^{29'}$.

Of the above groups, a linear or branched alkylene group, or a divalent linking group containing an oxygen atom as a hetero atom is preferred.

As the linear alkylene group, a methylene group or ethylene group is preferred, and a methylene group is particularly desirable.

As the branched alkylene group, an alkylmethylene group or alkylethylene group is preferred, and —CH(CH$_3$)—, —C(CH$_3$)$_2$— and —C(CH$_3$)$_2$CH$_2$— are particularly desirable.

The divalent linking group containing an oxygen atom is preferably a divalent linking group containing an ether linkage or an ester linkage, and is more preferably a group represented by one of the formulas —$Y^{21}$—O—$Y^{22}$—, —[$Y^{21}$—C(=O)—O]$_{m'}$—$Y^{22}$— and —$Y^{21}$—O—C(=O)—$Y^{22}$—. $Y^{21}$, $Y^{22}$, and m' are each the same as defined above.

Of these groups, a group represented by the formula —$Y^{21}$—O—C(=O)—$Y^{22}$— is preferred, and a group represented by a formula —(CH$_2$)$_c$—O—C(=O)—(CH$_2$)$_d$— is particularly desirable. c represents an integer of 1 to 5, preferably an integer of 1 to 3, and more preferably 1 or 2. d represents an integer of 1 to 5, preferably an integer of 1 to 3, and more preferably 1 or 2.

As the structural unit (a0), a structural unit represented by a general formula (a0-0-11) or (a0-0-12) shown below is preferred, and a structural unit represented by the formula (a0-0-12) is particularly desirable.

[Chemical Formula 65]

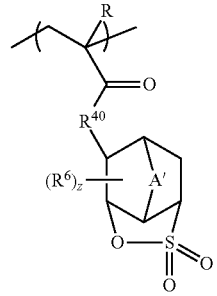

(a0-0-11)

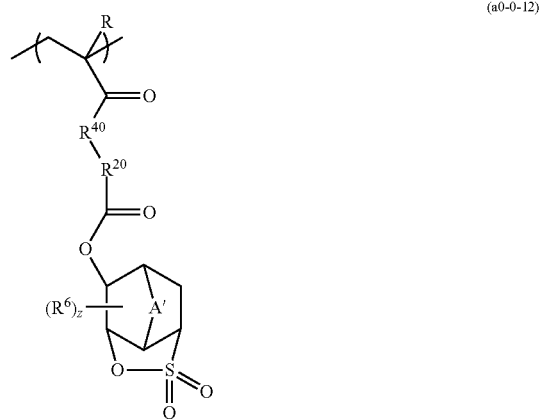

(a0-0-12)

In the formulas, R, $R^{40}$, A', $R^6$, z and $R^{20}$ are each the same as defined above.

In the formula (a0-0-11), A' is preferably a methylene group, an ethylene group, an oxygen atom (—O—) or a sulfur atom (—S—).

$R^{20}$ is preferably a linear or branched alkylene group, or a divalent linking group containing an oxygen atom. Examples of the linear or branched alkylene group, and the divalent linking group containing an oxygen atom for $R^{20}$ include the same linear or branched alkylene groups and divalent linking groups containing an oxygen atom as those described above.

As the structural unit represented by the formula (a0-0-12), a structural unit represented by a general formula (a0-0-12a) or (a0-0-12b) shown below is particularly desirable.

[Chemical Formula 66]

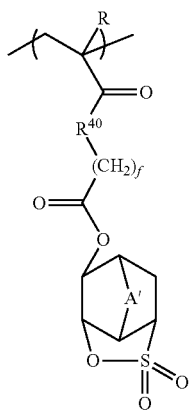
(a0-0-12a)

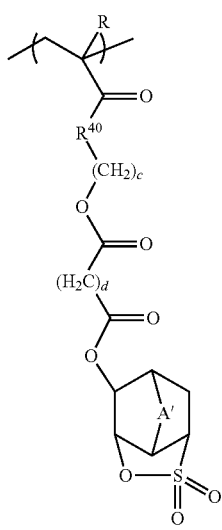
(a0-0-12b)

In the formulas, R, $R^{40}$ and A' are each the same as defined above, c and d are each the same as defined above, and f represents an integer of 1 to 5 (and preferably an integer of 1 to 3).

The structural unit (a0) contained within the component (A1) may be a single type of structural unit or a combination of two or more types.

The amount of the structural unit (a0) within the component (A1), based on the combined total of all the structural units that constitute the component (A1), is preferably within a range from 1 to 60 mol %, more preferably from 5 to 55 mol %, still more preferably from 10 to 50 mol %, and most preferably from 15 to 48 mol %, as an amount within this range yields a superior pattern shape for a resist pattern formed using a resist composition containing the component (A1), and the lithography properties such as the EL margin, LWR and mask reproducibility are also excellent.

[Structural Unit (a2)]

The structural unit (a2) is a structural unit containing a lactone-containing cyclic group.

In this description, the term "lactone-containing cyclic group" refers to a cyclic group including a ring (lactone ring) containing an —O—C(=O)— moiety. The lactone ring is counted as the first ring, and a lactone-containing cyclic group in which the only ring structure is the lactone ring is referred to as a monocyclic group, and groups containing other ring structures are described as polycyclic groups regardless of the structure of the other rings.

When the component (A1) is used in forming a resist film, the lactone-containing cyclic group of the structural unit (a2) is effective in improving the adhesion between the resist film and the substrate, and is also effective in improving the compatibility of the resist with developing solutions containing water (particularly in the case of an alkali developing process).

There are no particular limitations on the structural unit (a2), and an arbitrary structural unit may be used.

Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

The structural unit (a2) is preferably a structural unit derived from an acrylate ester in which the hydrogen atom bonded to the carbon atom on the α-position may be substituted with a substituent.

More specific examples of the structural unit (a2) include structural units represented by general formulas (a2-1) to (a2-7) shown below.

[Chemical Formula 67]

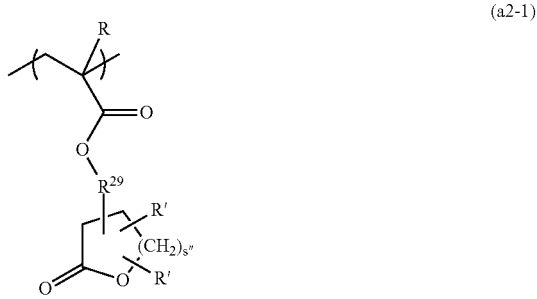
(a2-1)

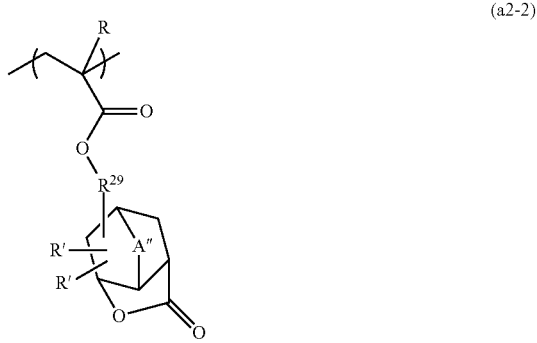
(a2-2)

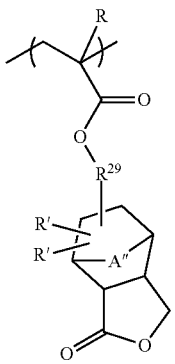
(a2-3)

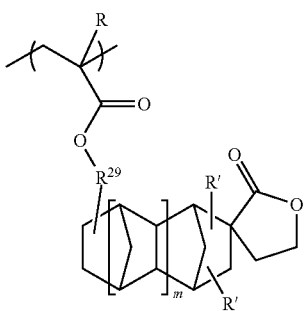
(a2-4)

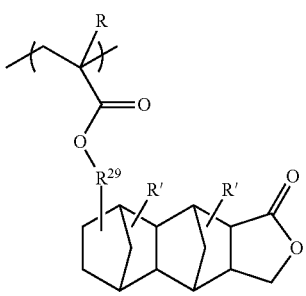
(a2-5)

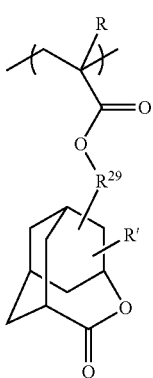
(a2-6)

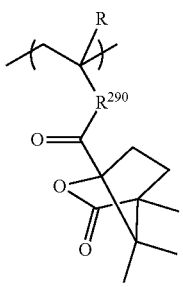
(a2-7)

In the above formulas, R represents a hydrogen atom, a lower alkyl group or a halogenated lower alkyl group, each R' independently represents a hydrogen atom, an alkyl group of 1 to 5 carbon atoms, an alkoxy group of 1 to 5 carbon atoms or —COOR'', wherein R'' represents a hydrogen atom or an alkyl group, $R^{29}$ represents a single bond or a divalent linking group, s'' represents 0 or an integer of 1 or 2, A'' represents an oxygen atom, a sulfur atom or an alkylene group of 1 to 5 carbon atoms which may contain an oxygen atom or a sulfur atom, m represents an integer of 0 or 1, and $R^{290}$ represents a divalent linking group.

In the general formulas (a2-1) to (a2-7), R is the same as defined above for R in the structural units (a11) to (a13).

In the general formulas (a2-1) to (a2-6), examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

In terms of factors such as ease of industrial availability, R' is preferably a hydrogen atom.

R'' preferably represents a hydrogen atom or a linear, branched or cyclic alkyl group of 1 to 15 carbon atoms.

When R'' is a linear or branched alkyl group, the alkyl group preferably contains 1 to 10 carbon atoms, and more preferably 1 to 5 carbon atoms.

When R'' is a cyclic alkyl group, the cycloalkyl group preferably contains 3 to 15 carbon atoms, more preferably 4 to 12 carbon atoms, and most preferably 5 to 10 carbon atoms.

A'' is preferably an alkylene group of 1 to 5 carbon atoms, or —O—, is more preferably an alkylene group of 1 to 5 carbon atoms, and is most preferably a methylene group.

$R^{29}$ represents a single bond or a divalent linking group. Examples of the divalent linking group include the same divalent linking groups as those described above within the description of $Y^2$ in the aforementioned general formula (a11-0-2), and of these groups, an alkylene group, an ester linkage (—C(=O)—O—) or a combination thereof is preferred. The alkylene group for the divalent linking group for $R^{29}$ is preferably a linear or branched alkylene group. Specific examples include the same groups as the linear alkylene groups and branched alkylene groups described above for the aliphatic hydrocarbon group for $Y^2$.

s'' is preferably an integer of 1 or 2.

The divalent linking group for $R^{290}$ is the same as defined above for the divalent linking group described for $A^0$, and is preferably a divalent linking group containing a hetero atom. Of such groups, $R^{290}$ is preferably a group represented by —C(=O)—$X^0$—$Y^{21}$—$X^0$— or —$B^0$—$X^0$—, is more preferably a group represented by —C(=O)—$X^0$—$(CH_2)_{n01}$—$X^0$— (wherein n01 is an integer of 2 or greater, and preferably an integer of 2 to 10) or —$B^0$—$X^0$—, and is still more preferably a group represented by —C(=O)—O—$(CH_2)_{n01}$—O— or —$B^0$—O—. In the above formulas, $Y^{21}$ is the same as defined above for $Y^{21}$ in the description relating to the "divalent linking group containing a hetero atom" for $A^0$, each $X^0$ independently represents —O—, —$NR^{04}$— (wherein $R^{04}$ represents a hydrogen atom or a hydrocarbon group which may have a substituent), —S— or —$SO_2$—O—, and each $B^0$ independently represents an aromatic hydrocarbon group. When a plurality of $X^0$ groups exist within a single formula, the $X^0$ groups may be the same or different.

Specific examples of the structural units represented by the above general formulas (a2-1) to (a2-7) are shown below.

In each of the following formulas, $R^\alpha$ represents a hydrogen atom, a methyl group or a trifluoromethyl group. $X^0$ and n01 are the same as defined above. l01 represents an integer of 1 to 5, and preferably an integer of 1 to 3. m01 represents an integer of 2 or greater, and is preferably an integer of 2 to 10. When a plurality of m01 labels exist within a single formula, the m01 labels may be the same or different.
[Chemical Formula 68]
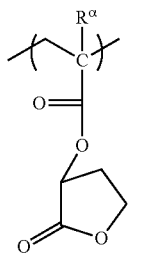 (a2-1-1)
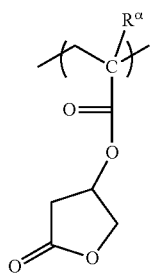 (a2-1-2)
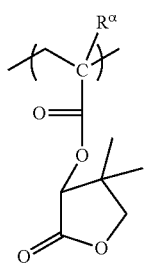 (a2-1-3)
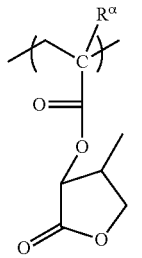 (a2-1-4)
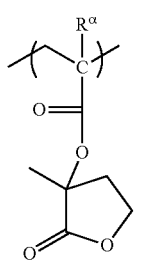 (a2-1-5)
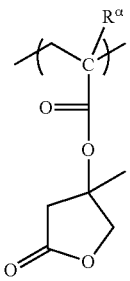 (a2-1-6)
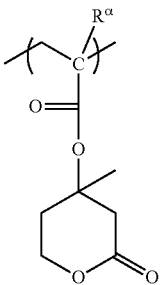 (a2-1-7)
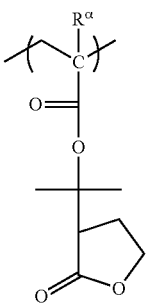 (a2-1-8)
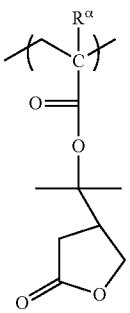 (a2-1-9)
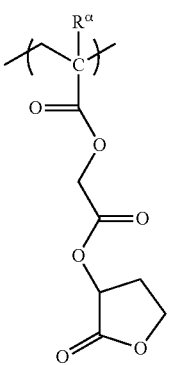 (a2-1-10)

(a2-1-11)
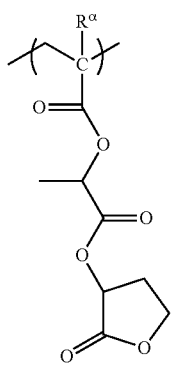
(a2-1-12)
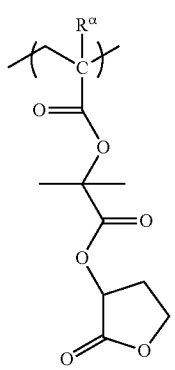
(a2-1-13)
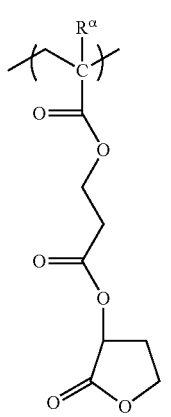
[Chemical Formula 69]
(a2-2-1)
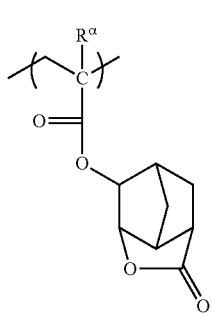
(a2-2-2)
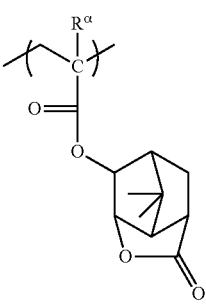
(a2-2-3)
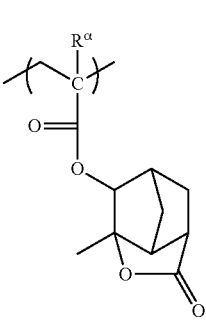
(a2-2-4)
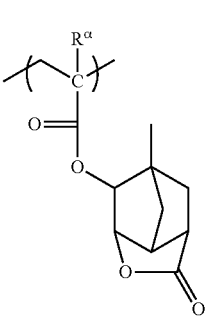
(a2-2-5)
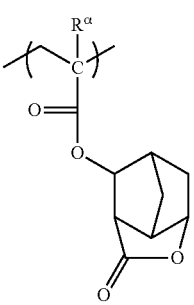
(a2-2-6)
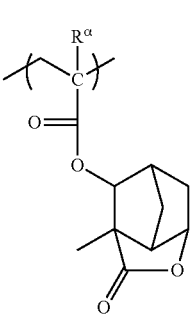

(a2-2-7)
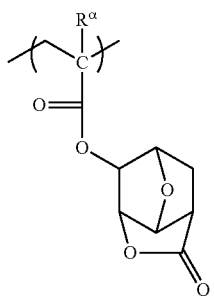
(a2-2-8)
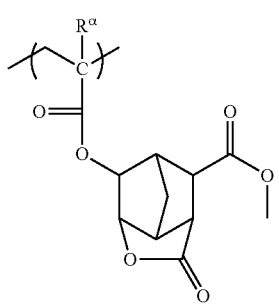
(a2-2-9)
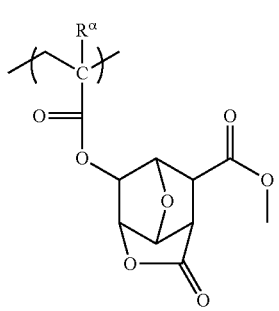
(a2-2-10)
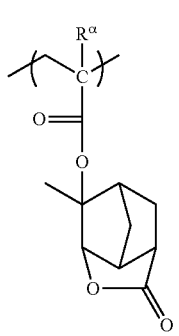
(a2-2-11)
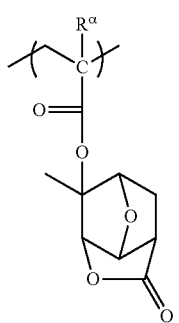
(a2-2-12)
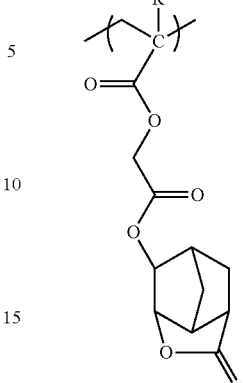
(a2-2-13)
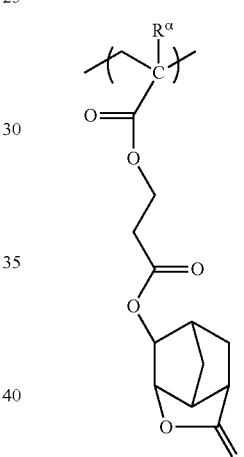
(a2-2-14)
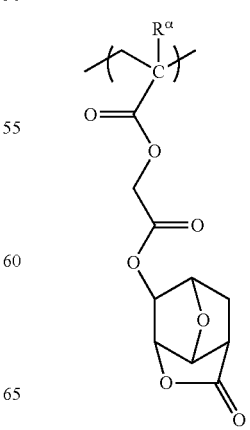

-continued
(a2-2-15)
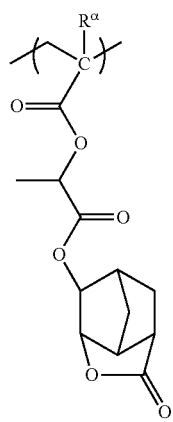
(a2-2-16)
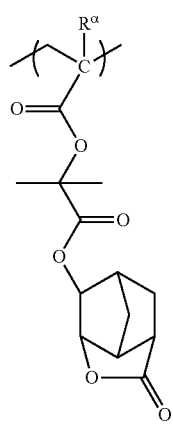
(a2-2-17)
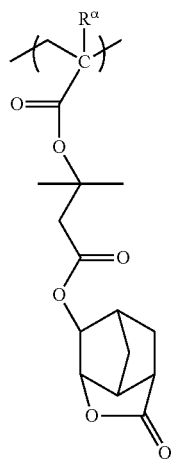
[Chemical Formula 70]
(a2-3-1)
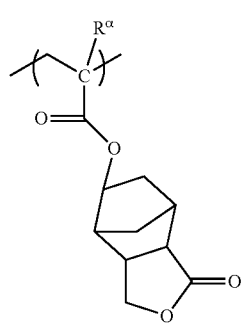
-continued
(a2-3-2)
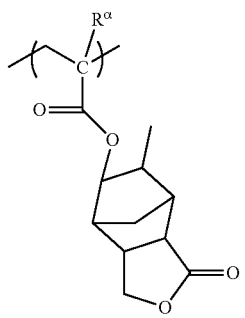
(a2-3-3)
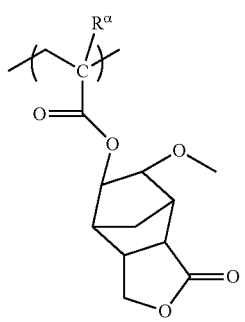
(a2-3-4)
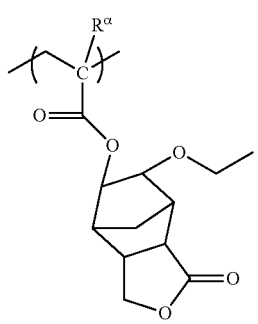
(a2-3-5)
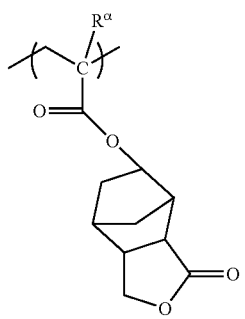
[Chemical Formula 71]
(a2-4-1)

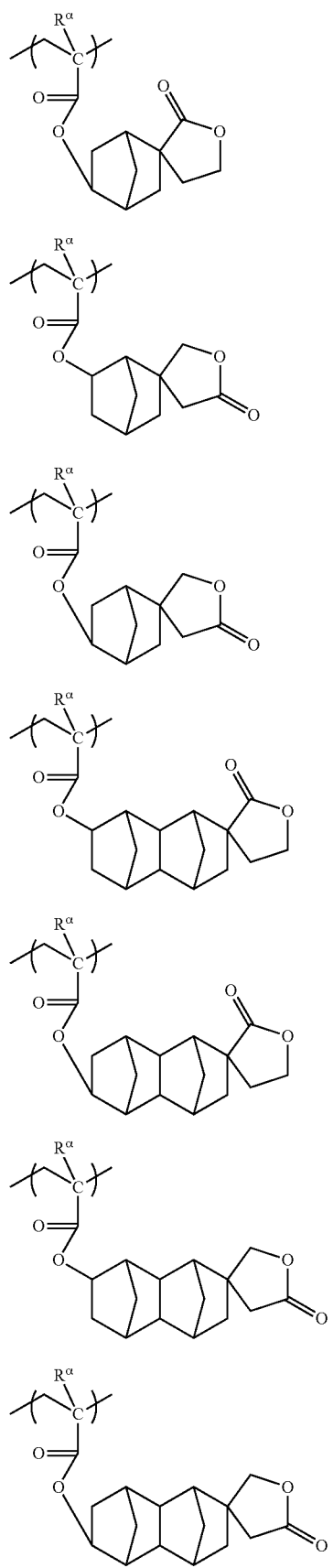
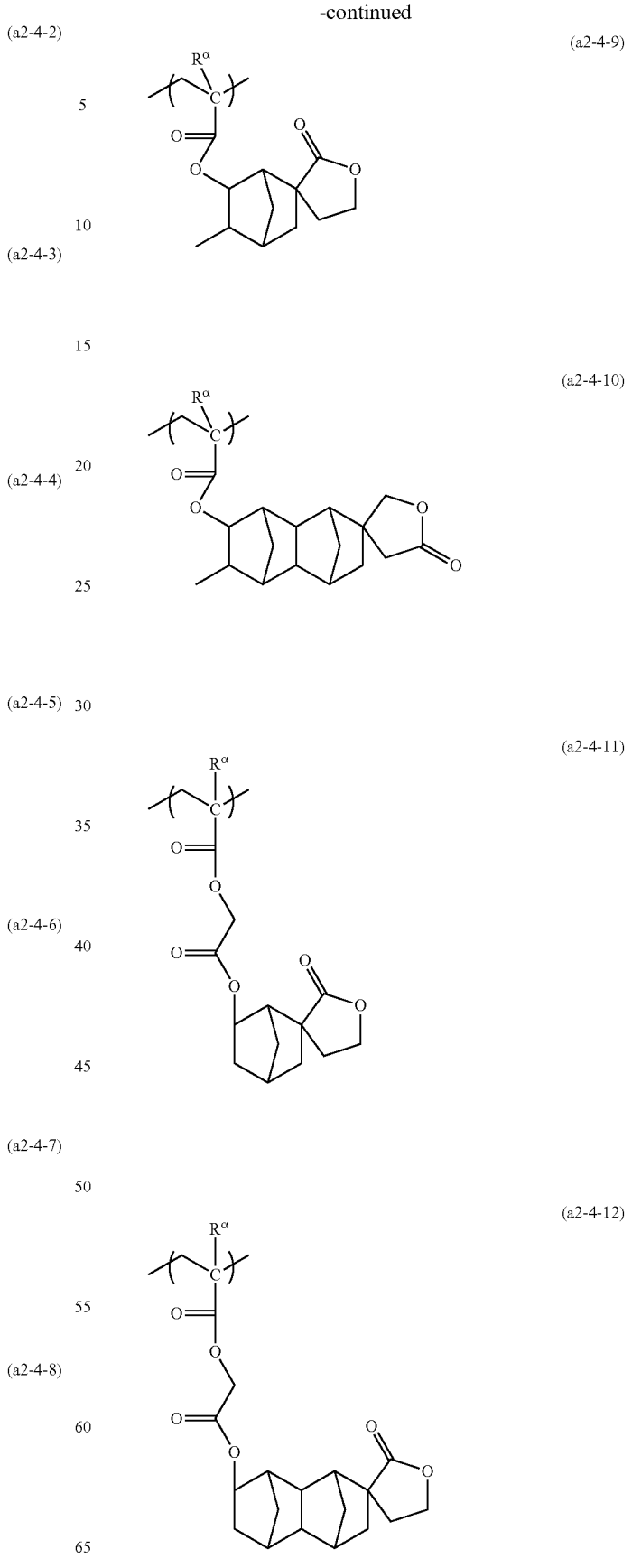

[Chemical Formula 72]
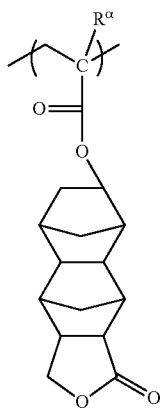 (a2-5-1)
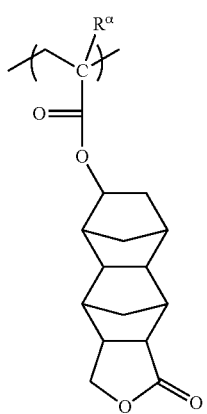 (a2-5-2)
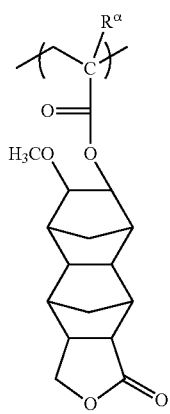 (a2-5-3)
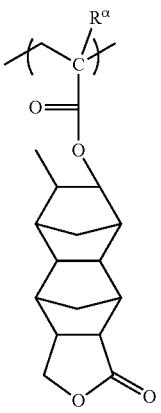 (a2-5-4)
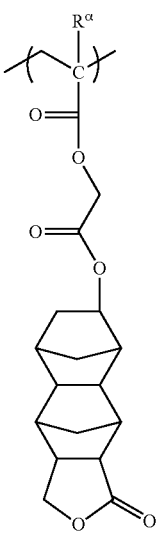 (a2-5-5)
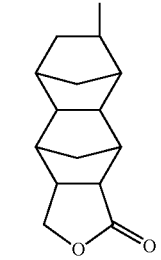 (a2-5-6)

[Chemical Formula 73]
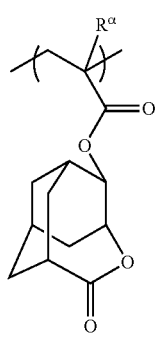
(a2-6-1)
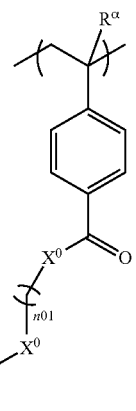
(a2-7-3)
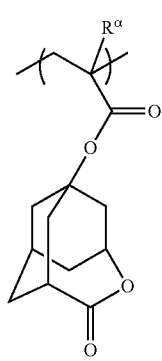
(a2-6-2)
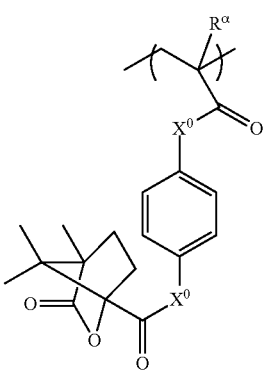
(a2-7-4)
[Chemical Formula 74]
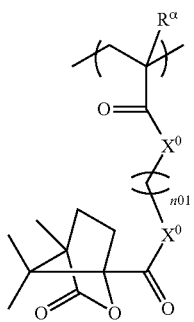
(a2-7-1)
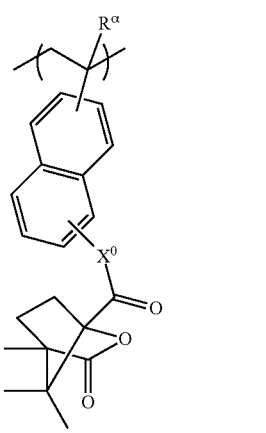
(a2-7-5)
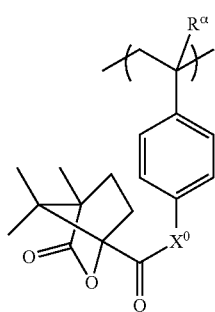
(a2-7-2)
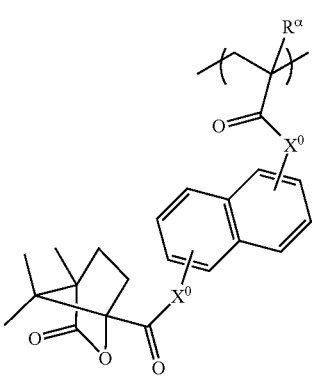
(a2-7-6)

[Chemical Formula 75]

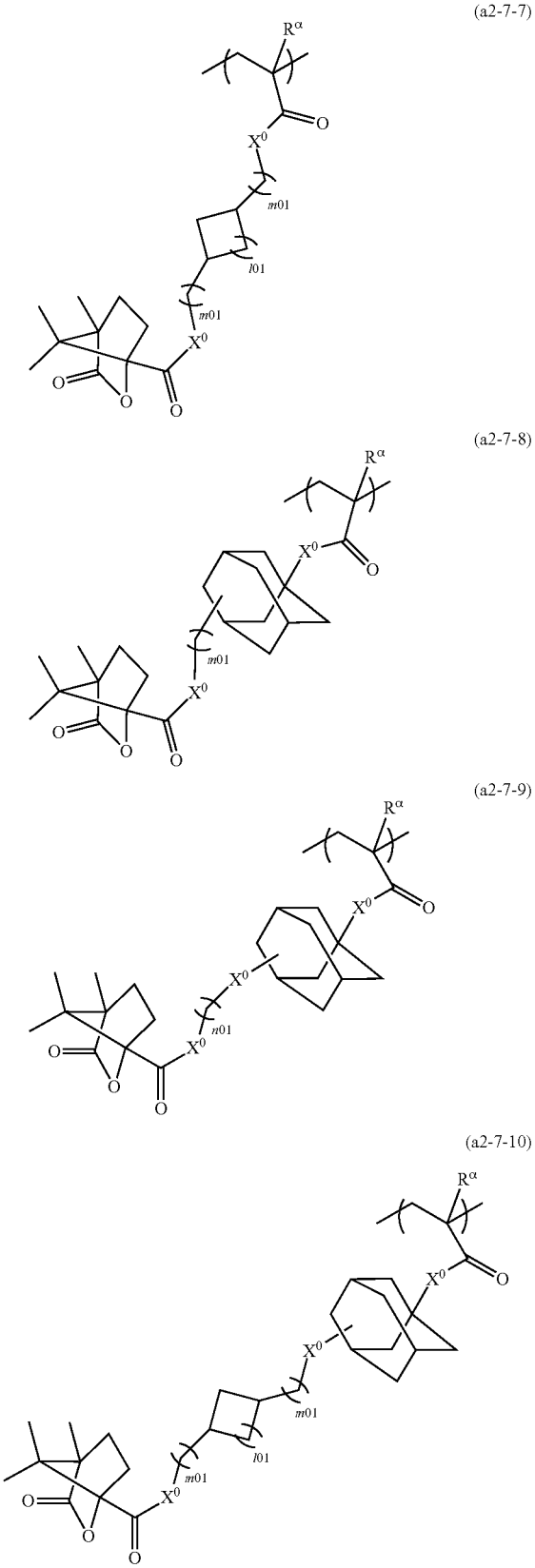

(a2-7-7)
(a2-7-8)
(a2-7-9)
(a2-7-10)

The structural unit (a2) contained within the component (A1) may be either a single type of structural unit or a combination of two or more types.

The structural unit (a2) is preferably at least one structural unit selected from the group consisting of structural units represented by the general formulas (a2-1) to (a2-7), and is more preferably at least one structural unit selected from the group consisting of structural units represented by the general formulas (a2-1), (a2-2), (a2-6) and (a2-7). Among these, the structural unit (a2) is preferably at least one structural unit selected from the group consisting of structural units represented by the above chemical formulas (a2-1-1), (a2-1-2), (a2-2-1) and (a2-2-7).

When a structural unit represented by the general formula (a2-6) is used as the structural unit (a2), the glass transition temperature of the resin tends not to decrease as much as that observed when a structural unit containing a lactone-containing cyclic group is used, and therefore diffusion of the acid generated upon exposure can be better controlled, resulting in an improvement in the resolution. When a structural unit represented by the general formula (a2-7) is used, the solubility in organic solvents is improved and swelling of the resist film is reduced, resulting in improved lithography properties.

The amount of the structural unit (a2) within the component (A1), based on the combined total of all the structural units that constitute the component (A1), is preferably within a range from 5 to 60 mol %, more preferably from 10 to 50 mol %, and still more preferably from 10 to 45 mol %.

When the amount of the structural unit (a2) is at least as large as the lower limit of the aforementioned range, the effects achieved be including the structural unit (a2) can be satisfactorily realized. On the other hand, when the amount of the structural unit (a2) is not more than the upper limit of the above range, a good balance can be more readily achieved with the other structural units.

[Structural Unit (a3)]

The structural unit (a3) is a structural unit derived from an acrylate ester in which the hydrogen atom bonded to the carbon atom on the α-position may be substituted with a substituent and containing a polar group-containing aliphatic hydrocarbon group (but excluding structural units that correspond with the aforementioned structural units (a5), (a1), (a0) and (a2)).

When the component (A1) includes the structural unit (a3), the hydrophilicity of the component (A1) is improved, which contributes to a favorable improvement in the resolution.

Examples of the polar group include a hydroxyl group, cyano group, carboxyl group, or hydroxyalkyl group in which part of the hydrogen atoms of the alkyl group have each been substituted with a fluorine atom, although a hydroxyl group is particularly desirable. This polar group is bonded to an aliphatic hydrocarbon group.

Examples of the aliphatic hydrocarbon group include linear or branched hydrocarbon groups (and preferably alkylene groups) of 1 to 10 carbon atoms, and cyclic aliphatic hydrocarbon groups (cyclic groups). These cyclic groups may be either monocyclic or polycyclic, and can be selected appropriately from the multitude of groups that have been proposed for the resins of resist compositions designed for use with ArF excimer lasers. The cyclic group is preferably a polycyclic group, and a polycyclic group containing 7 to 30 carbon atoms is particularly desirable.

Of the various possibilities, structural units derived from an acrylate ester that includes an aliphatic polycyclic group containing a hydroxyl group, cyano group, carboxyl group or a hydroxyalkyl group in which part of the hydrogen atoms of the alkyl group have each been substituted with a fluorine atom are particularly desirable. Examples of the polycyclic group include groups in which two or more hydrogen atoms have been removed from a bicycloalkane, tricycloalkane, or tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid, whereas when the hydrocarbon group is a polycyclic group, structural units represented by formulas (a3-1), (a3-2) and (a3-3) shown below are preferable.

[Chemical Formula 76]

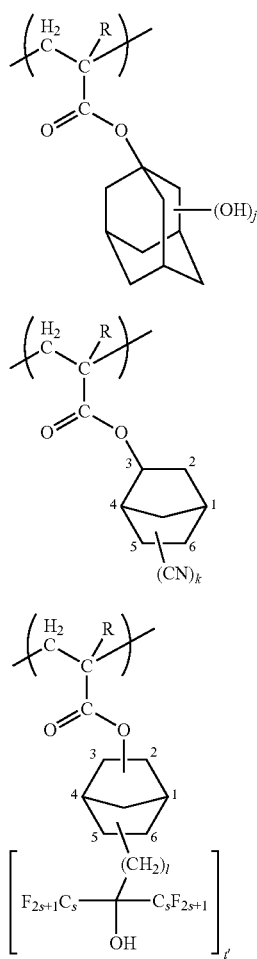

In the formulas, R is the same as defined above, j represents an integer of 1 to 3, k represents an integer of 1 to 3, t' represents an integer of 1 to 3, l represents an integer of 1 to 5, and s represents an integer of 1 to 3.

In the formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

j is preferably 1, and it is particularly desirable that the hydroxyl group is bonded to the 3rd position of the adamantyl group.

In the formula (a3-2), k is preferably 1. The cyano group is preferably bonded to the 5th or 6th position of the norbornyl group.

In the formula (a3-3), t' is preferably 1. l is preferably 1. s is preferably 1. Further, in the formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

Furthermore, as the structural unit (a3), structural units represented by any of the general formulas (a3-11) to (a3-13) are also preferred.

[Chemical Formula 77]

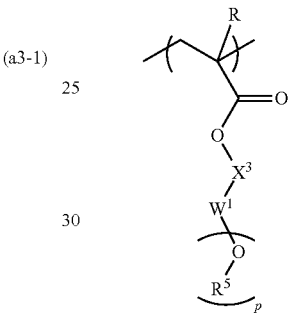

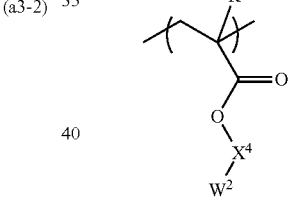

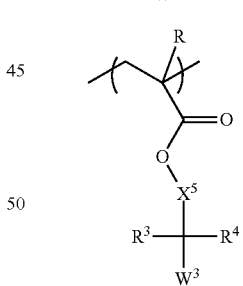

In the above formulas, R is the same as defined above, $X^3$ represents a single bond or a divalent linking group, each of $W^1$, $W^2$ and $W^3$ represents a cyclic saturated hydrocarbon group which may have a substituent at an arbitrary position, provided that $W^2$ has at least one OH group as a substituent, $R^5$ represents a saturated hydrocarbon group having at least one OH group as a substituent, p represents an integer of 1 to 3, each of $X^4$ and $X^5$ represents a divalent linking group, and each of $R^3$ and $R^4$ independently represents a hydrogen atom, an alkyl group of 1 to 10 carbon atoms, an OH group, or an alkyl group of 1 to 10 carbon atoms having at least one OH group as a substituent, provided that at least one of $R^3$ and $R^4$ contains an OH group.

In the formula (a3-11), $X^3$ represents a single bond or a divalent linking group.

The divalent linking group for $X^3$ is the same as the divalent linking group described above in relation to $A^0$, and is preferably a linear or branched alkylene group, or a divalent linking group containing a hetero atom. Among these possibilities, $X^3$ is preferably a single bond, an alkylene group or a divalent linking group containing a hetero atom, and is most preferably a single bond or an alkylene group.

In the formula (a3-11), $W^1$ represents a cyclic saturated hydrocarbon group which may have a substituent at an arbitrary position.

Examples of the cyclic saturated hydrocarbon group include the same groups as those described above for the divalent alicyclic hydrocarbon group for $A^0$, and among these groups, a group in which two or more hydrogen atoms have been removed from a polycycloalkane such as adamantane, norbornane, isobornane, tricyclodecane or tetracyclododecane or the like is preferred.

The cyclic saturated hydrocarbon group for $W^1$ may or may not have a substituent. Examples of the substituent include an alkyl group of 1 to 5 carbon atoms, a fluorine atom, a fluorinated alkyl group of 1 to 5 carbon atoms and an oxygen atom (=O).

In the formula (a3-11), $R^5$ represents a saturated hydrocarbon group having at least one OH group as a substituent.

The saturated hydrocarbon group for $R^5$ is preferably a linear, branched or cyclic alkyl group, or a combination thereof, and is more preferably a linear or branched alkyl group.

The linear alkyl group preferably contains 1 to 5 carbon atoms, more preferably 1 to 4 carbon atoms, and still more preferably 1 or 2 carbon atoms.

The branched alkyl group preferably contains 3 to 10 carbon atoms, and more preferably 3 to 5 carbon atoms, and is most preferably an isopropyl group.

The cyclic alkyl group preferably contains 4 to 20 carbon atoms, and more preferably 5 to 12 carbon atoms.

The saturated hydrocarbon group for $R^5$ has at least one OH group as a substituent at an arbitrary position. The saturated hydrocarbon group for $R^5$ may also contain, in addition to the OH group substituent, another substituent such as a fluorine atom or an oxygen atom (=O) or the like.

In the formula (a3-11), p represents an integer of 1 to 3, is preferably 1 or 2, and is most preferably 1. When p represents 2 or 3, the plurality of $R^5$ groups may be the same or different.

Specific examples of preferred forms of the structural unit represented by the formula (a3-11) are shown below.

In the following formulas, $R^\alpha$ represents a hydrogen atom, a methyl group or a trifluoromethyl group.

[Chemical Formula 78]

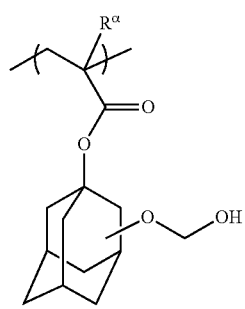

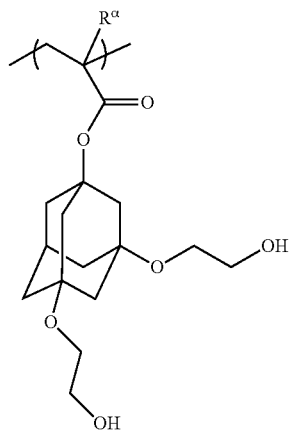

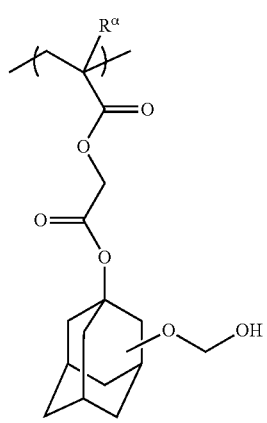

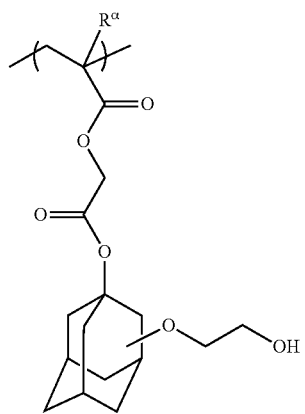

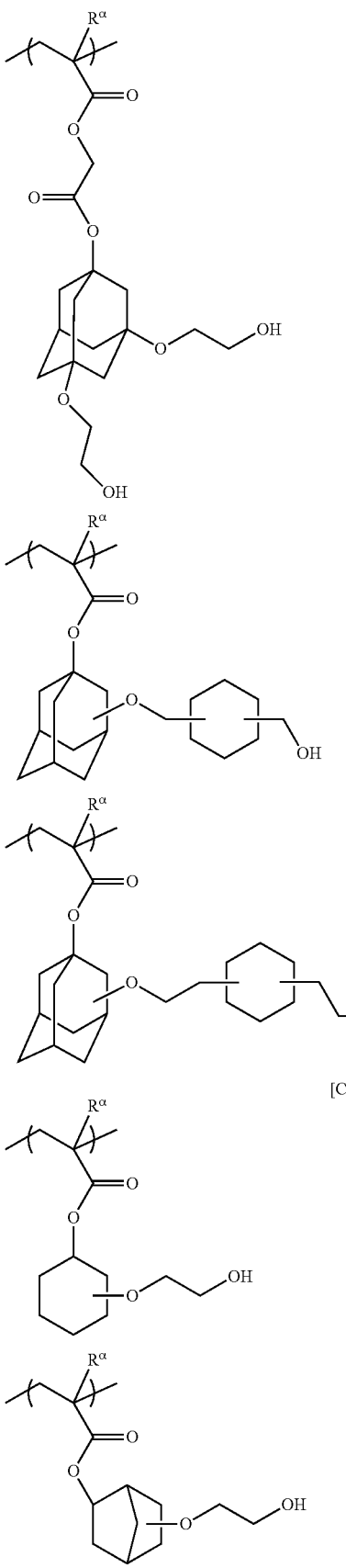

[Chemical Formula 79]

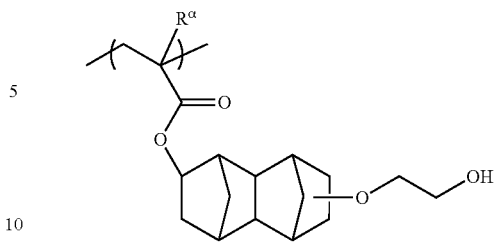

In the formula (a3-12), $X^4$ represents a divalent linking group, and examples include the same groups as those described above for the divalent linking group for $X^3$. Among such groups, the divalent linking group for $X^4$ is preferably an alkylene group, and most preferably a methylene group or an ethylene group.

In the formula (a3-12), $W^2$ represents a cyclic saturated hydrocarbon group which may have a substituent at an arbitrary position, wherein the substituent includes at least one OH group.

Examples of the cyclic saturated hydrocarbon group include the same groups as the monovalent alicyclic hydrocarbon groups described above for $R^{61}$.

Among these groups, the cyclic saturated hydrocarbon group is preferably a group in which one hydrogen atom has been removed from a polycycloalkane.

The cyclic saturated hydrocarbon group may also contain another substituent besides the OH group, such as an alkyl group of 1 to 5 carbon atoms, a fluorine atom, a fluorinated alkyl group of 1 to 5 carbon atoms or an oxygen atom (=O).

The OH group substituent in $W^2$ is preferably bonded directly to the ring of the cyclic aliphatic hydrocarbon group as a substituent for one of the hydrogen atoms of the hydrocarbon group that constitutes the ring, and is more preferably bonded to a tertiary carbon atom that constitutes part of the ring. By bonding the OH group to this type of tertiary carbon atom, the OH group is less likely to dissociate via a dehydrogenation reaction, which is desirable.

Specific examples of preferred forms of the structural unit represented by the formula (a3-12) are shown below.

In the following formulas, $R^\alpha$ represents a hydrogen atom, a methyl group or a trifluoromethyl group.

[Chemical Formula 80]

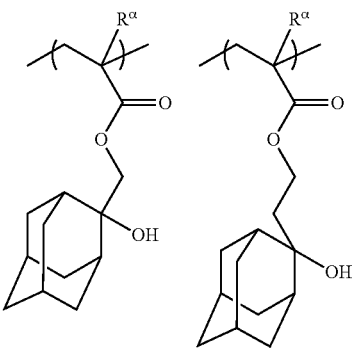

-continued

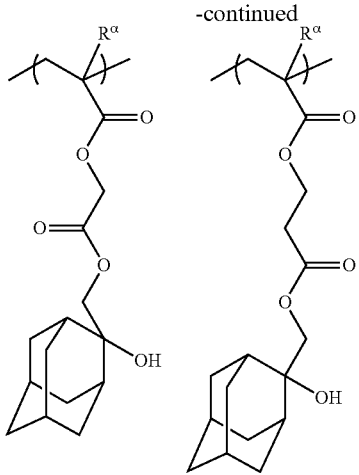

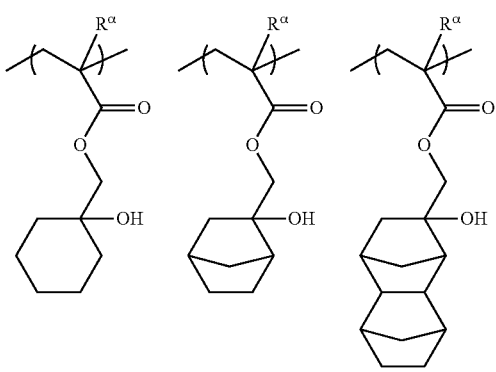

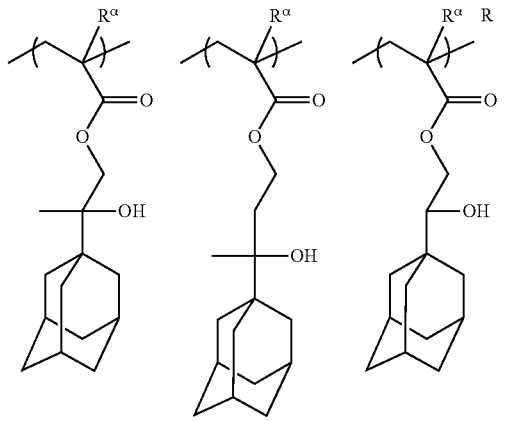

[Chemical Formula 81]

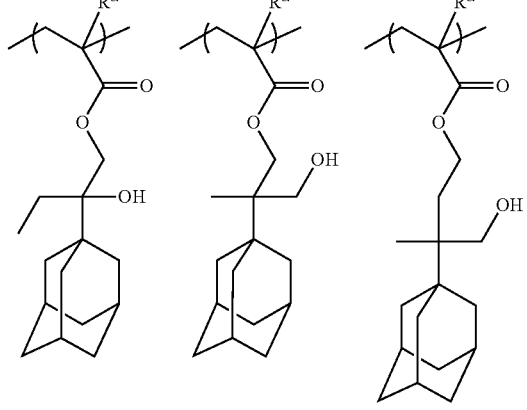

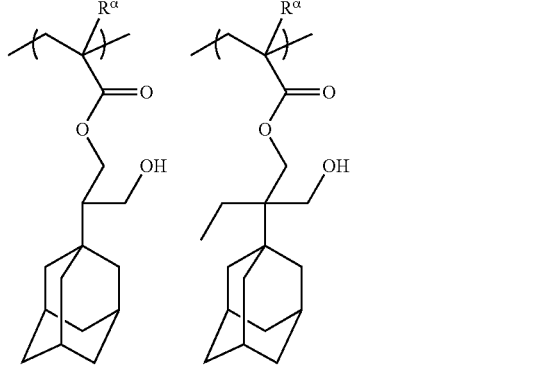

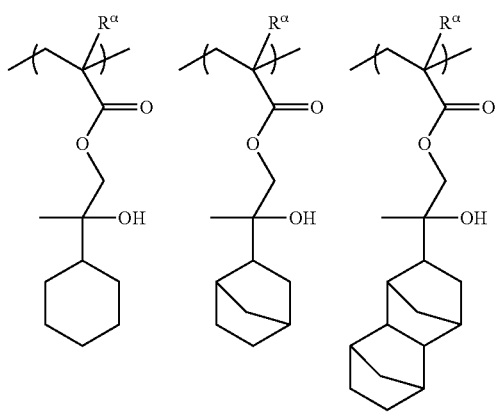

[Chemical Formula 82]

In the formula (a3-13), $X^5$ represents a divalent linking group, and is the same as defined above for the divalent linking group for $X^4$.

In the formula (a3-13), each of $R^3$ and $R^4$ independently represents a hydrogen atom, an alkyl group of 1 to 10 carbon atoms, an OH group, or an alkyl group of 1 to 10 carbon atoms having at least one OH group as a substituent, provided that at least one of $R^3$ and $R^4$ contains an OH group.

The alkyl group of 1 to 10 carbon atoms for $R^3$ and $R^4$ is preferably a chain-like alkyl group, wherein the chain-like alkyl group may be either linear or branched.

Examples of the alkyl group of 1 to 10 carbon atoms having at least one OH group as a substituent for $R^3$ and $R^4$ include groups in which one or more hydrogen atoms of an aforementioned alkyl group of 1 to 10 carbon atoms for $R^3$ and $R^4$ have each been substituted with an OH group.

Of the various possibilities, it is preferable that only one of $R^3$ and $R^4$ contains an OH group, and a combination of an alkyl group and an OH group is particularly desirable.

Specific examples of preferred forms of the structural unit represented by the formula (a3-13) are shown below.

In the following formulas, $R^\alpha$ represents a hydrogen atom, a methyl group or a trifluoromethyl group.

Furthermore, as the structural unit (a3), structural units represented by general formulas (a3-4) to (a3-6) shown below are also preferred.

[Chemical Formula 83]

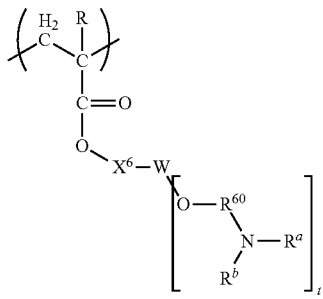

(a3-4)

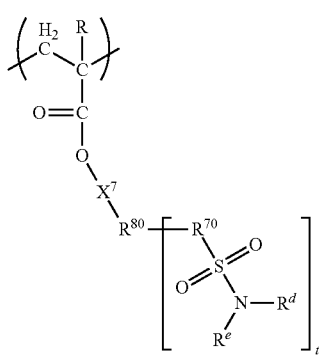

(a3-5)

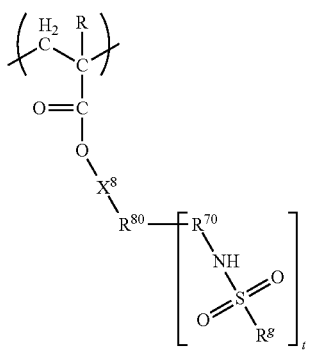

(a3-6)

In the above formulas, R is the same as defined above, and each t independently represents an integer of 1 to 3. In the formula (a3-4), $X^6$ represents a single bond or a divalent linking group, W represents a cyclic saturated hydrocarbon group which may contain an oxygen atom at an arbitrary position, $R^{60}$ represents —C(=O)— or —SO$_2$—, each of $R^a$ and $R^b$ independently represents a hydrogen atom or an alkyl group which may contain an oxygen atom at an arbitrary position, or $R^a$ and $R^b$ may be bonded to each other to form a ring together with the nitrogen atom in the formula, and t represents an integer of 1 to 3. In the formulas (a3-5) and (a3-6), $R^{80}$ represents a cyclic aliphatic hydrocarbon group of valency (t+1) which may contain an oxygen atom or a sulfur atom at an arbitrary position, $R^{70}$ represents a single bond or an alkylene group which may contain an oxygen atom or a sulfur atom at an arbitrary position, $X^7$ represents a single bond or a divalent linking group, each of $R^d$ and $R^e$ independently represents a hydrogen atom, a chain-like or cyclic alkyl group which may contain an oxygen atom at an arbitrary position and may have a substituent, a fluorinated alkyl group or an alkoxycarbonyl group, or $R^d$ and $R^e$ may be bonded to each other to form a ring, $X^8$ represents a single bond or a divalent linking group, and $R^g$ represents a chain-like or cyclic alkyl group which may have a substituent or a fluorinated alkyl group.

In the formula (a3-4), $X^6$ represents a single bond or a divalent linking group. Examples of the divalent linking group for $X^6$ include the same groups as those described above for the divalent linking group for $X^3$. Among such groups, the divalent linking group for $X^6$ is preferably a single bond or an alkylene group, more preferably a single bond, a methylene group or an ethylene group, and most preferably a single bond.

In the formula (a3-4), W represents a cyclic saturated hydrocarbon group which may contain an oxygen atom at an arbitrary position. The saturated hydrocarbon group preferably contains 3 to 20 carbon atoms, and more preferably 5 to 12 carbon atoms. Examples of the saturated hydrocarbon group include the same groups as those described above for the divalent alicyclic hydrocarbon group for $A^0$.

In the formula (a3-4), each of $R^a$ and $R^b$ independently represents a hydrogen atom, or an alkyl group which may contain an oxygen atom at an arbitrary position. The alkyl group for $R^a$ and $R^b$ may be linear, branched or cyclic. The linear or branched alkyl group is preferably an alkyl group of 1 to 5 carbon atoms. Examples of the cyclic alkyl group include the monovalent alicyclic hydrocarbon groups described above for $R^{61}$.

Each of the alkyl groups of $R^a$ and $R^b$ may contain an oxygen atom at an arbitrary position. The expression that the alkyl group "contains an oxygen atom" means that an oxygen atom (—O—) is introduced into the carbon chain of the alkyl group.

The alkyl group for $R^a$ and $R^b$ may also include a substituent (an atom other than a hydrogen atom or a group) that substitutes a hydrogen atom of the alkyl group.

In the formula (a3-4), $R^a$ and $R^b$ may be bonded to each other to form a ring together with the nitrogen atom in the formula. This ring may be either monocyclic or polycyclic, but is preferably monocyclic. The ring is preferably a 3- to 10-membered ring, and more preferably a 5- to 7-membered ring, including the nitrogen atom. It is preferable that at least one of $R^a$ and $R^b$ is a hydrogen atom, more preferable that either $R^a$ and $R^b$ are both hydrogen atoms, or one of $R^a$ and $R^b$ is a hydrogen atom and the other is an alkyl group which may contain an oxygen atom at an arbitrary position, and most preferable that $R^a$ and $R^b$ are both hydrogen atoms.

In the formula (a3-4), t represents an integer of 1 to 3, preferably 1 or 2, and more preferably 1.

Specific examples of preferred forms of the structural unit represented by the general formula (a3-4) are shown below. In the following formulas, $R^\alpha$ represents a hydrogen atom, a methyl group or a trifluoromethyl group.

[Chemical Formula 84]
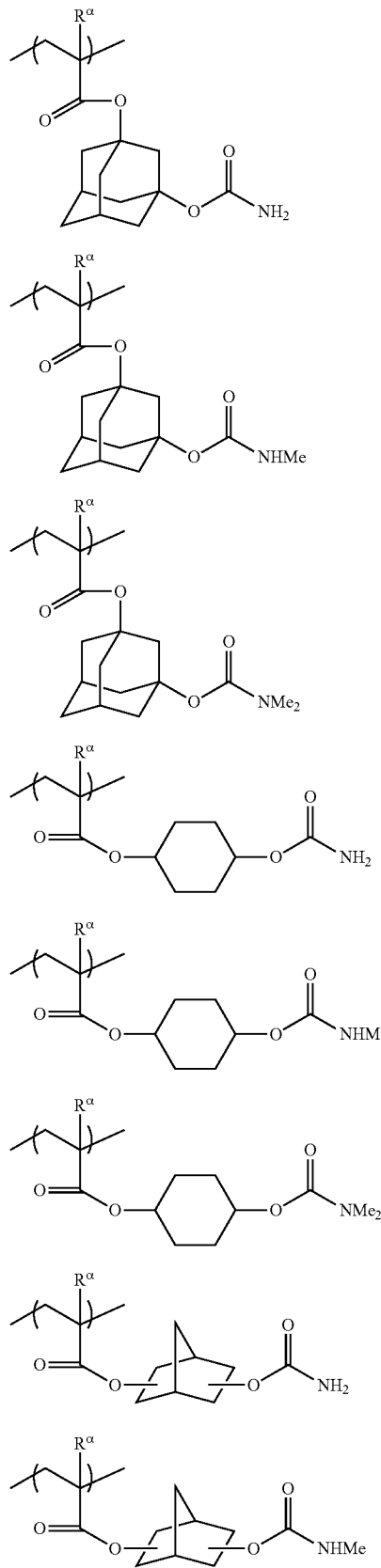
(a3-4-1)
(a3-4-2)
(a3-4-3)
(a3-4-4)
(a3-4-5)
(a3-4-6)
(a3-4-7)
(a3-4-8)
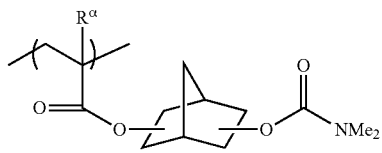
(a3-4-9)
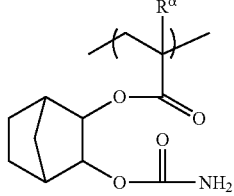
(a3-4-10)
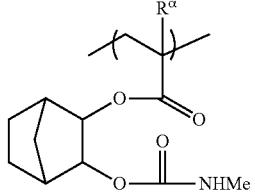
(a3-4-11)
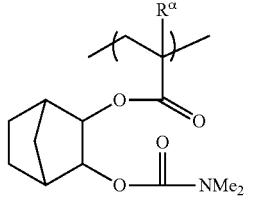
(a3-4-12)
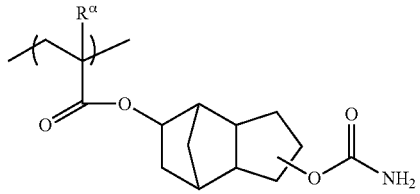
(a3-4-13)
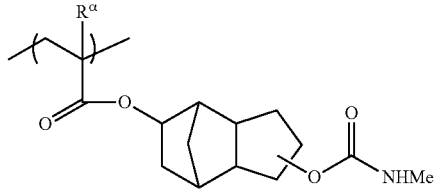
(a3-4-14)
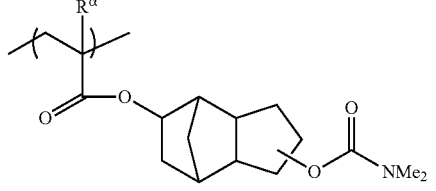
(a3-4-15)
[Chemical Formula 85]
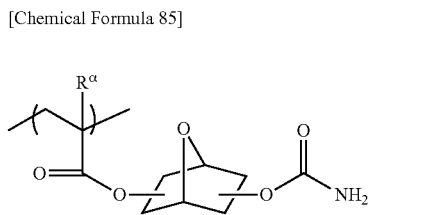
(a3-4-16)

-continued
(a3-4-17)
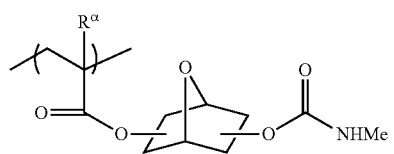
(a3-4-18)
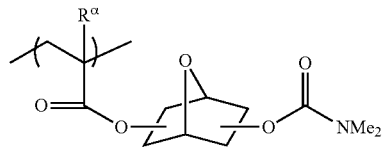
(a3-4-19)
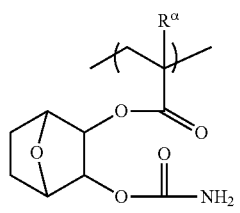
(a3-4-20)
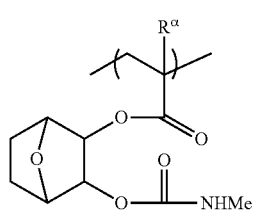
(a3-4-21)
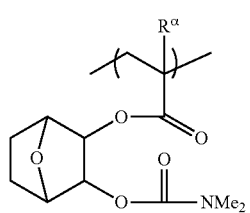
(a3-4-22)
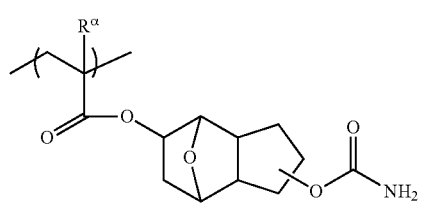
(a3-4-23)
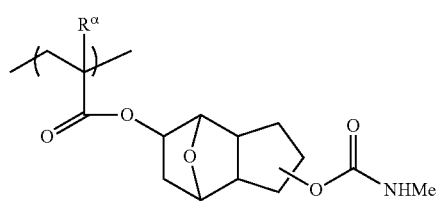
(a3-4-24)
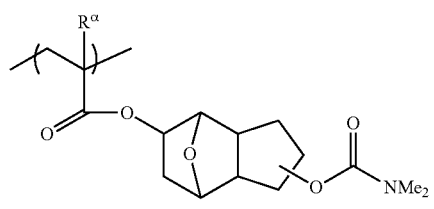
-continued
(a3-4-25)
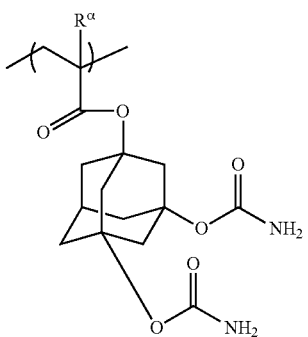
(a3-4-26)
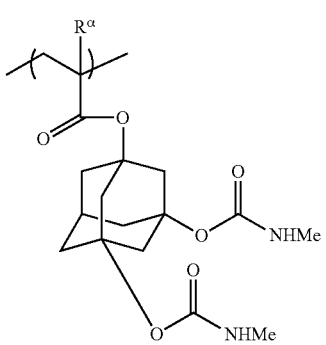
(a3-4-27)
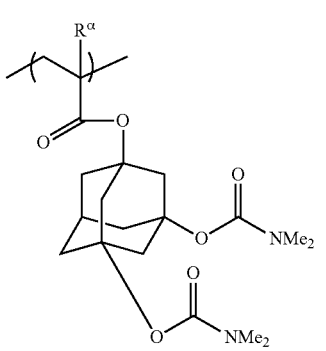
[Chemical Formula 86]
(a3-4-28)
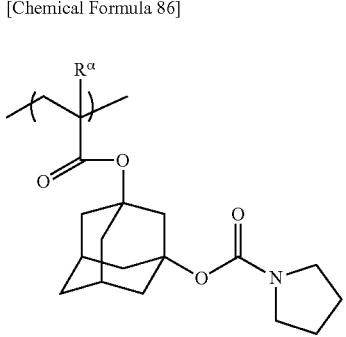
(a3-4-29)
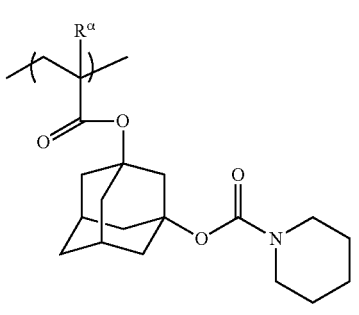

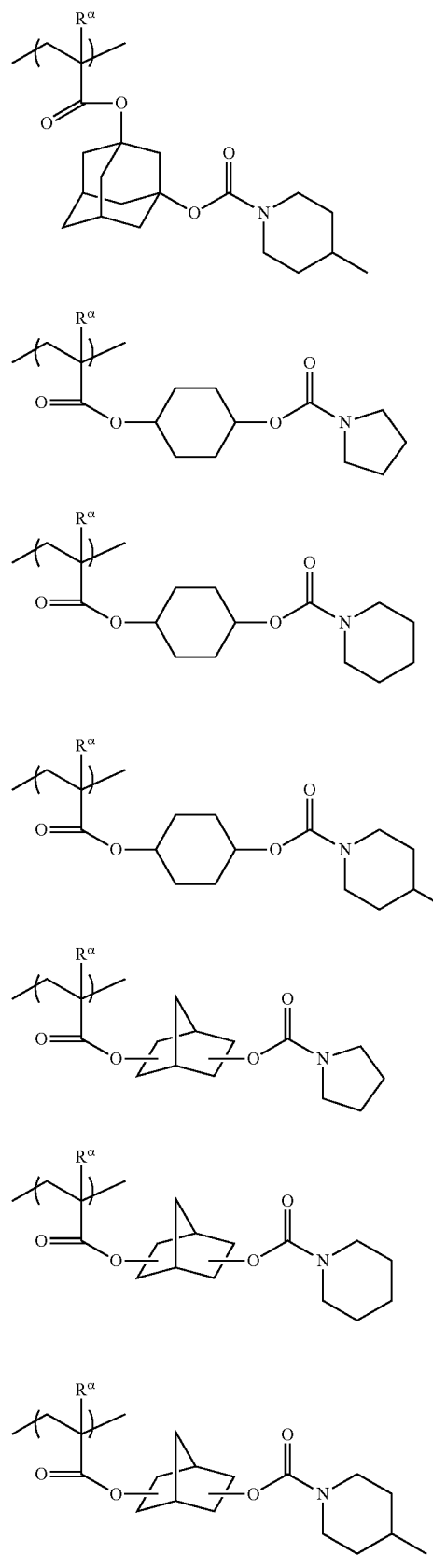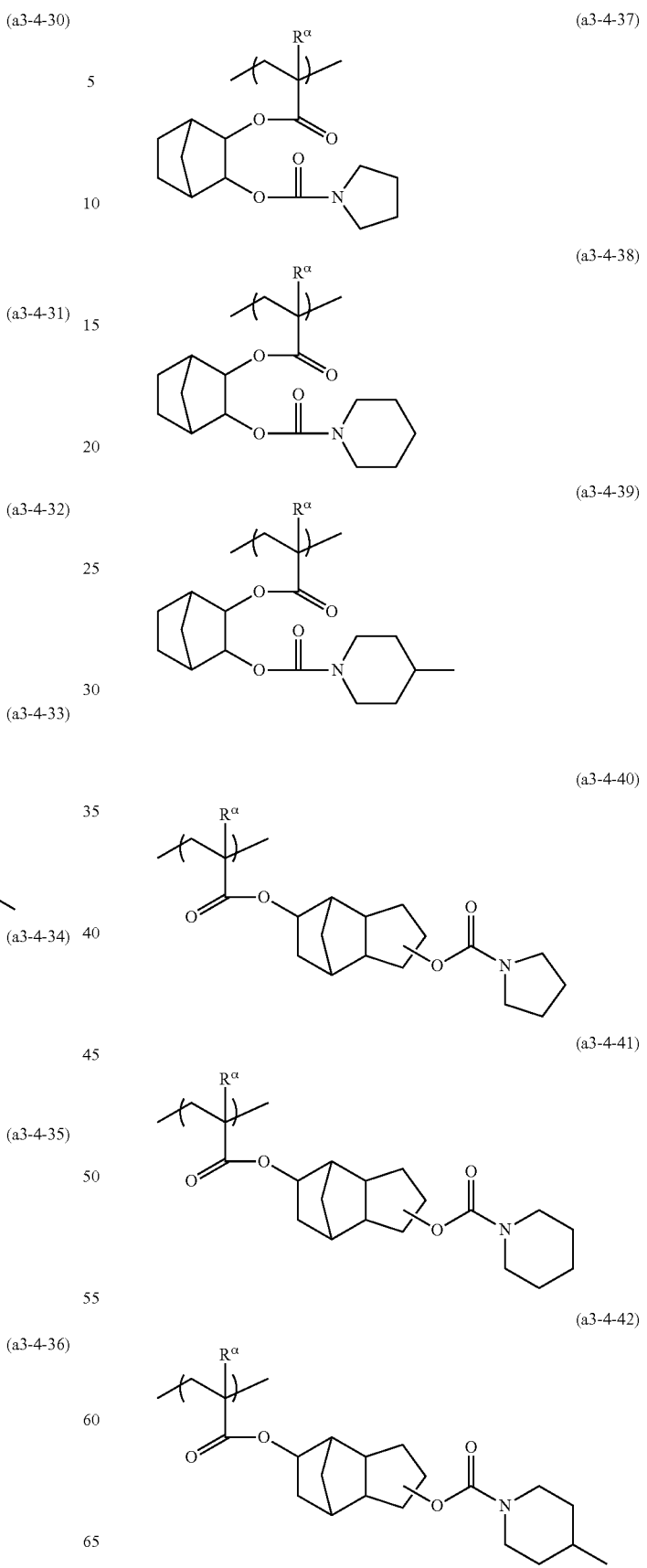

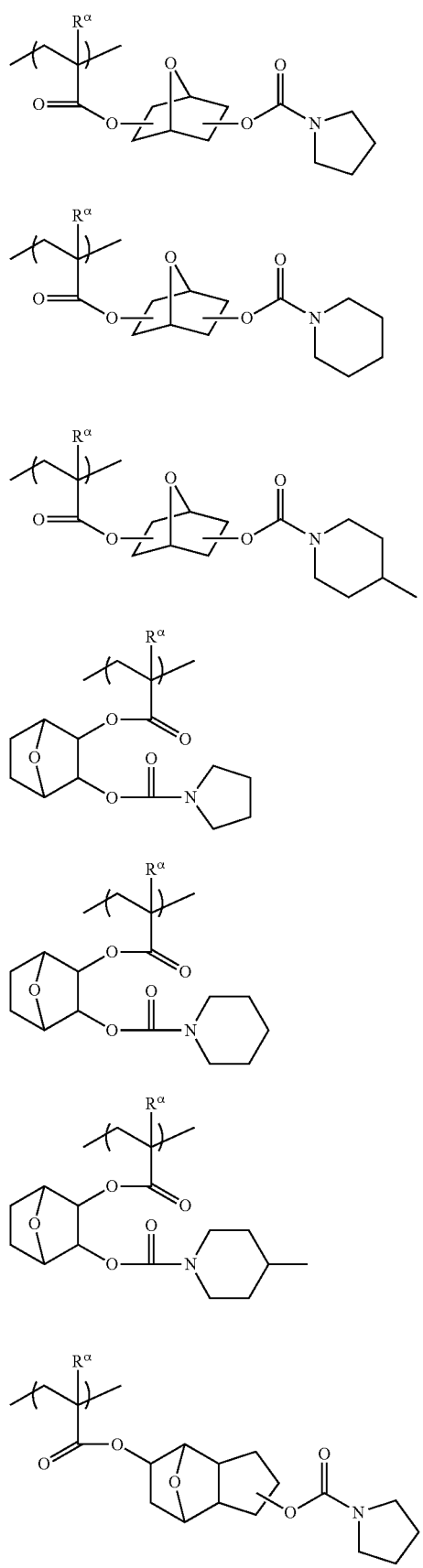
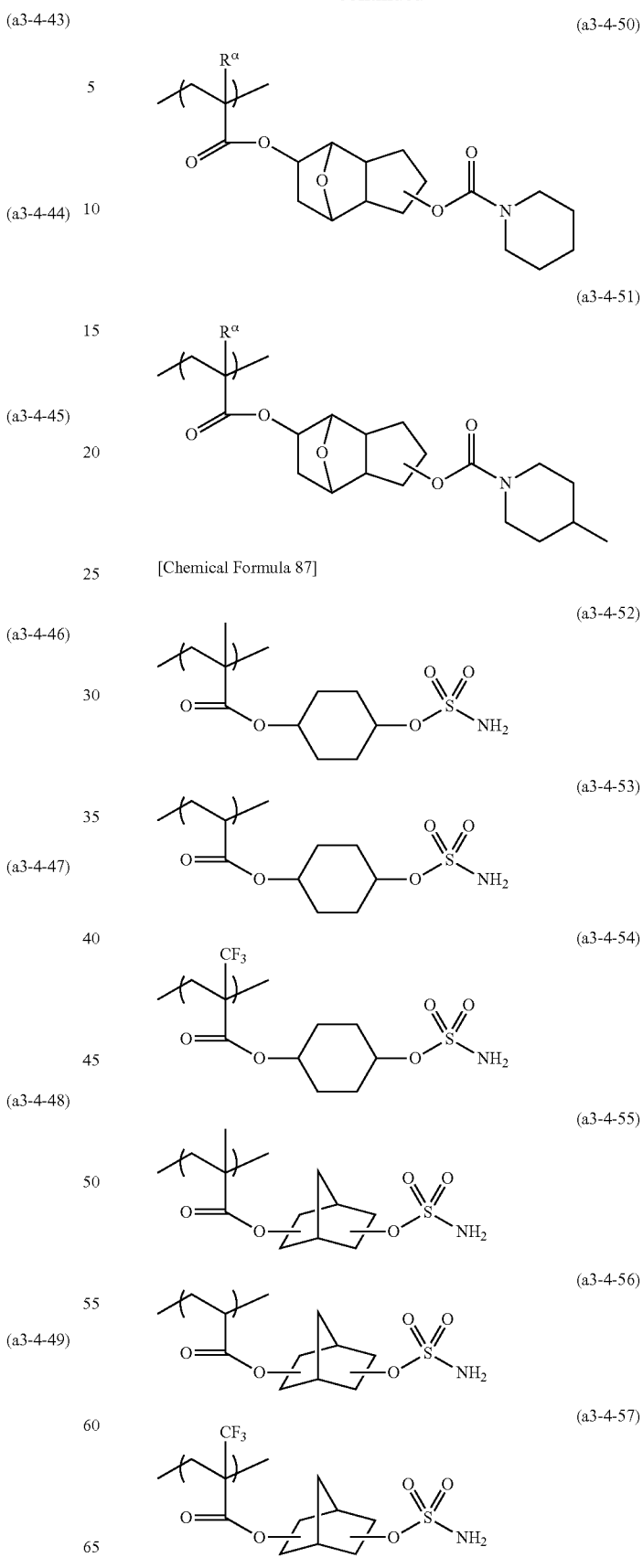

(a3-4-58)
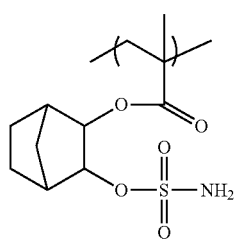
(a3-4-59)
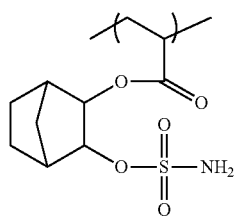
(a3-4-60)
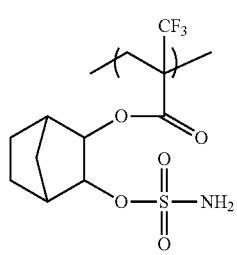
(a3-4-61)
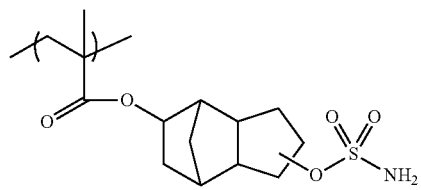
(a3-4-62)
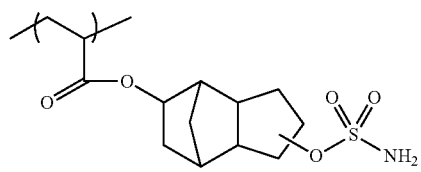
(a3-4-63)
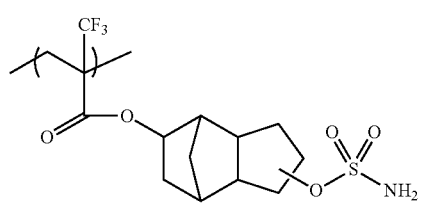
(a3-4-64)
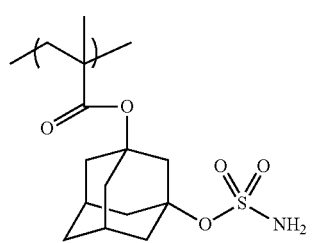
(a3-4-65)
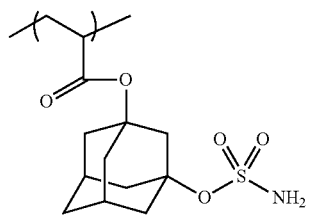
(a3-4-66)
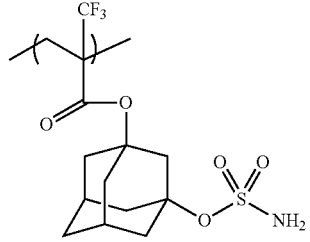
[Chemical Formula 88]
(a3-4-67)
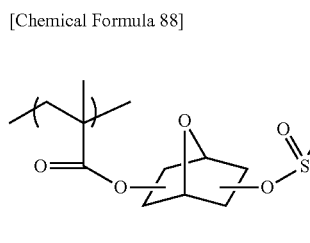
(a3-4-68)
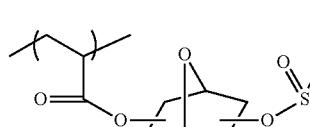
(a3-4-69)
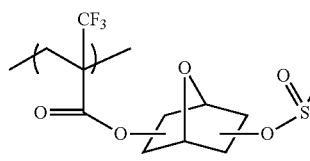
(a3-4-70)
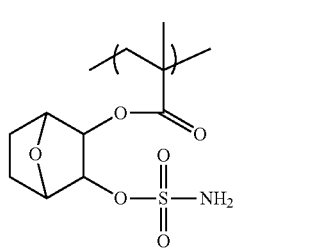
(a3-4-71)
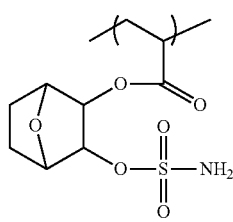

161

-continued (a3-4-72)
(a3-4-73)
(a3-4-74)
(a3-4-75)

[Chemical Formula 89]

(a3-4-76)
(a3-4-77)
(a3-4-78)

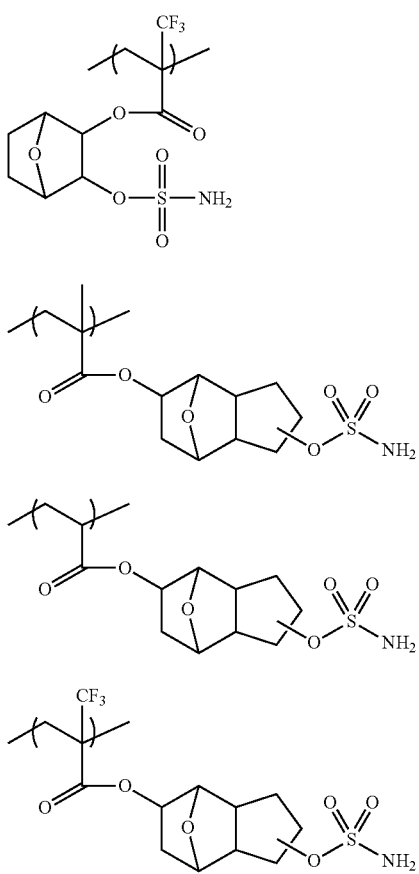
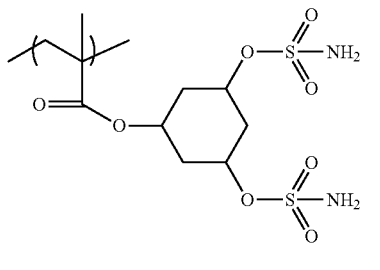
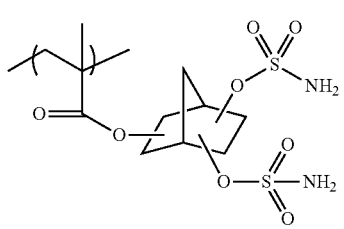
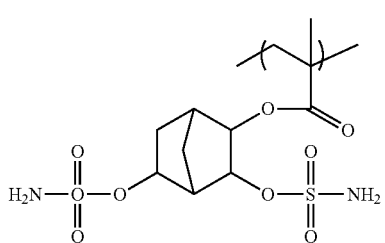

162

-continued

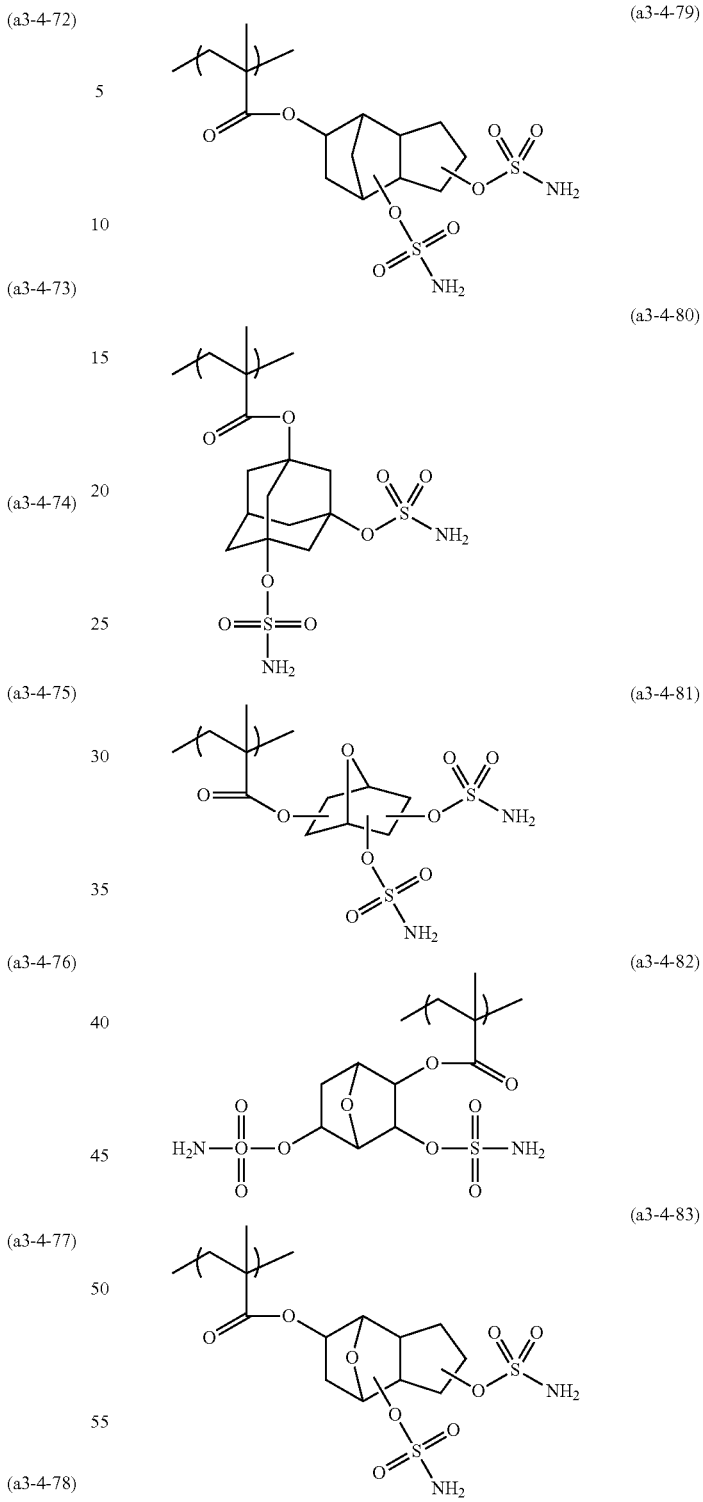

(a3-4-79)
(a3-4-80)
(a3-4-81)
(a3-4-82)
(a3-4-83)

In the formulas (a3-5) and (a3-6), $R^{80}$ represents a cyclic aliphatic hydrocarbon group of valency (t+1) which may contain an oxygen atom or a sulfur atom at an arbitrary position.

Here, the expression "may contain an oxygen atom or a sulfur atom" means that an oxygen atom (—O—) or a sulfur atom (—S—) may be inserted within the carbon chain (or within the ring structure in the case of the cyclic group).

The cyclic aliphatic hydrocarbon group preferably contains 3 to 20 carbon atoms, and more preferably 5 to 12 carbon atoms.

The cyclic aliphatic hydrocarbon group may be saturated or unsaturated, but is preferably saturated.

The cyclic aliphatic hydrocarbon group may be either monocyclic or polycyclic. In terms of improving the lithography properties by increasing the glass transition temperature (Tg), and further improving the etching resistance, a polycyclic group is preferred, and a bicyclic to tetracyclic group is particularly desirable.

The monocyclic aliphatic hydrocarbon group is preferably a group in which (t+1) hydrogen atoms have been removed from a monocycloalkane. The monocycloalkane preferably contains 3 to 6 carbon atoms, and specific examples include cyclopentane and cyclohexane.

The polycyclic aliphatic hydrocarbon group is preferably a group in which (t+1) hydrogen atoms have been removed from a polycycloalkane such as a bicycloalkane, tricycloalkane or tetracycloalkane. The polycycloalkane preferably contains 7 to 12 carbon atoms.

In the formulas (a3-5) and (a3-6), $R^{70}$ represents a single bond or an alkylene group which may contain an oxygen atom or a sulfur atom at an arbitrary position.

The alkylene group may be linear, branched or cyclic.

In the case of a linear or branched alkylene group, the alkylene group preferably contains 1 to 20 carbon atoms, more preferably 1 to 10 carbon atoms, and still more preferably 1 to 7 carbon atoms.

The cyclic alkylene group preferably contains 3 to 20 carbon atoms, and more preferably 3 to 16 carbon atoms.

The cyclic alkylene group may be either polycyclic or monocyclic. The monocyclic alkylene group is preferably a group in which two hydrogen atoms have been removed from a monocycloalkane of 3 to 6 carbon atoms. The polycyclic alkylene group is preferably a group in which two hydrogen atoms have been removed from a polycycloalkane of 7 to 12 carbon atoms.

$R^{70}$ is most preferably a single bond.

In the formula (a3-5), $X^7$ represents a single bond or a divalent linking group. Examples of the divalent linking group for $X^7$ include the same groups as those described above for the divalent linking group for $X^3$. Of the various possibilities, the divalent linking group for $X^7$ is preferably a single bond or an alkylene group, more preferably a single bond, a methylene group or an ethylene group, and most preferably a single bond.

In the formula (a3-5), each of $R^d$ and $R^e$ independently represents a hydrogen atom, a chain-like or cyclic alkyl group which may contain an oxygen atom (—O—) at an arbitrary position and may have a substituent, a fluorinated alkyl group or an alkoxycarbonyl group.

The chain-like alkyl group may be either linear or branched. The chain-like alkyl group preferably contains 1 to 10 carbon atoms, more preferably 1 to 7 carbon atoms, and still more preferably 1 to 5 carbon atoms. The cyclic alkyl group preferably contains 3 to 20 carbon atoms, more preferably 4 to 15 carbon atoms, and still more preferably 5 to 12 carbon atoms. The cyclic alkyl group may be either polycyclic or monocyclic. The monocyclic alkyl group is preferably a group in which one hydrogen atom has been removed from a monocycloalkane of 3 to 6 carbon atoms. The polycyclic alkyl group is preferably a group in which one hydrogen atom has been removed from a polycycloalkane of 7 to 12 carbon atoms.

The chain-like or cyclic alkyl group may contain an oxygen atom (—O—) at an arbitrary position, and may also contain a substituent that substitutes a hydrogen atom of the alkyl group.

For $R^d$ and $R^e$, examples of chain-like or cyclic alkyl groups which contain an oxygen atom include alkoxy groups and alkoxyalkyl groups. Furthermore, additional examples of cyclic alkyl groups which contain an oxygen atom include groups in which one hydrogen atom has been removed from a cyclic ether such as tetrahydropyran (hereafter this type of group may also be referred to as a "cyclic ether group").

Examples of the fluorinated alkyl group for $R^d$ and $R^e$ include groups in which part or all of the hydrogen atoms within an aforementioned alkyl group for $R^d$ and $R^e$ have each been substituted with a fluorine atom.

The fluorinated alkyl group for $R^d$ and $R^e$ is preferably a chain-like group, and may be either linear or branched. As this fluorinated alkyl group, a trifluoromethyl group is particularly desirable.

Examples of the alkyl group in the alkoxycarbonyl group for $R^d$ and $R^e$ include the same groups as those described above for the alkyl group for $R^d$ and $R^e$.

The alkoxycarbonyl group is preferably a chain-like alkoxycarbonyl group, and specific examples include a methoxycarbonyl group, ethoxycarbonyl group, propyloxycarbonyl group, butoxycarbonyl group and pentyloxycarbonyl group. Among such groups, chain-like tertiary alkoxycarbonyl groups such as a tert-butoxycarbonyl group and tert-pentyloxycarbonyl group are particularly desirable.

$R^d$ and $R^e$ may be bonded to each other to form a ring.

This ring may be either monocyclic or polycyclic, but is preferably monocyclic. In the case of a monocyclic ring, the ring is preferably a 3- to 10-membered ring, and more preferably a 5- to 7-membered ring, including the nitrogen atom.

In those cases where $R^d$ and $R^e$ are bonded to each other to form a ring, preferred examples of the ring represented by —N($R^d$)($R^e$) include a pyrrolidinyl group, piperidino group and 4-methylpiperidino group.

It is preferable that at least one of $R^d$ and $R^e$ is a hydrogen atom, more preferable that either $R^d$ and $R^e$ are both hydrogen atoms, or one of $R^d$ and $R^e$ is a hydrogen atom and the other is an alkyl group which may contain an oxygen atom at an arbitrary position or a fluorinated alkyl group. Of these possibilities, it is particularly desirable that either $R^d$ and $R^e$ are both hydrogen atoms, or one of $R^d$ and $R^e$ is a hydrogen atom and the other is a fluorinated alkyl group.

In the formula (a3-5), t represents an integer of 1 to 3, is preferably 1 or 2, and is most preferably 1.

In the formula (a3-6), $X^8$ represents a single bond or a divalent linking group. Examples of the divalent linking group for $X^8$ include the same groups as those described above for the divalent linking group for $X^3$. Among these groups, the divalent linking group for $X^8$ is preferably a single bond or an alkylene group, more preferably a single bond, a methylene group or an ethylene group, and most preferably a single bond.

In the formula (a3-6), $R^g$ represents a chain-like or cyclic alkyl group which may have a substituent or a fluorinated alkyl group. Examples of the chain-like or cyclic alkyl group and the chain-like or cyclic fluorinated alkyl group include the same groups as those described above for the chain-like or cyclic alkyl group and the fluorinated alkyl group for $R^d$ and $R^e$. $R^g$ is preferably a fluorinated alkyl group, and a trifluoromethyl group is particularly desirable.

In the formula (a3-6), t represents an integer of 1 to 3, is preferably 1 or 2, and is most preferably 1.

The structural unit represented by the general formula (a3-5) is preferably a structural unit represented by one of the general formulas (a3-5-1) to (a3-5-4) shown below, and a structural unit represented by the formula (a3-5-2) is particularly desirable.

The structural unit represented by the general formula (a3-6) is preferably a structural unit represented by one of the general formulas (a3-6-1) to (a3-6-4) shown below, and a structural unit represented by the formula (a3-6-4) is particularly desirable.

[Chemical Formula 90]

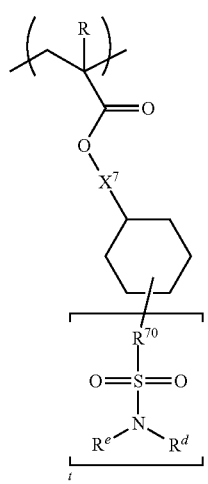

(a3-5-1)

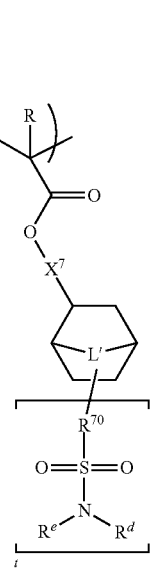

(a3-5-2)

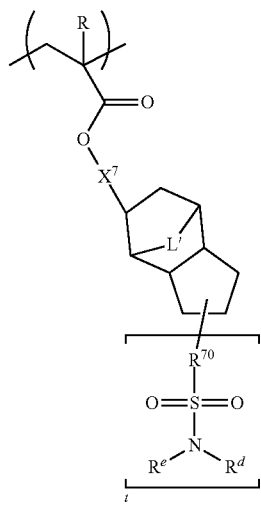

(a3-5-3)

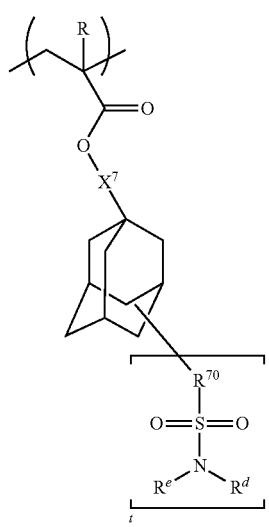

(a3-5-4)

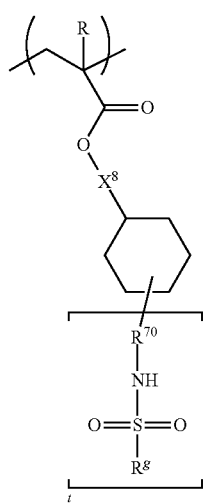

(a3-6-1)

-continued (a3-6-2)
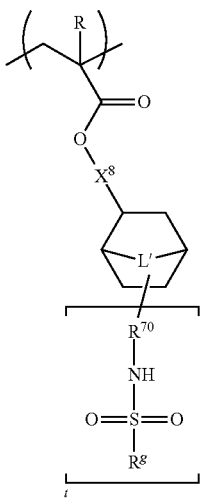

(a3-6-3)
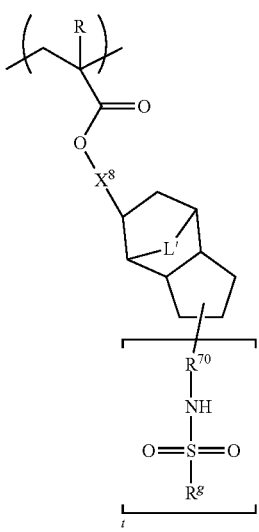

(a3-6-4)
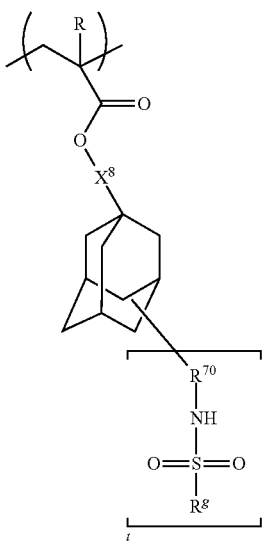

In the above formulas, R, $X^7$, $X^8$, $R^{70}$, $R^d$, $R^e$, $R^g$ and t are each the same as defined above, and L' represents an oxygen atom, a sulfur atom, or an alkylene group of 1 to 5 carbon atoms which may contain an oxygen atom or a sulfur atom at an arbitrary position.

The alkylene group of 1 to 5 carbon atoms for L' is preferably a linear or branched alkylene group, and specific examples include a methylene group, ethylene group, n-propylene group and isopropylene group.

When the alkylene group contains an oxygen atom or sulfur atom, examples of L' include groups in which —O— or —S— is inserted either at the terminal of the alkylene group or between carbon atoms of the alkylene group. Specific examples of such alkylene groups include —O—$CH_2$—, —$CH_2$—O—$CH_2$—, —$CH_2$—O—$(CH_2)_2$—, —S—$CH_2$—, —$CH_2$—S—$CH_2$— and —$CH_2$—S—$(CH_2)_2$—.

L' is preferably an alkylene group of 1 to 5 carbon atoms or —O—, more preferably an alkylene group of 1 to 5 carbon atoms or —O—, and still more preferably a methylene group or —O—.

Among the various possibilities, the structural unit represented by one of the above formulas (a3-5-1) to (a3-5-4) is preferably a structural unit in which $X^7$ and $R^{70}$ are single bonds. Further, the —N($R^d$)($R^e$) moiety within the formula is preferably —$NH_2$, —NH($CH_3$), —NH($CF_3$), a pyrrolidinyl group, a piperidino group or a 4-methylpiperidino group, and is more preferably —$NH_2$ or —NH($CF_3$).

Among the various possibilities, the structural unit represented by one of the above formulas (a3-6-1) to (a3-6-4) is preferably a structural unit in which $X^8$ and $R^{70}$ are single bonds. Further, $R^g$ is preferably a fluorinated alkyl group, and most preferably a trifluoromethyl group.

The structural unit (a3) contained within the component (A1) may be a single type of structural unit or a combination of two or more types.

The amount of the structural unit (a3) within the component (A1), based on the combined total of all the structural units that constitute the component (A1), is preferably within a range from 1 to 40 mol %, more preferably from 1 to 35 mol %, still more preferably from 3 to 30 mol %, and most preferably from 5 to 25 mol %.

When the amount of the structural unit (a3) is at least as large as the lower limit of the above range, the effects achieved be including the structural unit (a3) can be satisfactorily realized. On the other hand, when the amount of the structural unit (a3) is not more than the upper limit of the above range, a good balance can be more readily achieved with the other structural units.

[Other Structural Units]

The component (A1) may also include other structural units besides the aforementioned structural units (a5), (a1) to (a3), and (a0), as long as the effects of the present invention are not impaired.

As these other structural units, any other structural unit which cannot be classified as one of the above structural units can be used without any particular limitations, and any of the multitude of conventional structural units used within resist resins for ArF excimer lasers or KrF excimer lasers (and particularly for ArF excimer lasers) can be used.

Examples of these other structural units include a structural unit (a4) derived from an acrylate ester in which the hydrogen atom bonded to the carbon atom on the α-position may be substituted with a substituent and containing a non-acid-dissociable aliphatic polycyclic group.

(Structural Unit (a4))

The structural unit (a4) is a structural unit derived from an acrylate ester in which the hydrogen atom bonded to the carbon atom on the α-position may be substituted with a substituent and containing a non-acid-dissociable aliphatic polycyclic group.

In the structural unit (a4), examples of the polycyclic group include the same polycyclic groups as those described above in connection with the structural unit (a1), and any of the multitude of conventional polycyclic groups used within the resin component of resist compositions designed for ArF excimer lasers or KrF excimer lasers (and particularly for ArF excimer lasers) can be used.

In consideration of industrial availability and the like, at least one polycyclic group selected from among a tricyclodecyl group, adamantyl group, tetracyclododecyl group, isobornyl group and norbornyl group is particularly desirable. These polycyclic groups may be substituted with a linear or branched alkyl group of 1 to 5 carbon atoms.

Specific examples of the structural unit (a4) include structural units having structures represented by general formulas (a-4-1) to (a-4-5) shown below.

[Chemical Formula 91]

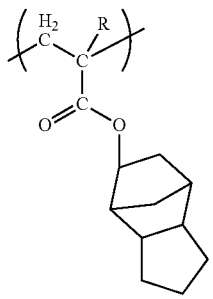
(a4-1)

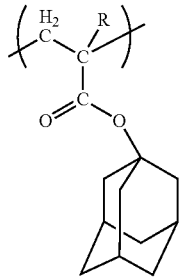
(a4-2)

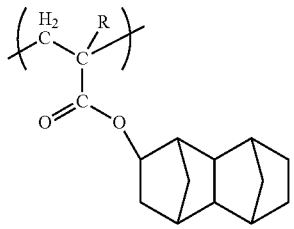
(a4-3)

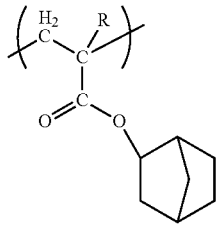
(a4-4)

-continued

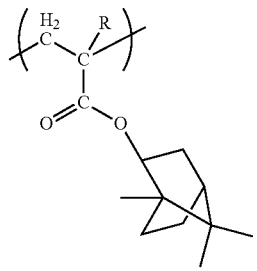
(a4-5)

In the formulas, R is the same as defined above.

When the structural unit (a4) is included in the component (A1), the amount of the structural unit (a4), based on the combined total of all the structural units that constitute the component (A1), is preferably within the range from 1 to 30 mol %, and more preferably from 10 to 20 mol %.

In the resist composition of the present invention, the component (A1) is preferably a polymeric compound containing the structural unit (a5) which decomposes upon exposure to generate an acid, and the structural unit (a1) which contains an acid-decomposable group that exhibits increased polarity under the action of acid.

Specific examples of preferred polymeric compounds for the component (A1) include polymeric compounds consisting of the structural units (a5), (a1) and (a0), polymeric compounds consisting of the structural units (a5), (a1), (a0) and (a3), polymeric compounds consisting of the structural units (a5), (a1), (a2) and (a3), and polymeric compounds consisting of the structural units (a5), (a1), (a2), (a3) and (A).

In the component (A), either a single component (A1) may be used alone, or two or more different types of the component (A1) may be used in combination.

The amount of the component (A1) within the component (A), based on the total weight of the component (A), is preferably at least 25% by weight, more preferably at least 50% by weight, still more preferably at least 75% by weight, and most preferably 100% by weight. Provided that the amount of the component (A1) is at least 25% by weight of the component (A), the lithography properties can be better improved.

The weight-average molecular weight (Mw) (the polystyrene equivalent value determined by gel permeation chromatography (GPC)) of the component (A1) is not particularly limited, but is preferably within a range from 1,000 to 50,000, more preferably from 1,500 to 30,000, and most preferably from 2,000 to 20,000. When the weight average molecular weight is not more than the upper limit of the above range, the polymeric compound (A1) exhibits satisfactory solubility in a resist solvent when used as a resist. On the other hand, when the weight average molecular weight is at least as large as the lower limit of the above range, the dry etching resistance and the cross-sectional shape of the resist pattern are improved.

Further, although there are no particular limitations on the dispersity (Mw/Mn) of the component (A1), the dispersity is preferably from 1.0 to 5.0, more preferably from 1.0 to 3.0, and most preferably from 1.0 to 2.5. Here, Mn represents the number-average molecular weight.

The component (A) may also include another base component besides the component (A1) (hereafter referred to as "component (A2)"), provided the inclusion of the component (A2) does not impair the effects of the present invention.

As the component (A2), a low molecular weight compound that has a molecular weight of at least 500 and less than 2,500, contains a hydrophilic group, and also contains an acid-dissociable group such as those described above in connection with the component (A1) may be used. Specific examples include compounds containing a plurality of phenol structures in which part or all of the hydrogen atoms of the hydroxyl groups have each been substituted with an aforementioned acid-dissociable group.

These low molecular weight compounds are preferably low molecular weight phenolic compounds in which part of the hydroxyl group hydrogen atoms have each been substituted with an aforementioned acid-dissociable group. These types of compounds are known, for example, as sensitizers or heat resistance improvers for use in non-chemically amplified g-line or i-line resists, and any of these compounds may be used.

Examples of these low molecular weight phenol compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers, tetramers, pentamers and hexamers of formalin condensation products of phenols such as phenol, m-cresol, p-cresol and xylenol. Needless to say, the low molecular weight phenol compound is not limited to these examples. In particular, a phenol compound having 2 to 6 triphenylmethane structures is preferable, as such compounds yield superior levels of resolution and line width roughness (LWR). There are no particular limitations on the acid-dissociable group, and examples include the groups described above.

In the resist composition of the present invention, the amount of the component (A) may be adjusted in accordance with factors such as the thickness of the resist film that is to be formed.

<Optional Components>

[Component (B)]

The resist composition of the present invention may also include, in addition to the component (A) described above, an acid generator component (B) that generates acid upon exposure (hereafter referred to as "component (B)").

There are no particular limitations on the component (B), and any of the known materials that have been proposed as acid generators for chemically amplified resists can be used.

Examples of these acid generators are numerous, and include onium salt acid generators such as iodonium salts and sulfonium salts, oxime sulfonate acid generators, diazomethane acid generators such as bisalkyl or bisaryl sulfonyl diazomethanes and poly(bis-sulfonyl)diazomethanes, nitrobenzylsulfonate acid generators, iminosulfonate acid generators, and disulfone acid generators.

Examples of onium salt acid generators include compounds represented by a general formula (b-1) or (b-2) shown below.

[Chemical Formula 92]

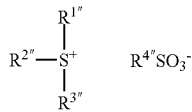

(b-1)

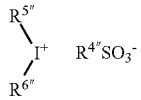

(b-2)

In the formulas, each of $R^{1\prime\prime}$ to $R^{3\prime\prime}$, $R^{5\prime\prime}$ and $R^{6\prime\prime}$ independently represents an aryl group, alkyl group or alkenyl group which may have a substituent. In the formula (b-1), two of $R^{1\prime\prime}$ to $R^{3\prime\prime}$ may be bonded to each other to form a ring together with the sulfur atom in the formula. $R^{4\prime\prime}$ represents an alkyl group, halogenated alkyl group, aryl group or alkenyl group which may have a substituent.

In the formula (b-1), $R^{1\prime\prime}$ to $R^{3\prime\prime}$ are the same as defined above for $R^{1\prime\prime}$ to $R^{3\prime\prime}$ in the general formula (g-c1). Among these groups, from the viewpoint of better improving the lithography properties and the resist pattern shape, it is preferable that at least one of $R^{1\prime\prime}$ to $R^{3\prime\prime}$ is an aryl group, more preferable that at least two of $R^{1\prime\prime}$ to $R^{3\prime\prime}$ are aryl groups, and most preferable that all of $R^{1\prime\prime}$ to $R^{3\prime\prime}$ are aryl groups.

In the formula (b-2), $R^{5\prime\prime}$ and $R^{6\prime\prime}$ are the same as defined above for $R^{5\prime\prime}$ and $R^{6\prime\prime}$ in the general formula (g-c2). Among these groups, from the viewpoint of better improving the lithography properties and the resist pattern shape, it is preferable that at least one of $R^{5\prime\prime}$ and $R^{6\prime\prime}$ is an aryl group, and more preferable that both of $R^{5\prime\prime}$ and $R^{6\prime\prime}$ are aryl groups.

In the formula (b-1), $R^{4\prime\prime}$ represents an alkyl group, halogenated alkyl group, aryl group or alkenyl group which may have a substituent.

The alkyl group for $R^{4\prime\prime}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for $R^{4\prime\prime}$ include groups in which part or all of the hydrogen atoms of an aforementioned linear, branched or cyclic alkyl group have each been substituted with a halogen atom. Examples of the halogen atom include a fluorine atom, chlorine atom, bromine atom and iodine atom, and a fluorine atom is preferable.

In the halogenated alkyl group, the percentage of the number of halogen atoms relative to the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4\prime\prime}$ is preferably an aryl group of 6 to 20 carbon atoms.

The alkenyl group for $R^{4\prime\prime}$ is preferably an alkenyl group of 2 to 10 carbon atoms.

With respect to $R^{4\prime\prime}$, the expression "may have a substituent" means that part or all of the hydrogen atoms within the aforementioned alkyl group, halogenated alkyl group, aryl group or alkenyl group may each be substituted with a substituent (an atom other than a hydrogen atom, or a group).

$R^{4\prime\prime}$ may have one substituent, or two or more substituents.

Examples of the substituent include a halogen atom, a hetero atom, an alkyl group, and a group represented by the formula $R^X$-$Q^1$- (wherein $Q^1$ represents a divalent linking group containing an oxygen atom, and $R^X$ represents a hydrocarbon group of 3 to 30 carbon atoms which may have a substituent).

Examples of the halogen atom and the alkyl group include the same halogen atoms and alkyl groups as those described above with respect to the halogenated alkyl group for $R^{4\prime\prime}$.

Examples of the hetero atom include an oxygen atom, a nitrogen atom, and a sulfur atom.

In the group represented by the formula $R^X$-$Q^1$-, $Q^1$ represents a divalent linking group containing an oxygen atom.

$Q^1$ may also contain atoms other than the oxygen atom. Examples of these atoms other than the oxygen atom include a carbon atom, hydrogen atom, sulfur atom and nitrogen atom.

Examples of the divalent linking group containing an oxygen atom include non-hydrocarbon, oxygen atom-containing linking groups such as an oxygen atom (an ether linkage, —O—), an ester linkage (—C(=O)—O—), an amide linkage (—C(=O)—NH—), a carbonyl group (—C(=O)—), a carbonate linkage (—O—C(=O)—O—), and combinations of these non-hydrocarbon, oxygen atom-containing linking groups with an alkylene group.

Specific examples of these combinations include —$R^{91}$—O—, —$R^{92}$—O—C(=O)—, —C(=O)—O—$R^{92}$—, and —C(=O)—O—$R^{93}$—O—C(=O)— (wherein each of $R^{91}$ to $R^{93}$ independently represents an alkylene group).

The alkylene group for $R^{91}$ to $R^{93}$ is preferably a linear or branched alkylene group, and preferably contains 1 to 12 carbon atoms, more preferably 1 to 5 carbon atoms, and most preferably 1 to 3 carbon atoms.

$Q^1$ is preferably a divalent linking group containing an ester linkage or an ether linkage, and of such groups, is more preferably a group represented by —$R^{91}$—O—, —$R^{92}$—β—C(=O)— or —C(=O)—O—$R^{93}$—O—C(=O)—.

In the group represented by the formula $R^X$-$Q^1$-, the hydrocarbon group for $R^X$ may be either an aromatic hydrocarbon group or an aliphatic hydrocarbon group.

The aromatic hydrocarbon group is a hydrocarbon group having an aromatic ring. The aromatic hydrocarbon group preferably has 5 to 30 carbon atoms, more preferably 5 to 20 carbon atoms, still more preferably 6 to 15 carbon atoms, and most preferably 6 to 12 carbon atoms. Here, the number of carbon atoms within substituents is not included in the number of carbon atoms of the aromatic hydrocarbon group.

Specific examples of the aromatic hydrocarbon group include aryl groups, which are groups in which one hydrogen atom has been removed from an aromatic hydrocarbon ring, such as a phenyl group, biphenylyl group, fluorenyl group, naphthyl group, anthryl group and phenanthryl group, and arylalkyl groups such as a benzyl group, phenethyl group, 1-naphthylmethyl group, 2-naphthylmethyl group, 1-naphthylethyl group and 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which part of the carbon atoms that constitute the ring within an aforementioned aryl group have been substituted with a hetero atom such as an oxygen atom, a sulfur atom or a nitrogen atom, and heteroarylalkyl groups in which part of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group and oxygen atom (=O) and the like.

The alkyl group as the substituent for the aromatic hydrocarbon group is preferably an alkyl group of 1 to 5 carbon atoms, and a methyl group, ethyl group, propyl group, n-butyl group or tert-butyl group is the most desirable.

The alkoxy group as the substituent for the aromatic hydrocarbon group is preferably an alkoxy group of 1 to 5 carbon atoms, is more preferably a methoxy group, ethoxy group, n-propoxy group, iso-propoxy group, n-butoxy group or tert-butoxy group, and is most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atom.

The aliphatic hydrocarbon group for $R^X$ may be either a saturated aliphatic hydrocarbon group or an unsaturated aliphatic hydrocarbon group. Further, the aliphatic hydrocarbon group may be linear, branched or cyclic.

In the aliphatic hydrocarbon group for $R^X$, part of the carbon atoms that constitute the aliphatic hydrocarbon group may be substituted with a substituent containing a hetero atom, or part or all of the hydrogen atoms that constitute the aliphatic hydrocarbon group may each be substituted with a substituent containing a hetero atom.

There are no particular limitations on this "hetero atom" within $R^X$, provided it is an atom other than a carbon atom or a hydrogen atom. Examples of the hetero atom include a halogen atom, oxygen atom, sulfur atom and nitrogen atom.

Examples of the halogen atom include a fluorine atom, chlorine atom, iodine atom and bromine atom.

The substituent containing a hetero atom may consist solely of the hetero atom, or may be a group that also contains a group or atom other than the hetero atom.

Specific examples of the substituent for substituting part of the carbon atoms include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituents in the ring structure.

Examples of the substituent for substituting part or all of the hydrogen atoms include an alkoxy group, halogen atom, halogenated alkyl group, hydroxyl group, oxygen atom (=O) and cyano group.

The alkoxy group is preferably an alkoxy group of 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom include a fluorine atom, chlorine atom, bromine atom and iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably contains 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably contains 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably contains 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (allyl group) and a butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

When the aliphatic cyclic group does not contain a hetero atom-containing substituent in the ring structure, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent in the ring structure, the hetero atom-containing substituent is preferably —O—, —C(=O)—O—, —S—, —S(=O)$_2$— or —S(=O)$_2$—O—. Specific examples of such aliphatic cyclic groups include the groups represented by formulas (L1) to (L6) and (S1) to (S4) shown below.

[Chemical Formula 93]

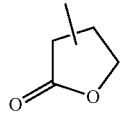

(L1)

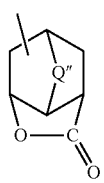

(L2)

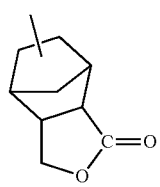

(L3)

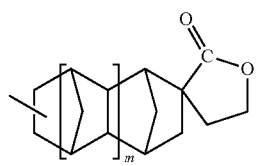

(L4)

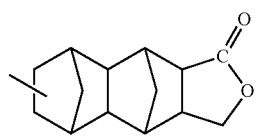

(L5)

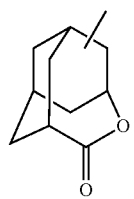

(L6)

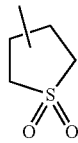

(S1)

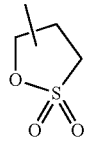

(S2)

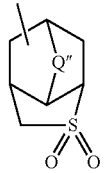

(S3)

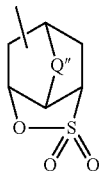
(S4)

In the above formulas, Q″ represents an alkylene group of 1 to 5 carbon atoms, —O—, —S—, —O—R$^{94}$— or —S—R$^{95}$—, wherein each of R$^{94}$ and R$^{95}$ independently represents an alkylene group of 1 to 5 carbon atoms, and m represents an integer of 0 or 1.

Examples of the alkylene groups for Q″ R$^{94}$ and R$^{95}$ include the same alkylene groups as those described above for R$^{91}$ to R$^{93}$.

In these aliphatic cyclic groups, part of the hydrogen atoms bonded to the carbon atoms that constitute the ring structure may each be substituted with a substituent. Examples of this substituent include an alkyl group, alkoxy group, halogen atom, halogenated alkyl group, hydroxyl group and oxygen atom (═O).

As the alkyl group, an alkyl group of 1 to 5 carbon atoms is preferable, and a methyl group, ethyl group, propyl group, n-butyl group or tert-butyl group is particularly desirable.

Examples of the alkoxy group and the halogen atom include the same groups and atoms as those listed above for the substituent used for substituting part or all of the hydrogen atoms of the aliphatic hydrocarbon group for R$^X$.

In the present invention, R$^X$ is preferably a cyclic group which may have a substituent. This cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, a polycyclic aliphatic cyclic group which may have a substituent is preferable. As this polycyclic aliphatic cyclic group, groups in which one or more hydrogen atoms have been removed from an aforementioned polycycloalkane, and groups represented by the above formulas (L2) to (L6), and (S3) and (S4) are preferable.

Further, from the viewpoint of better improving the lithography properties and the resist pattern shape, a group that includes a polar region is particularly desirable as R$^X$.

Examples of this type of group having a polar region include groups in which part of the carbon atoms that constitute an aliphatic cyclic group described above for R$^X$ have been substituted with a substituent containing a hetero atom such as —O—, —C(═O)—O—, —C(═O)—, —O—C(═O)—O—, —C(═O)—NH—, —NH— (wherein H may be substituted with a substituent such as an alkyl group or an acyl group), —S—, —S(═O)$_2$— and —S(═O)$_2$—O—.

Of the various possibilities described above, R$^{4″}$ preferably has R$^X$-Q$^1$- as a substituent. In such a case, R$^{4″}$ is preferably a group represented by the formula R$^X$-Q$^1$—Y$^1$— (wherein Q$^1$ and R$^X$ are the same as defined above, and Y$^1$ represents an alkylene group of 1 to 4 carbon atoms which may have a substituent, or a fluorinated alkylene group of 1 to 4 carbon atoms which may have a substituent).

In the group represented by the formula R$^X$-Q$^1$-Y$^1$—, examples of the alkylene group represented by Y$^1$ include those alkylene groups described above for Q$^1$ in which the number of carbon atoms is within a range from 1 to 4.

Examples of the fluorinated alkylene group for Y$^1$ include groups in which part or all of the hydrogen atoms of an aforementioned alkylene group have each been substituted with a fluorine atom.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—; —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)— and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$— and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may each be substituted, either with an atom other than a hydrogen atom or fluorine atom, or with a group.

Examples of substituents with which the alkylene group or fluorinated alkylene group may be substituted include alkyl groups of 1 to 4 carbon atoms, alkoxy groups of 1 to 4 carbon atoms, and a hydroxyl group.

Examples of R$^{4″}$ within the formula (b-2) include the same groups as those described above for R$^{4″}$ in the formula (b-1).

Specific examples of the onium salt acid generators represented by the formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl (1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyetetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; (3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

Furthermore, it is also possible to use onium salts in which the anion moiety of these onium salts has either been replaced by an alkyl sulfonate such as methanesulfonate, n-propanesulfonate, n-butanesulfonate, n-octanesulfonate, 1-adamantanesulfonate or 2-norbornanesulfonate, or been replaced by a sulfonate such as d-camphor-10-sulfonate, benzenesulfonate, perfluorobenzenesulfonate or p-toluenesulfonate.

Furthermore, onium salts in which the anion moiety of these onium salts has been replaced by an anion moiety represented by any one of formulas (b1) to (b8) shown below can also be used.

[Chemical Formula 94]

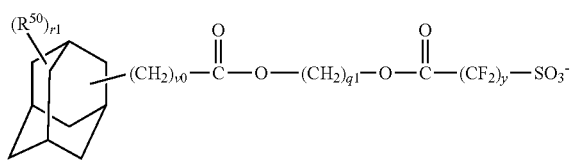
(b1)

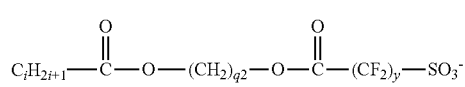
(b2)

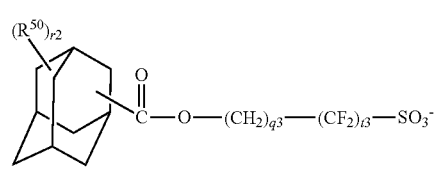
(b3)

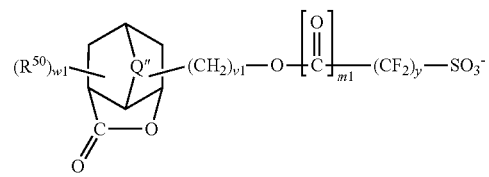
(b4)

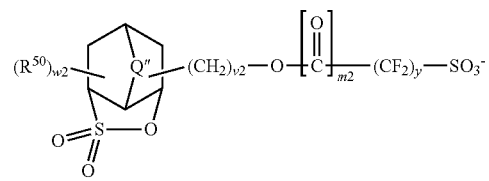
(b5)

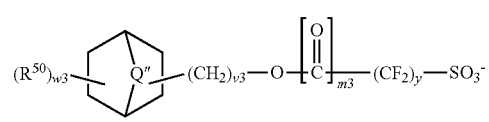
(b6)

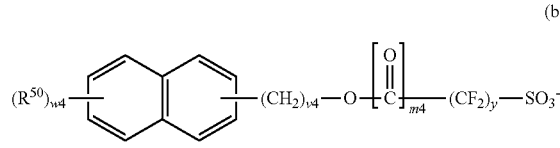
(b7)

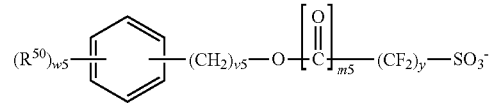
(b8)

In the above formulas, y represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^{50}$ represents a substituent, each of m1 to m5 independently represents 0 or 1, each of v0 to v5 independently represents an integer of 0 to 3, each of w1 to w5 independently represents an integer of 0 to 3, and Q″ is the same as defined above.

Examples of the substituent for $R^{50}$ include the same groups as those which the aforementioned aliphatic hydrocarbon group or aromatic hydrocarbon group for $R^X$ may have as a substituent.

When the subscript r1, r2 or w1 to w5 appended to $R^{50}$ represents an integer of 2 or more, the corresponding plurality of $R^{50}$ groups within the compound may be the same or different.

Further, onium salt acid generators in which the anion moiety ($R^{4''}SO_3^-$) in the above general formula (b-1) or (b-2) has been replaced by an anion moiety represented by a general formula (b-3) or (b-4) shown below (but in which the cation moiety is the same as the cation shown in the formula (b-1) or (b-2)) may also be used as the onium salt acid generator.

[Chemical Formula 95]

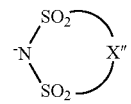
(b-3)

-continued

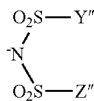
(b-4)

In the formulas, X" represents an alkylene group of 2 to 6 carbon atoms in which at least one hydrogen atom has been substituted with a fluorine atom, and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms in the alkylene group for X" or the alkyl group for Y" and Z" within the above-mentioned ranges of the number of carbon atoms, the more the solubility in a resist solvent is improved, and therefore a smaller number of carbon atoms is preferred.

Further, in the alkylene group for X" or the alkyl group for Y" and Z", it is preferable that the number of hydrogen atoms substituted with fluorine atoms is as large as possible, because the acid strength increases and the transparency to high energy radiation of 200 nm or less or electron beam is improved.

The proportion of fluorine atoms within the alkylene group or alkyl group, namely the fluorination ratio, is preferably within a range from 70 to 100%, and more preferably from 90 to 100%. A perfluoroalkylene or perfluoroalkyl group in which all the hydrogen atoms are substituted with fluorine atoms is the most desirable.

Further, as the onium salt acid generator, onium salts of the above general formula (b-1) or (b-2) in which the anion moiety ($R^{4"}SO_3^-$) has been substituted with $R^h$—$COO^-$ (wherein $R^h$ represents an alkyl group or a fluorinated alkyl group) (and in which the cation moiety is the same as that of the general formula (b-1) or (b-2)) may also be used.

Examples of $R^h$ in the above formula include the same groups as those described above for $R^{4"}$.

Specific examples of $R^h$—$COO^-$ include a trifluoroacetate ion, an acetate ion, and a 1-adamantanecarboxylate ion.

Furthermore, as the onium salt acid generator, sulfonium salts having a cation represented by one of the above general formulas (g-c3) or (g-c4) as the cation moiety can also be used.

Moreover, sulfonium salts having a cation represented by one of the above general formulas (g-c5) or (g-c6) as the cation moiety can also be used.

There are no particular limitations on the anion moiety of the sulfonium salt having a cation represented by one of the above general formulas (g-c3) to (g-c6) as the cation moiety, and the same anion moieties as those of conventionally proposed onium salt-based acid generators may be used. Examples of the anion moiety include a fluorinated alkylsulfonate ion such as the anion moiety ($R^{4"}SO_3^-$) of an onium salt-based acid generator represented by one of the aforementioned general formulas (b-1) or (b-2), an anion moiety represented by one of the aforementioned general formula (b-3) or (b-4), and an anion moiety represented by one of the aforementioned formulas (b1) to (b8).

In the present description, an oxime sulfonate-based acid generator is a compound having at least one group represented by a general formula (B-1) shown below, and has a feature of generating acid by irradiation. Such oxime sulfonate acid generators are widely used for chemically amplified resist compositions, and any of these known compounds may be selected as appropriate.

[Chemical Formula 96]

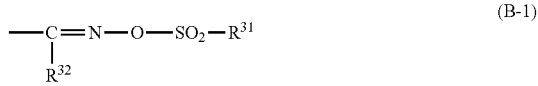
(B-1)

In the formula (B-1), each of $R^{31}$ and $R^{32}$ independently represents an organic group.

The organic group for $R^{31}$ and $R^{32}$ refers to a group containing a carbon atom, and may also include atoms other than the carbon atom (such as a hydrogen atom, oxygen atom, nitrogen atom, sulfur atom or halogen atom (such as a fluorine atom or chlorine atom) or the like).

The organic group for $R^{31}$ is preferably a linear, branched or cyclic alkyl group, or an aryl group. The alkyl group or aryl group may have a substituent. There are no particular limitations on the substituent, and examples include a fluorine atom or a linear, branched or cyclic alkyl group having 1 to 6 carbon atoms. The expression that the alkyl group or aryl group "may have a substituent" means that part or all of the hydrogen atoms of the alkyl group or aryl group may each be substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereafter, sometimes referred to as a "halogenated alkyl group") is particularly desirable. A "partially halogenated alkyl group" refers to an alkyl group in which part of the hydrogen atoms are each substituted with a halogen atom, whereas a "completely halogenated alkyl group" refers to an alkyl group in which all of the hydrogen atoms are substituted with halogen atoms. Examples of the halogen atom include a fluorine atom, chlorine atom, bromine atom or iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, a partially or completely halogenated aryl group is particularly desirable. A "partially halogenated aryl group" refers to an aryl group in which part of the hydrogen atoms are each substituted with a halogen atom, whereas a "completely halogenated aryl group" refers to an aryl group in which all of hydrogen atoms are substituted with halogen atoms.

As the organic group for $R^{31}$, an alkyl group of 1 to 4 carbon atoms which has no substituent, or a fluorinated alkyl group of 1 to 4 carbon atoms is particularly desirable.

The organic group for $R^{32}$ is preferably a linear, branched or cyclic alkyl group, an aryl group, or a cyano group. Examples of the alkyl group and the aryl group for $R^{32}$ include the same alkyl groups and aryl groups as those described above for $R^{31}$.

As the organic group for $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by a general formula (B-2) or (B-3) shown below.

[Chemical Formula 97]

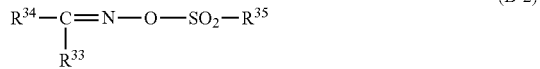

(B-2)

In the formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 98]

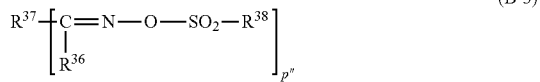

(B-3)

In the formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In the general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group for $R^{33}$ preferably has 50% or more of the alkyl group hydrogen atoms fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group and phenanthryl group, and heteroaryl groups in which part of the carbon atoms that constitute the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group, a halogenated alkyl group or an alkoxy group of 1 to 10 carbon atoms. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

In terms of enhancing the strength of the acid generated, the fluorinated alkyl group for $R^{35}$ preferably has 50% or more of the hydrogen atoms within the alkyl group fluorinated, more preferably 70% or more fluorinated, and still more preferably 90% or more fluorinated. A completely fluorinated alkyl group in which 100% of the hydrogen atoms have been substituted with fluorine atoms is particularly desirable.

In the general formula (B-3), examples of the alkyl group having no substituent or the halogenated alkyl group for $R^{36}$ include the same groups as those described above for the alkyl group having no substituent or the halogenated alkyl group for $R^{33}$.

Examples of the divalent or trivalent aromatic hydrocarbon group for $R^{37}$ include groups in which an additional one or two hydrogen atoms have been removed from the aryl group described above for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of suitable oxime sulfonate acid generators include α-(p-toluenesulfonyl oxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyamino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, (ethylsulfonyloxyimino)-ethyl acetonitrile, α-(propylsulfonyloxyimino)-propyl acetonitrile, α-(cyclohexyl sulfonyl oxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described on pages 65 to 85) may also be used favorably.

Furthermore, the following compounds may also be used as preferred examples.

[Chemical Formula 99]

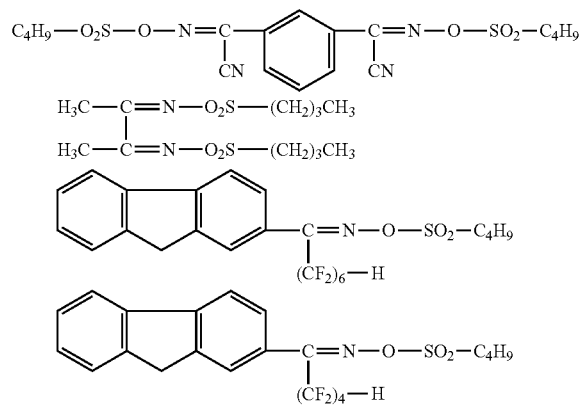

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B), one type of acid generator described above may be used alone, or two or more types may be used in combination.

The amount of the component (B) within the resist composition of the present invention is preferably within a range from 0.5 to 60 parts by weight, more preferably from 1 to 50 parts by weight, and still more preferably from 1 to 40 parts by weight, relative to 100 parts by weight of the component (A). By ensuring that the amount of the component (B) satisfies the above range, pattern formation can be performed satisfactorily. Further, a uniform solution can be obtained when each of the components of the resist composition is dissolved in an organic solvent, and the storage stability of the composition tends to improve.

[Component (D)]

The resist composition of the present invention may also include a nitrogen-containing organic compound (D) (hereafter referred to as "component (D)") that does not correspond with the aforementioned components (A) and (B), provided the effects of the present invention are not impaired.

There are no particular limitations on the component (D) provided it functions as an acid diffusion control agent, namely, a quencher which traps the acid generated from the component (A) (the structural unit (a5)), or the combination of the component (A) (the structural unit (a5)) and the component (B), upon exposure, and any of the multitude of compounds that have already been proposed may be used as appropriate. Examples include amines such as aliphatic amines and aromatic amines, and of these, an aliphatic amine, and particularly a secondary aliphatic amine or tertiary aliphatic amine, is preferable.

An "aliphatic amine" is an amine having one or more aliphatic groups, wherein each of the aliphatic groups preferably contains 1 to 20 carbon atoms.

Examples of these aliphatic amines include amines in which at least one hydrogen atom of ammonia ($NH_3$) has been substituted with an alkyl group or hydroxyalkyl group of 1 to 20 carbon atoms (namely, alkylamines or alkyl alcohol amines), and cyclic amines.

The alkyl group or the alkyl group within the hydroxyalkyl group may be linear, branched or cyclic.

When the alkyl group is a linear or branched group, the alkyl group preferably contains 2 to 20 carbon atoms, and more preferably 2 to 8 carbon atoms.

When the alkyl group is a cyclic group (namely, a cycloalkyl group), the cycloalkyl group preferably contains 3 to 30 carbon atoms, more preferably 3 to 20 carbon atoms, still more preferably 3 to 15 carbon atoms, still more preferably 4 to 12 carbon atoms, and most preferably 5 to 10 carbon atoms. The cycloalkyl group may be either monocyclic or polycyclic. Examples include groups in which one or more hydrogen atoms have been removed from a monocycloalkane, and groups in which one or more hydrogen atoms have been removed from a polycycloalkane such as a bicycloalkane, tricycloalkane or tetracycloalkane. Specific examples of the monocycloalkane include cyclopentane and cyclohexane. Further, specific examples of the polycycloalkane include adamantane, norbornane, isobornane, tricyclodecane and tetracyclododecane.

Specific examples of the alkylamine include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, and trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine.

Specific examples of the alkyl alcohol amine include diethanolamine, triethanolamine, diisopropanolamine, triisopropanolamine, di-n-octanolamine, tri-n-octanolamine, stearyldiethanolamine and lauryldiethanolamine.

Examples of the cyclic amine include heterocyclic compounds containing a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples include 1,5-diazabicyclo[4.3.0]-5-nonene, 1,8-diazabicyclo[5.4.0]-7-undecene, hexamethylenetetramine and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{2-(2-hydroxyethoxy)ethoxy}ethyl]amine.

Examples of the aromatic amine include aniline, pyridine, 4-dimethylaminopyridine, pyrrole, indole, pyrazole, imidazole and derivatives thereof, diphenylamine, triphenylamine and tribenzylamine.

One of these compounds may be used alone, or two or more compounds may be used in combination.

The component (D) is typically used in an amount within a range from 0.01 to 5.0 parts by weight relative to 100 parts by weight of the component (A). When the amount of the component (D) is within the above range, the shape of the resist pattern and the post exposure stability of the latent image formed by the pattern-wise exposure of the resist layer are improved.

[Component (E)]

In order to prevent any deterioration in sensitivity and improve the resist pattern shape and the post exposure stability of the latent image formed by the pattern-wise exposure of the resist layer, at least one compound (E) (hereafter referred to as "component (E)") selected from the group consisting of organic carboxylic acids, and phosphorus oxo acids and derivatives thereof may be added to the resist composition as an optional component.

Examples of the organic carboxylic acids include acetic acid, malonic acid, citric acid, malic acid, succinic acid, benzoic acid, and salicylic acid.

Examples of the phosphorus oxo acids include phosphoric acid, phosphonic acid and phosphinic acid, and among these, phosphonic acid is particularly desirable.

Examples of the oxo acid derivatives include esters in which a hydrogen atom within an aforementioned oxo acid is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenyl phosphonate, diphenyl phosphonate and dibenzyl phosphonate.

Examples of phosphinic acid derivatives include phenylphosphinic acid and phosphinate esters.

As the component (E), one type of compound may be used alone, or two or more types of compounds may be used in combination.

The component (E) is typically used in an amount within a range from 0.01 to 5.0 parts by weight, relative to 100 parts by weight of the component (A).

[Component (F)]

The resist composition of the present invention may further include a fluorine additive (hereafter, referred to as "component (F)") for the purpose of imparting the resist film with water repellency. By including the component (F), the hydrophobicity of the resist film surface can be enhanced, thereby better suppressing the occurrence of post-developing defects.

Examples of compounds that may be used as the component (F) include the fluorine-containing polymeric compounds disclosed in Japanese Unexamined Patent Application, First Publication No. 2010-002870.

Specific examples of preferred compounds for the component (F) include copolymers having a structural unit represented by a general formula (f1) shown below. More specifically, polymers (homopolymers) composed solely of a structural unit represented by the formula (f1) shown below, copolymers containing a structural unit represented by the formula (f1) shown below and an aforementioned structural unit (a1), and copolymers containing a structural unit represented by the formula (f1) shown below, a structural unit derived from acrylic acid or methacrylic acid, and an aforementioned structural unit (a1) are particularly preferred.

Among the various structural units (a1), a structural unit represented by the above formula (a1-1-32) is particularly desirable.

[Chemical Formula 100]

(f1)

In the formula, R represents a hydrogen atom, an alkyl group of 1 to 5 carbon atoms or a halogenated alkyl group of 1 to 5 carbon atoms, $R^{7''}$ represents an organic group containing a fluorine atom, and $R^{8''}$ represents an alkylene group of 1 to 5 carbon atoms which may have a substituent.

In the above formula (f1), $R^{7''}$ represents an organic group containing a fluorine atom, and is preferably a hydrocarbon group containing a fluorine atom. The hydrocarbon group containing a fluorine atom is preferably a fluorinated alkyl group, and more preferably a fluorinated alkyl group of 1 to 5 carbon atoms. Among such groups, $R^{7''}$ is preferably a group represented by $-(CH_2)_o-CF_3$ (wherein o indicates the number of repeating $CH_2$ units, and is typically an integer of 1 to 3).

In the formula (f1), the alkylene group for $R^{8''}$ contains 1 to 5 carbon atoms, preferably 1 to 3 carbon atoms, and more preferably 1 or 2 carbon atoms. The hydrogen atoms of the alkylene group for $R^{8''}$ may each be substituted with a fluorine atom, an alkyl group of 1 to 5 carbon atoms or a fluorinated alkyl group of 1 to 5 carbon atoms.

In the formula (f1), R is the same as defined above, and is preferably a hydrogen atom or a methyl group.

As the component (F), a single compound may be used alone, or two or more compounds may be used in combination.

The component (F) is typically used in an amount within a range from 1 to 10 parts by weight, relative to 100 parts by weight of the component (A). By ensuring that the amount of the component (F) satisfies the above range, the hydrophobicity of the resist film surface can be enhanced, and the occurrence of post-developing defects can be better suppressed.

If desired, other miscible additives can also be added to the resist composition of the present invention in appropriate amounts. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be produced by dissolving the materials for the resist composition in an organic solvent (hereafter also referred to as "component (S)").

The component (S) may be any organic solvent which can dissolve the respective components to give a uniform solution, and one or more types of organic solvent may be selected appropriately from those solvents that have been conventionally known as solvents for a chemically amplified resists.

Examples include lactones such as γ-butyrolactone; ketones such as acetone, methyl ethyl ketone, cyclohexanone, methyl n-pentyl ketone, methyl isopentyl ketone and 2-heptanone; polyhydric alcohols such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These organic solvents may be used individually, or as a mixed solvent containing two or more solvents.

Among the above solvents, γ-butyrolactone, propylene glycol monomethyl ether acetate (PGMEA), propylene glycol monomethyl ether (PGME), cyclohexanone, and ethyl lactate (EL) are preferred.

Further, among the mixed solvents, a mixed solvent obtained by mixing PGMEA with a polar solvent is preferable. The mixing ratio (weight ratio) of the mixed solvent may be determined as appropriate, with due consideration of the compatibility of the PGMEA with the polar solvent, but is preferably within a range from 1:9 to 9:1, and more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3. Furthermore, when a combination of PGME and cyclohexanone is mixed as the polar solvent, the PGMEA:(PGME+cyclohexanone) weight ratio is preferably from 1:9 to 9:1, more preferably from 2:8 to 8:2, and still more preferably from 3:7 to 7:3.

Further, as the component (S), a mixed solvent of PGMEA, EL or an aforementioned mixed solvent of PGMEA and a polar solvent, with γ-butyrolactone is also preferable. In this case, the mixing ratio (former:latter) of the mixed solvent is preferably from 70:30 to 95:5.

There are no particular limitations on the amount used of the component (S), which may be adjusted appropriately to produce a concentration that enables application of a coating solution onto a substrate in accordance with the thickness of the coating film. In general, the organic solvent is used in an amount that yields a solid fraction concentration for the resist composition that is within a range from 1 to 20% by weight, and preferably from 2 to 15% by weight.

<<Method of Forming Resist Pattern>>

The method of forming a resist pattern according to the present invention includes: forming a resist film on a substrate using the resist composition according to the present invention described above, conducting exposure of the resist film, and developing the resist film to form a resist pattern.

The method for forming a resist pattern according to the present invention can be performed, for example, as follows.

First, the resist composition of the present invention is applied onto a substrate using a spinner or the like, and a bake treatment (post applied bake (PAB)) is conducted under temperature conditions of 80 to 150° C. for 40 to 120 seconds, and preferably 60 to 90 seconds to form a resist film.

Subsequently, the resist film is selectively exposed using an exposure apparatus such as an ArF exposure apparatus, electron beam exposure apparatus or EUV exposure apparatus, either by irradiation through a mask having a predetermined pattern formed therein (namely, a mask pattern), or by patterning via direct irradiation with an electron beam without using a mask pattern, and the resist film is then subjected to a bake treatment (post exposure bake (PEB)) under temperature conditions of 80 to 150° C. for 40 to 120 seconds, and preferably 60 to 90 seconds.

Next, the resist film is subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment and/or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

There are no particular limitations on the substrate, and a conventionally known substrate may be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) or an organic film such as the lower organic film in a multilayer resist method can be used.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

There are no particular limitations on the wavelength used for exposure, and the exposure can be conducted using radiation such as an ArF excimer laser, KrF excimer laser, $F_2$ excimer laser, extreme ultraviolet radiation (EUV), vacuum ultraviolet radiation (VUV), electron beam (EB), X-rays, and soft X-rays. The resist composition described above is particularly effective for use with a KrF excimer laser, ArF excimer laser, EB or EUV.

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film that is to be exposed. The refractive index of the immersion medium is not particularly limited as long at it satisfies the above requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon solvents.

Conventional additives may be added to the organic developing solution as required. Examples of these additives include surfactants. There are no particular limitations on the surfactants, and for example, at least one ionic or nonionic fluorine-based surfactant, and/or ionic or nonionic silicon-based surfactant can be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following a solvent developing process include those organic solvents among the solvents described above for the organic solvent of the organic developing solution which exhibit poor dissolution of the resist pattern. Examples of typical solvents that may be used include one or more solvents selected from among hydrocarbon solvents, ketone-based solvents, ester-based solvents, alcohol-based solvents, amide-based solvents and ether-based solvents. Among these, at least one solvent selected from among hydrocarbon solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

EXAMPLES

A more detailed description of the present invention is presented below based on a series of examples, although the scope of the present invention is in no way limited by these examples.

In the examples, a compound represented by a chemical formula (1) is designated as "compound (1)", and a similar labeling system applies for compounds represented by other chemical formulas.

Method of Producing Polymeric Compounds

[Monomer Synthesis Example (Synthesis of Compounds (51) to (54) and (51a2)]

In the examples, the compounds (51) to (54) and (51a2) used as water-soluble monomers were synthesized by a typical sulfonate esterification reaction or a sulfonamidation reaction.

Each of these compounds (51) to (54) and (51a2) formed a transparent solution with no cloudiness when 1 g of the compound was dissolved in 100 g of water at 25° C.

Example 1

Production of Polymeric Compound (1)

Step (i):

In a separable flask fitted with a thermometer, a reflux condenser and a nitrogen inlet tube, 38.00 g (120.13 mmol) of a compound (01), 61.10 g (232.84 mmol) of a compound (11) and 11.24 g (37.05 mmol) of a compound (51) were dissolved in 138.75 g of a mixed solvent of ethyl lactate and γ-butyrolactone (EL/GBL). As a polymerization initiator, 27.30 mmol of dimethyl azobisisobutyrate (V-601, manufactured by Wako Pure Chemical Industries, Ltd.) was then added to the resulting solution and dissolved.

This solution was then added dropwise, over 4 hours and under a nitrogen atmosphere, to 76.90 g of a mixed solvent of EL/GBL that had been heated to 80° C. Following completion of the dropwise addition, the reaction solution was stirred under heat for one hour, and the reaction solution was then cooled to room temperature.

Subsequently, the obtained polymerization reaction solution was added dropwise to a large volume of isopropanol to precipitate the polymer, and the precipitated white powder (precursor polymer) was then collected by filtration.

Step (ii):

The obtained precursor polymer was dissolved in dichloromethane, and washed with water (liquid-liquid extraction). Subsequently, the solution was once again added dropwise to a large volume of isopropanol to precipitate the polymer, and the precipitated white powder was collected by filtration.

The thus obtained white powder was then dried, yielding 66.20 g of a polymeric compound (1-0).

[Chemical Formula 101]

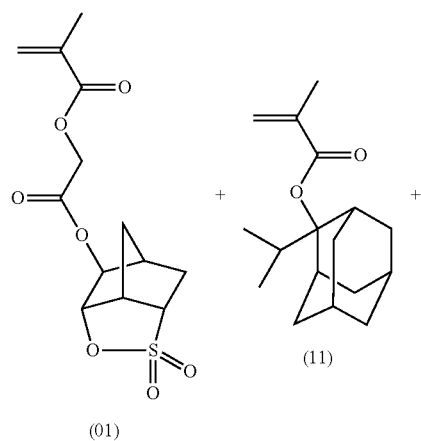

(01)   (11)

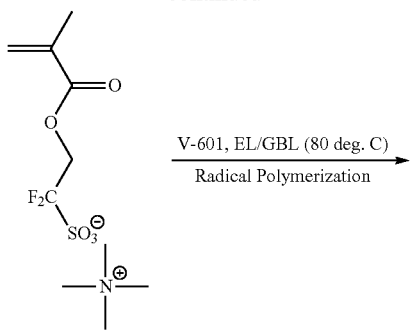

(51)

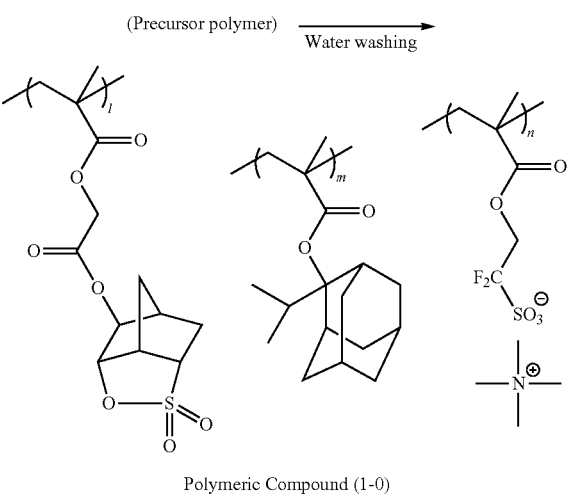

Polymeric Compound (1-0)

Step (iii):

The obtained 66.20 g of the polymeric compound (1-0) was placed in a round-bottom flask, and following dissolution in 331 g of dichloromethane, 11.24 g of a compound (c1) and 331 g of water were added to the flask and stirred for 30 minutes (salt exchange). The organic layer was then extracted.

Subsequently, the extracted organic layer was washed with water, and the solvent was removed by evaporation, yielding 64.23 g of the target polymeric compound (1).

[Chemical Formula 102]

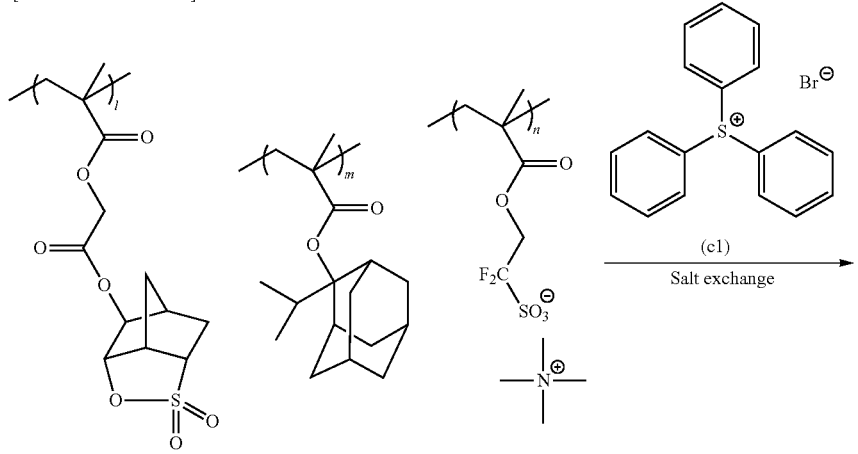

Polymeric Compound (1-0)

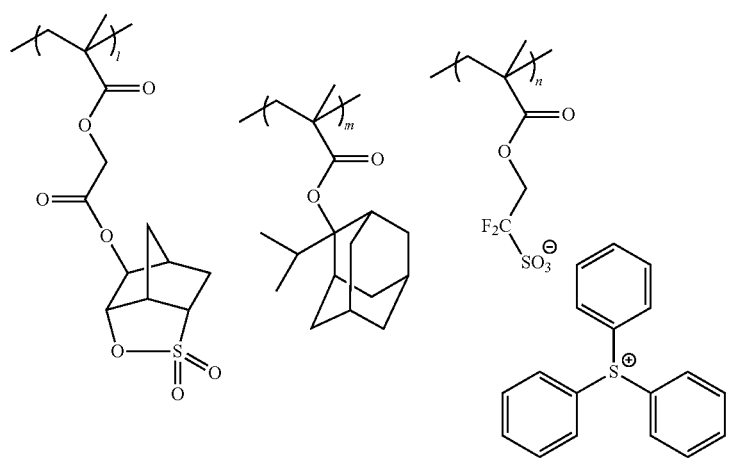

Polymeric Compound (1)

The polystyrene-equivalent weight-average molecular weight (Mw) of the polymeric compound (1) determined by GPC measurement was 13,400, and the molecular weight dispersity (Mw/Mn) was 1.57. The copolymer composition ratio (the ratio (molar ratio) of the respective structural units within the structural formula) determined by carbon-13 nuclear magnetic resonance spectroscopy (600 MHz $^{13}$C-NMR) was 1/m/n=39.0/48.8/12.2.

Examples 2 to 34

Production of Polymeric Compounds (2) to (34)

With the exceptions of using compounds represented by chemical formulas shown below in the prescribed molar ratio as the monomers in the aforementioned step (i) of the example 1, and using compounds represented by chemical formulas (c1) to (c9) shown below as the compound used in the salt exchange of the aforementioned step (ii), polymeric compounds (2) to (34) were obtained in the same manner as the steps (i) to (iii) described above.

[Chemical Formula 103]

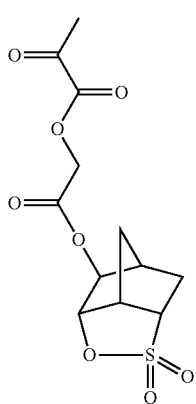

(01)

197
-continued
(11)
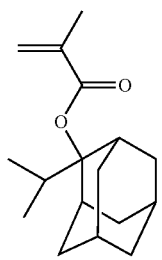
(51)
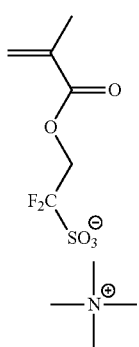
(02)
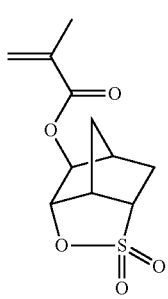
(03)
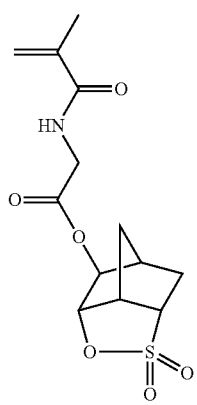
(12)
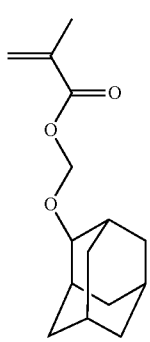
198
-continued
(13)
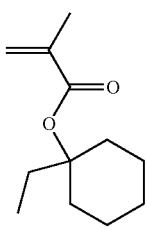
(14)
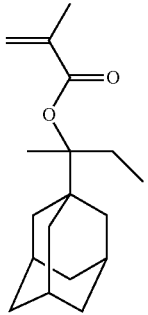
(15)
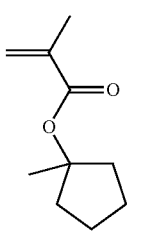
(21)
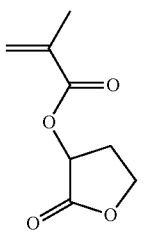
(22)
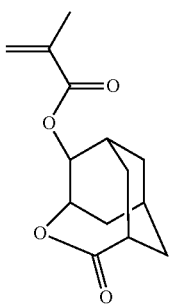
(23)

-continued
(24)
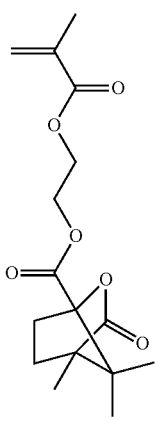
[Chemical Formula 104]
(31)
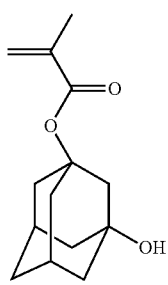
(32)
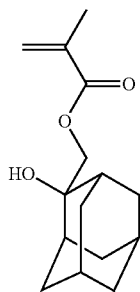
(33)
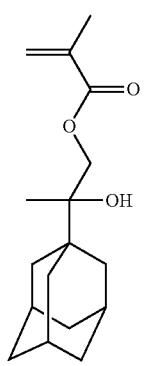
-continued
(34)
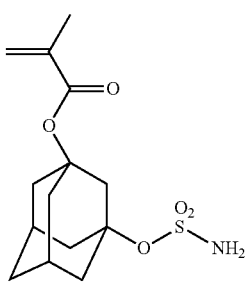
(35)
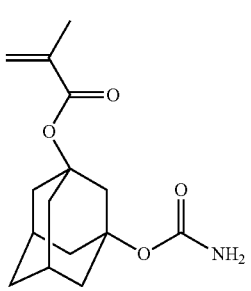
(36)
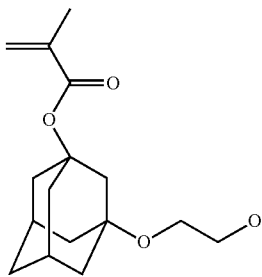
(37)
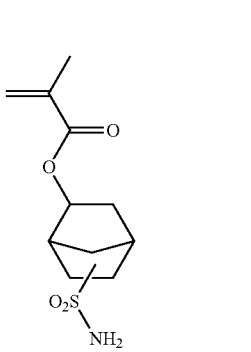
(38)
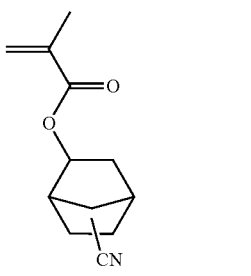

(51a2)
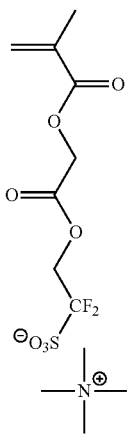
(54)
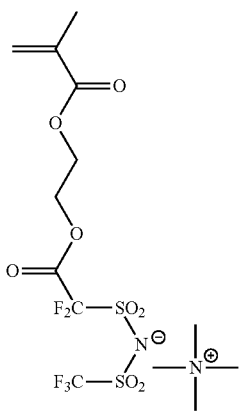
[Chemical Formula 105]
(c1)
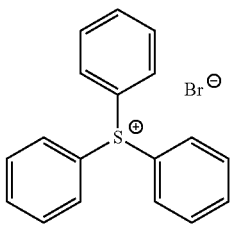
(52)
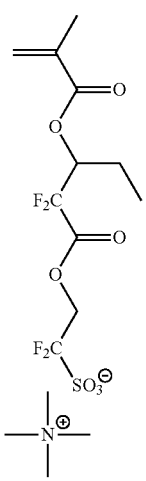
(c2)
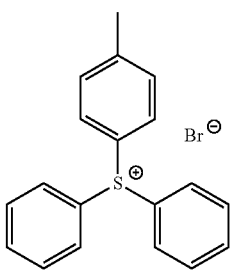
(53)
(c3)
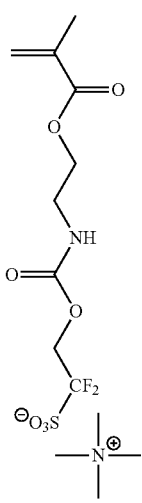
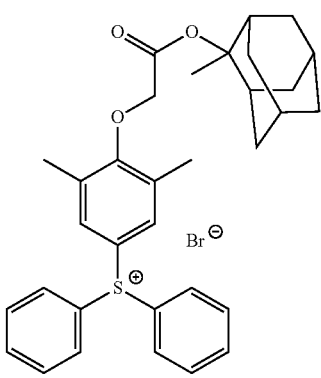

-continued

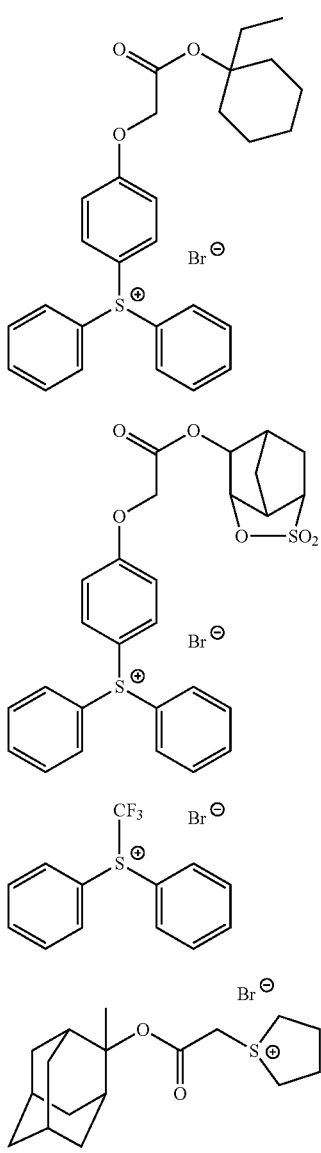

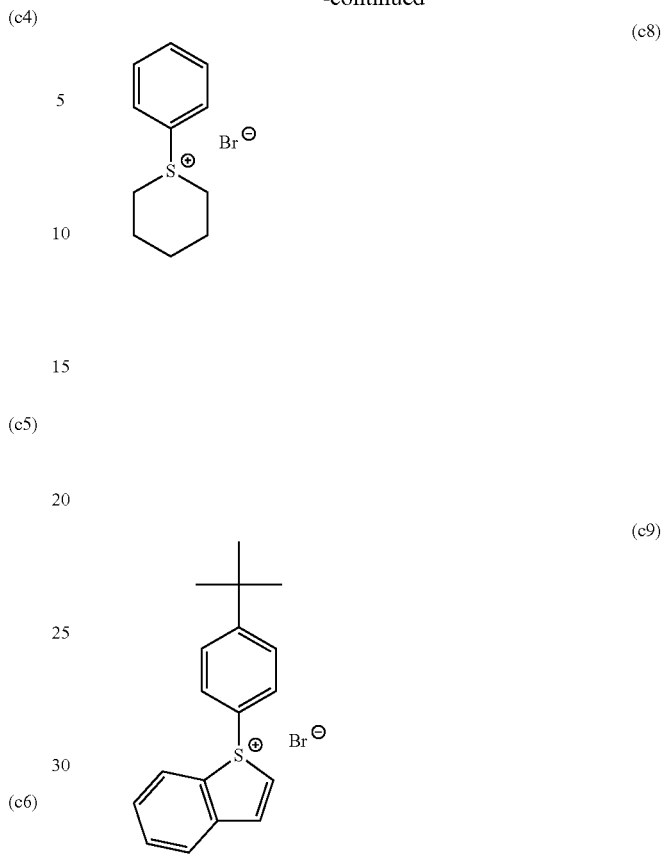

The monomers and salt exchange compound used in the production of each of the polymeric compounds (of the examples) are shown in Table 1.

Further, for the polymeric compound produced in each of the examples, the copolymer composition ratio (molar ratio) determined by carbon-13 nuclear magnetic resonance spectroscopy (600 MHz $^{13}$C-NMR), the polystyrene-equivalent weight-average molecular weight (Mw) determined by GPC measurement, and the molecular weight dispersity (Mw/Mn) are also shown in Table 1.

TABLE 1

| | Production of polymeric compound | | Obtained polymeric compound | | |
|---|---|---|---|---|---|
| | Monomers used | Salt exchange compound | Copolymer composition ratio (molar ratio) | Mw | Mw/Mn |
| Example 1 | (01)/(11)/(51) | (c1) | 39.0/48.8/12.2 | 13400 | 1.57 |
| Example 2 | (01)/(11)/(51) | (c1) | 41.0/38.1/20.9 | 13000 | 1.74 |
| Example 3 | (01)/(11)/(31)/(51) | (c1) | 37.2/34.7/16.3/11.8 | 14500 | 1.69 |
| Example 4 | (01)/(11)/(32)/(51) | (c1) | 36.8/35.0/15.4/12.8 | 12700 | 1.57 |
| Example 5 | (01)/(11)/(33)/(51) | (c1) | 35.4/36.1/15.6/12.9 | 11900 | 1.90 |
| Example 6 | (01)/(11)/(34)/(51) | (c1) | 36.3/34.5/18.0/11.2 | 13900 | 1.81 |
| Example 7 | (01)/(11)/(35)/(51) | (c1) | 37.0/35.3/15.1/12.6 | 12300 | 1.62 |
| Example 8 | (01)/(11)/(36)/(51) | (c1) | 37.4/34.5/17.0/11.1 | 11500 | 1.60 |
| Example 9 | (01)/(11)/(37)/(51) | (c1) | 35.4/36.4/17.1/11.1 | 14100 | 1.78 |
| Example 10 | (01)/(11)/(38)/(51) | (c1) | 36.9/33.9/16.5/12.7 | 13800 | 1.89 |
| Example 11 | (21)/(11)/(31)/(51) | (c1) | 38.4/34.4/14.9/12.3 | 13200 | 1.63 |
| Example 12 | (21)/(12)/(31)/(51) | (c1) | 33.6/38.1/16.0/12.3 | 12100 | 1.53 |
| Example 13 | (21)/(13)/(31)/(51) | (c1) | 33.4/35.0/18.3/13.3 | 10700 | 1.52 |
| Example 14 | (21)/(01)/(11)/(31)/(51) | (c1) | 19.5/14.7/36.6/17.0/12.2 | 13600 | 1.97 |
| Example 15 | (01)/(14)/(31)/(51) | (c1) | 34.8/38.5/15.3/11.4 | 11600 | 1.61 |
| Example 16 | (01)/(14)/(15)/(31)/(51) | (c1) | 35.7/27.3/10.2/14.9/11.9 | 11200 | 1.55 |
| Example 17 | (02)/(11)/(31)/(51) | (c1) | 34.6/37.2/17.6/10.6 | 11200 | 1.71 |

TABLE 1-continued

|  | Production of polymeric compound | | Obtained polymeric compound | | |
|---|---|---|---|---|---|
|  | Monomers used | Salt exchange compound | Copolymer composition ratio (molar ratio) | Mw | Mw/Mn |
| Example 18 | (01)/(11)/(31)/(51) | (c1) | 33.8/36.7/17.5/12.2 | 12000 | 1.84 |
| Example 19 | (03)/(11)/(31)/(51) | (c1) | 34.1/35.6/17.8/12.5 | 11000 | 1.76 |
| Example 20 | (22)/(11)/(31)/(51) | (c1) | 36.6/35.1/16.4/11.9 | 12900 | 1.73 |
| Example 21 | (23)/(11)/(31)/(51) | (c1) | 34.2/36.5/17.0/12.3 | 11100 | 1.59 |
| Example 22 | (24)/(11)/(31)/(51) | (c1) | 37.1/34.7/16.8/11.4 | 11700 | 1.69 |
| Example 23 | (01)/(11)/(51a2) | (c1) | 47.4/40.2/12.4 | 14100 | 1.90 |
| Example 24 | (01)/(11)/(53) | (c1) | 41.1/46.5/12.4 | 13500 | 1.76 |
| Example 25 | (01)/(11)/(52) | (c1) | 41.3/48.3/10.4 | 12200 | 1.81 |
| Example 26 | (01)/(11)/(54) | (c1) | 45.6/41.3/13.1 | 13400 | 2.10 |
| Example 27 | (01)/(11)/(51) | (c2) | 40.1/47.7/12.2 | 13400 | 1.57 |
| Example 28 | (01)/(11)/(51) | (c3) | 39.0/48.8/12.2 | 13400 | 1.57 |
| Example 29 | (01)/(11)/(51) | (c4) | 39.0/48.8/12.2 | 13400 | 1.57 |
| Example 30 | (01)/(11)/(51) | (c5) | 39.0/48.8/12.2 | 13400 | 1.57 |
| Example 31 | (01)/(11)/(51) | (c6) | 39.0/48.8/12.2 | 13400 | 1.57 |
| Example 32 | (01)/(11)/(51) | (c7) | 39.0/48.8/12.2 | 13400 | 1.57 |
| Example 33 | (01)/(11)/(51) | (c8) | 39.0/48.8/12.2 | 13400 | 1.57 |
| Example 34 | (01)/(11)/(51) | (c9) | 39.0/48.8/12.2 | 13400 | 1.57 |

The structures of the polymeric compounds (2) to (34), which were produced using the method of producing polymeric compounds of examples 2 to 34 that applied the method of the present invention, are shown below.

[Chemical Formula 106]

Polymeric Compound (2)

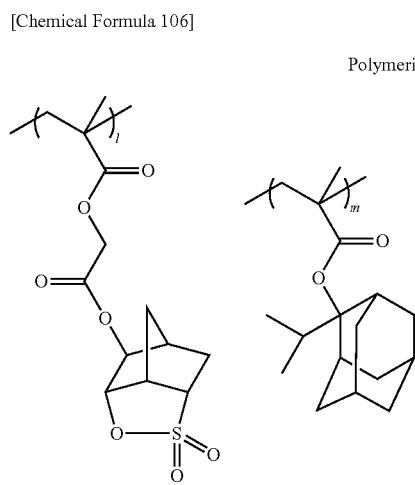

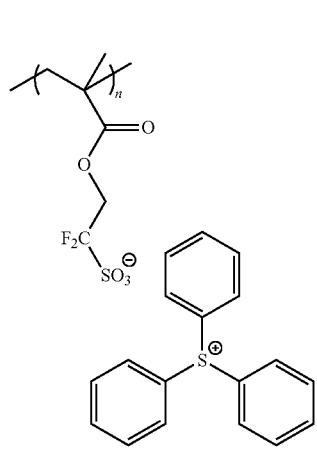

-continued

Polymeric Compound (3)

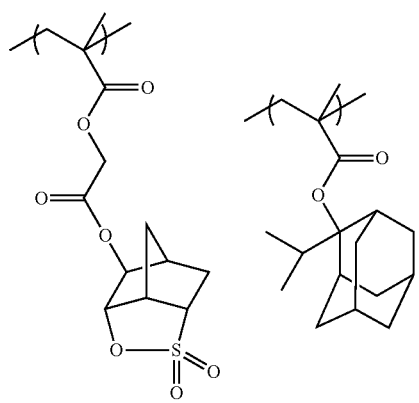

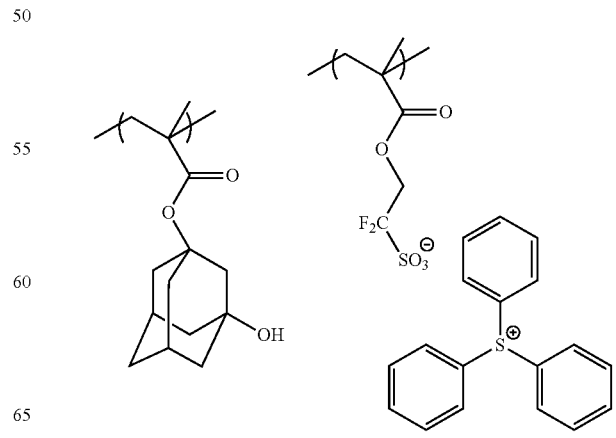

Polymeric Compound (4)
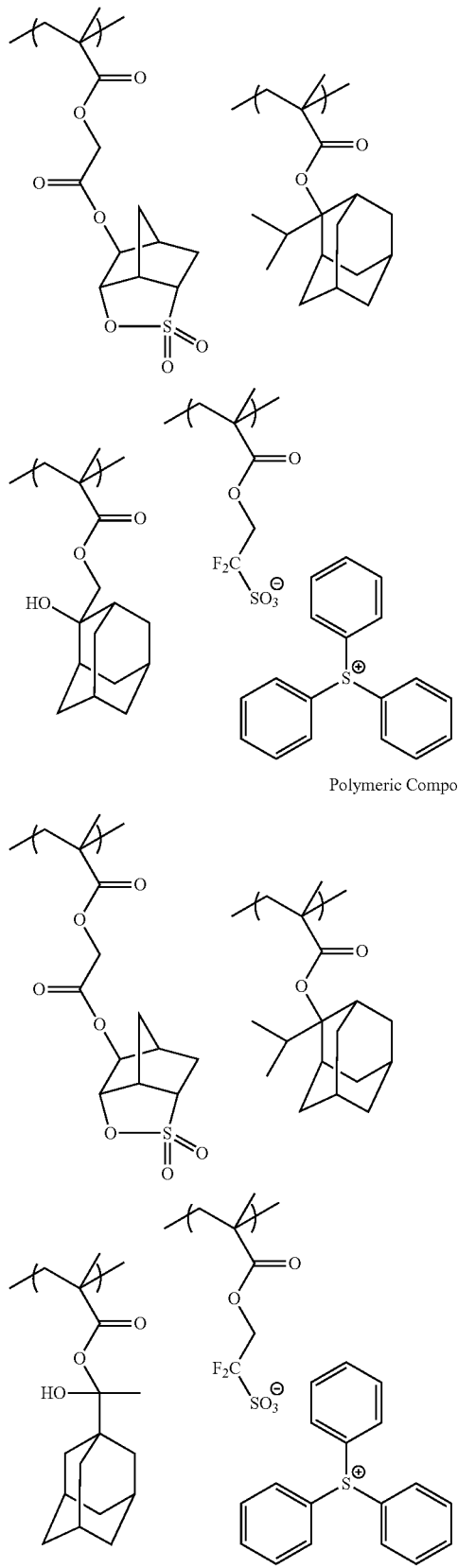
Polymeric Compound (5)
Polymeric Compound (6)
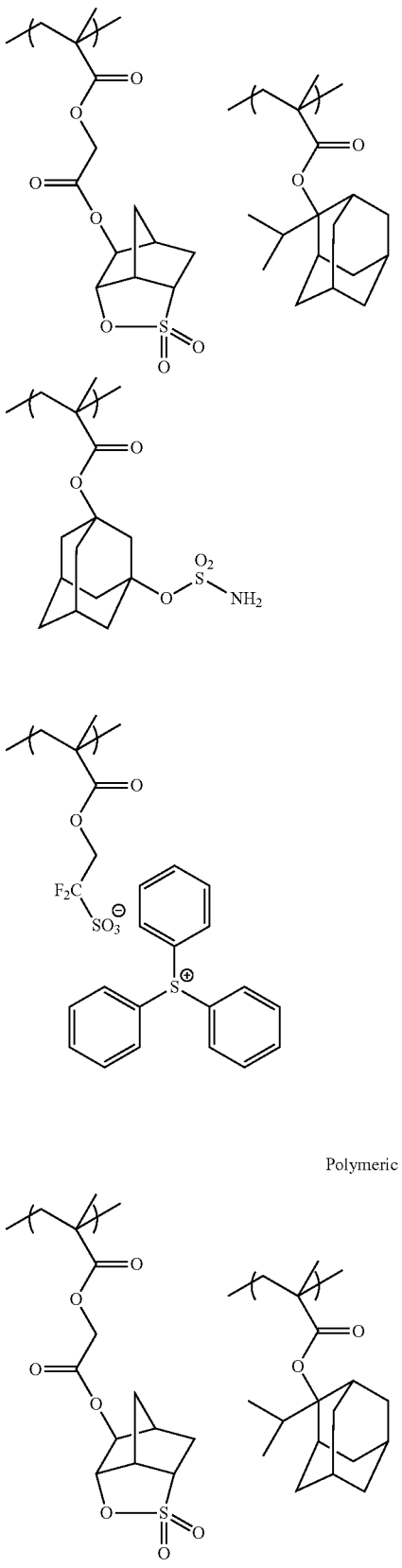
Polymeric Compound (7)

209
-continued
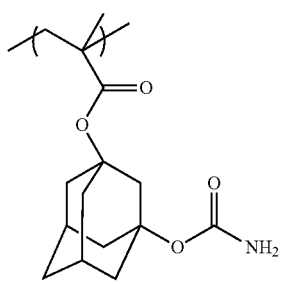
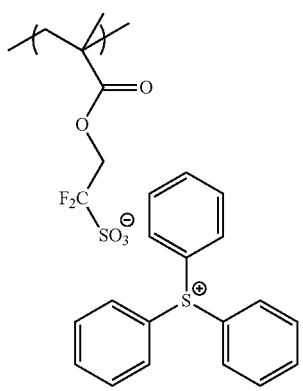
Polymeric Compound (8)
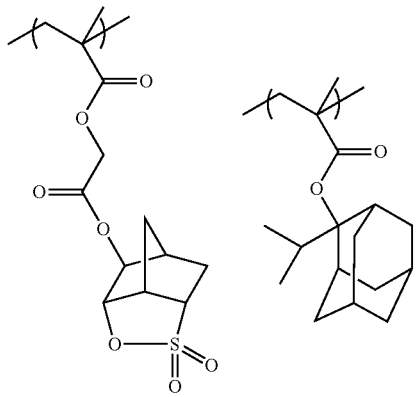
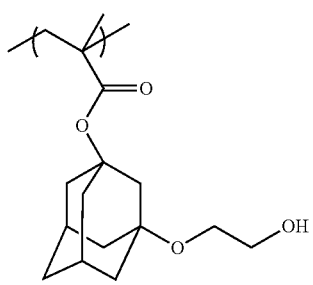
210
-continued
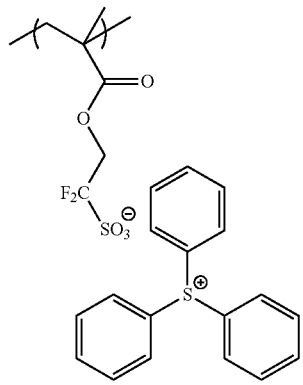
Polymeric Compound (9)
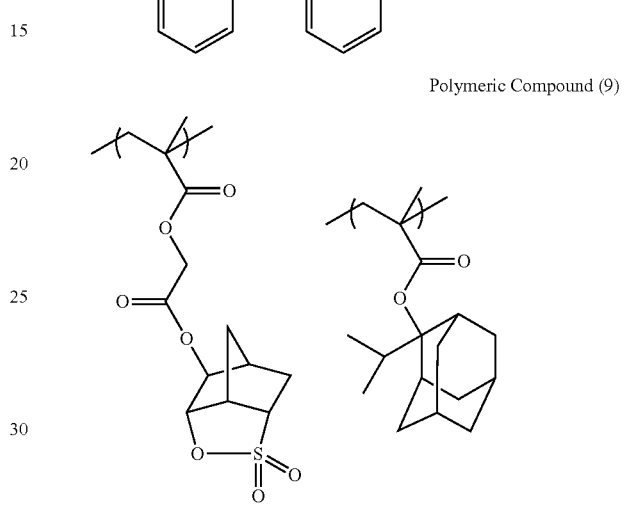
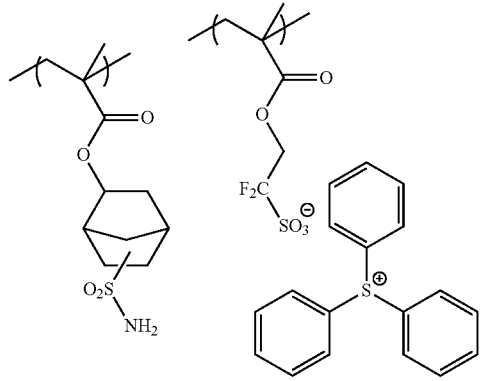
Polymeric Compound (10)
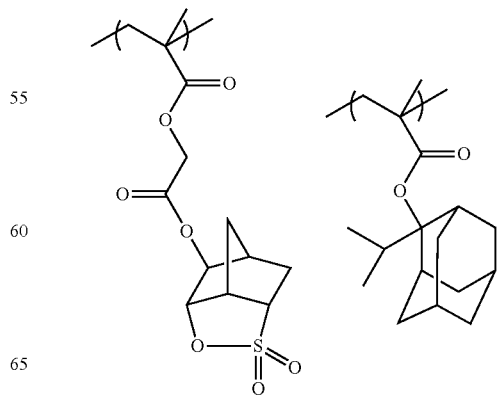

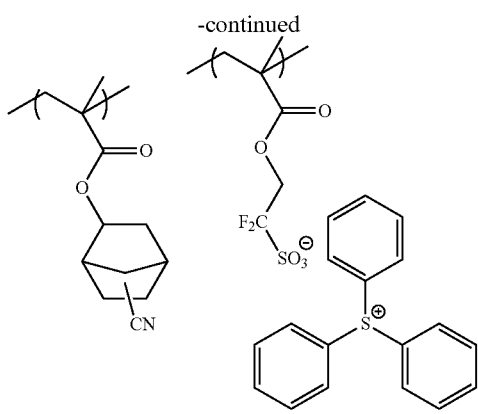
[Chemical Formula 108]
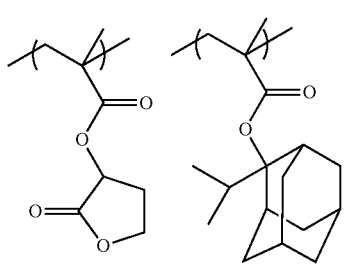
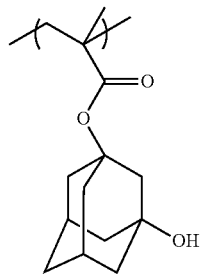
Polymeric Compound (11)
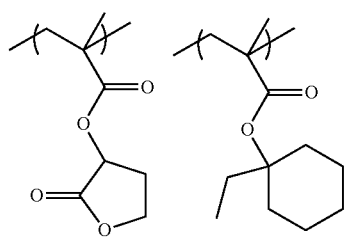
Polymeric Compound (12)
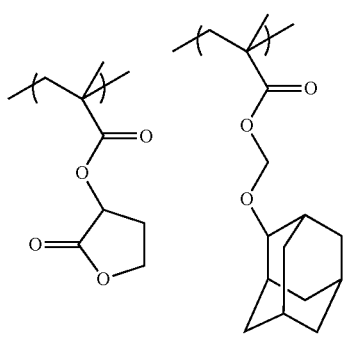
Polymeric Compound (13)
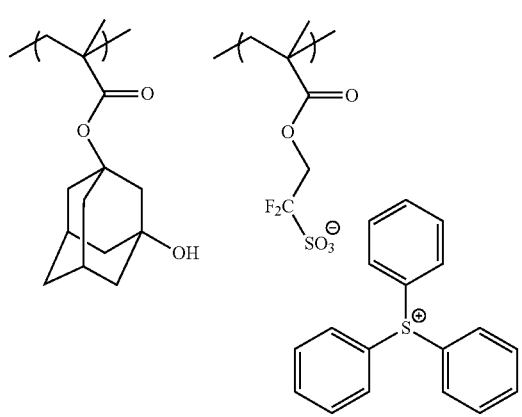

Polymeric Compound (14)
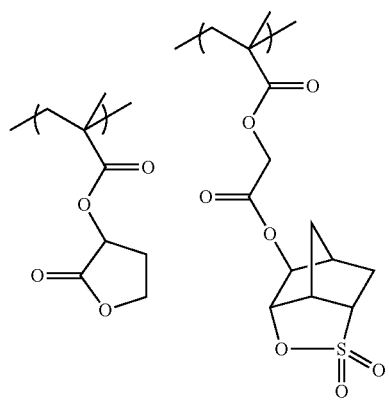
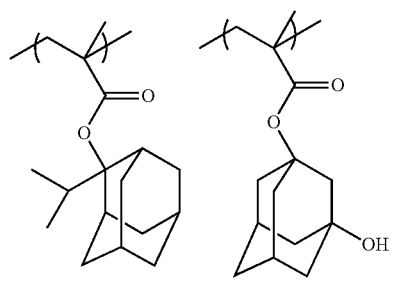
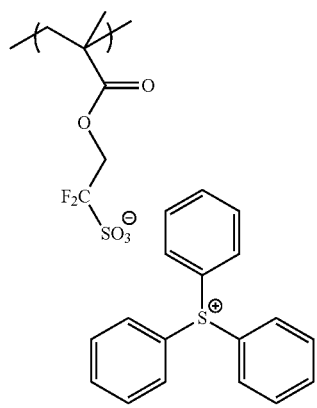
Polymeric Compound (15)
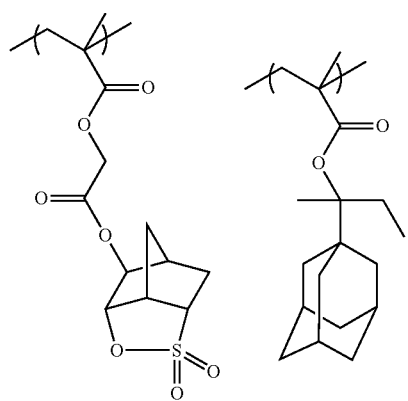
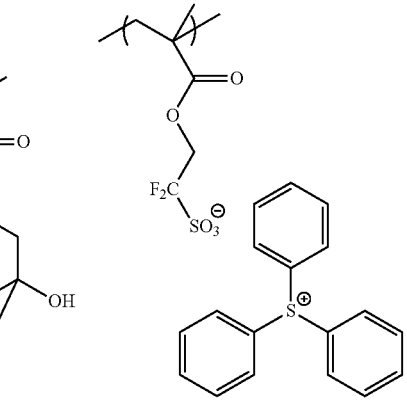
[Chemical Formula 109]
Polymeric Compound (16)
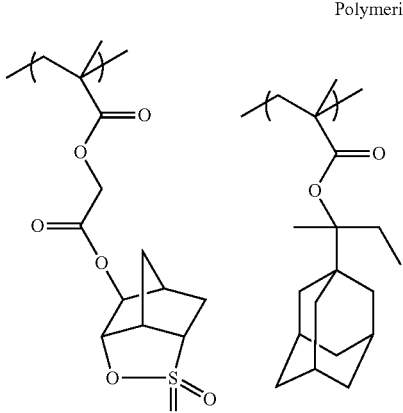
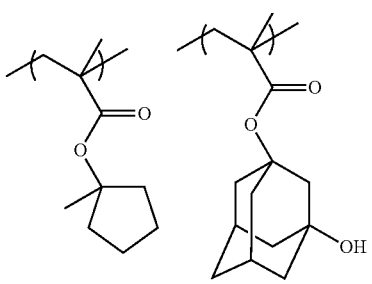
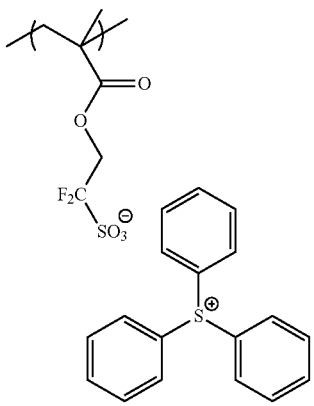

Polymeric Compound (17)
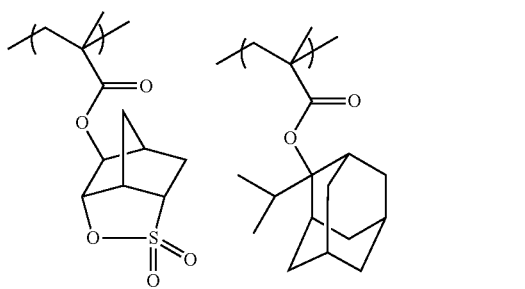
Polymeric Compound (19)
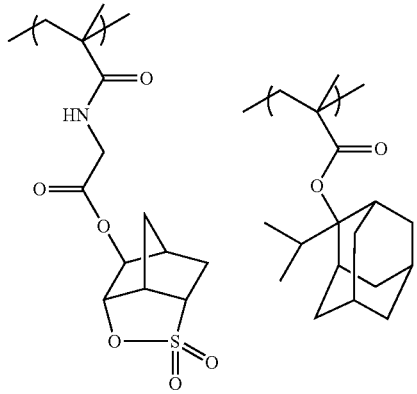
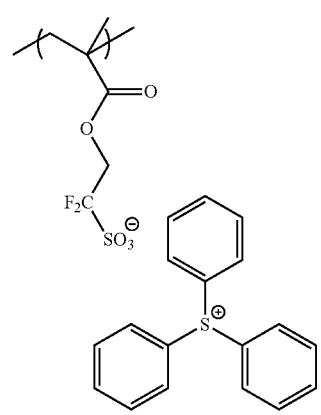
Polymeric Compound (18)
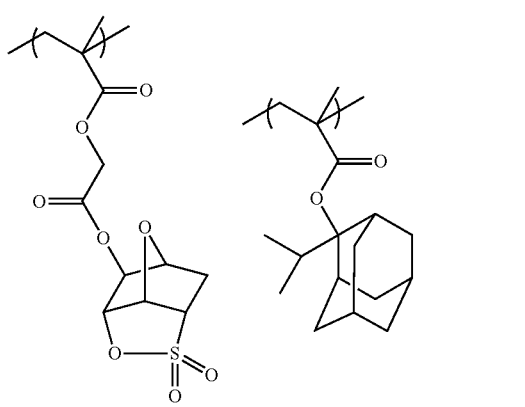
Polymeric Compound (20)
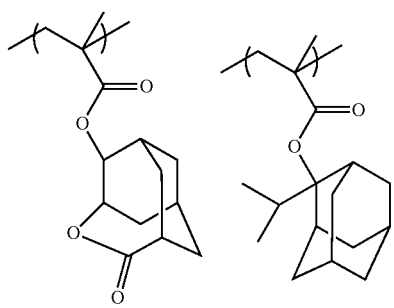
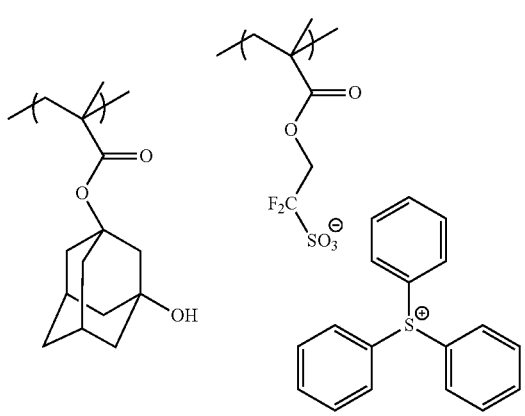
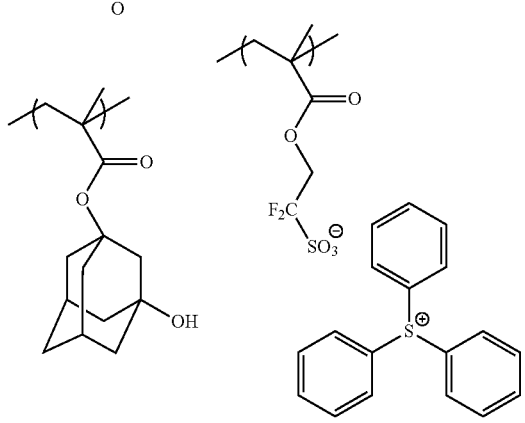

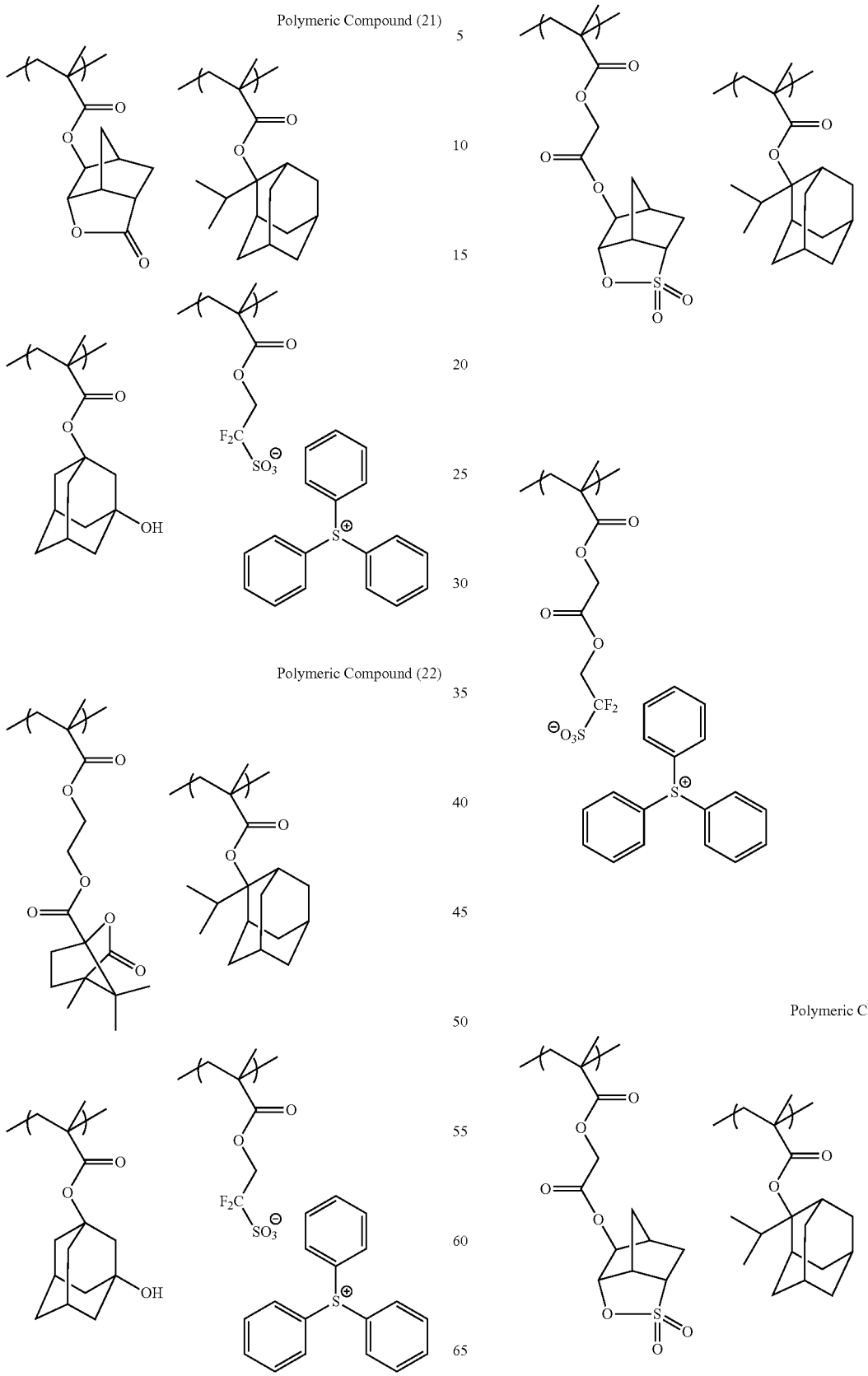

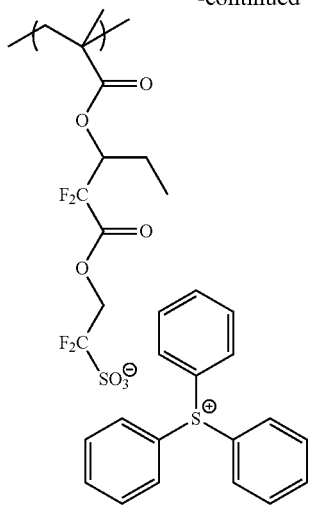
[Chemical Formula 111]
Polymeric Compound (25)
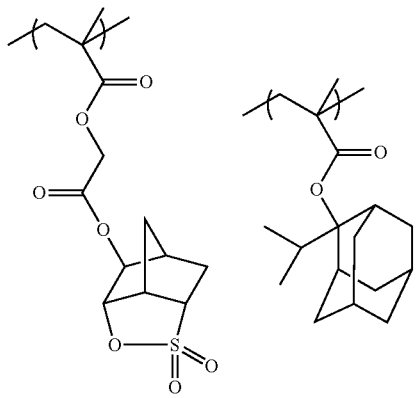
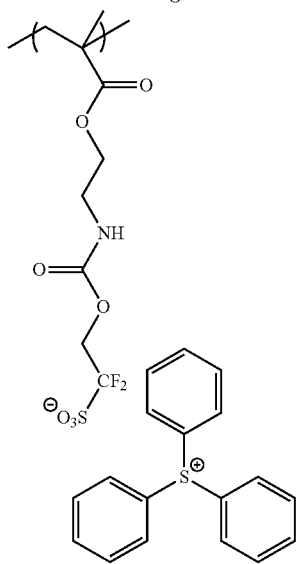
Polymeric Compound (26)
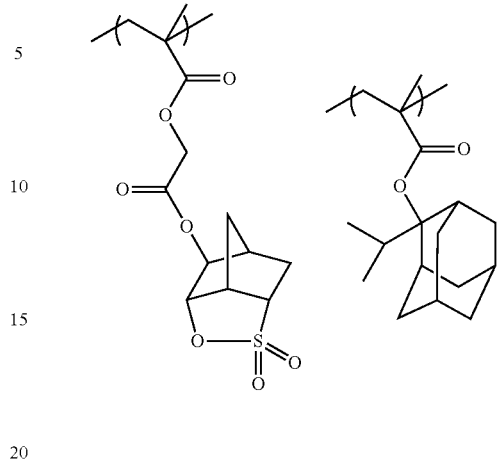
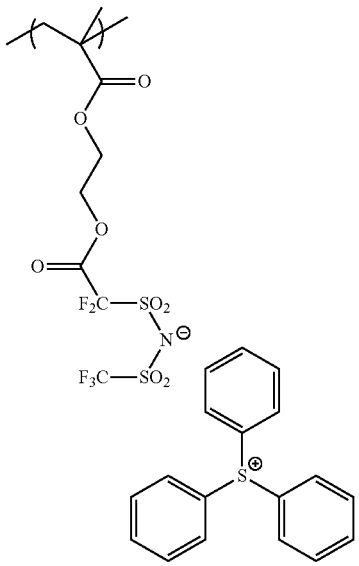
Polymeric Compound (27)
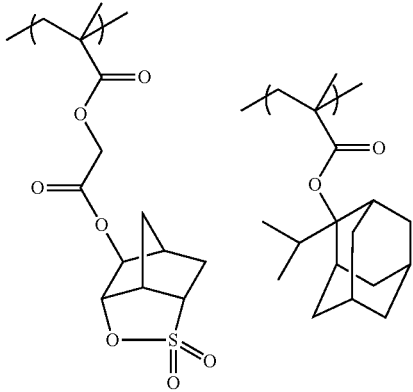

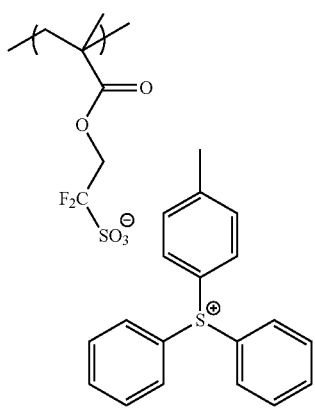
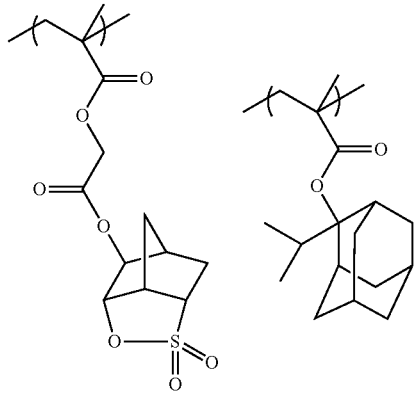
Polymeric Compound (28)
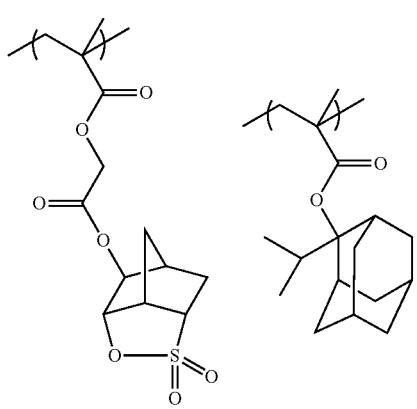
Polymeric Compound (29)
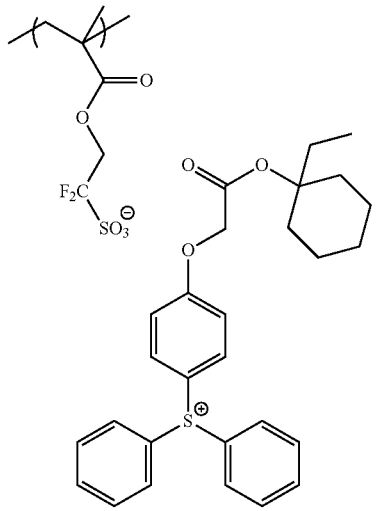
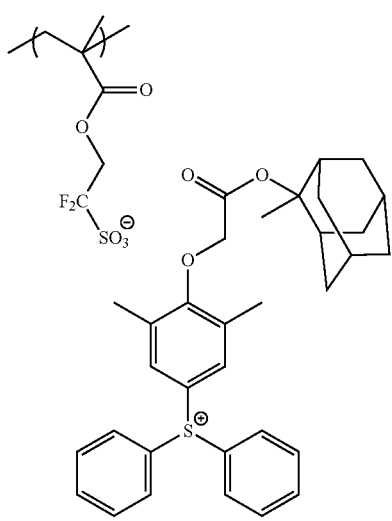
Polymeric Compound (30)
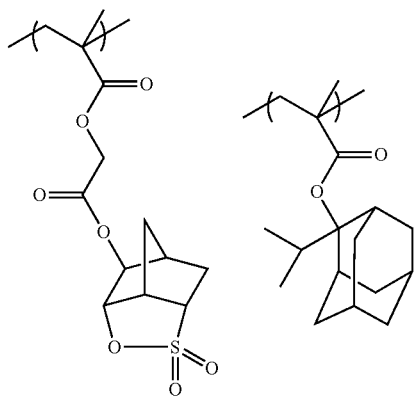

-continued
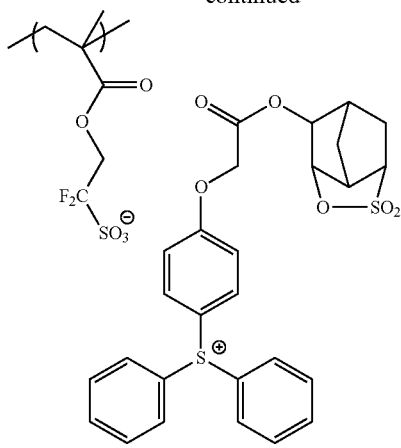
Polymeric Compound (31)
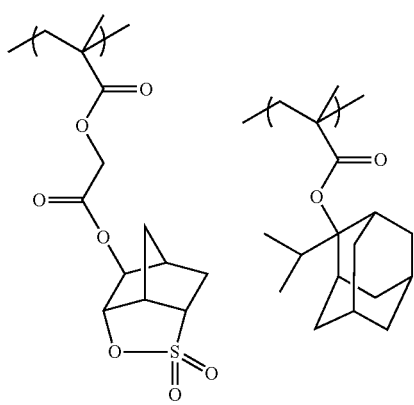
[Chemical Formula 113]
Polymeric Compound (32)
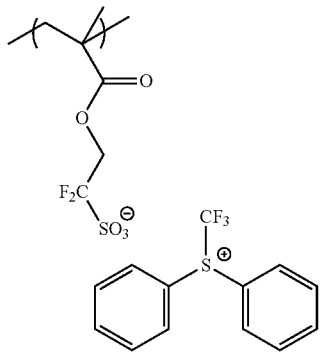
-continued
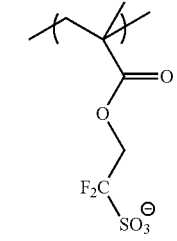
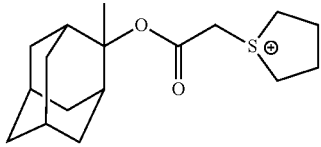
Polymeric Compound (33)
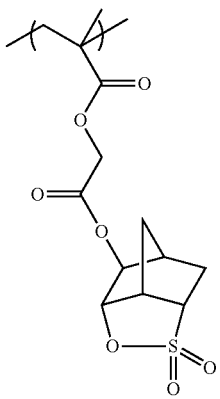 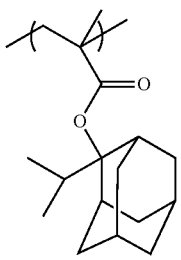
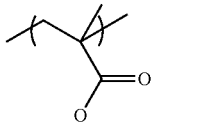
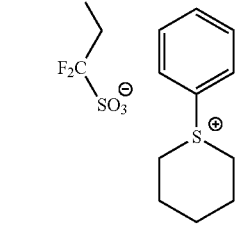
Polymeric Compound (34)
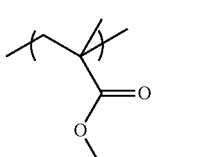 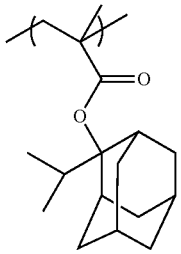
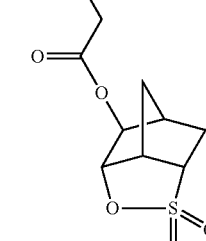

225
-continued

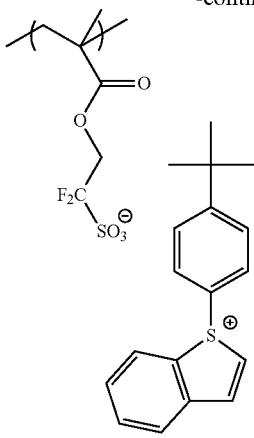

Comparative Example 1

Production of Polymeric Compound (1')

In a separable flask fitted with a thermometer, a reflux condenser and a nitrogen inlet tube, 38.00 g (120.13 mmol) of a compound (01), 61.10 g (232.84 mmol) of a compound (11) and 18.25 g (37.05 mmol) of a compound (51c1) were dissolved in 147.76 g of a mixed solvent of ethyl lactate and γ-butyrolactone (EL/GBL). As a polymerization initiator, 27.30 mmol of dimethyl azobisisobutyrate (V-601, manufactured by Wako Pure Chemical Industries, Ltd.) was then added to the resulting solution and dissolved.

This solution was then added dropwise, over 4 hours and under a nitrogen atmosphere, to 81.79 g of a mixed solvent of EL/GBL that had been heated to 80° C. Following completion of the dropwise addition, the reaction solution was stirred under heat for one hour, and the reaction solution was then cooled to room temperature.

Subsequently, the obtained polymerization reaction solution was added dropwise to a large volume of isopropanol to precipitate the polymer, and the precipitated white powder was collected by filtration, washed with methanol, and then dried, yielding 58.67 g of the target polymeric compound (1').

[Chemical Formula 114]

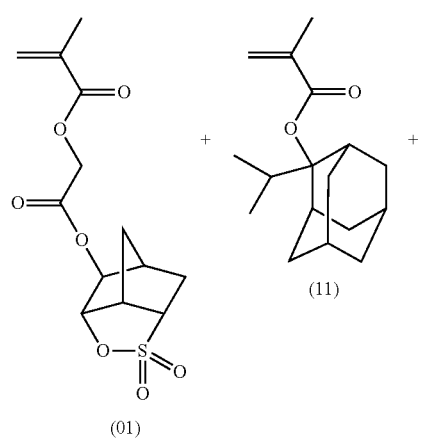

226
-continued

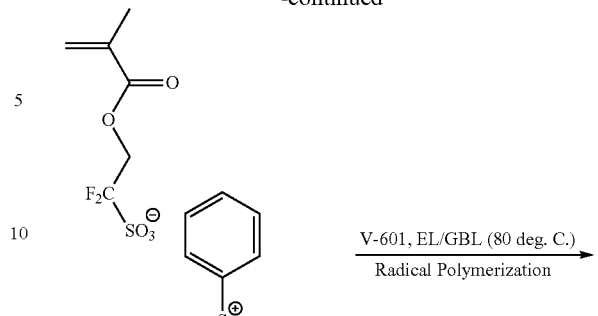

(51c1)

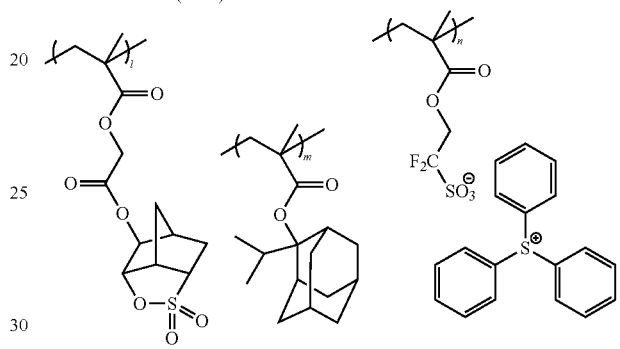

Polymeric Compound (1')

The polystyrene-equivalent weight-average molecular weight (Mw) of the polymeric compound (1') determined by GPC measurement was 10,100, and the molecular weight dispersity (Mw/Mn) was 1.79. The copolymer composition ratio (the ratio (molar ratio) of the respective structural units within the structural formula) determined by carbon-13 nuclear magnetic resonance spectroscopy (600 MHz $^{13}$C-NMR) was 1/m/n=44.0/42.9/13.1.

Comparative Examples 2 to 31

Production of Polymeric Compounds (2') to (31')

With the exception of using compounds represented by chemical formulas shown below and the compounds used in the examples described above, in the prescribed molar ratio, as the monomers in the aforementioned comparative example 1, polymeric compounds (2') to (31') were obtained in the same manner as the comparative example 1.

Comparative Examples 32 to 35

Production of Polymeric Compounds (32') to (35')

With the exceptions of using compounds represented by chemical formulas shown below and the compounds used in the examples described above, in the prescribed molar ratio, as the monomers in the aforementioned example 1, and not performing the washing with water (liquid-liquid extraction) of the aforementioned step (ii), polymeric compounds (32') to (35') were obtained in the same manner as the example 1. Specifically, the polymeric compounds were produced in the manner described below.

In a separable flask fitted with a thermometer, a reflux condenser and a nitrogen inlet tube, the prescribed amounts of the prescribed monomers were dissolved in a mixed solvent of ethyl lactate and γ-butyrolactone (EL/GBL). As a polymerization initiator, dimethyl azobisisobutyrate (V-601, manufactured by Wako Pure Chemical Industries, Ltd.) was then added to the resulting solution and dissolved.

This solution was then added dropwise, over 4 hours and under a nitrogen atmosphere, to a mixed solvent of EL/GBL that had been heated to 80° C. Following completion of the dropwise addition, the reaction solution was stirred under heat for one hour, and the reaction solution was then cooled to room temperature.

Subsequently, the obtained polymerization reaction solution was added dropwise to a large volume of isopropanol to precipitate the polymer, and the precipitated white powder was collected by filtration.

The thus obtained white powder was then dried, yielding a polymeric compound.

The thus obtained polymeric compound was then placed in a round-bottom flask, and following dissolution in dichloromethane, a prescribed salt exchange compound (c1) to (c9) and water were added to the flask and stirred for 30 minutes (salt exchange). The organic layer was then extracted.

Subsequently, the extracted organic layer was washed with water, and the solvent was removed by evaporation, yielding the target polymeric compound.

[Chemical Formula 115]

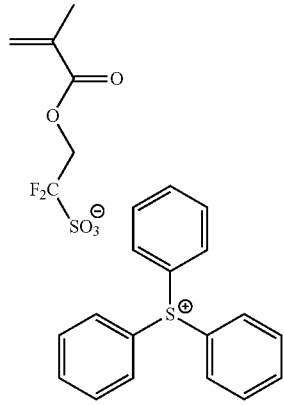

(51c1)

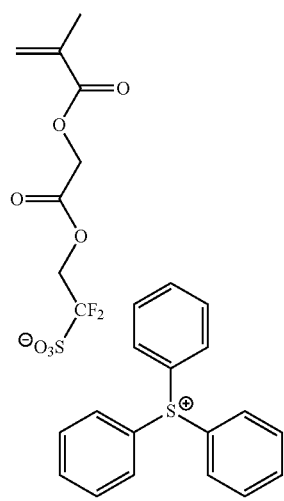

(51a2c1)

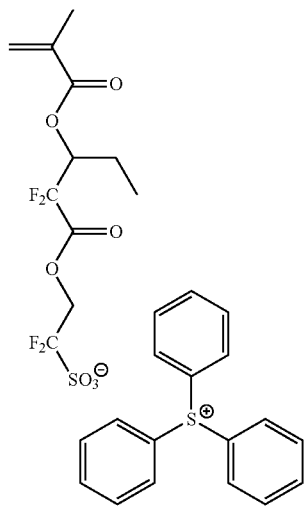

(53c1)

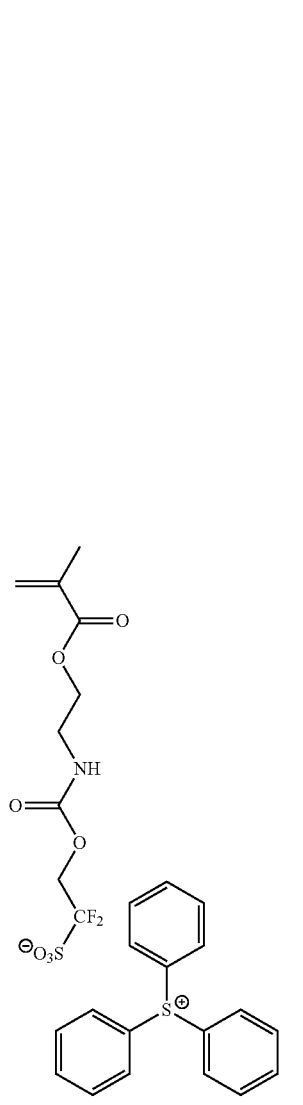

(52c1)

-continued
(54c1)
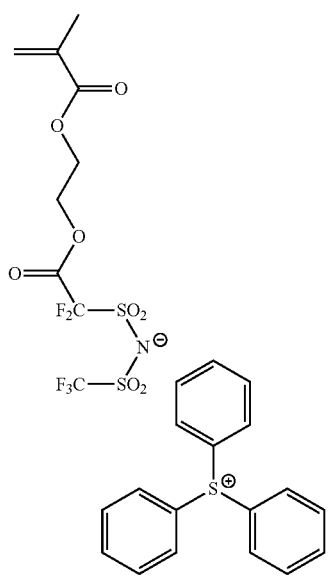
(51c2)
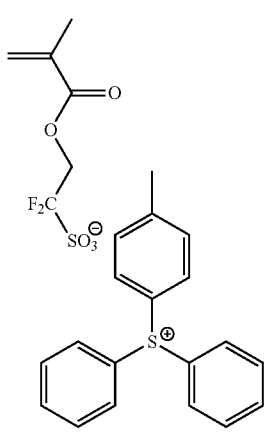
[Chemical Formula 116]
(51c3)
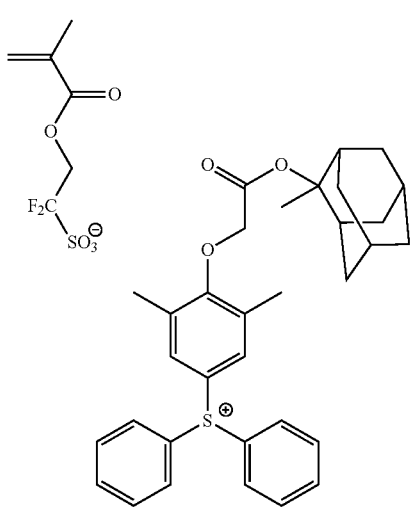
-continued
(51c4)
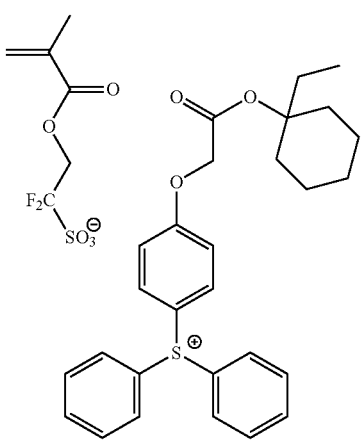
(51c5)
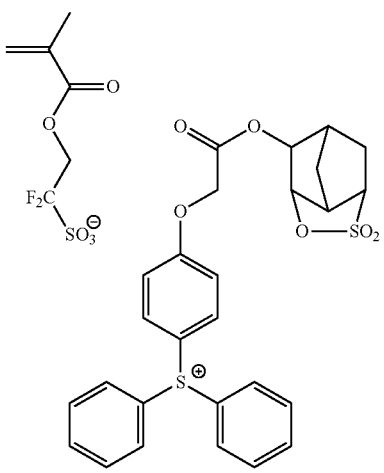
(51c6)
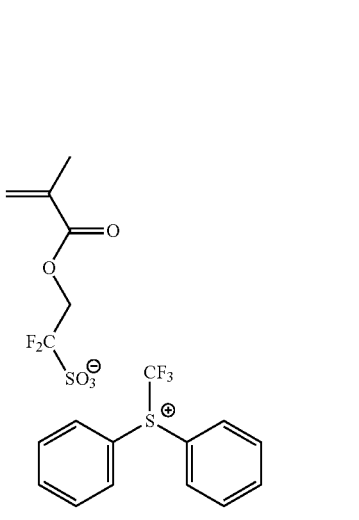

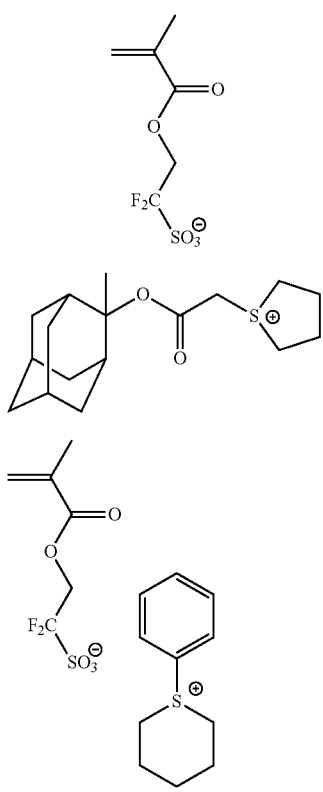

(51c7)

(51c8)

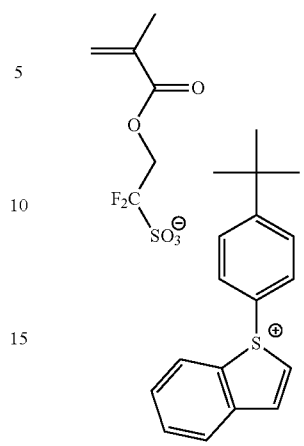

(51c9)

The monomers used in the production of each of the polymeric compounds (of the comparative examples) are shown in Table 2.

Further, for the polymeric compound produced in each of the comparative examples, the copolymer composition ratio (molar ratio) determined by carbon-13 nuclear magnetic resonance spectroscopy (600 MHz $^{13}$C-NMR), the polystyrene-equivalent weight-average molecular weight (Mw) determined by GPC measurement, and the molecular weight dispersity (Mw/Mn) are also shown in Table 2.

TABLE 2

| | Production of polymeric compound Monomers used | Obtained polymeric compound Copolymer composition ratio (molar ratio) | Mw | Mw/Mn |
|---|---|---|---|---|
| Comparative Example 1 | (01)/(11)/(51c1) | 44.0/42.9/13.1 | 10100 | 1.79 |
| Comparative Example 2 | (01)/(11)/(51c1) | 43.1/44.3/12.6 | 11800 | 1.61 |
| Comparative Example 3 | (01)/(11)/(51c1) | 42.5/37.1/20.4 | 12000 | 1.89 |
| Comparative Example 4 | (01)/(11)/(31)/(51c1) | 35.6/36.1/16.4/11.9 | 13300 | 2.10 |
| Comparative Example 5 | (01)/(11)/(32)/(51c1) | 34.6/36.2/17.7/11.5 | 11500 | 1.63 |
| Comparative Example 6 | (01)/(11)/(33)/(51c1) | 37.1/34.2/16.1/12.6 | 10400 | 1.71 |
| Comparative Example 7 | (01)/(11)/(34)/(51c1) | 34.6/35.0/18.1/12.3 | 11100 | 2.14 |
| Comparative Example 8 | (01)/(11)/(35)/(51c1) | 36.0/37.3/16.2/10.5 | 13500 | 1.69 |
| Comparative Example 9 | (01)/(11)/(36)/(51c1) | 35.2/37.5/16.4/10.9 | 12700 | 1.84 |
| Comparative Example 10 | (01)/(11)/(37)/(51c1) | 34.4/36.2/18.5/10.9 | 11600 | 1.72 |
| Comparative Example 11 | (01)/(11)/(38)/(51c1) | 35.8/34.6/16.9/12.7 | 10700 | 2.09 |
| Comparative Example 12 | (21)/(11)/(31)/(51c1) | 39.7/33.6/16.6/10.1 | 14300 | 1.81 |
| Comparative Example 13 | (21)/(12)/(31)/(51c1) | 35.1/37.9/15.9/11.1 | 13600 | 1.92 |
| Comparative Example 14 | (21)/(13)/(31)/(51c1) | 35.0/35.3/18.8/10.9 | 12200 | 1.66 |
| Comparative Example 15 | (21)/(01)/(11)/(31)/(51c1) | 21.2/14.1/35.0/16.5/13.2 | 13400 | 2.15 |
| Comparative Example 16 | (01)/(14)/(31)/(51c1) | 35.0/39.3/15.3/10.4 | 10600 | 1.96 |
| Comparative Example 17 | (01)/(14)/(15)/(31)/(51c1) | 34.7/28.2/9.5/16.9/10.7 | 9900 | 1.91 |
| Comparative Example 18 | (02)/(11)/(31)/(51c1) | 35.9/35.1/16.3/12.7 | 12900 | 1.60 |
| Comparative Example 19 | (01)/(11)/(31)/(51c1) | 34.5/36.6/15.1/13.8 | 10700 | 1.78 |
| Comparative Example 20 | (03)/(11)/(31)/(51c1) | 33.3/38.7/16.2/11.8 | 12300 | 1.98 |
| Comparative Example 21 | (22)/(11)/(31)/(51c1) | 37.5/33.6/17.4/11.5 | 10900 | 1.69 |
| Comparative Example 22 | (23)/(11)/(31)/(51c1) | 32.7/39.4/16.6/11.3 | 9500 | 2.03 |
| Comparative Example 23 | (24)/(11)/(31)/(51c1) | 39.9/34.6/14.8/10.7 | 13800 | 1.63 |
| Comparative Example 24 | (01)/(11)/(51a2c1) | 44.6/41.5/13.9 | 13400 | 2.01 |
| Comparative Example 25 | (01)/(11)/(53c1) | 43.6/44.0/12.4 | 15200 | 1.70 |
| Comparative Example 26 | (01)/(11)/(52c1) | 44.7/42.1/13.2 | 11000 | 1.69 |
| Comparative Example 27 | (01)/(11)/(54c1) | 43.8/43.1/13.1 | 15000 | 1.93 |
| Comparative Example 28 | (01)/(11)/(51c2) | 42.3/47.3/10.4 | 11500 | 1.73 |
| Comparative Example 29 | (01)/(11)/(51c3) | 40.3/48.7/11.0 | 12200 | 1.70 |
| Comparative Example 30 | (01)/(11)/(51c4) | 41.1/46.6/12.3 | 11900 | 1.74 |
| Comparative Example 31 | (01)/(11)/(51c5) | 45.6/43.7/10.7 | 14000 | 1.62 |
| Comparative Example 32 | (01)/(11)/(51c6) | 39.0/48.8/12.2 | 13400 | 1.57 |
| Comparative Example 33 | (01)/(11)/(51c7) | 39.0/48.8/12.2 | 13400 | 1.57 |

TABLE 2-continued

|  | Production of polymeric compound Monomers used | Obtained polymeric compound | | |
|---|---|---|---|---|
|  |  | Copolymer composition ratio (molar ratio) | Mw | Mw/Mn |
| Comparative Example 34 | (01)/(11)/(51c8) | 39.0/48.8/12.2 | 13400 | 1.57 |
| Comparative Example 35 | (01)/(11)/(51c9) | 39.0/48.8/12.2 | 13400 | 1.57 |

In relation to the structures of the polymeric compounds (2') to (35') produced using the method of producing polymeric compounds according to the aforementioned comparative examples 2 to 35:

the polymeric compounds (2') and (3') each had the same structure as the aforementioned polymeric compound (1'), and the polymeric compounds (4') to (35') had the same structures as the polymeric compounds (3) to (34) respectively.

Preparation of Resist Compositions

Examples 35 to 68, Comparative Examples 36 to 70

The components shown in Table 3 were mixed together and dissolved to prepare resist compositions of an example 35 and a comparative example 36 respectively.

With the exceptions of replacing the component (A) with the polymeric compounds (2) to (34) and the polymeric compounds (2') to (35') described above respectively, resist compositions of examples 36 to 68 and comparative examples 37 to 70 were prepared in the same manner as that described for the resist compositions of the example 35 and the comparative example 36.

TABLE 3

|  | Component (A) | Component (D) | Component (E) | Component (S) | | | |
|---|---|---|---|---|---|---|---|
| Example 35 | (A)-1 [100] | (D)-1 [1.60] | (E)-1 [0.64] | (S)-1 [200] | (S)-2 [2080] | (S)-3 [1250] | (S)-4 [830] |
| Comparative example 36 | (A)-2 [100] | (D)-1 [1.60] | (E)-1 [0.64] | (S)-1 [200] | (S)-2 [2080] | (S)-3 [1250] | (S)-4 [830] |

In Table 3, the numerical values in brackets [ ] indicate the amount (in parts by weight) of the component added. Further, the reference symbols in Table 3 have the meanings shown below.

(A)-1: the aforementioned polymeric compound (1)
(A)-2: the aforementioned polymeric compound (1')
(D)-1: tri-n-octylamine
(E)-1: salicylic acid
(S)-1: γ-butyrolactone
(S)-2: cyclohexanone
(S)-3: propylene glycol monomethyl ether acetate
(S)-4: propylene glycol monomethyl ether <Measurement of Residual Amount of Water-Soluble Monomer>

The residual amount of water-soluble monomer was measured using the procedures described below.

Procedure 1: The water-soluble monomer was dissolved in γ-butyrolactone to prepare a series of solutions, HPLC measurements were performed using solutions having different concentration levels (namely, 5 different concentrations), a calibration curve was prepared, and a relational expression was determined between "HPLC surface area and water-soluble monomer concentration".

Procedure 2: Solutions having a concentration of 1% by weight were prepared by dissolving, in γ-butyrolactone, the synthesized product obtained in the step (ii) (namely, the polymeric compound prior to salt exchange) in the case of each of the examples and the comparative examples 32 to 35, and the final synthesized product (following washing with methanol) in the case of the comparative examples 1 to 31.

Procedure 3: HPLC measurement was performed using each of the solutions having a concentration of 1% by weight, and the relational expression described above was used to calculate the amount of the water-soluble monomer (% by weight) relative to the solid fraction of the polymeric compound. The results are shown in Tables 4 and 5 under the heading "Residual amount of water-soluble monomer (ppm)".

The water-soluble monomers contained within each of the synthesized products refer to the ammonium salt [compounds (51), (51a2), (52), (53), (54)], or a monomer having an organic cation [compounds (51c1), (51a2c1), (53c1), (52c1), (54c1), (51c2), (51c3), (51c4), (51c5), (51c6), (51c7), (51c8) and (51c9)].

The above HPLC measurements were performed under the measurement conditions listed below.

[HPLC Measurement Conditions]

Developing solvent: acetonitrile/buffer solution (volumetric ratio: 80/20)
Buffer solution: trifluoroacetic acid/ion-exchanged water (0.1% by weight)
Column: Superiorex-ODS
Oven temperature: 30° C.
Measurement wavelength: 210 nm
Flow rate: 1 ml/minute (until 7 minutes elapsed), and then 3 ml/minute (until 20 minutes)

The mixing ratio of the HPLC developing solvent was altered appropriately within a range from acetonitrile/buffer solution=90/10 to 30/70 (by volume) in accordance with the variety of the water-soluble monomer being used.

<Formation of Resist Patterns>

Using a spinner, each of the resist compositions of the above examples was applied uniformly onto an 8-inch silicon substrate that had been treated with hexamethyldisilazane (HMDS) for 36 seconds at 90° C., and a bake treatment (PAB) was then conducted for 60 seconds at 140° C., thereby forming a resist film (film thickness: 60 nm).

This resist film was subjected to direct patterning (exposure) with an electron beam lithography apparatus HL800D (VSB) (manufactured by Hitachi, Ltd.) at an accelerating voltage of 50 keV.

Next, a bake treatment (post exposure bake (PEB)) was conducted for 60 seconds at 110° C., followed by development for 60 seconds at 23° C. in a 2.38% by weight aqueous solution of tetramethylammonium hydroxide (TMAH) (product name: NMD-3, manufactured by Tokyo Ohka Kogyo Co., Ltd.).

As a result, a line and space pattern (hereafter also referred to as an "LS pattern") having a line width of 100 nm and a pitch of 200 nm was formed in each of the examples.

The optimum exposure Eop ($\mu C/cm^2$; sensitivity) for formation of the LS pattern was determined. The results are shown in Tables 4 and 5.

[Evaluation of Exposure Latitude (EL Margin)]

At the aforementioned optimum exposure Eop, the exposure at which an LS pattern having a line width within a range specified by: [targeted dimension (line width of 100 nm)±5%] (namely, within a range from 95 nm to 105 nm) was formed was determined, and the EL margin (unit: %) was determined using the formula shown below. The results are shown in Tables 4 and 5.

EL margin (%)=(|E1−E2|/Eop)×100

E1: the exposure (mJ/cm$^2$) for forming an LS pattern with a line width of 95 nm.

E2: the exposure (mJ/cm$^2$) for forming an LS pattern with a line width of 105 nm.

The larger the value for the EL margin, the smaller the variation in the pattern size caused by fluctuation in the exposure.

[Evaluation of Line edge Roughness (LER)]

For each of the LS patterns formed at the aforementioned optimum exposure Eop, the value of 3σ was determined as an indicator of LER. The results are shown in Tables 4 and 5 as "LER (nm)".

"3σ" describes the value obtained by measuring the line width of the LS pattern at 400 locations along the lengthwise direction of the line using a measuring SEM (scanning electron microscope, accelerating voltage: 800 V, product name: S-9380, manufactured by Hitachi High-Technologies Corporation), determining the standard deviation (σ) from the measurement results, and then calculating the value of 3 times the standard deviation (3σ) (units: nm). The smaller this value of 3σ, the lower the level of roughness in the line side walls, indicating an LS pattern of more uniform width.

[Evaluation of Resist Pattern Shape]

For each of the LS patterns formed at the aforementioned optimum exposure Eop, the cross-sectional shape of the pattern was inspected using a scanning electron microscope (product name: SU-8000, manufactured by Hitachi High-Technologies Corporation), and the resist pattern shape was evaluated. The results are shown in Tables 4 and 5. In the tables, "Top-round" describes a shape in which the upper portion of the pattern cross-section was a rounded shape, meaning that the rectangularity was poor.

TABLE 4

| | Residual amount of water-soluble monomer (ppm) | Eop ($\mu C/cm^2$) | EL margin (%) | LER (nm) | Resist pattern shape |
|---|---|---|---|---|---|
| Example 35 | <100 | 52.0 | 18.28 | 8.63 | Rectangular |
| Comparative example 36 | 1200 | 46.6 | 14.05 | 9.83 | Top-round |
| Comparative example 37 | 350 | 49.8 | 17.18 | 9.30 | Top-round |
| Example 36 | <100 | 46.6 | 17.44 | 9.01 | Rectangular |
| Comparative example 38 | 880 | 40.2 | 13.34 | 10.67 | Top-round |
| Example 37 | <100 | 56.1 | 21.73 | 7.74 | Rectangular |
| Comparative example 39 | 1010 | 50.5 | 15.46 | 9.51 | Top-round |
| Example 38 | <100 | 57.5 | 22.11 | 7.90 | Rectangular |
| Comparative example 40 | 640 | 53.3 | 16.83 | 9.08 | Top-round |
| Example 39 | <100 | 54.1 | 20.39 | 8.32 | Rectangular |
| Comparative example 41 | 1340 | 48.0 | 13.35 | 10.29 | Top-round |
| Example 40 | <100 | 49.4 | 19.01 | 8.16 | Rectangular |
| Comparative example 42 | 1160 | 43.5 | 14.86 | 10.02 | Top-round |
| Example 41 | <100 | 60.3 | 22.90 | 6.75 | Rectangular |
| Comparative example 43 | 740 | 55.3 | 16.75 | 9.21 | Top-round |
| Example 42 | <100 | 52.4 | 19.49 | 8.22 | Rectangular |
| Comparative example 44 | 900 | 46.0 | 14.38 | 10.77 | Top-round |
| Example 43 | <100 | 42.7 | 20.86 | 7.93 | Rectangular |
| Comparative example 45 | 560 | 38.5 | 16.89 | 10.44 | Top-round |
| Example 44 | <100 | 53.2 | 19.40 | 8.59 | Rectangular |
| Comparative example 46 | 940 | 47.6 | 15.13 | 11.62 | Top-round |
| Example 45 | <100 | 45.3 | 17.17 | 9.21 | Rectangular |
| Comparative example 47 | 1100 | 40.4 | 13.21 | 10.95 | Top-round |
| Example 46 | <100 | 48.8 | 17.89 | 8.65 | Rectangular |
| Comparative example 48 | 1240 | 44.3 | 14.09 | 10.91 | Top-round |
| Example 47 | <100 | 50.5 | 17.22 | 8.10 | Rectangular |
| Comparative example 49 | 750 | 46.6 | 14.11 | 10.34 | Top-round |
| Example 48 | <100 | 49.7 | 19.67 | 8.23 | Rectangular |
| Comparative example 50 | 430 | 45.4 | 17.49 | 9.94 | Top-round |
| Example 49 | <100 | 50.4 | 18.02 | 9.00 | Rectangular |
| Comparative example 51 | 970 | 45.3 | 14.88 | 10.36 | Top-round |
| Example 50 | <100 | 53.3 | 19.24 | 8.05 | Rectangular |
| Comparative example 52 | 520 | 48.0 | 16.59 | 9.89 | Top-round |
| Example 51 | <100 | 62.4 | 23.78 | 7.57 | Rectangular |
| Comparative example 53 | 310 | 57.6 | 20.67 | 8.93 | Top-round |

TABLE 5

| | Residual amount of water-soluble monomer (ppm) | Eop (μC/cm²) | EL margin (%) | LER (nm) | Resist pattern shape |
|---|---|---|---|---|---|
| Example 52 | <100 | 57.2 | 21.75 | 8.20 | Rectangular |
| Comparative example 54 | 690 | 52.3 | 15.82 | 11.26 | Top-round |
| Example 53 | <100 | 61.0 | 22.98 | 6.91 | Rectangular |
| Comparative example 55 | 880 | 55.4 | 17.27 | 9.15 | Top-round |
| Example 54 | <100 | 54.4 | 19.43 | 7.49 | Rectangular |
| Comparative example 56 | 650 | 47.5 | 15.03 | 9.46 | Top-round |
| Example 55 | <100 | 50.8 | 17.27 | 9.15 | Rectangular |
| Comparative example 57 | 1170 | 44.1 | 13.69 | 12.32 | Top-round |
| Example 56 | <100 | 43.5 | 16.82 | 9.42 | Rectangular |
| Comparative example 58 | 870 | 36.7 | 12.38 | 13.11 | Top-round |
| Example 57 | <100 | 47.1 | 17.78 | 8.55 | Rectangular |
| Comparative example 59 | 1250 | 40.3 | 13.63 | 10.42 | Top-round |
| Example 58 | <100 | 44.6 | 17.15 | 8.09 | Rectangular |
| Comparative example 60 | 490 | 41.2 | 14.71 | 9.94 | Top-round |
| Example 59 | <100 | 57.5 | 20.44 | 7.97 | Rectangular |
| Comparative example 61 | 400 | 54.2 | 18.31 | 9.55 | Top-round |
| Example 60 | <100 | 49.6 | 16.73 | 8.95 | Rectangular |
| Comparative example 62 | 1070 | 43.6 | 12.91 | 11.70 | Top-round |
| Example 61 | <100 | 56.1 | 18.36 | 6.81 | Rectangular |
| Comparative example 63 | 680 | 53.5 | 15.29 | 9.84 | Top-round |
| Example 62 | <100 | 59.5 | 20.39 | 7.18 | Rectangular |
| Comparative example 64 | 570 | 56.2 | 17.10 | 10.45 | Top-round |
| Example 63 | <100 | 56.7 | 19.60 | 7.28 | Rectangular |
| Comparative example 65 | 830 | 52.4 | 15.78 | 10.43 | Top-round |
| Example 64 | <100 | 60.6 | 20.79 | 6.73 | Rectangular |
| Comparative example 66 | 330 | 58.1 | 18.16 | 8.97 | Top-round |
| Example 65 | <100 | 41.2 | 17.42 | 8.34 | Rectangular |
| Comparative example 67 | >3000 | 32.4 | 11.62 | 14.83 | Top-round |
| Example 66 | <100 | 58.3 | 18.44 | 8.76 | Rectangular |
| Comparative example 68 | >3000 | 41.4 | 12.09 | 15.33 | Top-round |
| Example 67 | <100 | 57.9 | 18.16 | 8.70 | Rectangular |
| Comparative example 69 | >3000 | 39.9 | 11.60 | 14.92 | Top-round |
| Example 68 | <100 | 58.9 | 18.16 | 9.16 | Rectangular |
| Comparative example 70 | >3000 | 41.0 | 11.81 | 15.48 | Top-round |

Based on the result shown in the above tables, it is evident that the resist compositions of the examples 35 to 68 according to the present invention exhibited superior lithography properties when compared with the resist compositions of the comparative examples 36 to 70 which differ from the present invention. Further, it is also evident that the resist compositions of the examples 35 to 68 yielded favorable resist pattern shapes with a high degree of rectangularity.

In addition, it is clear that the polymeric compounds produced in the examples 1 to 34 in accordance with the present invention contained extremely small residual amounts of the water-soluble monomer.

In contrast, in cases such as the comparative examples 1 to 31, in which the monomer having the organic cation that gives rise to the structural unit (a5) is polymerized directly, even when washing with methanol was performed after the polymerization, satisfactory removal of the residual monomer having the organic cation still proved difficult.

The residual amount of the water-soluble monomer determined in the examples was calculated by measuring the concentration of the monomer relative to the polymeric compound prior to salt exchange, but in the step (iii), the residual water-soluble monomer also undergoes salt exchange at the same time as the salt exchange performed on the polymeric compound (precursor polymer). As a result, the residual amount of the monomer group, consisting of the water-soluble monomer and the monomer produced as a result of the water-soluble monomer undergoing salt exchange with the aforementioned organic cation, relative to the amount of the polymeric compound following salt exchange is essentially equal to, or less than, the above measured residual amount (ppm) of the water-soluble monomer. As a result, the resist compositions of the examples 35 to 68, which contain the polymeric compounds produced in the examples 1 to 34 having small residual amounts of the aforementioned monomer group, have more favorable lithography properties, including superior exposure latitude and reduced roughness, and also yield a more favorable resist pattern shape.

While preferred examples of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a polymeric compound containing a structural unit that decomposes upon exposure to irradiation with radiation to generate an acid, the method comprising: synthesizing a precursor polymer by polymerizing a water-soluble monomer having an anionic group which is at least one group selected from the group consisting of groups represented by general formulas (a5-an1) and (a5-an2) shown below:

(a5-an1)

(a5-an2)

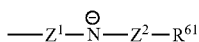

wherein each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, p represents an integer of 1 to 8, each of $Z^1$ and $Z^2$ independently represents —C(=O)— or —SO$_2$—, and $R^{61}$ represents a hydrocarbon group which may have a fluorine atom;

washing the precursor polymer with water; and subsequently subjecting the precursor polymer to a salt exchange with an organic cation.

2. The method of producing a polymeric compound according to claim 1, wherein the anionic group is at least one group selected from the group consisting of sulfonate anions, carboxylate anions, sulfonylimide anions, bis(alkylsulfonyl)imide anions, and tris (alkylsulfonyl)methide anions.

3. The method of producing a polymeric compound according to claim 1, wherein the water-soluble monomer comprises at least one compound selected from the group consisting of compounds represented by general formulas (a5-1), (a5-2), (a5-3) and (a5-4) shown below:

(a5-1)

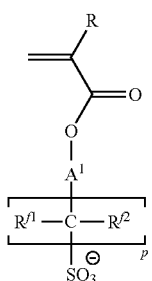

(a5-2)

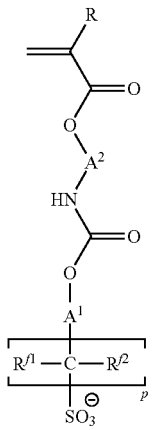

(a5-3)

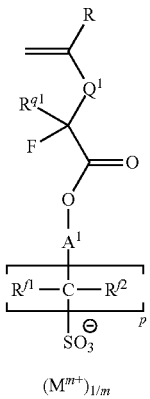

(a5-4)

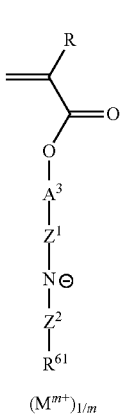

wherein each R independently represents a hydrogen atom, an alkyl group of 1 to 5 carbon atoms or a halogenated alkyl group of 1 to 5 carbon atoms, each $A^1$ independently represents a single bond or a divalent linking group, each of $R^{f1}$ and $R^{f2}$ independently represents a hydrogen atom, an alkyl group, a fluorine atom or a fluorinated alkyl group, provided that at least one of $R^{f1}$ and $R^{f2}$ represents a fluorine atom or a fluorinated alkyl group, each p independently represents an integer of 1 to 8, each $M^{m+}$ independently represents a counter cation, and each m independently represents an integer of 1 to 3, and wherein within the formula (a5-2), $A^2$ represents a divalent linking group, within the formula (a5-3), $Q^1$ represents a group containing —O—, —CH$_2$—O— or —C(=O)—O—, and $R^{q1}$ represents a fluorine atom or a fluorinated alkyl group, and within the formula (a5-4), $A^3$ represents a divalent linking group, each of $Z^1$ and $Z^2$ independently represents —C(=O)— or —SO$_2$—, and $R^{61}$ represents a hydrocarbon group which may have a fluorine atom.

4. The method of producing a polymeric compound according to claim 1, wherein the organic cation is a sulfonium ion or an iodonium ion.

* * * * *

UNITED STATES PATENT AND TRADEMARK OFFICE
CERTIFICATE OF CORRECTION

PATENT NO. : 8,987,386 B2
APPLICATION NO. : 13/491860
DATED : March 24, 2015
INVENTOR(S) : Yoshiyuki Utsumi et al.

Page 1 of 2

It is certified that error appears in the above-identified patent and that said Letters Patent is hereby corrected as shown below:

ON THE TITLE PAGE
Page 1 (Item 56), Col. 2, line 3, Under Other Publications, "Reists," should be -- Resists, --.
Page 1 (Item 56), Col. 2, line 3, Under Other Publications, "Jouranl" should be -- Journal --.
IN THE SPECIFICATION
Col. 6, line 22, "sulfanilamide" should be -- sulfonylimide --.
Col. 10, line 46, "—O—C(=O)—$Y^{22}$—," should be -- —$Y^{21}$—O—C(=O)—$Y^{22}$—, --.
Col. 21, line 51, "$R^{f1}$, $R^{f3}$, $M^{m+}$" should be -- $R^{f1}$, $R^{f2}$, p, $M^{m+}$ --.
Col. 22, line 16, "Q'" should be -- $Q^1$ --.
Col. 43, lines 15-28:

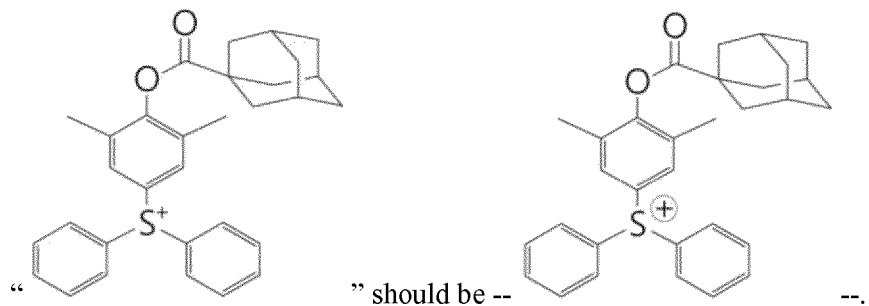

Col. 43, lines 32-45:

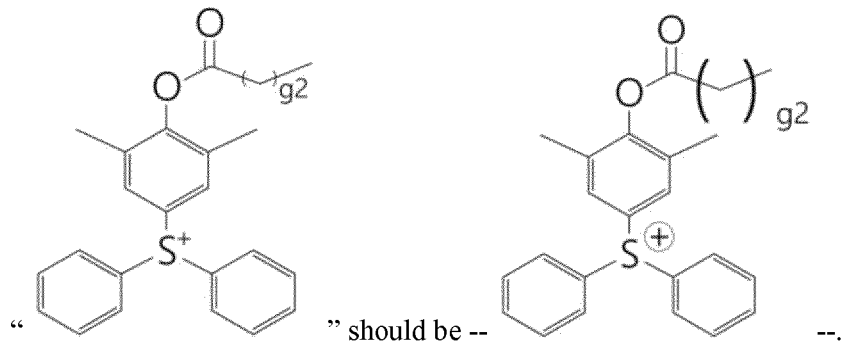

Signed and Sealed this
Twenty-sixth Day of January, 2016

Michelle K. Lee
*Director of the United States Patent and Trademark Office*

CERTIFICATE OF CORRECTION (continued)
U.S. Pat. No. 8,987,386 B2

IN THE SPECIFICATION
Col. 43, lines 50-64:

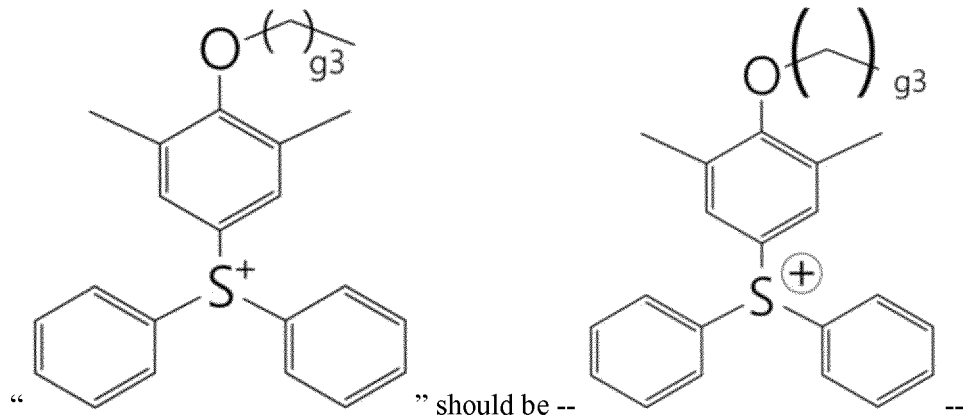

Col. 51, line 60, "(a1))" should be -- (a1) --.
Col. 53, line 61, "glycoluryl" should be -- glycoluril --.
Col. 101, line 27, "(a1'-0-2)" should be -- (a11-0-2) --.
Col. 110, line 4, "(a1))" should be -- (a1) --.
Col. 169, line 21, "(a-4-1)" should be -- (a4-1) --.
Col. 169, line 21, "(a-4-5)" should be -- (a4-5) --.
Col. 179, lines 29-30, "(3,5-dimethyl-" should be -- 1-(3,5-dimethyl- --.
Col. 184, line 20, "α-(p-toluenesulfonyl oxyimino)-" should be -- α-(p-toluenesulfonyloxyimino)- --.
Col. 184, line 34, "α-(tosyloxyamino)-" should be -- α-(tosyloxyimino)- --.
Col. 184, line 43, "α-(cyclohexyl sulfonyl oxyimino)-" should be
-- α-cyclohexylsulfonyloxyimino)- --.
Col. 191, line 34, "at it" should be -- as it --.